(12) United States Patent
Song

(10) Patent No.: US 12,417,075 B2
(45) Date of Patent: *Sep. 16, 2025

(54) PROCESSING-IN-MEMORY (PIM) DEVICES

(71) Applicant: SK hynix Inc., Icheon-si (KR)

(72) Inventor: Choung Ki Song, Yongin-si (KR)

(73) Assignee: SK hynix Inc., Icheon-si (KR)

(*) Notice: Subject to any disclaimer, the term of this patent is extended or adjusted under 35 U.S.C. 154(b) by 1059 days.

This patent is subject to a terminal disclaimer.

(21) Appl. No.: 17/410,752

(22) Filed: Aug. 24, 2021

(65) Prior Publication Data

US 2021/0382693 A1    Dec. 9, 2021

Related U.S. Application Data

(63) Continuation-in-part of application No. 17/090,462, filed on Nov. 5, 2020, now Pat. No. 11,537,323.

(60) Provisional application No. 62/958,223, filed on Jan. 7, 2020.

(30) Foreign Application Priority Data

Jan. 17, 2020  (KR) .................. 10-2020-0006902

(51) Int. Cl.
| | |
|---|---|
| *G06F 7/544* | (2006.01) |
| *G06F 7/523* | (2006.01) |
| *G06F 17/16* | (2006.01) |
| *G11C 7/10* | (2006.01) |

(52) U.S. Cl.
CPC ............ *G06F 7/5443* (2013.01); *G06F 7/523* (2013.01); *G06F 17/16* (2013.01); *G11C 7/1069* (2013.01); *G11C 7/1096* (2013.01)

(58) Field of Classification Search
CPC ..... G06F 7/5443; G06F 17/16; G11C 7/1069; G11C 7/1096
See application file for complete search history.

(56) References Cited

U.S. PATENT DOCUMENTS

| | | |
|---|---|---|
| 8,966,153 B2 | 2/2015 | Kajigaya |
| 10,042,639 B2 | 8/2018 | Gopal et al. |
| 10,915,298 B1 * | 2/2021 | Far .................. G06N 3/065 |

(Continued)

FOREIGN PATENT DOCUMENTS

| | | |
|---|---|---|
| KR | 1020170138926 A | 12/2017 |
| KR | 1020190080120 A | 7/2019 |
| KR | 1020200066953 A | 6/2020 |

*Primary Examiner* — Michael D. Yaary
(74) *Attorney, Agent, or Firm* — WILLIAM PARK AND ASSOCIATES LTD.

(57) ABSTRACT

A processing-in-memory (PIM) device includes a plurality of multiplication/accumulation (MAC) operators, a plurality of memory banks, and a plurality of data input/output (I/O) circuits. The plurality of MAC operators is configured to perform a MAC arithmetic operation using weight data of a weight matrix provided by the plurality of memory banks as input data to generate plural sets of MAC result data corresponding to elements of a result matrix. The PIM device is configured to store the weight data of the weight matrix in the memory banks in units of rows of the weight matrix. The PIM device is also configured to sequentially output the plural sets of MAC result data from the PIM device through the plurality of data I/O circuits according to a sequence in which the row number of the result matrix increases.

12 Claims, 73 Drawing Sheets

(56) References Cited

U.S. PATENT DOCUMENTS

| | | |
|---|---|---|
| 2009/0150575 A1 | 6/2009 | Madruga et al. |
| 2009/0177849 A1 | 7/2009 | Mazzola et al. |
| 2020/0026498 A1* | 1/2020 | Sumbul ............... G06F 12/0811 |
| 2020/0193277 A1 | 6/2020 | Kwon |
| 2020/0294575 A1 | 9/2020 | O et al. |

* cited by examiner

| REMAP_S | OPERATION |
|---|---|
| LOGIC LOW ("LO") | SKIP "BANK ADDRESS REMAPPING DISCRIMINATING OPERATION" AND TRANSFER "ADDR1" TO ADDRESS OUTPUT CIRCUIT |
| LOGIC HIGH ("HI") | PERFORM "BANK ADDRESS REMAPPING DISCRIMINATING OPERATION" |

FIG.68

| MEMORY BANK | FIRST BANK ADDRESS (BA1) | BANK ADDRESS DISCRIMINATING OPERATION |
|---|---|---|
| BK(0) | 0000 | DISCRIMINATE THAT "BANK ADDRESS REMAPPING IS PERFORMED" AND TRANSFER "ADDR1" TO ADDRESS OUTPUT CIRCUIT(5133) |
| BK(1) | 0001 | |
| BK(2) | 0010 | |
| BK(3) | 0011 | |
| BK(4) | 0100 | |
| BK(5) | 0101 | |
| BK(6) | 0110 | |
| BK(7) | 0111 | DISCRIMINATE THAT "BANK ADDRESS REMAPPING IS SKIPPED" AND TRANSFER "ADDR1" TO BANK ADDRESS CHANGING CIRCUIT(5132) |
| BK(8) | 1000 | |
| BK(9) | 1001 | |
| BK(10) | 1010 | |
| BK(11) | 1011 | |
| BK(12) | 1100 | |
| BK(13) | 1101 | |
| BK(14) | 1110 | DISCRIMINATE THAT "BANK ADDRESS REMAPPING IS PERFORMED" AND TRANSFER "ADDR1" TO ADDRESS OUTPUT CIRCUIT(5133) |
| BK(15) | 1111 | |

FIG. 70

| MEMORY BANK | FIRST BANK ADDRESS (BA1) | SECOND BANK ADDRESS (BA2) | MEMORY BANK |
|---|---|---|---|
| BK(0) | 0000 | 0000 | BK(0) |
| BK(1) | 0001 | 0001 | BK(1) |
| BK(2) | 0010 | 1000 | BK(8) |
| BK(3) | 0011 | 1001 | BK(9) |
| BK(4) | 0100 | 0010 | BK(2) |
| BK(5) | 0101 | 0011 | BK(3) |
| BK(6) | 0110 | 1010 | BK(10) |
| BK(7) | 0111 | 1011 | BK(11) |
| BK(8) | 1000 | 0100 | BK(4) |
| BK(9) | 1001 | 0101 | BK(5) |
| BK(10) | 1010 | 1100 | BK(12) |
| BK(11) | 1011 | 1101 | BK(13) |
| BK(12) | 1100 | 0110 | BK(6) |
| BK(13) | 1101 | 0111 | BK(7) |
| BK(14) | 1110 | 1110 | BK(14) |
| BK(15) | 1111 | 1111 | BK(15) |

| OUTPUT ORDER | MAC RESULT DATA (MAC_RST) | MAC OPERATOR / MEMORY BANK PROVIDING WEIGHT DATA | MAC OPERATION |
|---|---|---|---|
| 1 (DQ1-DQ16) | MAC_RST(1) | MAC(0) / BK(0) | (W(1,1)~W(1,64)) × (V(1)~V(64)) |
| 2 (DQ17-DQ32) | MAC_RST(2) | MAC(1) / BK(1) | (W(2,1)~W(2,64)) × (V(1)~V(64)) |
| 3 (DQ33-DQ48) | MAC_RST(3) | MAC(8) / BK(8) | (W(3,1)~W(3,64)) × (V(1)~V(64)) |
| 4 (DQ49-DQ64) | MAC_RST(4) | MAC(9) / BK(9) | (W(4,1)~W(4,64)) × (V(1)~V(64)) |
| 5 (DQ1-DQ16) | MAC_RST(5) | MAC(2) / BK(2) | (W(5,1)~W(5,64)) × (V(1)~V(64)) |
| 6 (DQ17-DQ32) | MAC_RST(6) | MAC(3) / BK(3) | (W(6,1)~W(6,64)) × (V(1)~V(64)) |
| 7 (DQ33-DQ48) | MAC_RST(7) | MAC(10) / BK(10) | (W(7,1)~W(7,64)) × (V(1)~V(64)) |
| 8 (DQ49-DQ64) | MAC_RST(8) | MAC(11) / BK(11) | (W(8,1)~W(8,64)) × (V(1)~V(64)) |
| 9 (DQ1-DQ16) | MAC_RST(9) | MAC(4) / BK(4) | (W(9,1)~W(9,64)) × (V(1)~V(64)) |
| 10 (DQ17-DQ32) | MAC_RST(10) | MAC(5) / BK(5) | (W(10,1)~W(10,64)) × (V(1)~V(64)) |
| 11 (DQ33-DQ48) | MAC_RST(11) | MAC(12) / BK(12) | (W(11,1)~W(11,64)) × (V(1)~V(64)) |
| 12 (DQ49-DQ64) | MAC_RST(12) | MAC(13) / BK(13) | (W(12,1)~W(12,64)) × (V(1)~V(64)) |
| 13 (DQ1-DQ16) | MAC_RST(13) | MAC(6) / BK(6) | (W(13,1)~W(13,64)) × (V(1)~V(64)) |
| 14 (DQ17-DQ32) | MAC_RST(14) | MAC(7) / BK(7) | (W(14,1)~W(14,64)) × (V(1)~V(64)) |
| 15 (DQ33-DQ48) | MAC_RST(15) | MAC(14) / BK(14) | (W(15,1)~W(15,64)) × (V(1)~V(64)) |
| 16 (DQ49-DQ64) | MAC_RST(16) | MAC(15) / BK(15) | (W(16,1)~W(16,64)) × (V(1)~V(64)) |

FIRST OUTPUT: rows 1–4
SECOND OUTPUT: rows 5–8
THIRD OUTPUT: rows 9–12
FOURTH OUTPUT: rows 13–16

PROCESSING-IN-MEMORY (PIM) DEVICES

CROSS-REFERENCE TO RELATED APPLICATIONS

This is a continuation-in-part of U.S. patent application Ser. No. 17/090,462, filed Nov. 5, 2020, which claims the priority of provisional application No. 62/958,223, filed on Jan. 7, 2020, and Korean Application No. 10-2020-0006902, filed on Jan. 17, 2020, which are incorporated herein by reference in their entirety.

BACKGROUND

1. Technical Field

Various embodiments of the present disclosure relate to processing-in-memory (PIM) devices and, more particularly, to PIM devices performing a deterministic arithmetic operation.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. One cause of this widespread interest may be due to the improved performance of processors performing arithmetic operations. To improve the performance of artificial intelligence, it may be necessary to increase the number of layers constituting a neural network of the artificial intelligence to educate the artificial intelligence. This trend has continued in recent years, which has led to an exponential increase in the amount of computations required for hardware actually performing the computations. Moreover, if artificial intelligence employs a general hardware system including a memory and a processor which are separated from each other, the performance of the artificial intelligence may be degraded due to a limitation of the amount of data communication between the memory and the processor. In order to solve this problem, a PIM device in which a processor and memory are integrated in one semiconductor chip has been used as a neural network computing device. Because the PIM device directly performs arithmetic operations in the PIM device, a data processing speed in the neural network may be improved.

SUMMARY

A processing-in-memory (PIM) device according to an embodiment of the present disclosure includes first to $L^{th}$ multiplication/accumulation (MAC) operators, first to $L^{th}$ memory banks, and a plurality of data input/output (I/O) circuits. The first to $L^{th}$ MAC operators are configured to perform a MAC arithmetic operation for weight data of a weight matrix having "M"-number of rows to generate first to $M^{th}$ MAC result data corresponding to elements of a result matrix (where, "L" is divisor of "M", and "M" is a natural number which is equal to or greater than two). The first to $L^{th}$ memory banks configured to provide the weight data to the first to $L^{th}$ MAC operators. The plurality of data I/O circuits are configured to output the first to $M^{th}$ MAC result data, which are generated by the first to $L^{th}$ MAC operators, as output data of the PIM device. The PIM device is configured to, when the number "i" is one of 0, 1, . . . , and "M/L−1" and the number "j" is one of "iL+1", "iL+2", "iL+3", . . . , "iL+(L−1)", and "iL+L", store "L" sets of the weight data arrayed in the $(iL+1)^{th}$ to $(iL+L)^{th}$ rows of the weight matrix in respective ones of the first to $L^{th}$ memory banks, and store the weight data arrayed in the $j^{th}$ row of the weight matrix in the $(j-iL)^{th}$ memory bank. The PIM device is configured to output the first to $M^{th}$ MAC result data through the plurality of data I/O circuits in order of a row number of the result matrix.

A processing-in-memory (PIM) device according to an embodiment of the present disclosure includes first to $L^{th}$ multiplication/accumulation (MAC) operators, first to $L^{th}$ memory banks, first to $L^{th}$ additional adders, and a plurality of data input/output (I/O) circuits. The first to $L^{th}$ MAC operators are configured to perform a MAC arithmetic operation for weight data of a weight matrix having "M"-number of rows (where, "L" is divisor of "M", and "M" is a natural number which is equal to or greater than two). The first to $L^{th}$ MAC operators include first to $L^{th}$ left MAC operators generating respective ones of first to $L^{th}$ left MAC data and first to $L^{th}$ right MAC operators generating respective ones of first to $L^{th}$ right MAC data. The first to $L^{th}$ memory banks are configured to provide the weight data to the first to $L^{th}$ MAC operators. The first to $L^{th}$ memory banks include first to $L^{th}$ left memory banks and first to $L^{th}$ right memory banks. The first to $L^{th}$ additional adders are configured to add the first to $L^{th}$ left MAC data generated by respective ones of the first to $L^{th}$ left MAC operators to the first to $L^{th}$ right MAC data generated by respective ones of the first to $L^{th}$ right MAC operators to generate and output first to $M^{th}$ MAC result data. The plurality of data I/O circuits include left data I/O circuits and right data I/O circuits configured to output the first to $M^{th}$ MAC result data as output data of the PIM device. Each of the first to $L^{th}$ additional adders is classified as either a left additional adder or a right additional adder. The left additional adders are configured to transmit a first portion of the first to $M^{th}$ MAC result data to the left data I/O circuits, and the right additional adders are configured to transmit a second portion of the first to $M^{th}$ MAC result data to the right data I/O circuits.

A processing-in-memory (PIM) device according to an embodiment of the present disclosure includes first to $L^{th}$ multiplication/accumulation (MAC) operators, first to $L^{th}$ memory banks, and a plurality of data input/output (I/O) circuits. The first to $L^{th}$ MAC operators are configured to perform a MAC arithmetic operation for weight data of a weight matrix having "M"-number of rows to generate first to $M^{th}$ MAC result data (where, "L" is divisor of "M", and "M" is a natural number which is equal to or greater than two). The first to $L^{th}$ MAC operators include first to $L^{th}$ left MAC operators and first to $L^{th}$ right MAC operators. The first to $L^{th}$ memory banks are configured to provide the weight data to the first to $L^{th}$ MAC operators. The first to $L^{th}$ memory banks include first to $L^{th}$ left memory banks and first to $L^{th}$ right memory banks. The plurality of data I/O circuits include left data I/O circuits and right data I/O circuits that output the first to $M^{th}$ MAC result data as output data of the PIM device. A $U^{th}$ MAC operator among the first to $L^{th}$ MAC operators is configured to output one of the first to $M^{th}$ MAC result data through a $U^{th}$ left MAC operator among the first to $L^{th}$ left MAC operators or a $U^{th}$ right MAC operator among the first to $L^{th}$ right MAC operators (where, "U" is one of 1, . . . , and L). The PIM device is configured to output the MAC result data outputted through the left MAC operators through the left data I/O circuits, and output the MAC result data outputted through the right MAC operators through the right data I/O circuits.

A processing-in-memory (PIM) device according to an embodiment of the present disclosure includes first to $L^{th}$ multiplication/accumulation (MAC) operators, first to $L^{th}$ memory banks, first to $L^{th}$ additional adders, a plurality of data input/output (I/O) circuits, and an address remapper. The first to $L^{th}$ MAC operators are configured to perform a MAC arithmetic operation for weight data of a weight matrix having "M"-number of rows (where, "L" is divisor of "M", and "M" is a natural number which is equal to or greater than two). The first to $L^{th}$ MAC operators include first to $L^{th}$ left MAC operators configured to generate respective ones of first to $L^{th}$ left MAC data and first to $L^{th}$ right MAC operators configured to generate respective ones of first to $L^{th}$ right MAC data. The first to $L^{th}$ memory banks are configured to provide the weight data to the first to $L^{th}$ MAC operators. The first to $L^{th}$ memory banks include first to $L^{th}$ left memory banks and first to $L^{th}$ right memory banks. The first to $L^{th}$ additional adders are configured to add the first to $L^{th}$ left MAC data generated by respective ones of the first to $L^{th}$ left MAC operators to the first to $L^{th}$ right MAC data generated by respective ones of the first to $L^{th}$ right MAC operators to generate and output first to $M^{th}$ MAC result data. The plurality of data I/O circuits include left data I/O circuits and right data I/O circuits configured to output the first to $M^{th}$ MAC result data as output data of the PIM device. The address remapper is configured to perform a remapping operation for remapping bank addresses of the first to $L^{th}$ memory banks during a write process for writing the weight data into the first to $L^{th}$ memory banks.

A processing-in-memory (PIM) device according to an embodiment of the present disclosure includes first to $L^{th}$ multiplication/accumulation (MAC) operators, first to $L^{th}$ memory banks, a plurality of data input/output (I/O) circuits, and an address remapper. The first to $L^{th}$ multiplication/accumulation (MAC) operators are configured to perform a MAC arithmetic operation for weight data of a weight matrix having "M"-number of rows to generate first to $M^{th}$ MAC result data (where, "L" is divisor of "M", and "M" is a natural number which is equal to or greater than two). The first to $L^{th}$ MAC operators include first to $L^{th}$ left MAC operators and first to $L^{th}$ right MAC operators. The first to $L^{th}$ memory banks are configured to provide the weight data to the first to $L^{th}$ MAC operators. The first to $L^{th}$ memory banks include first to $L^{th}$ left memory banks and first to $L^{th}$ right memory banks. The plurality of data I/O circuits include left data I/O circuits and right data I/O circuits configured to output the first to $M^{th}$ MAC result data as output data of the PIM device. The address remapper is configured to perform a remapping operation for remapping bank addresses of the first to $L^{th}$ memory banks during a write process for writing the weight data into the first to $L^{th}$ memory banks.

BRIEF DESCRIPTION OF THE DRAWINGS

Certain features of the disclosed technology are illustrated by various embodiments with reference to the attached drawings.

Figure 45:
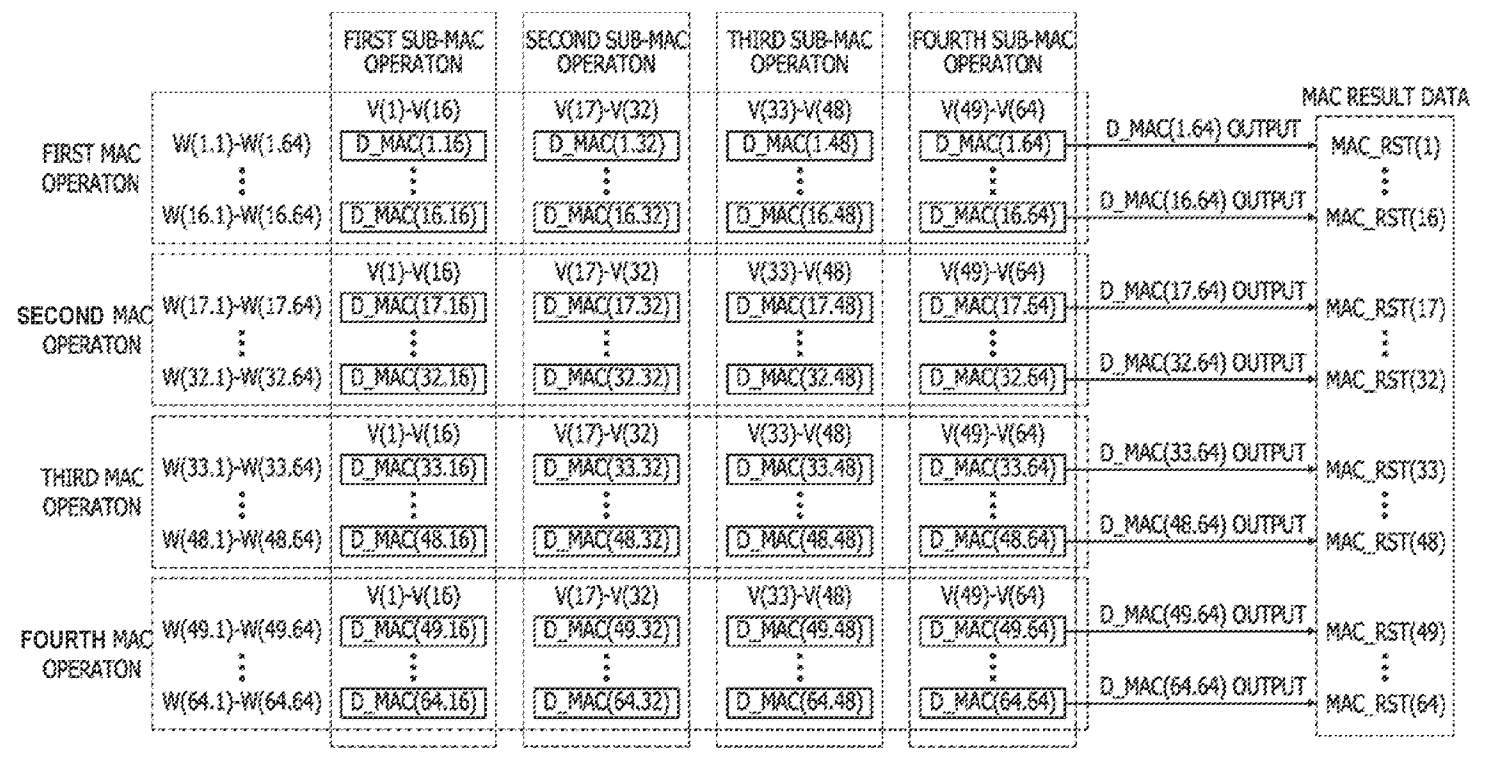

FIG. 45 illustrates an output process of MAC result data obtained as a result of the matrix multiplying calculation of FIG. 33 performed by the PIM device illustrated in FIG. 31.

FIG. 67 illustrates an operation for determining whether to execute or skip a remap discriminating operation of a remap discriminating circuit included in the address remapper of FIG. 66.

FIG. 68 illustrates a remap discriminating operation of a remap discriminating circuit included in the address remapper of FIG. 66.

FIG. 70 illustrates a remapped result of bank addresses generated by the bank address remapping operation described with reference to FIG. 69.

FIG. 72 illustrates a state of memory banks in which weight data are stored by a bank address remapping operation, in each of the PIM devices illustrated in FIGS. 61 and 62.

FIG. 73 illustrates an output sequence of MAC result data when weight data are stored in memory banks by a bank address remapping operation in each of the PIM devices illustrated in FIGS. 61 and 62.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices which are capable of performing a deterministic arithmetic operation at a high speed.

Figure 1:
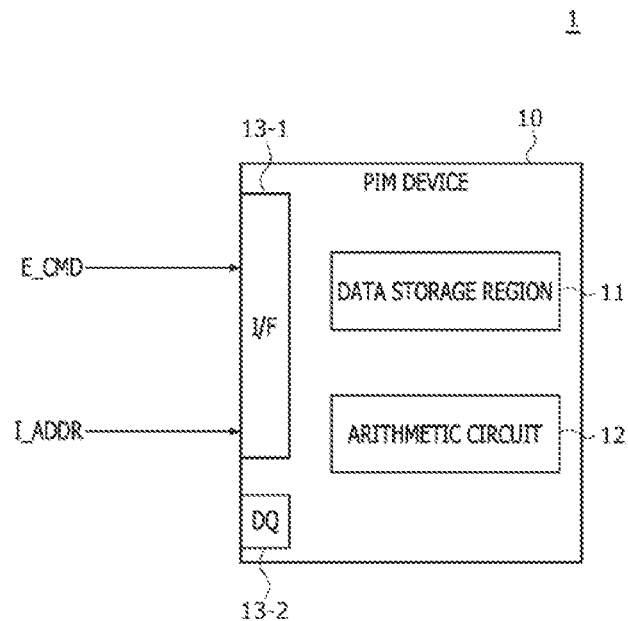
FIG. 1 is a block diagram illustrating a PIM device according to an embodiment of the present disclosure.

FIG. 1 is a block diagram illustrating a PIM device according to an embodiment of the present disclosure. As illustrated in FIG. 1, the PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2. In an embodiment, the arithmetic circuit 12 may perform additional operations, for example a bias addition operation and an active function operation, for a neural network calculation, for example, an arithmetic operation in a deep learning process. In another embodiment, the PIM device 10 may include a bias addition circuit and active function circuit separated from the arithmetic circuit 12.

The interface 13-1 of the PIM device 10 may receive an external command E_CMD and an input address I_ADDR from an external device. The external device may denote a host or a PIM controller coupled to the PIM device 10. Hereinafter, it may be assumed that the external command E_CMD transmitted to the PIM device 10 is a command requesting the MAC arithmetic operation. That is, the PIM device 10 may perform a MAC arithmetic operation in response to the external command E_CMD. The data I/O pad 13-2 of the PIM device 10 may function as a data communication terminal between a device external to the PIM device 10, for example the PIM controller or a host located outside the PIM system 1. Accordingly, data outputted from the host or the PIM controller may be inputted into the PIM device 10 through the data I/O pad 13-2. Also, data outputted from the PIM device 10 may be inputted to the host or the PIM controller through the data I/O pad 13-2.

In an embodiment, the PIM device 10 may operate in a memory mode or a MAC arithmetic mode. In the event that the PIM device 10 operates in the memory mode, the PIM device 10 may perform a data read operation or a data write operation for the data storage region 11. In the event that the PIM device 10 operates in the MAC arithmetic mode, the arithmetic circuit 12 of the PIM device 10 may receive first data and second data from the data storage region 11 to perform the MAC arithmetic operation. In the event that PIM device 10 operates in the MAC arithmetic mode, the PIM device 10 may also perform the data write operation for the data storage region 11 to execute the MAC arithmetic operation. The MAC arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
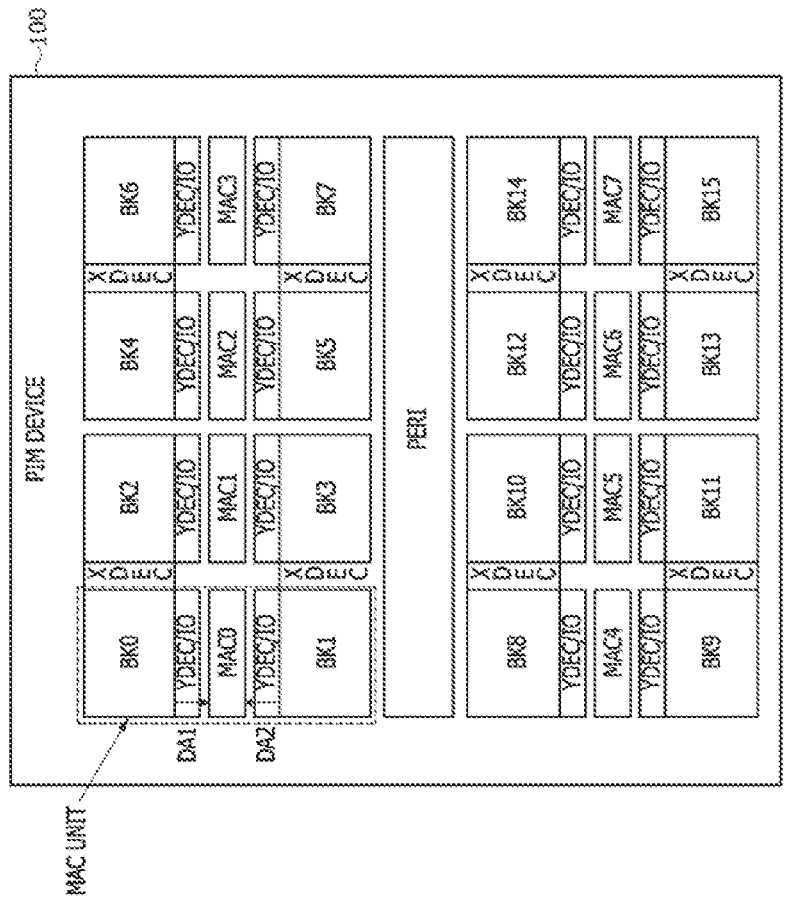
FIG. 2 is a schematic diagram illustrating an arrangement of memory banks and multiplication/accumulation (MAC) operators included in a PIM device according to a first embodiment of the present disclosure.

FIG. 2 illustrates a disposal structure indicating placement of memory banks BK0, . . . , and BK15 and MAC operators MAC0, . . . , and MAC7 included in a PIM device 100 according to an embodiment of the present disclosure. In an embodiment, the memory banks BK0, . . . , and BK15 and the MAC operators MAC0, . . . , and MAC7 may be included in the data storage region and the arithmetic circuit of the PIM device 10 of FIG. 1, respectively. Referring to FIG. 2, the PIM device 100 may include a data storage region and an arithmetic circuit. In an embodiment, the data storage region may include the memory banks BK0, . . . , and BK15. Although the present embodiment illustrates an example in which the data storage region includes the memory banks BK0, . . . , and BK15, the memory banks BK0, . . . , and BK15 are merely examples which are suitable for the data storage region. In some embodiments, the memory banks BK0, . . . , and BK15 may be a memory region corresponding to a volatile memory device, for example, a DRAM device. In an embodiment, each of the memory banks BK0, . . . , and BK15 may be a component unit which is independently activated and may be configured to have the same data bus width as data I/O lines in the PIM device 100. In an embodiment, the memory banks BK0, . . . , and BK15 may operate through interleaving such that an active operation of any one of the memory banks is performed in parallel while another memory bank is selected. Although the present embodiment illustrates an example in which the PIM device 100 includes the memory banks BK0, . . . , and BK15, the number of the memory banks is not limited to 16 and may be different in different embodiments. Each of the memory banks BK0, . . . , and BK15 may include at least one cell array which includes memory unit cells located at cross points of a plurality of rows and a plurality of columns. The memory banks BK0, . . . , and BK15 may include a first group of memory banks (e.g., odd-numbered memory banks BK0, BK2, . . . , and BK14) and a second group of memory banks (e.g., even-numbered memory banks BK1, BK3, . . . , and BK15).

A core circuit may be disposed to be adjacent to the memory banks BK0, . . . , and BK15. The core circuit may include X-decoders XDECs and Y-decoders/IO circuits YDEC/IOs. An X-decoder XDEC may also be referred to as a word line decoder or a row decoder. In an embodiment, two odd-numbered memory banks arrayed to be adjacent to each other in one row among the odd-numbered memory banks BK0, BK2, . . . , and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, . . . , and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. The X-decoder XDEC may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/IOs may be disposed to be allocated to the memory banks BK0, . . . , and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum outputted from the corresponding memory bank during a read operation and a write driver for driving a write datum during a write operation for the corresponding memory bank.

In an embodiment, the arithmetic circuit may include MAC operators MAC0, . . . , and MAC7. Although the present embodiment illustrates an example in which the MAC operators MAC0, . . . , and MAC7 are employed as the arithmetic circuit, the present embodiment may be merely an example of the present disclosure. For example, in some other embodiments, processors other than the MAC operators MAC0, . . . , and MAC7 may be employed as the arithmetic circuit. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, . . . , and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. In addition, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 outputted from the first memory bank BK0 included in the first MAC unit and second data DA2 outputted from the second memory bank BK1 included in the first MAC unit. In addition, the first MAC operator MAC0 may perform a MAC arithmetic operation of the first data DA1 and the second data DA2. In the event that the PIM device 100 performs a neural network calculation, for example, an arithmetic operation in a deep learning process, one of the first data DA1 and the second data DA2 may be weight data and the other may be vector data. A configuration of any one of the MAC operators MAC0-MAC7 will be described in more detail hereinafter.

In the PIM device 100, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 100 according to the present embodiment may operate in any one mode of a memory mode and a MAC arithmetic mode. In the memory mode, the PIM device 100 may operate to perform the same operations as general memory devices. The memory mode may include a memory read operation mode and a memory write operation mode. In the memory read operation mode, the PIM device 100 may perform a read operation for reading out data from the memory banks BK0, BK1, . . . , and BK15 to output the read data, in response to an external request. In the memory write operation mode, the PIM device 100 may perform a write operation for storing data provided by an external device into the memory banks BK0, BK1, . . . , and BK15, in response to an external request.

In the MAC arithmetic mode, the PIM device 100 may perform the MAC arithmetic operation using the MAC operators MAC0, . . . , and MAC7. Specifically, the PIM device 100 may perform the read operation of the first data DA1 for each of the odd-numbered memory banks BK0, BK2, . . . , and BK14 and the read operation of the second data DA2 for each of the even-numbered memory banks BK1, BK3, . . . , and BK15, for the MAC arithmetic operation in the MAC arithmetic mode. In addition, each of the MAC operators MAC0, . . . , and MAC7 may perform the MAC arithmetic operation of the first data DA1 and the second data DA2 which are read out of the memory banks to store a result of the MAC arithmetic operation into the memory bank or to output the result of the MAC arithmetic operation. In some cases, the PIM device 100 may perform a data write operation for storing data to be used for the MAC arithmetic operation into the memory banks before the data read operation for the MAC arithmetic operation is performed in the MAC arithmetic mode.

The operation mode of the PIM device 100 according to the present embodiment may be determined by a command which is transmitted from a host or a controller to the PIM device 100. In an embodiment, if a first external command requesting a read operation or a write operation for the memory banks BK0, BK1, . . . , and BK15 is inputted to the PIM device 100, the PIM device 100 may perform the data read operation or the data write operation in the memory mode. Meanwhile, if a second external command requesting a MAC calculation corresponding to the MAC arithmetic operation is inputted to the PIM device 100, the PIM device 100 may perform the MAC arithmetic operation.

The PIM device 100 may perform a deterministic MAC arithmetic operation. The term "deterministic MAC arithmetic operation" used in the present disclosure may be defined as the MAC arithmetic operation performed in the PIM device 100 during a predetermined fixed time. Thus, the host or the controller may always predict a point in time (or a clock) when the MAC arithmetic operation terminates in the PIM device 100 at a point in time when an external command requesting the MAC arithmetic operation is transmitted from the host or the controller to the PIM device 100. No operation for informing the host or the controller of a status of the MAC arithmetic operation is required while the PIM device 100 performs the deterministic MAC arithmetic operation. In an embodiment, a latency during which the MAC arithmetic operation is performed in the PIM device 100 may be fixed for the deterministic MAC arithmetic operation.

Figure 3:
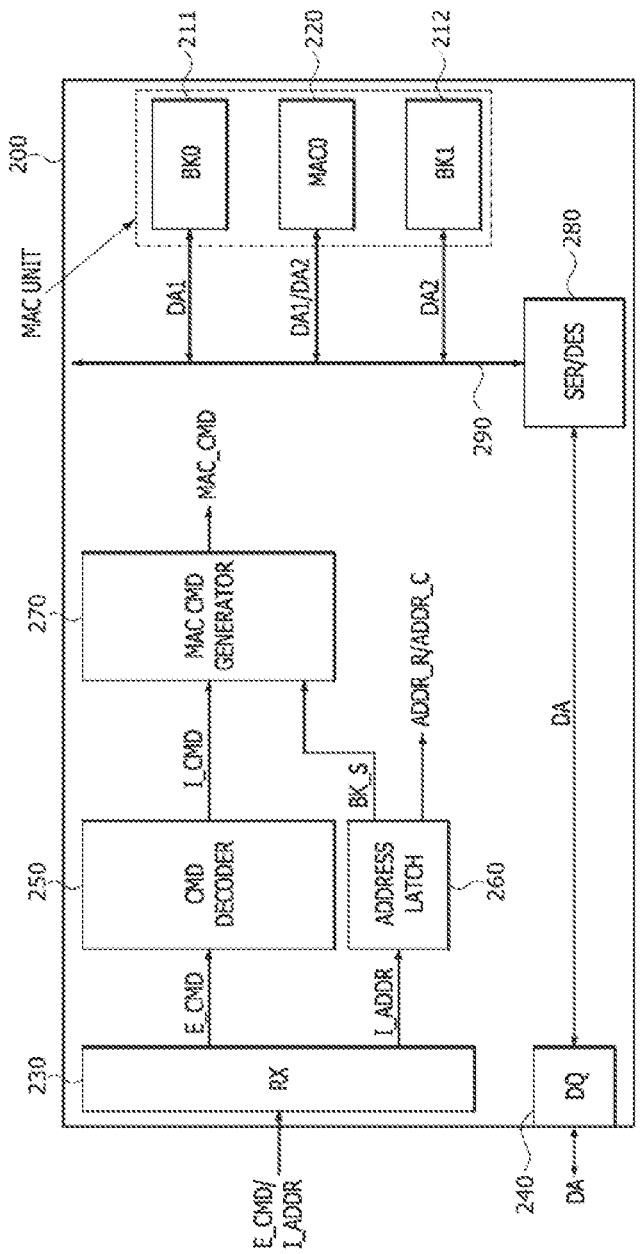
FIG. 3 is a block diagram illustrating a configuration of a PIM device according to the first embodiment of the present disclosure.
Figure 4:
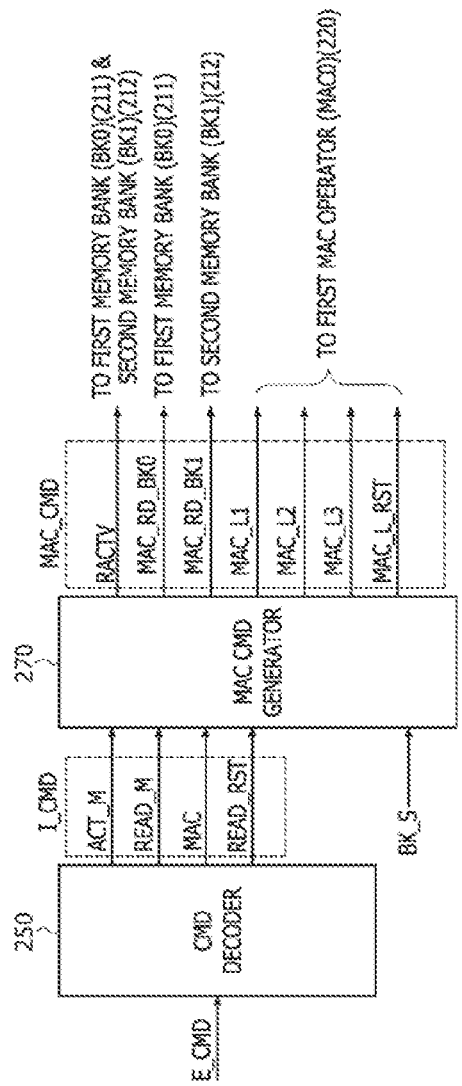
FIG. 4 illustrates internal command signals outputted from a command decoder and MAC command signals outputted from a MAC command generator in the PIM device of FIG. 3.

FIG. 3 is a block diagram illustrating a configuration of a PIM device 200 corresponding to the PIM device 100 illustrated in FIG. 3, and FIG. 4 illustrates an internal command signal I_CMD outputted from a command decoder 250 and a MAC command signal MAC_CMD outputted from a MAC command generator 270 included in the PIM device 200 of FIG. 3. FIG. 3 illustrates only the first memory bank (BK0) 211, the second memory bank (BK1) 212, and the first MAC operator (MAC0) 220 constituting the first MAC unit among the plurality of MAC units. However, FIG. 3 illustrates merely an example for simplification of the drawing. Accordingly, the following description for the first MAC unit may be equally applicable to the remaining MAC units. Referring to FIG. 3, the PIM device 200 may include a global I/O line (hereinafter, referred to as a 'GIO line') 290. The first memory bank (BK0) 211, the second memory bank (BK1) 212, and the first MAC operator (MAC0) 220 may communicate with each other through the GIO line 290. In an embodiment, the GIO line 290 may be disposed in the peripheral circuit PERI of FIG. 2.

The PIM device 200 may include a receiving driver (RX) 230, a data I/O circuit (DQ) 240, a command decoder 250, an address latch 260, a MAC command generator 270, and a serializer/deserializer (SER/DES) 280. The command decoder 250, the address latch 260, the MAC command generator 270, and the serializer/deserializer 280 may be disposed in the peripheral circuit PERI of the PIM device 100 illustrated in FIG. 2. The receiving driver 230 may receive an external command E_CMD and an input address I_ADDR from an external device. The external device may denote a host or a controller coupled to the PIM device 200. Hereinafter, it may be assumed that the external command E_CMD transmitted to the PIM device 200 is a command requesting the MAC arithmetic operation. That is, the PIM device 200 may perform the deterministic MAC arithmetic operation in response to the external command E_CMD. The data I/O circuit 240 may include an I/O pad. The data I/O circuit 240 may be coupled to data I/O line. The PIM device 200 may communicate with the external device through the data I/O circuit 240. The receiving driver 230 may separately output the external command E_CMD and the input address I_ADDR received from the external device. Data DA inputted to the PIM device 200 through the data I/O circuit 240 may be processed by the serializer/deserializer 280 and may be transmitted to the first memory bank (BK0) 211 and the second memory bank (BK1) 212 through the GIO line 290 of the PIM device 200. The data DA outputted from the first memory bank (BK0) 211, the second memory bank (BK1) 212, and the first MAC operator (MAC0) 220 through the GIO line 290 may be processed by the serializer/deserializer 280 and may be outputted to the external device through the data I/O circuit 240. The serializer/deserializer 280 may convert the data DA into parallel data if the data DA are serial data or may convert the data DA into serial data if the data DA are parallel data. For the data conversion, the serializer/deserializer 280 may include a serializer converting parallel data into serial data and a deserializer converting serial data into parallel data.

The command decoder 250 may decode the external command E_CMD outputted from the receiving driver 230 to generate and output the internal command signal I_CMD. As illustrated in FIG. 4, the internal command signal I_CMD outputted from the command decoder 250 may include first to fourth internal command signals. In an embodiment, the first internal command signal may be a memory active signal ACT_M, the second internal command signal may be a memory read signal READ_M, the third internal command signal may be a MAC arithmetic signal MAC, and the fourth internal command signal may be a result read signal READ_RST. The first to fourth internal command signals outputted from the command decoder 250 may be sequentially inputted to the MAC command generator 270.

In order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks). In an embodiment, the memory active signal ACT_M, the memory read signal READ_M, the MAC arithmetic signal MAC, and the result read signal READ_RST may have predetermined latencies, respectively. For example, the memory read signal READ_M may be generated after a first latency elapses from a point in time when the memory active signal ACT_M is generated, the MAC arithmetic signal MAC may be generated after a second latency elapses from a point in time when the memory read signal READ_M is generated, and the result read signal READ_RST may be generated after a third latency elapses from a point in time when the MAC arithmetic signal MAC is generated. No signal is generated by the command decoder 250 until a fourth latency elapses from a point in time when the result read signal READ_RST is generated. The first to fourth latencies may be predetermined and fixed. Thus, the host or the controller outputting the external command E_CMD may predict the points in time when the first to fourth internal command signals constituting the internal command signal I_CMD are generated by the command decoder 250 in advance at a point in time when the external command E_CMD is outputted from the host or the controller.

The address latch 260 may convert the input address I_ADDR outputted from the receiving driver 230 into a bank selection signal BK_S and a row/column address ADDR_R/ADDR_C to output the bank selection signal BK_S and the row/column address ADDR_R/ADDR_C. The bank selection signal BK_S may be inputted to the MAC command generator 270. The row/column address ADDR_R/ADDR_C may be transmitted to the first and second memory banks 211 and 212. One of the first and second memory banks 211 and 212 may be selected by the bank selection signal BK_S. One of rows included in the selected memory bank and one of columns included in the selected memory bank may be selected by the row/column address ADDR_R/ADDR_C. In an embodiment, a point in time when the bank selection signal BK_S is inputted to the MAC command generator 270 may be the same moment as a point in time when the row/column address ADDR_R/ADDR_C is inputted to the first and second memory banks 211 and 212. In an embodiment, the point in time when the bank selection signal BK_S is inputted to the MAC command generator 270 and the point in time when the row/column address ADDR_R/ADDR_C is inputted to the first and second memory banks 211 and 212 may be a point in time when the MAC command is generated to read out data from the first and second memory banks 211 and 212 for the MAC arithmetic operation.

The MAC command generator 270 may output the MAC command signal MAC_CMD in response to the internal command signal I_CMD outputted from the command decoder 250 and the bank selection signal BK_S outputted from the address latch 260. As illustrated in FIG. 4, the MAC command signal MAC_CMD outputted from the MAC command generator 270 may include first to seventh MAC command signals. In an embodiment, the first MAC command signal may be a MAC active signal RACTV, the second MAC command signal may be a first MAC read signal MAC_RD_BK0, the third MAC command signal may be a second MAC read signal MAC_RD_BK1, the fourth MAC command signal may be a first MAC input latch signal MAC_L1, the fifth MAC command signal may be a second MAC input latch signal MAC_L2, the sixth MAC command signal may be a MAC output latch signal MAC_L3, and the seventh MAC command signal may be a MAC result latch signal MAC_L_RST.

The MAC active signal RACTV may be generated based on the memory active signal ACT_M outputted from the command decoder 250. The first MAC read signal MAC_RD_BK0 may be generated in response to the memory read signal READ_M outputted from the command decoder 250 and the bank selection signal BK_S having a first level (e.g., a logic "low" level) outputted from the address latch 260. The first MAC input latch signal MAC_L1 may be generated at a point in time when a certain time elapses from a point in time when the first MAC read signal MAC_RD_BK0 is generated. For various embodiments, a certain time means a fixed time duration. The second MAC read signal MAC_RD_BK1 may be generated in response to the memory read signal READ_M outputted from the command decoder 250 and the bank selection signal BK_S having a second level (e.g., a logic "high" level) outputted from the address latch 260. The second MAC input latch signal MAC_L2 may be generated at a point in time when a certain time elapses from a point in time when the second MAC read signal MAC_RD_BK1 is generated. The MAC output latch signal MAC_L3 may be generated in response to the MAC arithmetic signal MAC outputted from the command decoder 250. Finally, the MAC result latch signal MAC_L_RST may be generated in response to the result read signal READ_RST outputted from the command decoder 250.

The MAC active signal RACTV outputted from the MAC command generator 270 may control an activation operation for the first and second memory banks 211 and 212. The first MAC read signal MAC_RD_BK0 outputted from the MAC command generator 270 may control a data read operation for the first memory bank 211. The second MAC read signal MAC_RD_BK1 outputted from the MAC command generator 270 may control a data read operation for the second memory bank 212. The first MAC input latch signal MAC_L1 and the second MAC input latch signal MAC_L2 outputted from the MAC command generator 270 may control an input data latch operation of the first MAC operator (MAC0) 220. The MAC output latch signal MAC_L3 outputted from the MAC command generator 270 may control an output data latch operation of the first MAC operator (MAC0) 220. The MAC result latch signal MAC_L_RST outputted from the MAC command generator 270 may control a reset operation of the first MAC operator (MAC0) 220.

As described above, in order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks), respectively. Thus, the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST may also be generated and outputted from the MAC command generator 270 at predetermined points in time after the external command E_CMD is inputted to the PIM device 200, respectively. That is, a time period from a point in time when the first and second memory banks 211 and 212 are activated by the MAC active signal RACTV until a point in time when the first MAC operator (MAC0) 220 is reset by the MAC result latch signal MAC_L_RST may be predetermined, and thus the PIM device 200 may perform the deterministic MAC arithmetic operation.

Figure 5:
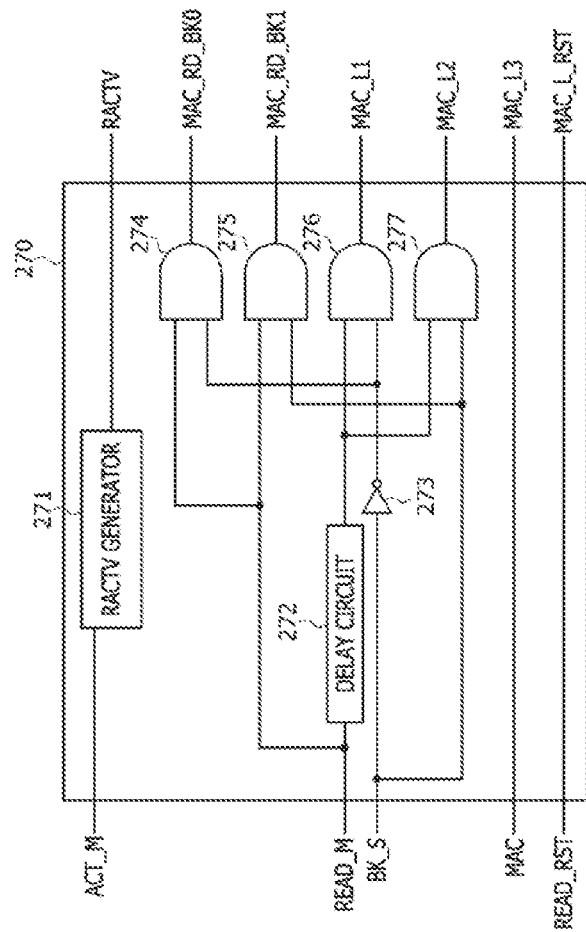
FIG. 5 illustrates an example of a configuration of a MAC command generator included in the PIM device of FIG. 3.

FIG. 5 illustrates an example of a configuration of the MAC command generator 270 included in the PIM device 200 illustrated in FIG. 3. Referring to FIG. 5, the MAC command generator 270 may sequentially receive the memory active signal ACT_M, the memory read signal READ_M, the MAC arithmetic signal MAC, and the result read signal READ_RST from the command decoder 250. In addition, the MAC command generator 270 may also receive the bank selection signal BK_S from the address latch 260. The MAC command generator 270 may output the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST in series with certain time intervals. For an embodiment, a certain time interval is a time interval having a fixed duration.

In an embodiment, the MAC command generator 270 may be configured to include an active signal generator 271, a delay circuit 272, an inverter 273, and first to fourth AND gates 274, 275, 276, and 277. The active signal generator 271 may receive the memory active signal ACT_M to generate and output the MAC active signal RACTV. The MAC active signal RACTV outputted from the active signal generator 271 may be transmitted to the first and second memory banks 211 and 212 to activate the first and second memory banks 211 and 212. The delay circuit 272 may receive the memory read signal READ_M and may delay the memory read signal READ_M by a delay time DELAY_T to output the delayed signal of the memory read signal READ_M. The inverter 273 may receive the bank selection signal BK_S and may invert a logic level of the bank selection signal BK_S to output the inverted signal of the bank selection signal BK_S.

The first AND gate 274 may receive the memory read signal READ_M and an output signal of the inverter 273 and may perform a logical AND operation of the memory read signal READ_M and an output signal of the inverter 273 to generate and output the first MAC read signal MAC_RD_BK0. The second AND gate 275 may receive the memory read signal READ_M and the bank selection signal BK_S and may perform a logical AND operation of the memory read signal READ_M and the bank selection signal BK_S to generate and output the second MAC read signal MAC_RD_BK1. The third AND gate 276 may receive an output signal of the delay circuit 272 and an output signal of the inverter 273 and may perform a logical AND operation of the output signals of the delay circuit 272 and the inverter 273 to generate and output the first MAC input latch signal MAC_L1. The fourth AND gate 277 may receive an output signal of the delay circuit 272 and the bank selection signal BK_S and may perform a logical AND operation of the output signal of the delay circuit 272 and the bank selection signal BK_S to generate and output the second MAC input latch signal MAC_L2.

It may be assumed that the memory read signal READ_M inputted to the MAC command generator 270 has a logic "high" level and the bank selection signal BK_S inputted to the MAC command generator 270 has a logic "low" level. A level of the bank selection signal BK_S may change from a logic "low" level into a logic "high" level after a certain time elapses. When the memory read signal READ_M has a logic "high" level and the bank selection signal BK_S has a logic "low" level, the first AND gate 274 may output the first MAC read signal MAC_RD_BK0 having a logic "high" level and the second AND gate 275 may output the second MAC read signal MAC_RD_BK1 having a logic "low" level. The first memory bank 211 may transmit the first data DA1 to the first MAC operator 220 according to a control operation based on the first MAC read signal MAC_RD_BK0 having a logic "high" level. If a level transition of the bank selection signal BK_S occurs so that both of the memory read signal READ_M and the bank selection signal BK_S have a logic "high" level, the first AND gate 274 may output the first MAC read signal MAC_RD_BK0 having a logic "low" level and the second AND gate 275 may output the second MAC read signal MAC_RD_BK1 having a logic "high" level. The second memory bank 212 may transmit the second data DA2 to the first MAC operator 220 according to a control operation based on the second MAC read signal MAC_RD_BK1 having a logic "high" level.

Due to the delay time of the delay circuit 272, the output signals of the third and fourth AND gates 276 and 277 may be generated after the first and second MAC read signals MAC_RD_BK0 and MAC_RD_BK1 are generated. Thus, after the second MAC read signal MAC_RD_BK1 is generated, the third AND gate 276 may output the first MAC input latch signal MAC_L1 having a logic "high" level. The first MAC operator 220 may latch the first data DA1 in response to the first MAC input latch signal MAC_L1 having a logic "high" level. After a certain time elapses from a point in time when the first data DA1 are latched by the first MAC operator 220, the fourth AND gate 277 may output the second MAC input latch signal MAC_L2 having a logic "high" level. The first MAC operator 220 may latch the second data DA2 in response to the second MAC input latch signal MAC_L2 having a logic "high" level. The first MAC operator 220 may start to perform the MAC arithmetic operation after the first and second data DA1 and DA2 are latched.

The MAC command generator 270 may generate the MAC output latch signal MAC_L3 in response to the MAC arithmetic signal MAC outputted from the command decoder 250. The MAC output latch signal MAC_L3 may have the same logic level as the MAC arithmetic signal MAC. For example, if the MAC arithmetic signal MAC having a logic "high" level is inputted to the MAC command generator 270, the MAC command generator 270 may generate the MAC output latch signal MAC_L3 having a logic "high" level. The MAC command generator 270 may generate the MAC result latch signal MAC_L_RST in response to the result read signal READ_RST outputted from the command decoder 250. The MAC result latch signal MAC_L_RST may have the same logic level as the result read signal READ_RST. For example, if the result read signal READ_RST having a logic "high" level is inputted to the MAC command generator 270, the MAC command generator 270 may generate the MAC result latch signal MAC_L_RST having a logic "high" level.

Figure 6:
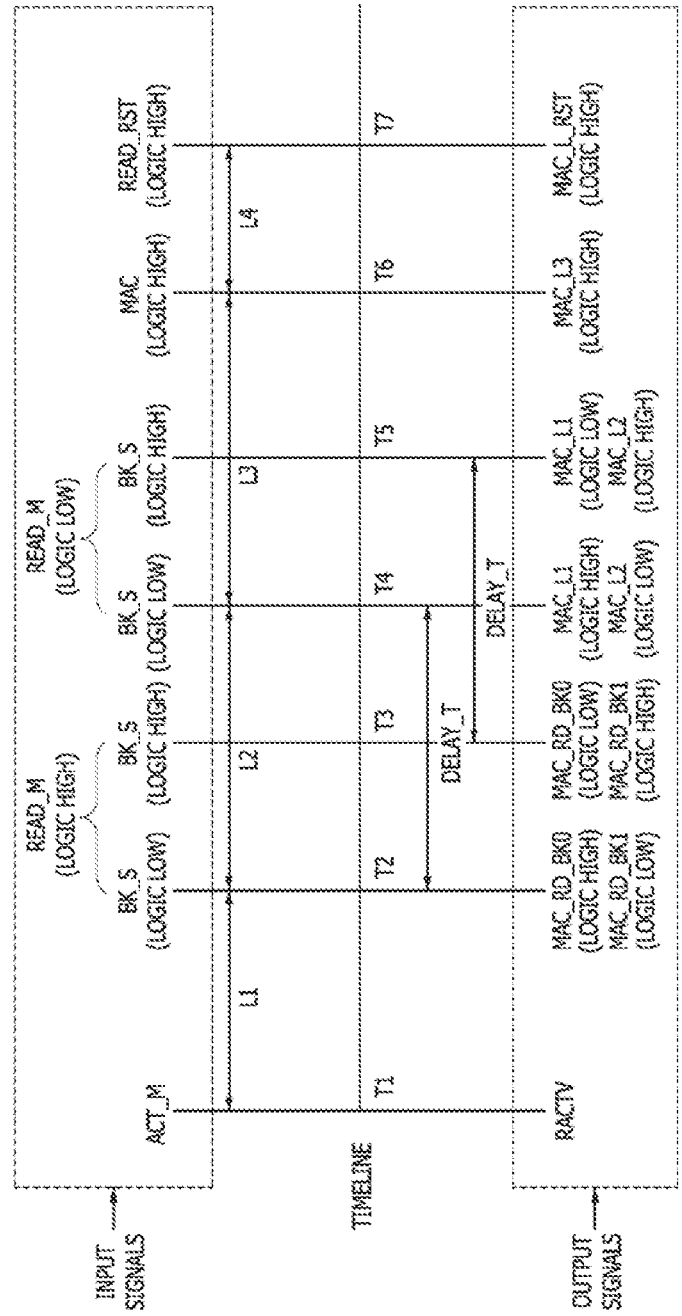
FIG. 6 illustrates input signals and output signals of the MAC command generator illustrated in FIG. 5 with a timeline.

FIG. 6 illustrates input signals and output signals of the MAC command generator 270 illustrated in FIG. 5 along a timeline. In FIG. 6, signals transmitted from the command decoder 250 to the MAC command generator 270 are illustrated in an upper dotted line box, and signals outputted from the MAC command generator 270 are illustrated in a lower dotted line box. Referring to FIGS. 5 and 6 at a first point in time "T1" of the timeline, the memory active signal ACT_M may be inputted to the MAC command generator 270 and the MAC command generator 270 may output the MAC active signal RACTV. At a second point in time "T2" when a certain time, for example, a first latency L1 elapses from the first point in time "T1", the memory read signal READ_M having a logic "high" level and the bank selection signal BK_S having a logic "low" level may be inputted to the MAC command generator 270. In response to the memory read signal READ_M having a logic "high" level and the bank selection signal BK_S having a logic "low" level, the MAC command generator 270 may output the first MAC read signal MAC_RD_BK0 having a logic "high" level and the second MAC read signal MAC_RD_BK1 having a logic "low" level in response to the memory read signal READ_M having a logic "high" level and the bank selection signal BK_S having a logic "low" level, as described with reference to FIG. 5. At a third point in time "T3" when a certain time elapses from the second point in time "T2", a logic level of the bank selection signal BK_S may change from a logic "low" level into a logic "high" level. In such a case, the MAC command generator 270 may output the first MAC read signal MAC_RD_BK0 having a logic "low" level and the second MAC read signal MAC_RD_BK1 having a logic "high" level, as described with reference to FIG. 5.

At a fourth point in time "T4" when the delay time DELAY_T elapses from the second point in time "T2", the MAC command generator 270 may output the first MAC input latch signal MAC_L1 having a logic "high" level and the second MAC input latch signal MAC_L2 having a logic "low" level. The delay time DELAY_T may be set by the delay circuit 272. The delay time DELAY_T may bet to be different according a logic design scheme of the delay circuit 272 and may be fixed once the logic design scheme of the delay circuit 272 is determined. In an embodiment, the delay time DELAY_T may be set to be equal to or greater than a second latency L2. At a fifth point in time "T5" when a certain time elapses from the fourth point in time "T4", the MAC command generator 270 may output the first MAC input latch signal MAC_L1 having a logic "low" level and the second MAC input latch signal MAC_L2 having a logic "high" level. The fifth point in time "T5" may be a moment when the delay time DELAY_T elapses from the third point in time "T3".

At a sixth point in time "T6" when a certain time, for example, a third latency L3 elapses from the fourth point in time "T4", the MAC arithmetic signal MAC having a logic "high" level may be inputted to the MAC command generator 270. In response to the MAC arithmetic signal MAC having a logic "high" level, the MAC command generator 270 may output the MAC output latch signal MAC_L3 having a logic "high" level, as described with reference to FIG. 5. Subsequently, at a seventh point in time "T7" when a certain time, for example, a fourth latency L4 elapses from the sixth point in time "T6", the result read signal READ_RST having a logic "high" level may be inputted to the MAC command generator 270. In response to the result read signal READ_RST having a logic "high" level, the MAC command generator 270 may output the MAC result latch signal MAC_L_RST having a logic "high" level, as described with reference to FIG. 5.

In order to perform the deterministic MAC arithmetic operation, moments when the internal command signals ACT_M, READ_M, MAC, and READ_RST generated by the command decoder 250 are inputted to the MAC command generator 270 may be fixed and moments when the MAC command signals RACTV, MAC_RD_BK0, MAC_RD_BK1, MAC_L1, MAC_L2, MAC_L3, and MAC_L_RST are outputted from the MAC command generator 270 in response to the internal command signals ACT_M, READ_M, MAC, and READ_RST may also be fixed. Thus, all of the first latency L1 between the first point in time "T1" and the second point in time "T2", the second latency L2 between the second point in time "T2" and the fourth point in time "T4", the third latency L3 between the fourth point in time "T4" and the sixth point in time "T6", and the fourth latency L4 between the sixth point in time "T6" and the seventh point in time "T7" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks BK0 and BK1 based on the first and second MAC read signals MAC_RD_BK0 and MAC_RD_BK1 and to input the first and second data DA1 and DA2 into the first MAC operator (MAC0) 220. The third latency L3 may be defined as a time it takes to latch the first and second data DA1 and DA2 in the first MAC operator (MAC0) 220 based on the first and second MAC input latch signals MAC_L1 and MAC_L2 and it takes the first MAC operator (MAC0) 220 to perform the MAC arithmetic operation of the first and second data. The fourth latency L4 may be defined as a time it takes to latch the output data in the first MAC operator (MAC0) 220 based on the MAC output latch signal MAC_L3.

Figure 7:
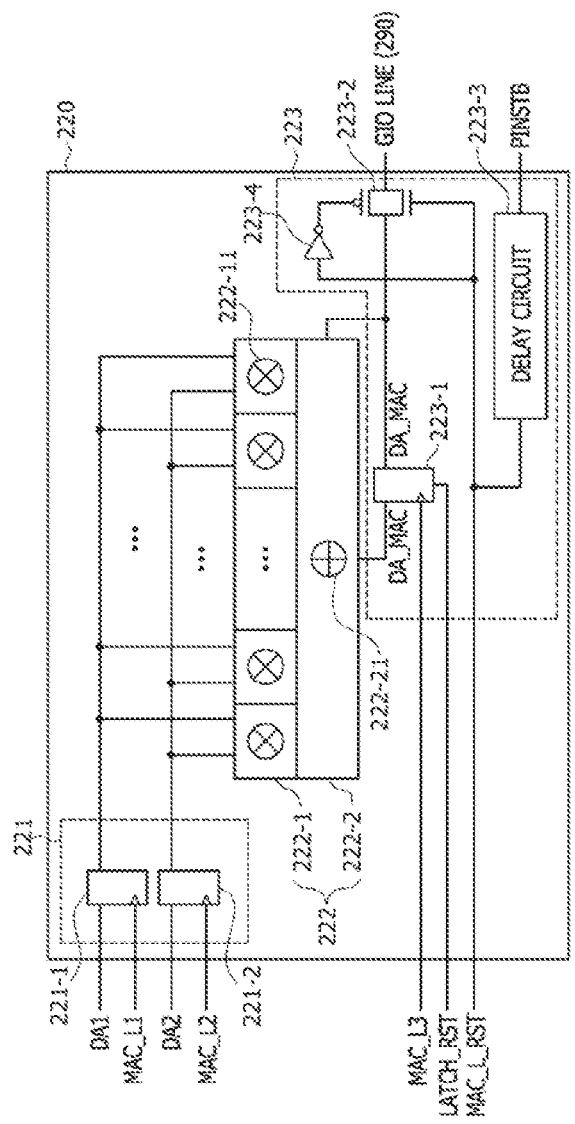
FIG. 7 illustrates an example of a configuration of a MAC operator included in the PIM device of FIG. 3.
Figure 8:
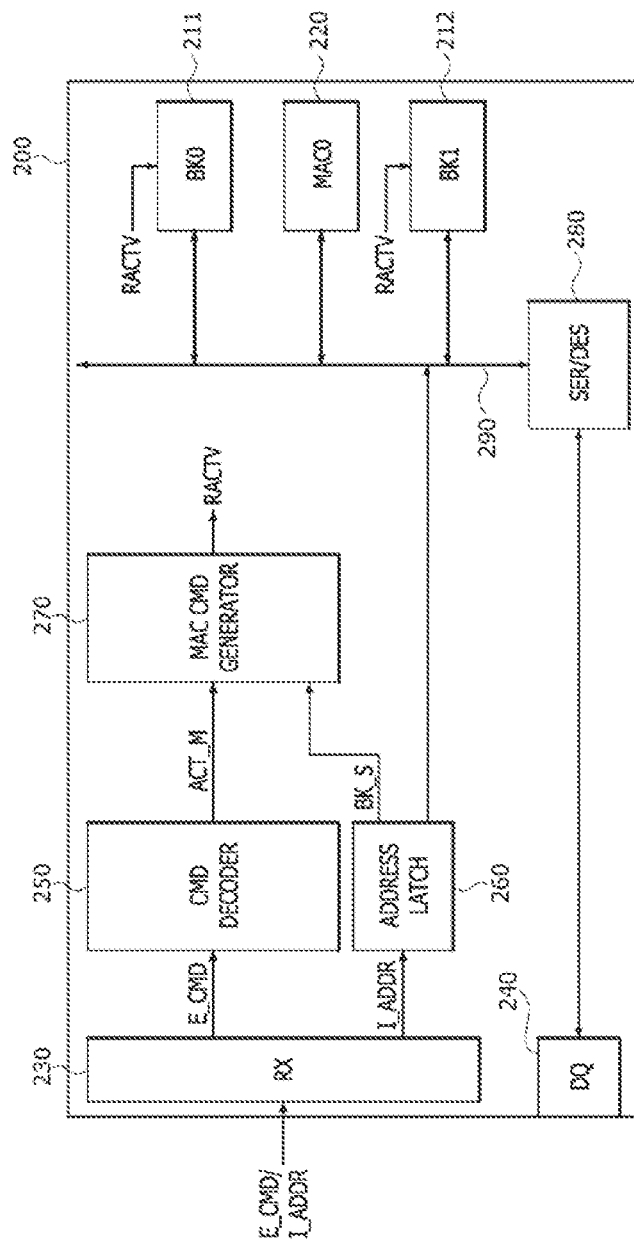
FIGS. 8 to 14 are block diagrams illustrating operations of the PIM device illustrated in FIG. 3.

FIG. 7 illustrates an example of a configuration of the first MAC operator (MAC0) 220 included in the PIM device 200 illustrated in FIG. 3. Referring to FIG. 7, the first MAC operator (MAC0) 220 may be configured to include a data input circuit 221, a MAC circuit 222, and a data output circuit 223. The data input circuit 221 may be configured to include a first input latch 221-1 and a second input latch 221-2. The MAC circuit 222 may be configured to include a multiplication logic circuit 222-1 and an addition logic circuit 222-2. The data output circuit 223 may be configured to include an output latch 223-1, a transfer gate 223-2, a delay circuit 223-3, and an inverter 223-4. In an embodiment, the first input latch 221-1, the second input latch 221-2, and the output latch 223-1 may be realized using flip-flops.

The data input circuit 221 of the first MAC operator (MAC0) 220 may be synchronized with the first and second MAC input latch signals MAC_L1 and MAC_L2 to receive and output the first and second data DA1 and DA2 inputted through the GIO line 290 to the MAC circuit 222. Specifically, the first data DA1 may be transmitted from the first memory bank BK0 (211 of FIG. 3) to the first input latch 221-1 of the data input circuit 221 through the GIO line 290, in response to the first MAC read signal MAC_RD_BK0 having a logic "high" level outputted from the MAC command generator (270 of FIG. 3). The second data DA2 may be transmitted from the second memory bank BK1 (212 of FIG. 2) to the second input latch 221-2 of the data input circuit 221 through the GIO line 290, in response to the second MAC read signal MAC_RD_BK1 having a logic "high" level outputted from the MAC command generator 270. The first input latch 221-1 may output the first data DA1 to the MAC circuit 222 in synchronization with the first MAC input latch signal MAC_L1 having a logic "high" level outputted from the MAC command generator 270 (270 of FIG. 3). The second input latch 221-2 may output the second data DA2 to the MAC circuit 222 in synchronization with the second MAC input latch signal MAC_L2 having a logic "high" level outputted from the MAC command generator (270 of FIG. 3). As described with reference to FIG. 5, the second MAC input latch signal MAC_L2 may be generated at a moment (corresponding to the fifth point in time "T5" of FIG. 6) when a certain time elapses from a moment (corresponding to the fourth point in time "T4" of FIG. 6) when the first MAC input latch signal MAC_L1 is generated. Thus, after the first data DA1 is inputted to the MAC circuit 222, the second data DA2 may then be inputted to the MAC circuit 222.

The MAC circuit 222 may perform a multiplying calculation and an accumulative adding calculation for the first and second data DA1 and DA2. The multiplication logic circuit 222-1 of the MAC circuit 222 may include a plurality of multipliers 222-11. Each of the plurality of multipliers 222-11 may perform a multiplying calculation of the first data DA1 outputted from the first input latch 221-1 and the second data DA2 outputted from the second input latch 221-2 and may output the result of the multiplying calculation. Bit values constituting the first data DA1 may be separately inputted to the multipliers 222-11. Similarly, bit values constituting the second data DA2 may also be separately inputted to the multipliers 222-11. For example, if each of the first and second data DA1 and DA2 is comprised of an 'N'-bit binary stream and the number of the multipliers 222-11 is 'M', the first data DA1 having 'N/M' bits and the second data DA2 having 'N/M' bits may be inputted to each of the multipliers 222-11. That is, each of the multipliers 222-11 may be configured to perform a multiplying calculation of first 'N/M'-bit data and second 'N/M'-bit data. Multiplication result data outputted from each of the multipliers 222-11 may have '2N/M' bits.

The addition logic circuit 222-2 of the MAC circuit 222 may include a plurality of adders 222-21. Although not shown in the drawings, the plurality of adders 222-21 may be disposed to provide a tree structure including a plurality of stages. Each of the adders 222-21 disposed at a first stage may receive two sets of multiplication result data from two of the multipliers 222-11 included in the multiplication logic circuit 222-1 and may perform an adding calculation of the two sets of multiplication result data to output addition result data. Each of the adders 222-21 disposed at a second stage may receive two sets of addition result data from two of the adders 222-21 disposed at the first stage and may perform an adding calculation of the two sets of addition result data to output addition result data. The adders 222-21 disposed at a last stage may receive two sets of addition result data from two adders 222-21 disposed at the previous stage and may perform an adding calculation of the two sets of addition result data to output the addition result data. The adders 222-21 constituting the addition logic circuit 222-2 may include an adder for performing an accumulative adding calculation of the addition result data outputted from the adder 222-21 disposed at the last stage and previous MAC result data stored in the output latch 223-1 of the data output circuit 223.

The data output circuit 223 may output MAC result data DA_MAC outputted from the MAC circuit 222 to the GIO line 290. Specifically, the output latch 223-1 of the data output circuit 223 may latch the MAC result data DA_MAC outputted from the MAC circuit 222 and may output the latched data of the MAC result data DA_MAC in synchronization with the MAC output latch signal MAC_L3 having a logic "high" level outputted from the MAC command generator (270 of FIG. 3). The MAC result data DA_MAC outputted from the output latch 223-1 may be fed back to the MAC circuit 222 for the accumulative adding calculation. In addition, the MAC result data DA_MAC may be inputted to the transfer gate 223-2, and the transfer gate 223-2 may output the MAC result data DA_MAC to the GIO line 290. The output latch 223-1 may be initialized if a latch reset signal LATCH_RST is inputted to the output latch 223-1. In such a case, all of data latched by the output latch 223-1 may be removed. In an embodiment, the latch reset signal LATCH_RST may be activated by generation of the MAC result latch signal MAC_L_RST having a logic "high" level and may be inputted to the output latch 223-1.

The MAC result latch signal MAC_L_RST outputted from the MAC command generator 270 may be inputted to the transfer gate 223-2, the delay circuit 223-3, and the inverter 223-4. The inverter 223-4 may inversely buffer the MAC result latch signal MAC_L_RST to output the inversely buffered signal of the MAC result latch signal MAC_L_RST to the transfer gate 223-2. The transfer gate 223-2 may transfer the MAC result data DA_MAC from the output latch 223-1 to the GIO line 290 in response to the MAC result latch signal MAC_L_RST having a logic "high" level. The delay circuit 223-3 may delay the MAC result latch signal MAC_L_RST by a certain time to generate and output a latch control signal PINSTB.

FIGS. 8 to 14 are block diagrams illustrating operations of the PIM device 200 illustrated in FIG. 3. In FIGS. 8 to 14, the same reference numerals or the same reference symbols as used in FIG. 3 denote the same elements. First, referring to FIG. 8, if the external command E_CMD requesting the MAC arithmetic operation and the input address I_ADDR are transmitted from an external device to the receiving driver 230, the receiving driver 230 may output the external command E_CMD and the input address I_ADDR to the command decoder 250 and the address latch 260, respectively. The command decoder 250 may decode the external command E_CMD to generate and transmit the memory active signal ACT_M to the MAC command generator 270. The address latch 260 receiving the input address I_ADDR may generate and transmit the bank selection signal BK_S to the MAC command generator 270. The MAC command generator 270 may generate and output the MAC active signal RACTV in response to the memory active signal ACT_M and the bank selection signal BK_S. The MAC active signal RACTV may be transmitted to the first memory bank (BK0) 211 and the second memory bank (BK1) 212. The first memory bank (BK0) 211 and the second memory bank (BK1) 212 may be activated by the MAC active signal RACTV.

Figure 9:
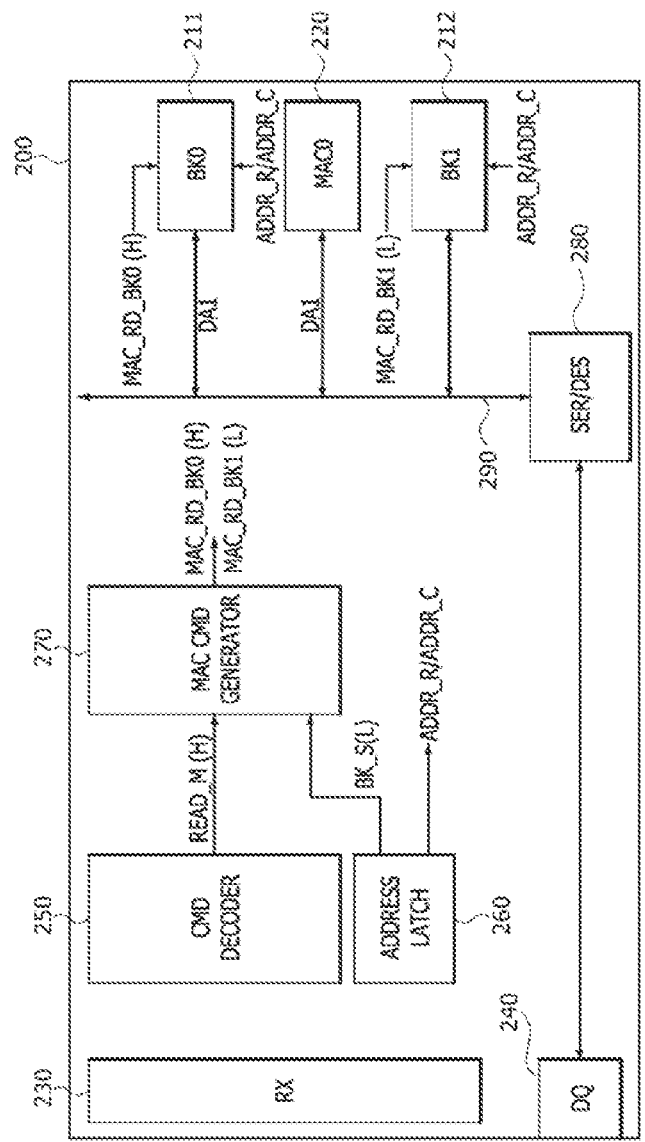

Next, referring to FIG. 9, the command decoder 250 may generate and output the memory read signal READ_M having a logic "high(H)" level to the MAC command generator 270. In addition, the address latch 260 may generate and output the bank selection signal BK_S having a logic "low(L)" level to the MAC command generator 270. In response to the memory read signal READ_M having a logic "high(H)" level and the bank selection signal BK_S having a logic "low(L)" level, the MAC command generator 270 may generate and output the first MAC read signal MAC_RD_BK0 having a logic "high(H)" level and the second MAC read signal MAC_RD_BK1 having a logic "low(L)" level, as described with reference to FIG. 4. The first MAC read signal MAC_RD_BK0 having a logic "high (H)" level, together with the row/column address ADDR_R/ADDR_C, may be transmitted to the first memory bank (BK0) 211. The second MAC read signal MAC_RD_BK1 having a logic "low(L)" level, together with the row/column address ADDR_R/ADDR_C, may be transmitted to the second memory bank (BK1) 212. The first data DA1 may be read out of the first memory bank (BK0) 211 by the first MAC read signal MAC_RD_BK0 having a logic "high(H)" level and may be transmitted to the first MAC operator (MAC0) 220 through the GIO line 290.

Figure 10:
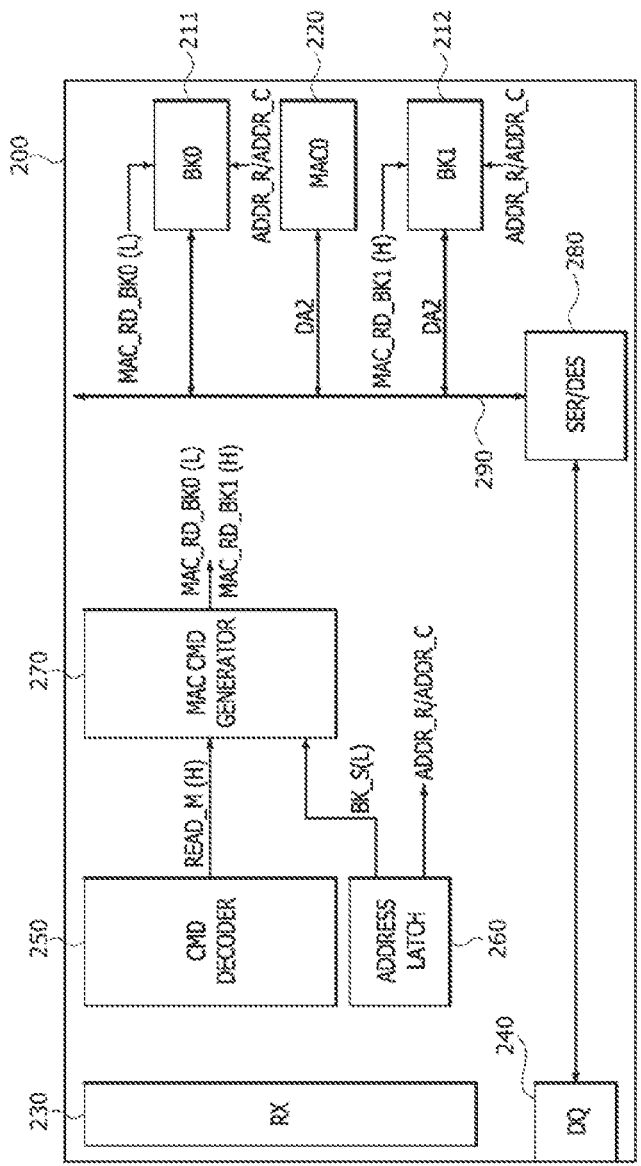

Next, referring to FIG. 10, a logic level of the bank selection signal BK_S may change from a logic "low(L)" level into a logic "high(H)" level while the memory read signal READ_M maintains a logic "high(H)" level. In such a case, as described with reference to FIG. 5, the MAC command generator 270 may generate and output the first MAC read signal MAC_RD_BK0 having a logic "low(L)" level and the second MAC read signal MAC_RD_BK1 having a logic "high(H)" level. The first MAC read signal MAC_RD_BK0 having a logic "low(L)" level, together with the row/column address ADDR_R/ADDR_C, may be transmitted to the first memory bank (BK0) 211. The second MAC read signal MAC_RD_BK1 having a logic "high(H)" level, together with the row/column address ADDR_R/ADDR_C, may be transmitted to the second memory bank (BK1) 212. The second data DA2 may be read out of the second memory bank (BK1) 212 by the second MAC read signal MAC_RD_BK1 having a logic "high(H)" level and may be transmitted to the first MAC operator (MAC0) 220 through the GIO line 290.

Figure 11:
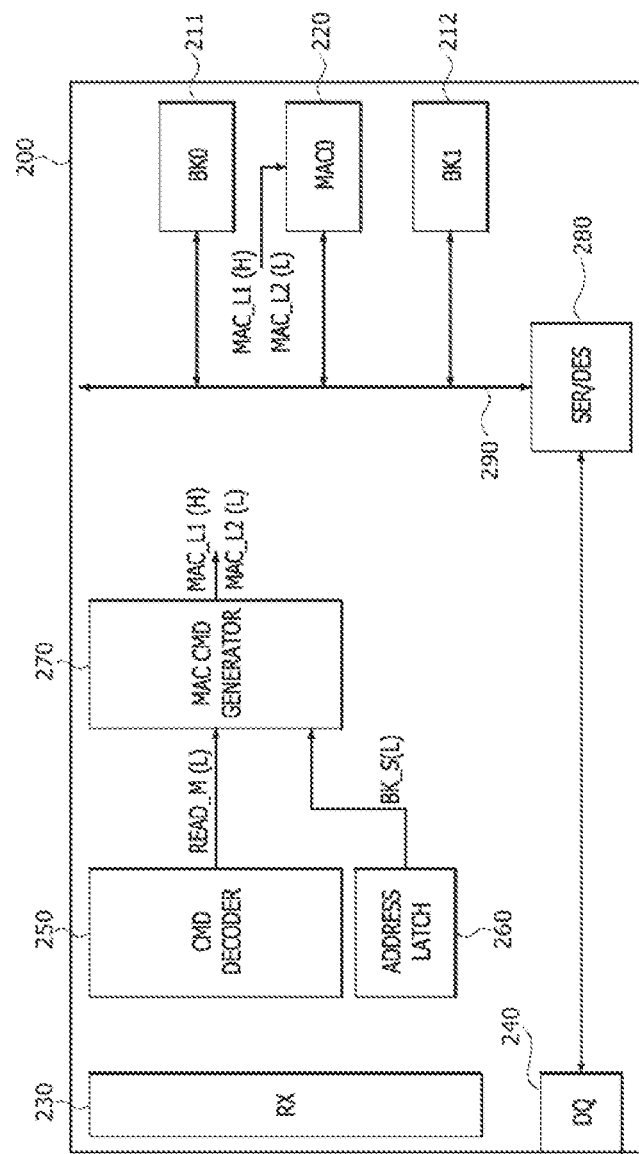

Next, referring to FIG. 11, a logic level of the memory read signal READ_M transmitted from the command decoder 250 to the MAC command generator 270 may change from a logic "high(H)" level into a logic "low(L)" level. In addition, a logic level of the bank selection signal BK_S transmitted from the address latch 260 to the MAC command generator 270 may change from a logic "high(H)" level into a logic "low(L)" level. In such a case, the MAC command generator 270 may generate and output the first MAC input latch signal MAC_L1 having a logic "high(H)" level and the second MAC input latch signal MAC_L2 having a logic "low(L)" level. A point in time when the first MAC input latch signal MAC_L1 having a logic "high(H)" level and the second MAC input latch signal MAC_L2 having a logic "low(L)" level are outputted from the MAC command generator 270 may be determined by a delay time of the delay circuit (271 of FIG. 4), as described with reference to FIG. 5. The first MAC input latch signal MAC_L1 having a logic "high(H)" level and the second MAC input latch signal MAC_L2 having a logic "low(L)" level outputted from the MAC command generator 270 may be transmitted to the first MAC operator (MAC0) 220. As described with reference to FIG. 7, the first MAC operator (MAC0) 220 may perform a latch operation of the first data DA1.

Figure 12:
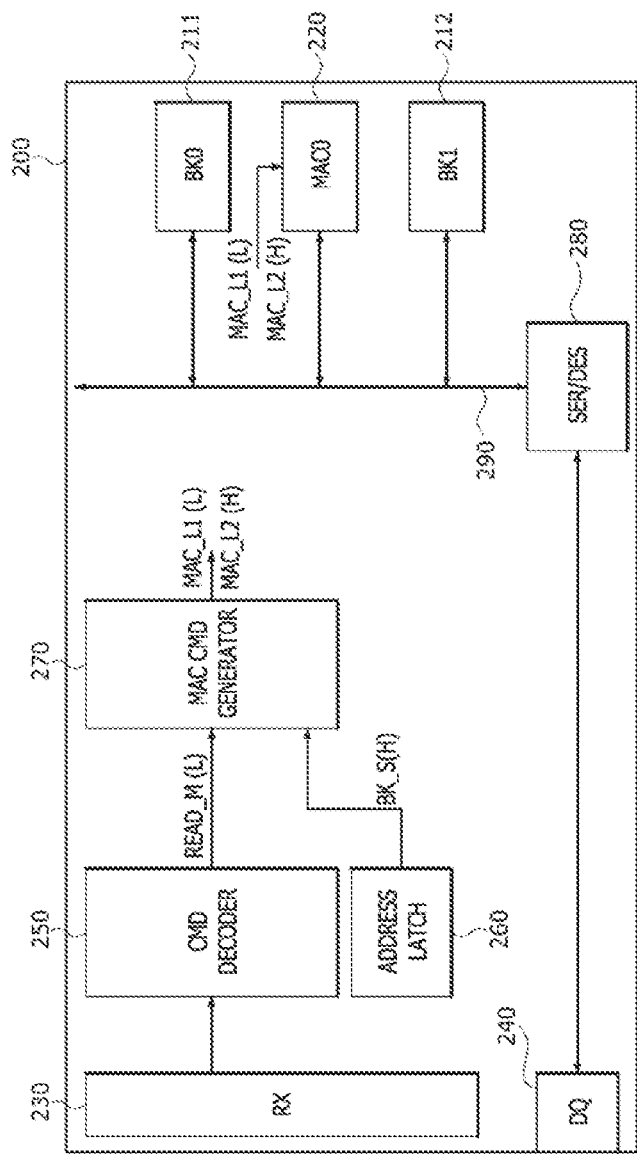

Next, referring to FIG. 12, a logic level of the bank selection signal BK_S transmitted from the address latch 260 to the MAC command generator 270 may change from a logic "low(L)" level into a logic "high(H)" level while the memory read signal READ_M maintains a logic "low(L)" level. In such a case, the MAC command generator 270 may generate and output the first MAC input latch signal MAC_L1 having a logic "low(L)" level and the second MAC input latch signal MAC_L2 having a logic "high(H)" level. A point in time when the first MAC input latch signal MAC_L1 having a logic "low(L)" level and the second MAC input latch signal MAC_L2 having a logic "high(H)" level are outputted from the MAC command generator 270 may be determined by a delay time of the delay circuit (271 of FIG. 5), as described with reference to FIG. 5. The first MAC input latch signal MAC_L1 having a logic "low(L)" level and the second MAC input latch signal MAC_L2 having a logic "high(H)" level outputted from the MAC command generator 270 may be transmitted to the first MAC operator (MAC0) 220. As described with reference to FIG. 7, the first MAC operator (MAC0) 220 may perform a latch operation of the second data DA2. After the latch operations of the first and second data DA1 and DA2 terminate, the first MAC operator (MAC0) 220 may perform the MAC arithmetic operation and may generate the MAC result data DA_MAC. The MAC result data DA_MAC generated by the first MAC operator (MAC0) 220 may be inputted to the output latch 223-1 included in the first MAC operator (MAC0) 220.

Figure 13:
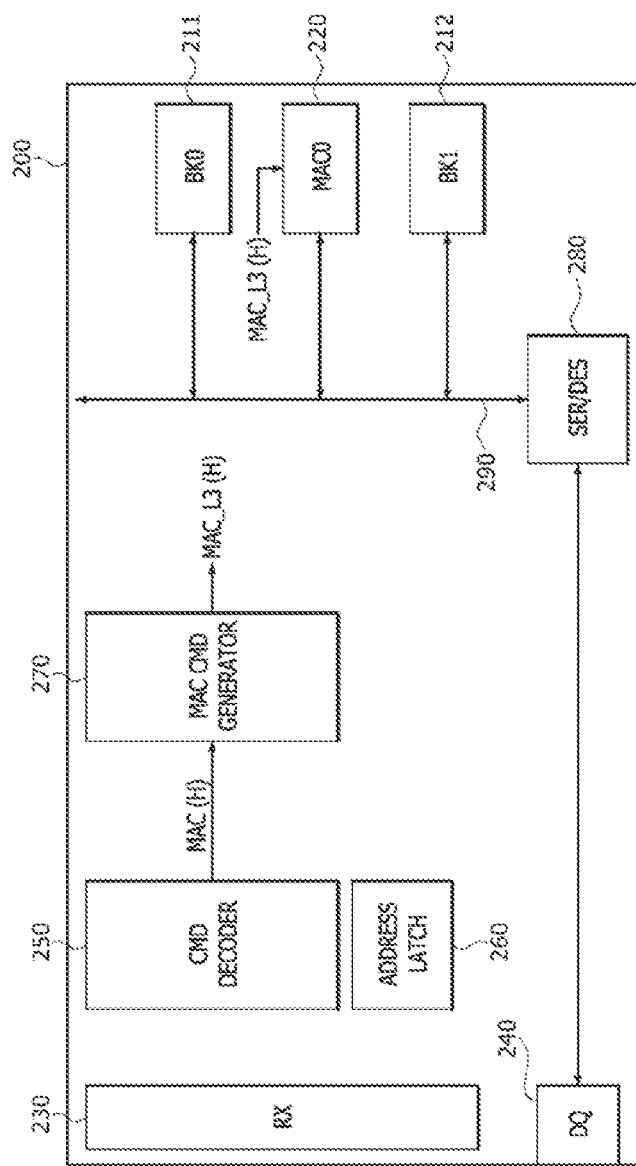

Next, referring to FIG. 13, the command decoder 250 may output and transmit the MAC arithmetic signal MAC having a logic "high(H)" level to the MAC command generator 270. The MAC command generator 270 may generate and output the MAC output latch signal MAC_L3 having a logic "high" level in response to the MAC arithmetic signal MAC having a logic "high(H)" level. The MAC output latch signal MAC_L3 having a logic "high" level may be transmitted to the first MAC operator (MAC0) 220. As described with reference to FIG. 7, the output latch (223-1 of FIG. 7) of the first MAC operator (MAC0) 220 may be synchronized with the MAC output latch signal MAC_L3 having a logic "high" level to transfer the MAC result data DA_MAC outputted from the MAC circuit 222 of the first MAC operator (MAC0) 220 to the transfer gate (233-2 of FIG. 7) of the first MAC operator (MAC0) 220. The MAC result data DA_MAC outputted from the output latch (223-1 of FIG. 7) may be fed back to the addition logic circuit (222-2 of FIG. 7) for the accumulative adding calculation.

Figure 14:
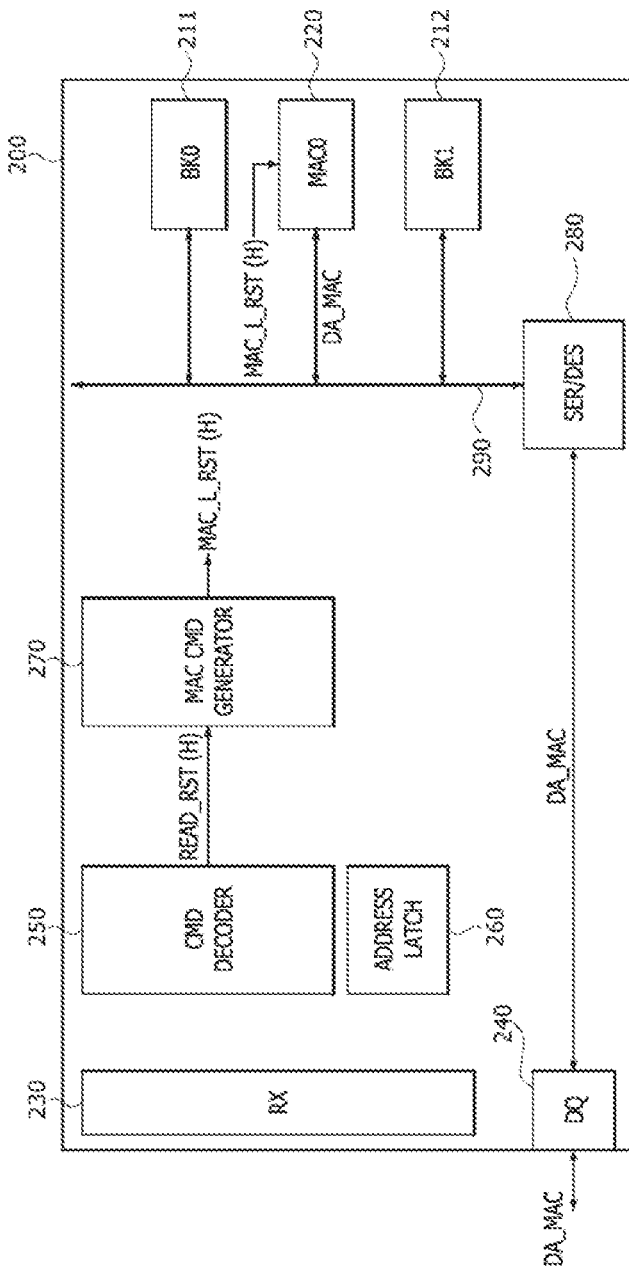

Next, referring to FIG. 14, the command decoder 250 may output and transmit the result read signal READ_RST having a logic "high(H)" level to the MAC command generator 270. The MAC command generator 270 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 220. As described with reference to FIG. 7, the first MAC operator (MAC0) 220 may output the MAC result data DA_MAC to the GIO line 290 in response to the MAC result latch signal MAC_L_RST having a logic "high" level and may also reset the output latch (223-1 of FIG. 6) included in the first MAC operator (MAC0) 220 in response to the MAC result latch signal MAC_L_RST having a logic "high" level. The MAC result data DA_MAC transmitted to the GIO line 290 may be outputted to an external device through the serializer/deserializer 280 and the data I/O circuit 240.

Figure 15:
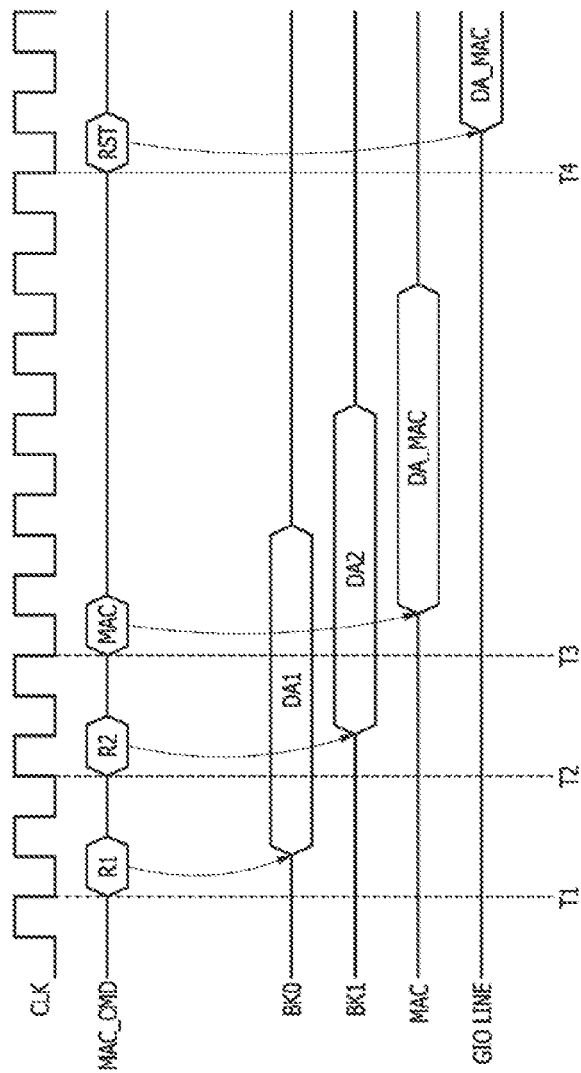
FIG. 15 is a timing diagram illustrating an operation of the PIM device illustrated in FIG. 3.

FIG. 15 is a timing diagram illustrating an operation of the PIM device 200 illustrate in FIG. 3. Referring to FIG. 15, at a first point in time "T1", the MAC command generator 270 may be synchronized with a falling edge of a clock signal CLK to generate and output the first MAC read signal MAC_RD_BK0 (R1) having a logic "high(H)" level. The first memory bank (BK0) 211 may be selected by the first MAC read signal MAC_RD_BK0 (R1) having a logic "high(H)" level so that the first data DA1 are read out of the first memory bank (BK0) 211. At a second point in time "T2", the MAC command generator 270 may be synchronized with a falling edge of the clock signal CLK to generate and output the second MAC read signal MAC_RD_BK1 (R2) having a logic "high(H)" level. The second memory bank (BK1) 212 may be selected by the second MAC read signal MAC_RD_BK1 (R2) having a logic "high(H)" level so that the second data DA2 are read out of the second memory bank (BK1) 212. At a third point in time "T3", the MAC command generator 270 may be synchronized with a falling edge of the clock signal CLK to generate and output the MAC arithmetic signal MAC having a logic "high(H)" level. The first MAC operator (MAC0) 220 may perform the multiplying calculations and the adding calculations of the first and second data DA1 and DA2 to generate the MAC result data DA_MAC, in response to the MAC arithmetic signal MAC having a logic "high(H)" level. At a fourth point in time "T4", the MAC command generator 270 may be synchronized with a falling edge of the clock signal CLK to generate and output the MAC result latch signal MAC_L_RST (RST) having a logic "high" level. The MAC result data DA_MAC generated by the first MAC operator (MAC0) 220 may be transmitted to the GIO line 290 by the MAC result latch signal MAC_L_RST (RST) having a logic "high" level.

Figure 16:
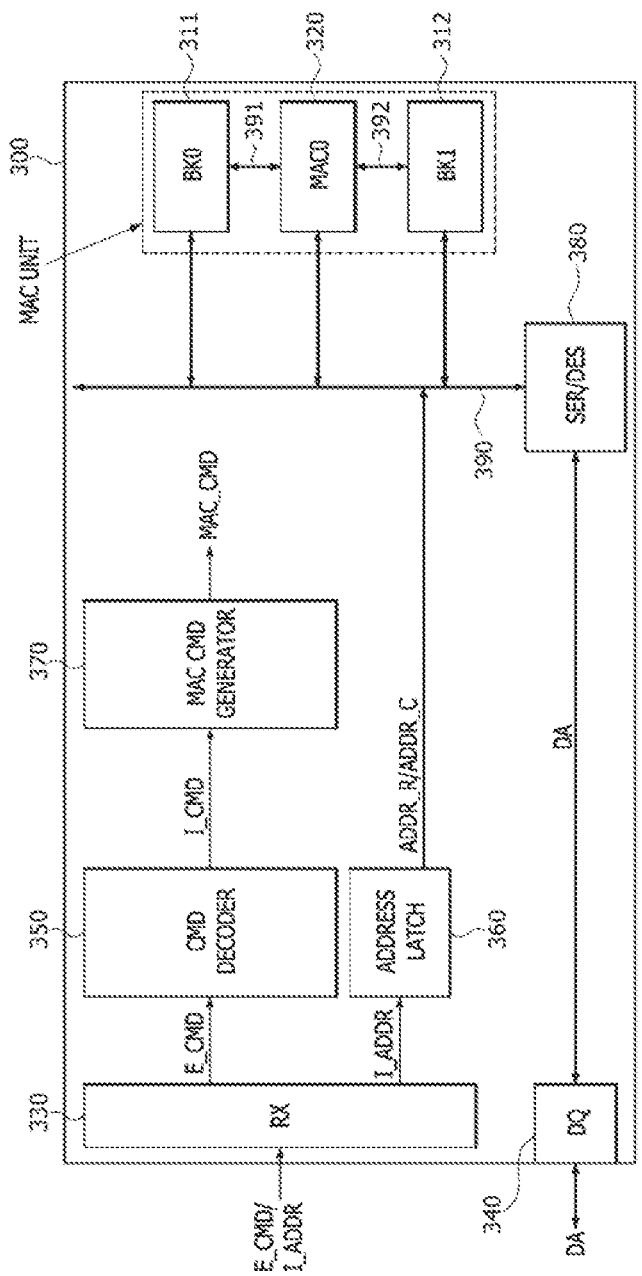
FIG. 16 is a block diagram illustrating another configuration of a PIM device according to the first embodiment of the present disclosure.
Figure 17:
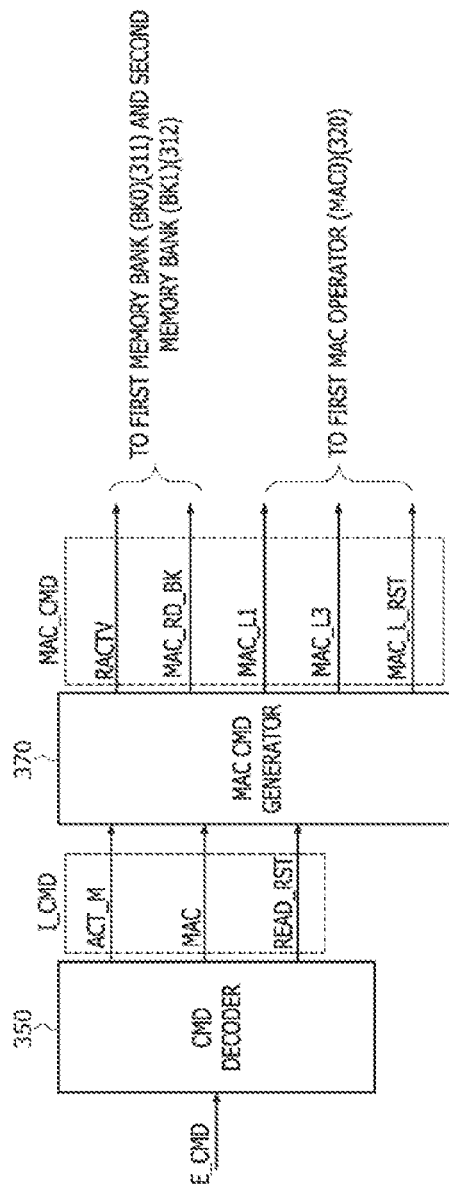
FIG. 17 illustrates internal command signals outputted from a command decoder and MAC command signals outputted from a MAC command generator in the PIM device of FIG. 16.

FIG. 16 is a block diagram illustrating another configuration of a PIM device 300 according to an embodiment of the present disclosure, and FIG. 17 illustrates an internal command signal I_CMD outputted from a command decoder 350 of the PIM device 300 and a MAC command signal MAC_CMD outputted from a MAC command generator 370 of the PIM device 300. FIG. 16 illustrates only a first memory bank (BK0) 311, a second memory bank (BK1) 312, and a first MAC operator (MAC0) 320 constituting a first MAC unit among the plurality of MAC units. However, FIG. 16 illustrates merely an example for simplification of the drawing. Accordingly, the following description for the first MAC unit may be equally applicable to the remaining MAC units.

Referring to FIG. 16, the PIM device 300 may be configured to include the first memory bank (BK0) 311, the second memory bank (BK1) 312, and the first MAC operator (MAC0) 320. The PIM device 300 according to the present embodiment may include a GIO line 390, a first bank input/output (BIO) line 391, and a second BIO line 392 acting as data transmission lines. Data communication of the first memory bank (BK0) 311, the second memory bank (BK1) 312, and the first MAC operator (MAC0) 320 may be achieved through the GIO line 390. Only the data transmission between the first memory bank (BK0) 311 and the first MAC operator (MAC0) 320 may be achieved through the first BIO line 391, and only the data transmission between the second memory bank (BK1) 312 and the first MAC operator (MAC0) 320 may be achieved through the second BIO line 392. Thus, the first MAC operator (MAC0) 320 may directly receive first data and second data from the first and second memory banks (BK0 and BK1) 311 and 312 through the first BIO line 391 and the second BIO line 392 without using the GIO line 390.

The PIM device 300 may further include a receiving driver (RX) 330, a data I/O circuit (DQ) 340, the command decoder 350, an address latch 360, the MAC command generator 370, and a serializer/deserializer (SER/DES) 380. The command decoder 350, the address latch 360, the MAC command generator 370, and the serializer/deserializer 380 may be disposed in the peripheral circuit PERI of the PIM device 100 illustrated in FIG. 2. The receiving driver 330 may receive an external command E_CMD and an input address I_ADDR from an external device. The external device may denote a host or a controller coupled to the PIM device 300. Hereinafter, it may be assumed that the external command E_CMD transmitted to the PIM device 300 is a command requesting the MAC arithmetic operation. That is, the PIM device 300 may perform the deterministic MAC arithmetic operation in response to the external command E_CMD. The data I/O circuit 340 may include a data I/O pad. The data I/O pad may be coupled with an data I/O line. The PIM device 300 communicates with the external device through the data I/O circuit 340.

The receiving driver 330 may separately output the external command E_CMD and the input address I_ADDR received from the external device. Data DA inputted to the PIM device 300 through the data I/O circuit 340 may be processed by the serializer/deserializer 380 and may be transmitted to the first memory bank (BK0) 311 and the second memory bank (BK1) 312 through the GIO line 390 of the PIM device 300. The data DA outputted from the first memory bank (BK0) 311, the second memory bank (BK1) 312, and the first MAC operator (MAC0) 320 through the GIO line 390 may be processed by the serializer/deserializer 380 and may be outputted to the external device through the data I/O circuit 340. The serializer/deserializer 380 may convert the data DA into parallel data if the data DA are serial data or may convert the data DA into serial data if the data DA are parallel data. For the data conversion, the serializer/deserializer 380 may include a serializer for converting parallel data into serial data and a deserializer for converting serial data into parallel data.

The command decoder 350 may decode the external command E_CMD outputted from the receiving driver 330 to generate and output the internal command signal I_CMD. As illustrated in FIG. 17, the internal command signal I_CMD outputted from the command decoder 350 may include first to third internal command signals. In an embodiment, the first internal command signal may be a memory active signal ACT_M, the second internal command signal may be a MAC arithmetic signal MAC, and the third internal command signal may be a result read signal READ_RST. The first to third internal command signals outputted from the command decoder 350 may be sequentially inputted to the MAC command generator 370.

In order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks). In an embodiment, the memory active signal ACT_M, the MAC arithmetic signal MAC, and the result read signal READ_RST may have predetermined latencies, respectively. For example, the MAC arithmetic signal MAC may be generated after a first latency elapses from a point in time when the memory active signal ACT_M is generated, and the result read signal READ_RST may be generated after a third latency elapses from a point in time when the MAC arithmetic signal MAC is generated. No signal is generated by the command decoder 350 until a fourth latency elapses from a point in time when the result read signal READ_RST is generated. The first to fourth latencies may be predetermined and fixed. Thus, the host or the controller outputting the external command E_CMD may predict the points in time when the first to third internal command signals constituting the internal command signal I_CMD are generated by the command decoder 350 in advance at a point in time when the external command E_CMD is outputted from the host or the controller. That is, the host or the controller may predict a point in time (or a clock) when the MAC arithmetic operation terminates in the PIM device 300 after the external command E_CMD requesting the MAC arithmetic operation is transmitted from the host or the controller to the PIM device 300, even without receiving any signals from the PIM device 300.

The address latch 360 may convert the input address I_ADDR outputted from the receiving driver 330 into a row/column address ADDR_R/ADDR_C to output the row/column address ADDR_R/ADDR_C. The row/column address ADDR_R/ADDR_C outputted from the address latch 360 may be transmitted to the first and second memory banks 311 and 312. According to the present embodiment, the first data and the second data to be used for the MAC arithmetic operation may be simultaneously read out of the first and second memory banks (BK0 and BK1) 311 and 312, respectively. Thus, it may be unnecessary to generate a bank selection signal for selecting any one of the first and second memory banks 311 and 312. In an embodiment, a point in time when the row/column address ADDR_R/ADDR_C is inputted to the first and second memory banks 311 and 312 may be a point in time when a MAC command (i.e., the MAC arithmetic signal MAC) requesting a data read operation for the first and second memory banks 311 and 312 for the MAC arithmetic operation is generated.

The MAC command generator 370 may output the MAC command signal MAC_CMD in response to the internal command signal I_CMD outputted from the command decoder 350. As illustrated in FIG. 16, the MAC command signal MAC_CMD outputted from the MAC command generator 370 may include first to fifth MAC command signals. In an embodiment, the first MAC command signal may be a MAC active signal RACTV, the second MAC command signal may be a MAC read signal MAC_RD_BK, the third MAC command signal may be a MAC input latch signal MAC_L1, the fourth MAC command signal may be a MAC output latch signal MAC_L3, and the fifth MAC command signal may be a MAC result latch signal MAC_L_RST.

The MAC active signal RACTV may be generated based on the memory active signal ACT_M outputted from the command decoder 350. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 350. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 350.

The MAC active signal RACTV outputted from the MAC command generator 370 may control an activation operation for the first and second memory banks 311 and 312. The MAC read signal MAC_RD_BK outputted from the MAC command generator 370 may control a data read operation for the first and second memory banks 311 and 312. The MAC input latch signal MAC_L1 outputted from the MAC command generator 370 may control an input data latch operation of the first MAC operator (MAC0) 320. The MAC output latch signal MAC_L3 outputted from the MAC command generator 370 may control an output data latch operation of the first MAC operator (MAC0) 320. The MAC result latch signal MAC_L_RST outputted from the MAC command generator 370 may control an output operation of MAC result data of the first MAC operator (MAC0) 320 and a reset operation of the first MAC operator (MAC0) 320.

As described above, in order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 370 at predetermined points in time after the external command E_CMD is inputted to the PIM device 300, respectively. That is, a time period from a point in time when the first and second memory banks 311 and 312 are activated by the MAC active signal RACTV until a point in time when the first MAC operator (MAC0) 320 is reset by the MAC result latch signal MAC_L_RST may be predetermined.

Figure 18:
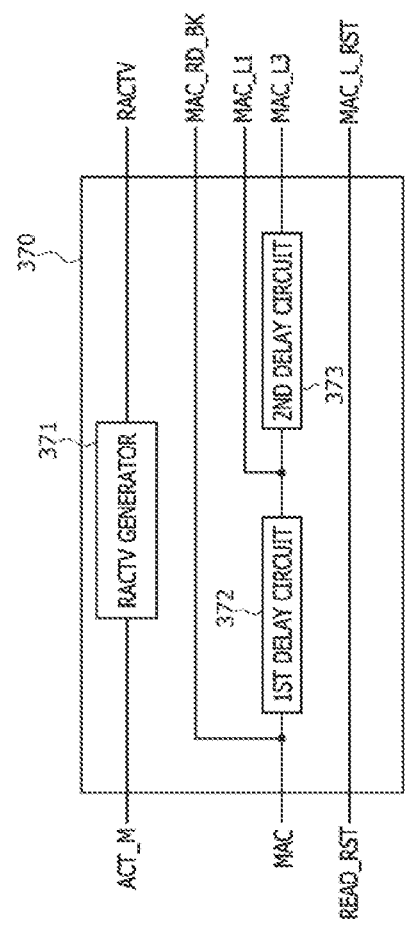
FIG. 18 illustrates an example of a configuration of a MAC command generator included in the PIM device of FIG. 16.

FIG. 18 illustrates an example of a configuration of the MAC command generator 370 included in the PIM device 300 illustrated in FIG. 16. Referring to FIG. 18, the MAC command generator 370 may sequentially receive the memory active signal ACT_M, the MAC arithmetic signal MAC, and the result read signal READ_RST from the command decoder 350. In addition, the MAC command generator 370 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted in series with certain time intervals.

In an embodiment, the MAC command generator 370 may be configured to include an active signal generator 371, a first delay circuit 372, and a second delay circuit 373. The active signal generator 371 may receive the memory active signal ACT_M to generate and output the MAC active signal RACTV. The MAC active signal RACTV outputted from the active signal generator 371 may be transmitted to the first and second memory banks 311 and 312 to activate the first and second memory banks 311 and 312. The MAC command generator 370 may receive the MAC arithmetic signal MAC outputted from the command decoder 350 to output the MAC arithmetic signal MAC as the MAC read signal MAC_RD_BK. The first delay circuit 372 may receive the MAC arithmetic signal MAC and may delay the MAC arithmetic signal MAC by a first delay time DELAY_T1 to generate and output the MAC input latch signal MAC_L1. The second delay circuit 373 may receive an output signal of the first delay circuit 372 and may delay the output signal of the first delay circuit 372 by a second delay time DELAY_T2 to generate and output the MAC output latch signal MAC_L3. The MAC command generator 370 may generate the MAC result latch signal MAC_L_RST in response to the result read signal READ_RST outputted from the command decoder 350.

The MAC command generator 370 may generate and output the MAC active signal RACTV in response to the memory active signal ACT_M outputted from the command decoder 350. Subsequently, the MAC command generator 370 may generate and output the MAC read signal MAC_RD_BK in response to the MAC arithmetic signal MAC outputted from the command decoder 350. The MAC arithmetic signal MAC may be inputted to the first delay circuit 372. The MAC command generator 370 may delay the MAC arithmetic signal MAC by a certain time determined by the first delay circuit 372 to generate and output an output signal of the first delay circuit 372 as the MAC input latch signal MAC_L1. The output signal of the first delay circuit 372 may be inputted to the second delay circuit 373. The MAC command generator 370 may delay the MAC input latch signal MAC_L1 by a certain time determined by the second delay circuit 373 to generate and output an output signal of the second delay circuit 373 as the MAC output latch signal MAC_L3. Subsequently, the MAC command generator 370 may generate and output the MAC result latch signal MAC_L_RST in response to the result read signal READ_RST outputted from the command decoder 350.

Figure 19:
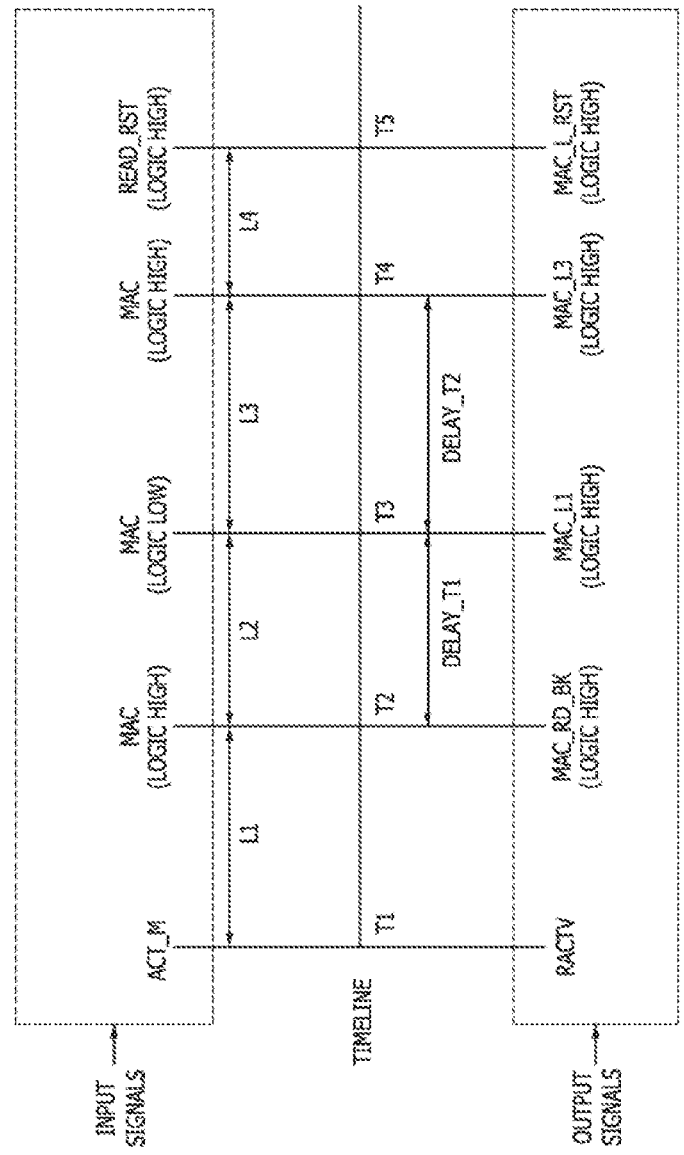
FIG. 19 illustrates input signals and output signals of the MAC command generator illustrated in FIG. 18 with a timeline.

FIG. 19 illustrates input signals and output signals of the MAC command generator 370 illustrated in FIG. 18 with a timeline. In FIG. 19, signals transmitted from the command decoder 350 to the MAC command generator 370 are illustrated in an upper dotted line box, and signals outputted from the MAC command generator 370 are illustrated in a lower dotted line box. Referring to FIGS. 18 and 19, at a first point in time "T1" of the timeline, the memory active signal ACT_M may be inputted to the MAC command generator 370 and the MAC command generator 370 may output the MAC active signal RACTV. At a second point in time "T2" when a certain time, for example, a first latency L1 elapses from the first point in time "T1", the MAC arithmetic signal MAC having a logic "high" level may be inputted to the MAC command generator 370. In response to the MAC arithmetic signal MAC having a logic "high" level, the MAC command generator 370 may output the MAC read signal MAC_RD_BK having a logic "high" level. At a third point in time "T3" when a certain time elapses from the second point in time "T2", a logic level of the MAC arithmetic signal MAC may change from a logic "high" level into a logic "low" level.

At the third point in time "T3" when the first delay time DELAY_T1 elapses from the second point in time "T2", the MAC command generator 370 may output the MAC input latch signal MAC_L1 having a logic "high" level. The first delay time DELAY_T1 may correspond to a delay time determined by the first delay circuit 372 illustrated in FIG. 18. The first delay time DELAY_T1 may be set to be different according to a logic design scheme of the first delay circuit 372. In an embodiment, the first delay time DELAY_T1 may be set to be equal to or greater than a second latency L2. At a fourth point in time "T4" when a certain time elapses from the third point in time "T3", the MAC command generator 370 may output the MAC output latch signal MAC_L3 having a logic "high" level. The fourth point in time "T4" may be a moment when the second delay time DELAY_T2 elapses from the third point in time "T3". The second delay time DELAY_T2 may correspond to a delay time determined by the second delay circuit 373 illustrated in FIG. 18. The second delay time DELAY_T2 may be set to be different according to a logic design scheme of the second delay circuit 373. In an embodiment, the second delay time DELAY_T2 may be set to be equal to or greater than a third latency L3. At a fifth point in time "T5" when a certain time, for example, a fourth L4 elapses from the fourth point in time "T4", the result read signal READ_RST having a logic "high" level may be inputted to the MAC command generator 370. In response to the result read signal READ_RST having a logic "high" level, the MAC command generator 370 may output the MAC result latch signal MAC_L_RST having a logic "high" level, as described with reference to FIG. 18.

In order to perform the deterministic MAC arithmetic operation, moments when the internal command signals ACT_M, MAC, and READ_RST generated by the command decoder 350 are inputted to the MAC command generator 370 may be fixed and moments when the MAC command signals RACTV, MAC_RD_BK, MAC_L1, MAC_L3, and MAC_L_RST are outputted from the MAC command generator 370 in response to the internal command signals ACT_M, MAC, and READ_RST may also be fixed. Thus, all of the first latency L1 between the first point in time "T1" and the second point in time "T2", the second latency L2 between the second point in time "T2" and the third point in time "T3", the third latency L3 between the third point in time "T3" and the fourth point in time "T4", and the fourth latency L4 between the fourth point in time "T4" and the fifth point in time "T5" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks (BK0 and BK1) 311 and 312 based on the MAC read signals MAC_RD_BK and to input the first and second data DA1 and DA2 into the first MAC operator (MAC0) 320. The third latency L3 may be defined as a time it takes to latch the first and second data DA1 and DA2 in the first MAC operator (MAC0) 320 based on the MAC input latch signals MAC_L1 and it takes the first MAC operator (MAC0) 320 to perform the MAC arithmetic operation of the first and second data. The fourth latency L4 may be defined as a time it takes to latch the output data in the first MAC operator (MAC0) 320 based on the MAC output latch signal MAC_L3.

Figure 20:
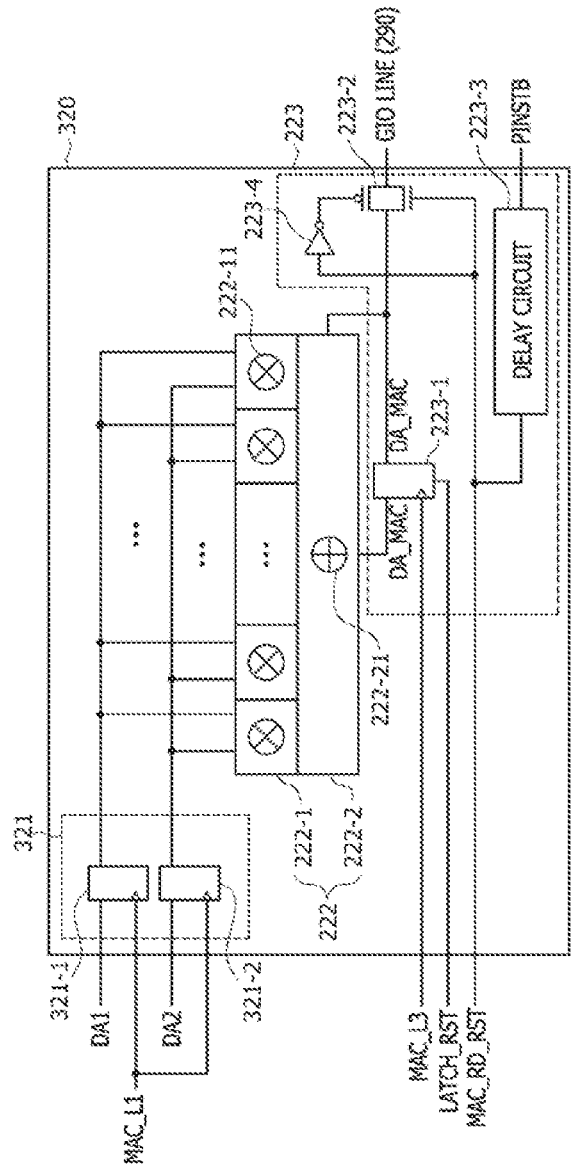
FIG. 20 illustrates an example of a configuration of a MAC operator included in the PIM device of FIG. 16.
Figure 21:
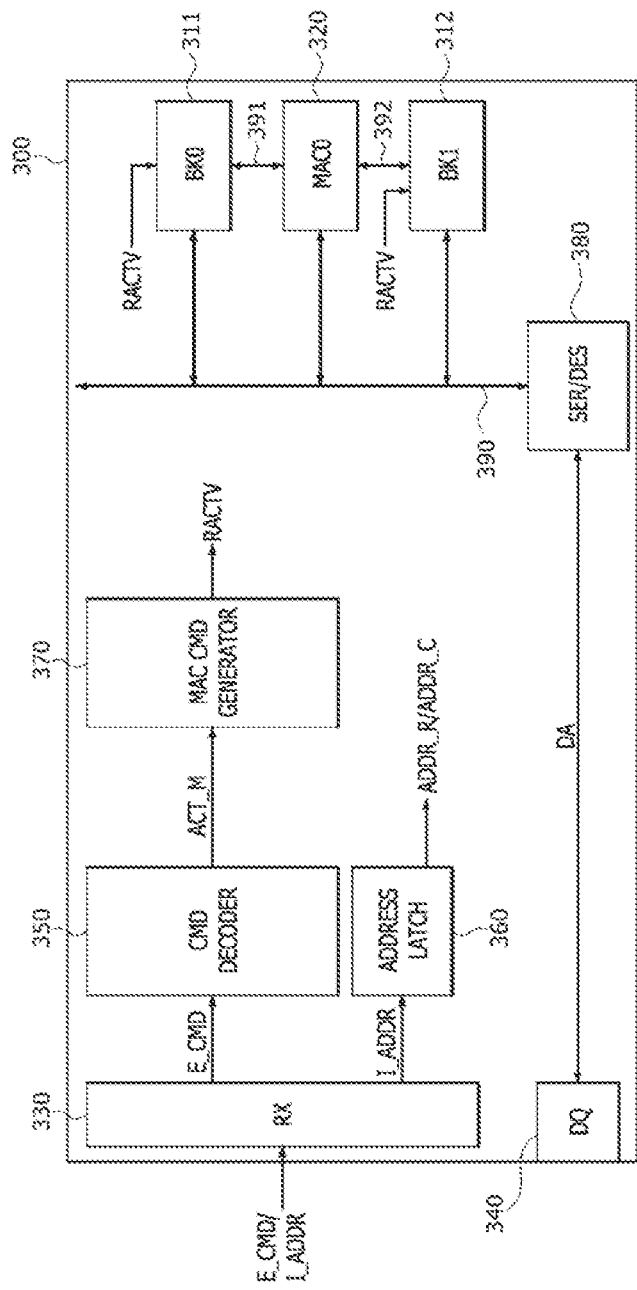
FIGS. 21 to 25 are block diagrams illustrating operations of the PIM device illustrated in FIG. 16.

FIG. 20 illustrates an example of a configuration of the first MAC operator (MAC0) 320 included in the PIM device 300 of FIG. 16. The first MAC operator (MAC0) 320 included in the PIM device 300 may have the same configuration as the first MAC operator (MAC0) 220 described with reference to FIG. 7 except for a signal applied to clock terminals of first and second input latches 321-1 and 321-2 constituting a data input circuit 321. Thus, in FIG. 20, the same reference numerals or the same reference symbols as used in FIG. 7 denote the same elements, and descriptions of the same elements as set forth with reference to FIG. 7 will be omitted hereinafter.

Describing in detail the differences between the first MAC operator (MAC0) 220 and the first MAC operator (MAC0) 320, in the case of the first MAC operator (MAC0) 220 illustrated in FIG. 7, the first input latch (221-1 of FIG. 7) and the second input latch (221-2 of FIG. 7) of the data input circuit (221 of FIG. 7) may be synchronized with the first and second MAC input latch signals MAC_L1 and MAC_L2, respectively, sequentially generated with a certain time interval to output the first data DA1 and the second data DA2. In contrast, in the case of the first MAC operator (MAC0) 320, the MAC input latch signal MAC_L1 may be inputted to both of the clock terminals of the first and second input latches 321-1 and 321-2 constituting a data input circuit 321. Thus, both of the first and second input latches 321-1 and 321-2 may be synchronized with the MAC input latch signal MAC_L1 to output the first data DA1 and the second data DA2, respectively. Accordingly, the first MAC operator (MAC0) 320 may transmit the first and second data DA1 and DA2 to the MAC circuit 222 in parallel without any time interval between the first and second data DA1 and DA2. As a result, the MAC arithmetic operation of the MAC circuit 222 may be quickly performed without any delay of data input time.

FIGS. 21 to 25 are block diagrams illustrating operations of the PIM device 300 illustrated in FIG. 16. In FIGS. 21 to 25, the same reference numerals or the same reference symbols as used in FIG. 16 denote the same elements. First, referring to FIG. 21, if the external command E_CMD requesting the MAC arithmetic operation and the input address I_ADDR are transmitted from an external device to the receiving driver 330, the receiving driver 330 may output the external command E_CMD and the input address I_ADDR to the command decoder 350 and the address latch 360, respectively. The command decoder 350 may decode the external command E_CMD to generate and transmit the memory active signal ACT_M to the MAC command generator 370. The MAC command generator 370 may generate and output the MAC active signal RACTV in response to the memory active signal ACT_M. The MAC active signal RACTV may be transmitted to the first memory bank (BK0) 311 and the second memory bank (BK1) 312. Both of the first memory bank (BK0) 311 and the second memory bank (BK1) 312 may be activated by the MAC active signal RACTV.

Figure 22:
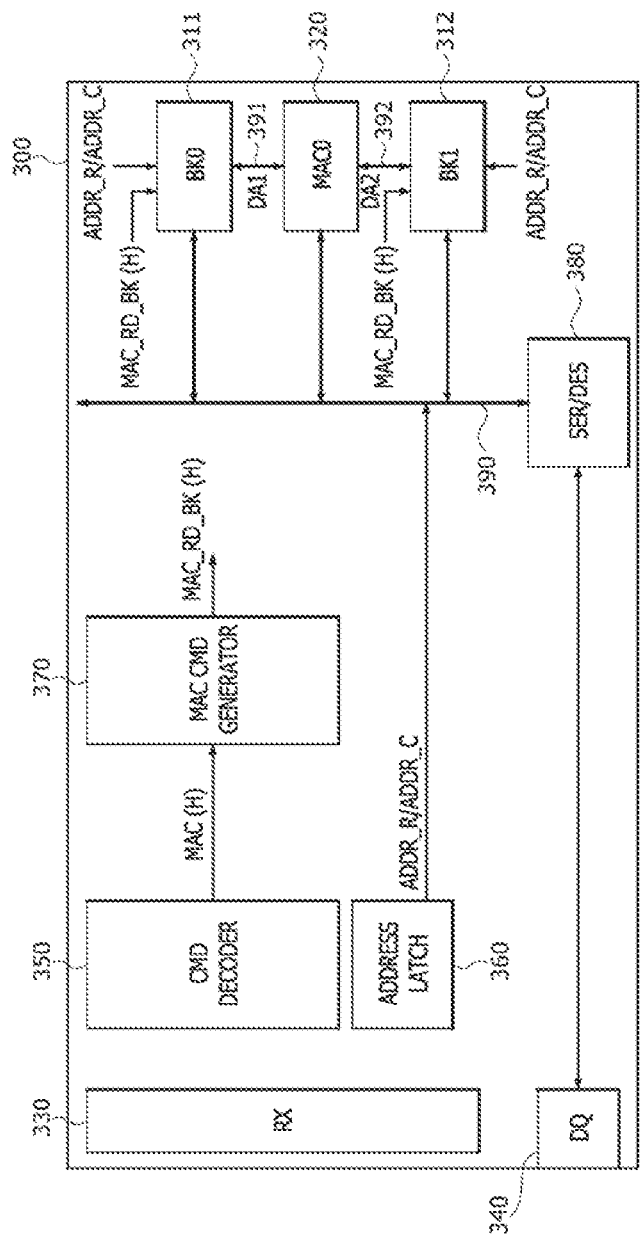

Next, referring to FIG. 22, the command decoder 350 may generate and output the MAC arithmetic signal MAC having a logic "high(H)" level to the MAC command generator 370. In response to the MAC arithmetic signal MAC having a logic "high(H)" level, the MAC command generator 370 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 311 and the second memory bank (BK1) 312. The first data DA1 may be read out of the first memory bank (BK0) 311 by the MAC read signal MAC_RD_BK having a logic "high(H)" level and may be transmitted to the first MAC operator (MAC0) 320 through the first BIO line 391. In addition, the second data DA2 may be read out of the second memory bank (BK1) 312 by the MAC read signal MAC_RD_BK having a logic "high(H)" level and may be transmitted to the first MAC operator (MAC0) 320 through the second BIO line 392.

Figure 23:
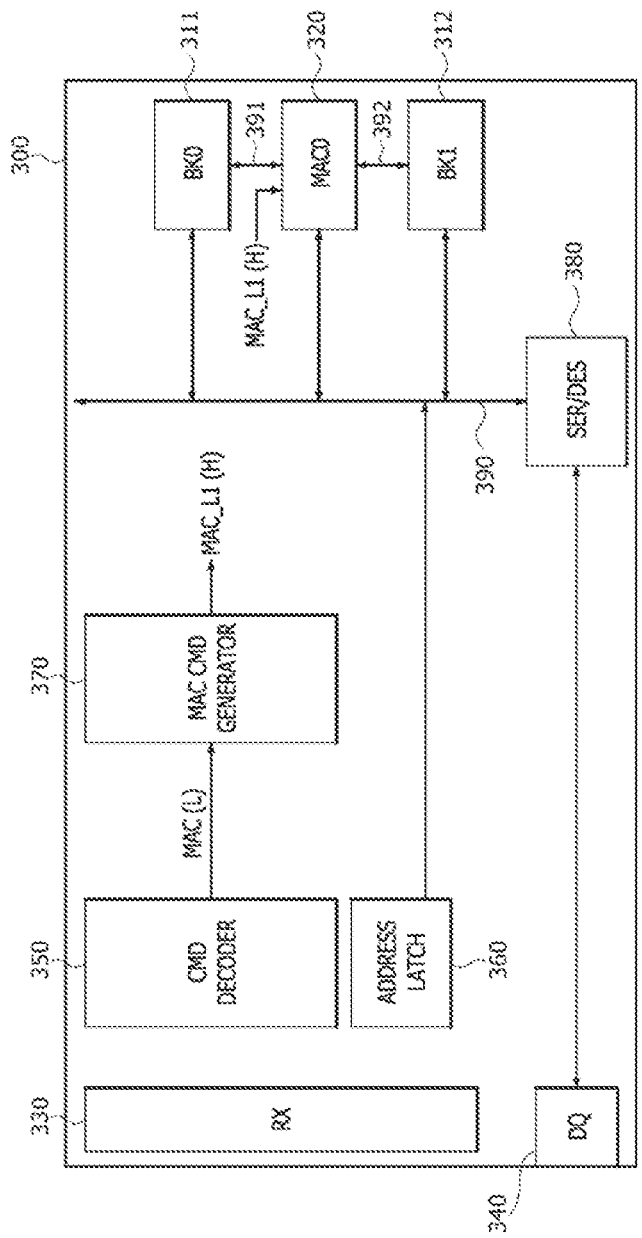

Next, referring to FIG. 23, a logic level of the MAC arithmetic signal MAC outputted from the command decoder 350 may change from a logic "high(H)" level into a logic "low(L)" level at a point in time when the first delay time DELAY_T1 determined by the first delay circuit (372 of FIG. 18) elapses from a point in time when the MAC read signal MAC_RD_BK is outputted from the MAC command generator 370. The MAC command generator 370 may generate and output the MAC input latch signal MAC_L1 having a logic "high(H)" level in response to the MAC arithmetic signal MAC having a logic "low(L)" level. The MAC input latch signal MAC_L1 having a logic "high(H)" level may be transmitted to the first MAC operator (MAC0) 320. The first MAC operator (MAC0) 320 may be synchronized with the MAC input latch signal MAC_L1 having a logic "high(H)" level to perform a latch operation of the first and second data DA1 and DA2 outputted from the first and second memory banks (BK0 and BK1) 311 and 312. If the latch operation of the first and second data DA1 and DA2 terminates, the first MAC operator (MAC0) 320 may perform the MAC arithmetic operation and may generate the MAC result data DA_MAC. The MAC result data DA_MAC generated by the first MAC operator (MAC0) 320 may be inputted to the output latch (223-1 of FIG. 20) included in the first MAC operator (MAC0) 320.

Figure 24:
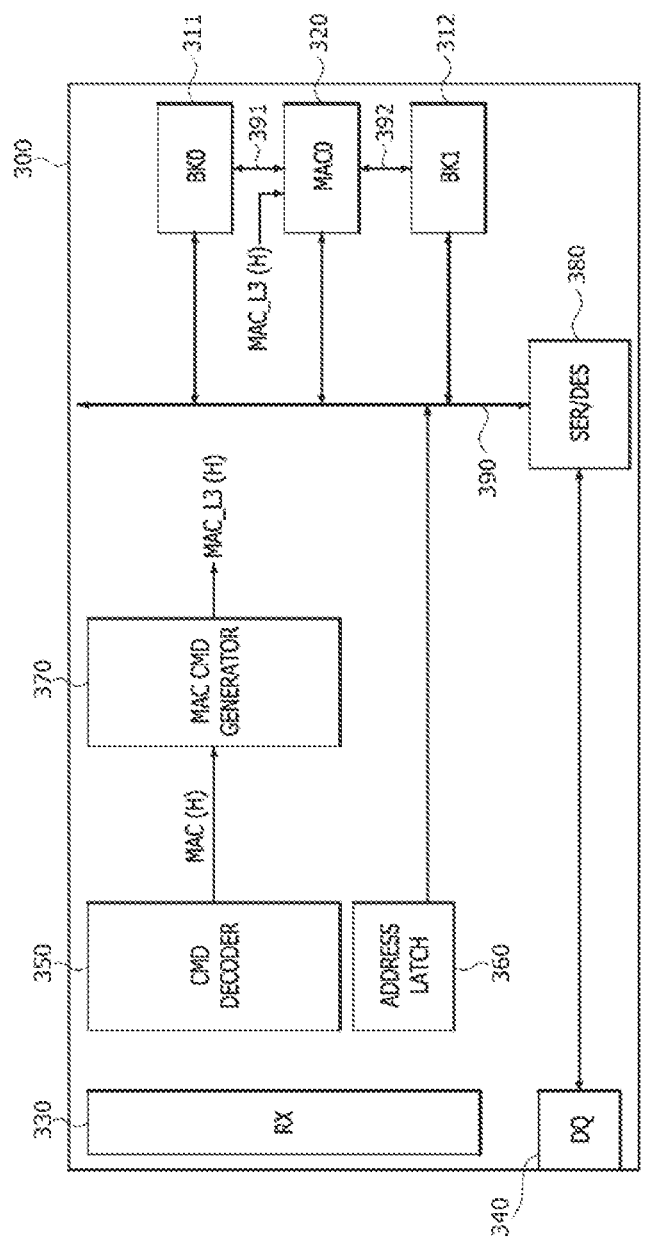

Next, referring to FIG. 24, a logic level of the MAC arithmetic signal MAC outputted from the command decoder 350 may change from a logic "low(L)" level into a logic "high(H)" level at a point in time when the second delay time DELAY_T2 determined by the second delay circuit (373 of FIG. 18) elapses from a point in time when the MAC input latch signal MAC_L1 having a logic "high (H)" level is outputted from the MAC command generator 370. The MAC command generator 370 may generate and output the MAC output latch signal MAC_L3 having a logic "high(H)" level in response to the MAC arithmetic signal MAC having a logic "high(H)" level. The MAC output latch signal MAC_L3 having a logic "high(H)" level may be transmitted to the first MAC operator (MAC0) 320. The output latch (223-1 of FIG. 20) included in the first MAC operator (MAC0) 320 may be synchronized with the MAC output latch signal MAC_L3 having a logic "high(H)" level to transfer the MAC result data DA_MAC generated by the MAC circuit (222 of FIG. 20) to the transfer gate (223-2 of FIG. 20) included in the first MAC operator (MAC0) 320. The MAC result data DA_MAC outputted from the output latch (223-1 of FIG. 20) may be fed back to the addition logic circuit (222-2 of FIG. 20) for the accumulative adding calculation executed by the MAC circuit (222 of FIG. 20).

Figure 25:
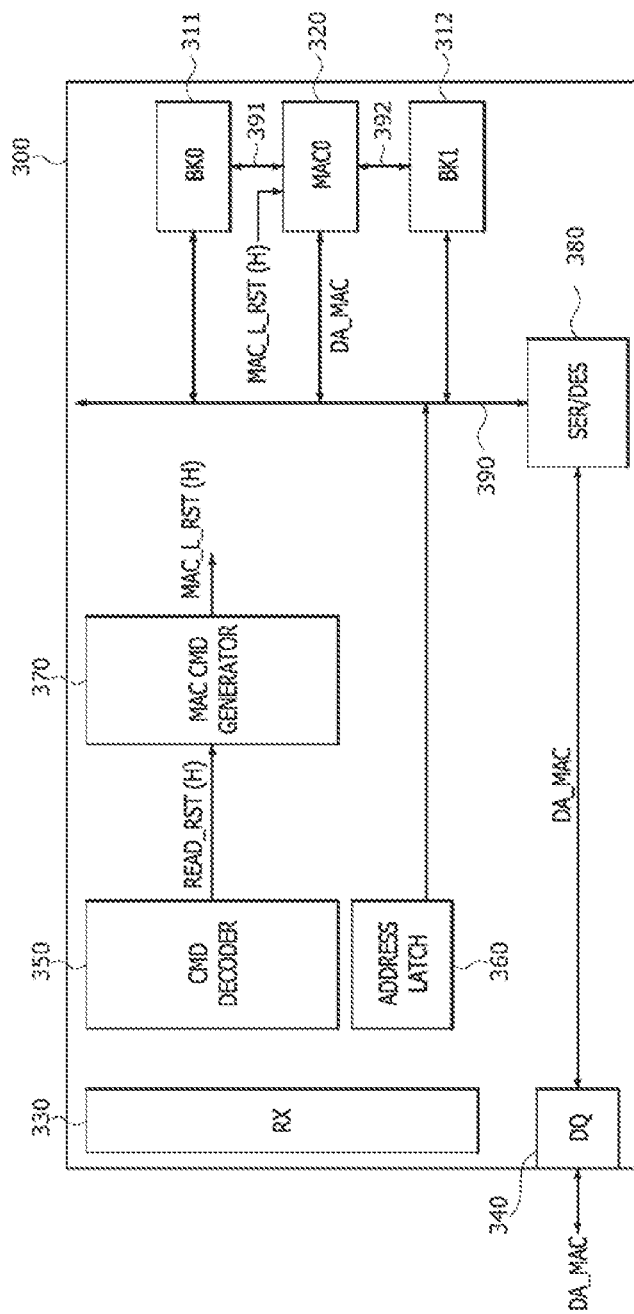

Next, referring to FIG. 25, the command decoder 350 may output and transmit the result read signal READ_RST having a logic "high(H)" level to the MAC command generator 370. The MAC command generator 370 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 320. As described with reference to FIG. 20, the first MAC operator (MAC0) 320 may output the MAC result data DA_MAC to the GIO line 390 in response to the MAC result latch signal MAC_L_RST having a logic "high" level and may also reset the output latch (223-1 of FIG. 20) included in the first MAC operator (MAC0) 320 in response to the MAC result latch signal MAC_L_RST having a logic "high" level. The MAC result data DA_MAC transmitted to the GIO line 390 may be outputted to an external device through the serializer/deserializer 380 and the data I/O line 340. Although not shown in the drawings, the MAC result data DA_MAC outputted from the first MAC operator (MAC0) 320 may be written into the first memory bank (BK0) 311 through the first BIO line 391 without using the GIO line 390 or may be written into the second memory bank (BK1) 312 through the second BIO line 392 without using the GIO line 390.

Figure 26:
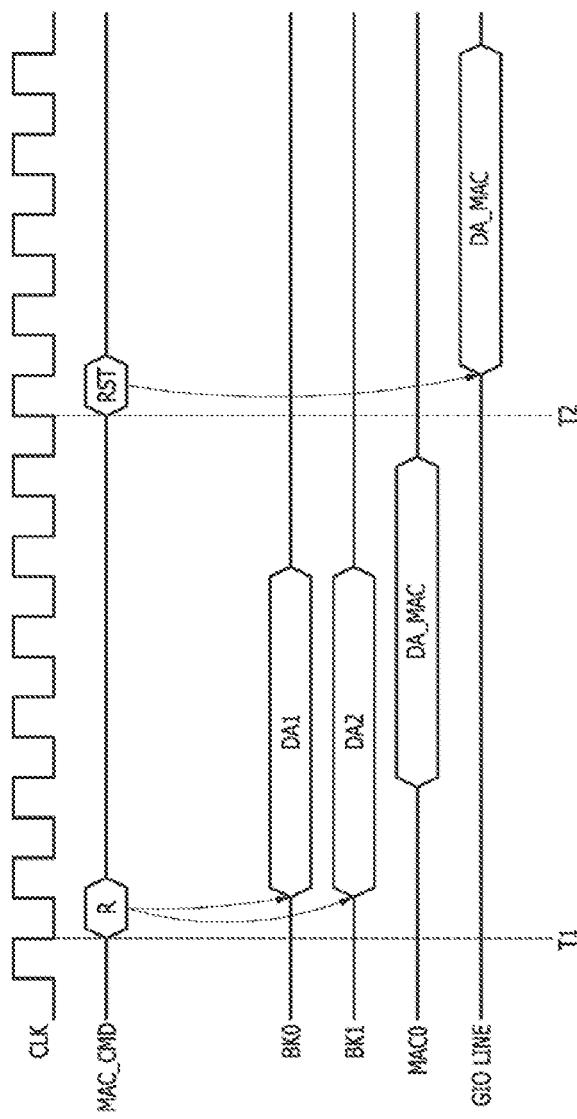
FIG. 26 is a timing diagram an operation of the PIM device illustrated in FIG. 16.

FIG. 26 is a timing diagram illustrating an operation of the PIM device 300 illustrated in FIG. 16. Referring to FIG. 26, at a first point in time "T1", the MAC command generator 370 may be synchronized with a falling edge of a clock signal CLK to generate and output the MAC read signal MAC_RD_BK (R) having a logic "high(H)" level. The first and second memory banks (BK0 and BK1) 311 and 312 may be selected by the MAC read signal MAC_RD_BK (R) having a logic "high(H)" level so that the first data DA1 and the second data DA2 are read out of the first and second memory banks (BK0 and BK1) 311 and 312. If a certain time elapses from a point in time when first data DA1 and the second data DA2 are read out, the first MAC operator (MAC0) 320 may perform the MAC arithmetic operation of the first and second data DA1 and DA2 to generate the MAC result data DA_MAC. At a second point in time "T2", the MAC command generator 370 may be synchronized with a falling edge of the clock signal CLK to generate and output the MAC result latch signal MAC_L_RST (RST) having a logic "high" level. The MAC result data DA_MAC may be transmitted to the GIO line 390 by the MAC result latch signal MAC_L_RST (RST) having a logic "high" level.

Figure 27:
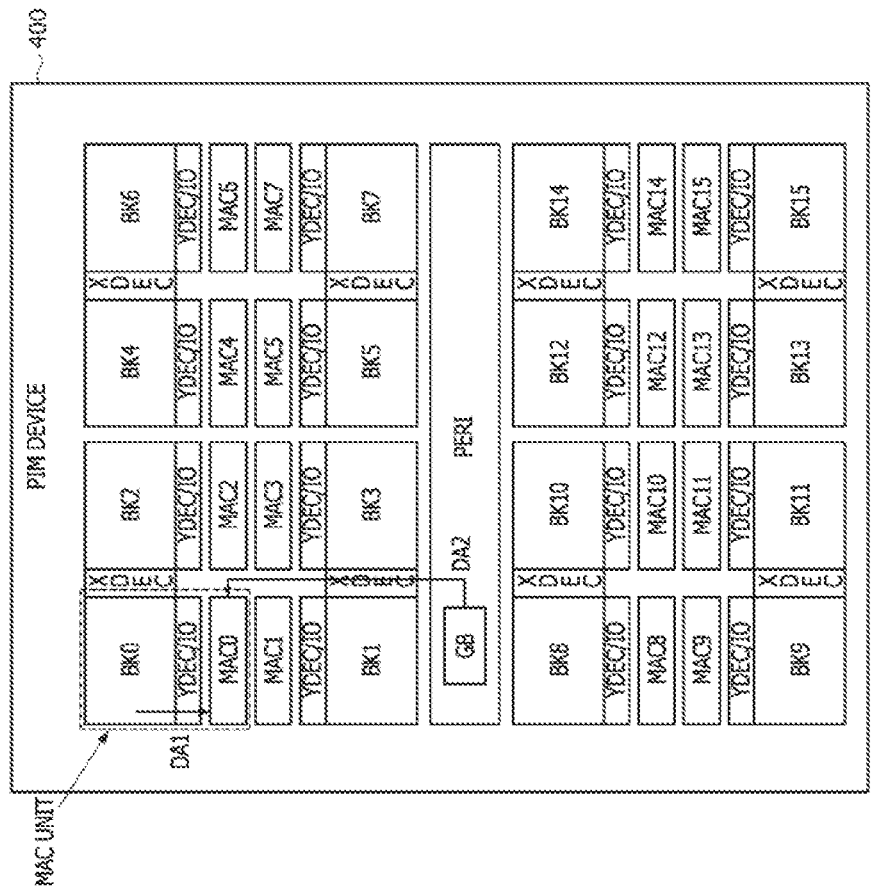
FIG. 27 is a schematic diagram illustrating an arrangement of memory banks and multiplication/accumulation (MAC) operators included in a PIM device according to a second embodiment of the present disclosure.

FIG. 27 illustrates a disposal structure indicating placement of memory banks and MAC operators included in a PIM device 400 according to another embodiment of the present disclosure. Referring to FIG. 27, the PIM device 400 may include memory devices such as a plurality of memory banks (e.g., first to sixteenth memory banks BK0, . . . , and BK15), processing devices such as a plurality of MAC operators (e.g., first to sixteenth MAC operators MAC0, . . . , and MAC15), and a global buffer GB. A core circuit may be disposed to be adjacent to the memory banks BK0, . . . , and BK15. The core circuit may include X-decoders XDECs and Y-decoders/IO circuits YDEC/IOs. The memory banks BK0, . . . , and BK15 and the core circuit may have the same configuration as described with reference to FIG. 2. Thus, descriptions of the memory banks BK0, . . . , and BK15 and the core circuit will be omitted hereinafter. The MAC operators MAC0, . . . , and MAC15 may be disposed to be allocated to the memory banks BK0, . . . , and BK15, respectively. That is, in the PIM device 400, two or more memory banks do not share one MAC operator with each other. Thus, the number of the MAC operators MAC0, . . . , and MAC15 included in the PIM device 400 may be equal to the number of the memory banks BK0, . . . , and BK15 included in the PIM device 400. One of the memory banks BK0, . . . , and BK15 together with one of the MAC operators MAC0, . . . , and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC arithmetic operation from the respective memory bank.

The PIM device 400 may further include a peripheral circuit PERI. The peripheral circuit PERI may be disposed in a region other than an area in which the memory banks BK0, BK1, . . . , and BK15; the MAC operators MAC0, . . . , and MAC15; and the core circuit are disposed. The peripheral circuit PERI may be configured to include a control circuit relating to a command/address signal, a control circuit relating to input/output of data, and a power supply circuit. The peripheral circuit PERI of the PIM device 400 may have substantially the same configuration as the peripheral circuit PERI of the PIM device 100 illustrated in FIG. 2. A difference between the peripheral circuit PERI of the PIM device 400 and the peripheral circuit PERI of the PIM device 100 is that the global buffer GB is disposed in the peripheral circuit PERI of the PIM device 400. The global buffer GB may receive second data DA2 to be used for the MAC operation from an external device and may store the second data DA2. The global buffer GB may output the second data DA2 to each of the MAC operators MAC0, . . . , and MAC15 through a GIO line. In the event that the PIM device 400 performs neural network calculation, for example, an arithmetic operation in a deep learning process, the first data DA1 may be weight data and the second data DA2 may be vector data.

The PIM device 400 according to the present embodiment may operate in a memory mode or a MAC arithmetic mode. In the memory mode, the PIM device 400 may operate to perform the same operations as general memory devices. The memory mode may include a memory read operation mode and a memory write operation mode. In the memory read operation mode, the PIM device 400 may perform a read operation for reading out data from the memory banks BK0, BK1, . . . , and BK15 to output the read data, in response to an external request. In the memory write operation mode, the PIM device 400 may perform a write operation for storing data provided by an external device into the memory banks BK0, BK1, . . . , and BK15, in response to an external request. In the MAC arithmetic mode, the PIM device 400 may perform the MAC arithmetic operation using the MAC operators MAC0, . . . , and MAC15. In the PIM device 400, the MAC arithmetic operation may be performed in a deterministic way, and the deterministic MAC arithmetic operation of the PIM device 400 will be described more fully hereinafter. Specifically, the PIM device 400 may perform the read operation of the first data DA1 for each of the memory banks BK0, . . . , and BK15 and the read operation of the second data DA2 for the global buffer GB, for the MAC arithmetic operation in the MAC arithmetic mode. In addition, each of the MAC operators MAC0, . . . , and MAC15 may perform the MAC arithmetic operation of the first data DA1 and the second data DA2 to store a result of the MAC arithmetic operation into the memory bank or to output the result of the MAC arithmetic operation to an external device. In some cases, the PIM device 400 may perform a data write operation for storing data to be used for the MAC arithmetic operation into the memory banks before the data read operation for the MAC arithmetic operation is performed in the MAC arithmetic mode.

The operation mode of the PIM device 400 according to the present embodiment may be determined by a command which is transmitted from a host or a controller to the PIM device 400. In an embodiment, if a first external command requesting a read operation or a write operation for the memory banks BK0, BK1, . . . , and BK15 is transmitted from the host or the controller to the PIM device 400, the PIM device 400 may perform the data read operation or the data write operation in the memory mode. Alternatively, if a second external command requesting the MAC arithmetic operation is transmitted from the host or the controller to the PIM device 400, the PIM device 400 may perform the data read operation and the MAC arithmetic operation.

The PIM device 400 may perform the deterministic MAC arithmetic operation. Thus, the host or the controller may always predict a point in time (or a clock) when the MAC arithmetic operation terminates in the PIM device 400 from a point in time when an external command requesting the MAC arithmetic operation is transmitted from the host or the controller to the PIM device 400. Because the timing is predictable, no operation for informing the host or the controller of a status of the MAC arithmetic operation is required while the PIM device 400 performs the deterministic MAC arithmetic operation. In an embodiment, a latency during which the MAC arithmetic operation is performed in the PIM device 400 may be set to a fixed value for the deterministic MAC arithmetic operation.

Figure 28:
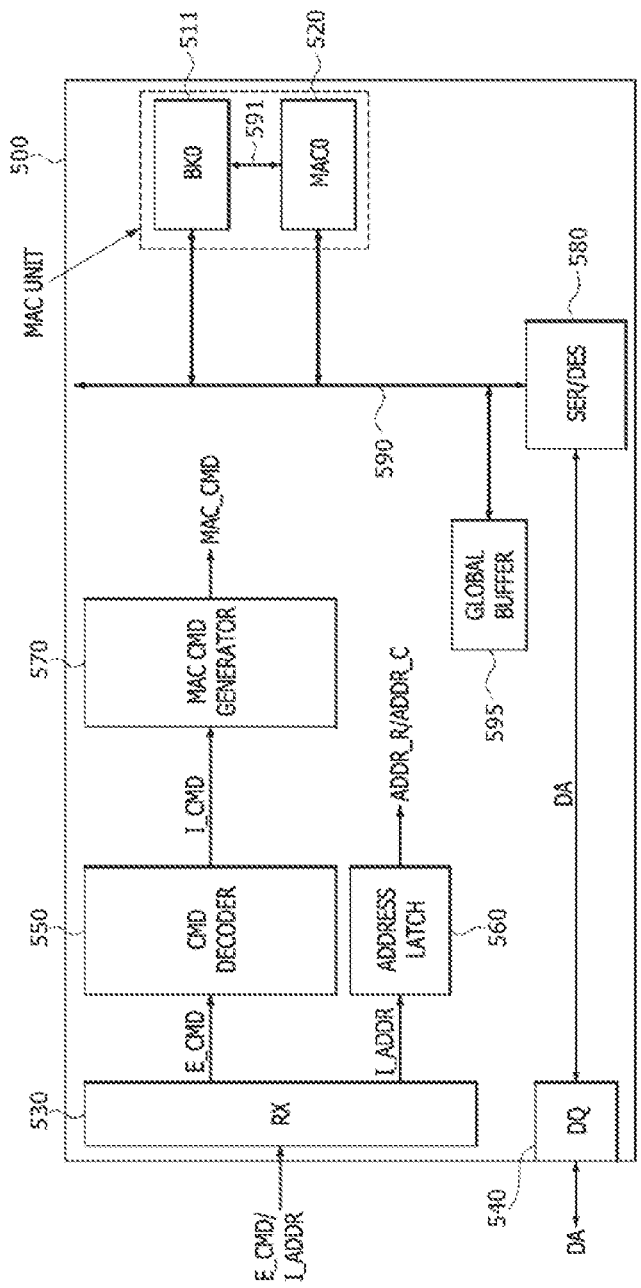
FIG. 28 is a block diagram illustrating a configuration of a PIM device according to the second embodiment of the present disclosure.

FIG. 28 is a block diagram illustrating an example of a detailed configuration of a PIM device 500 corresponding to the PIM device 400 illustrated in FIG. 27. FIG. 28 illustrates only a first memory bank (BK0) 511 and a first MAC operator (MAC0) 520 constituting a first MAC unit among a plurality of MAC units. However, FIG. 28 illustrates merely an example for simplification of the drawing. Accordingly, the following description for the first MAC unit may be equally applicable to the remaining MAC units. Referring to FIG. 28, the PIM device 500 may be configured to include the first memory bank (BK0) 511 and the first MAC operator (MAC0) 520 constituting the first MAC unit as well as a global buffer 595. The PIM device 500 may further include a GIO line 590 and a BIO line 591 used as data transmission lines. The first memory bank (BK0) 511 and the first MAC operator (MAC0) 520 may communicate with the global buffer 595 through the GIO line 590. Only the data transmission between the first memory bank (BK0) 511 and the first MAC operator (MAC0) 520 may be achieved through the BIO line 591. The BIO line 591 is dedicated specifically for data transmission between the first memory bank (BK0) 511 and the first MAC operator (MAC0) 520. Thus, the first MAC operator (MAC0) 520 may receive the first data DA1 to be used for the MAC arithmetic operation from the first memory bank (BK0) 511 through the BIO line 591 and may receive the second data DA2 to be used for the MAC arithmetic operation from the global buffer 595 through the GIO line 590.

The PIM device 500 may include a receiving driver (RX) 530, a data I/O circuit (DQ) 540, a command decoder 550, an address latch 560, a MAC command generator 570, and a serializer/deserializer (SER/DES) 580. The command decoder 550, the address latch 560, the MAC command generator 570, and the serializer/deserializer 580 may be disposed in the peripheral circuit PERI of the PIM device 400 illustrated in FIG. 27. The receiving driver 530 may receive an external command E_CMD and an input address I_ADDR from an external device. The external device may denote a host or a controller coupled to the PIM device 500. Hereinafter, it may be assumed that the external command E_CMD transmitted to the PIM device 500 is a command requesting the MAC arithmetic operation. That is, the PIM device 500 may perform the deterministic MAC arithmetic operation in response to the external command E_CMD. The data I/O circuit 540 may provide a means through which the PIM device 500 communicates with the external device.

The receiving driver 530 may separately output the external command E_CMD and the input address I_ADDR received from the external device. Data DA inputted to the PIM device 500 through the data I/O circuit 540 may be processed by the serializer/deserializer 580 and may be transmitted to the first memory bank (BK0) 511 and the global buffer 595 through the GIO line 590 of the PIM device 500. The data DA outputted from the first memory bank (BK0) 511 and the first MAC operator (MAC0) 520 through the GIO line 590 may be processed by the serializer/deserializer 580 and may be outputted to the external device through the data I/O circuit 540. The serializer/deserializer 580 may convert the data DA into parallel data if the data DA are serial data or may convert the data DA into serial data if the data DA are parallel data. For the data conversion, the serializer/deserializer 580 may include a serializer converting parallel data into serial data and a deserializer converting serial data into parallel data.

The command decoder 550 may decode the external command E_CMD outputted from the receiving driver 530 to generate and output the internal command signal I_CMD. The internal command signal I_CMD outputted from the command decoder 550 may be the same as the internal command signal I_CMD described with reference to FIG. 17. That is, the internal command signal I_CMD may include a first internal command signal corresponding to the memory active signal ACT_M, a second internal command signal corresponding to the MAC arithmetic signal MAC, and a third internal command signal corresponding to the result read signal READ_RST. The first to third internal command signals outputted from the command decoder 550 may be sequentially inputted to the MAC command generator 570. As described with reference to FIG. 17, the memory active signal ACT_M, the MAC arithmetic signal MAC, and the result read signal READ_RST outputted from the command decoder 550 may be sequentially generated at predetermined points in time (or clocks) in order to perform the deterministic MAC arithmetic operation of the PIM device 500. Thus, the host or the controller outputting the external command E_CMD may predict the points in time when the first to third internal command signals constituting the internal command signal I_CMD are generated by the command decoder 550 in advance at a point in time when the external command E_CMD is outputted from the host or the controller. That is, the host or the controller may predict a point in time (or a clock) when the MAC arithmetic operation terminates in the PIM device 500 after the external command E_CMD requesting the MAC arithmetic operation is transmitted from the host or the controller to the PIM device 500, even without receiving any signals from the PIM device 500.

The address latch 560 may convert the input address I_ADDR outputted from the receiving driver 530 into a row/column address ADDR_R/ADDR_C to output the row/column address ADDR_R/ADDR_C. The row/column address ADDR_R/ADDR_C outputted from the address latch 560 may be transmitted to the first memory bank (BK0) 511. According to the present embodiment, the first data and the second data to be used for the MAC arithmetic operation may be simultaneously read out of the first memory bank (BK0) 511 and the global buffer 595, respectively. Thus, it may be unnecessary to generate a bank selection signal for selecting the first memory bank 511. A point in time when the row/column address ADDR_R/ADDR_C is inputted to the first memory bank 511 may be a point in time when a MAC command (i.e., the MAC arithmetic signal MAC) requesting a data read operation for the first memory bank 511 for the MAC arithmetic operation is generated.

The MAC command generator 570 may output the MAC command signal MAC_CMD in response to the internal command signal I_CMD outputted from the command decoder 550. The MAC command signal MAC_CMD outputted from the MAC command generator 570 may be the same as the MAC command signal MAC_CMD described with reference to FIG. 17. That is, the MAC command signal MAC_CMD outputted from the MAC command generator 570 may include the MAC active signal RACTV corresponding to the first MAC command signal, the MAC read signal MAC_RD_BK corresponding to the second MAC command signal, the MAC input latch signal MAC_L1 corresponding to the third MAC command signal, the MAC output latch signal MAC_L3 corresponding to the fourth MAC command signal, and the MAC result latch signal MAC_L_RST corresponding to the fifth MAC command signal.

The MAC active signal RACTV may be generated based on the memory active signal ACT_M outputted from the command decoder 550. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 550. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 550.

The MAC active signal RACTV outputted from the MAC command generator 570 may control an activation operation for the first memory bank 511. The MAC read signal MAC_RD_BK outputted from the MAC command generator 570 may control a data read operation for the first memory bank 511 and the global buffer 595. The MAC input latch signal MAC_L1 outputted from the MAC command generator 570 may control an input data latch operation of the first MAC operator (MAC0) 520. The MAC output latch signal MAC_L3 outputted from the MAC command generator 570 may control an output data latch operation of the first MAC operator (MAC0) 520. The MAC result latch signal MAC_L_RST outputted from the MAC command generator 570 may control an output operation of MAC result data of the first MAC operator (MAC0) 520 and a reset operation of the first MAC operator (MAC0) 520.

As described above, in order to perform the deterministic MAC arithmetic operation of the PIM device 500, the memory active signal ACT_M, the MAC arithmetic signal MAC, and the result read signal READ_RST outputted from the command decoder 550 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 570 at predetermined points in time after the external command E_CMD is inputted to the PIM device 500, respectively. That is, a time period from a point in time when the first and second memory banks 511 is activated by the MAC active signal RACTV until a point in time when the first MAC operator (MAC0) 520 is reset by the MAC result latch signal MAC_L_RST may be predetermined.

The MAC command generator 570 of the PIM device 500 according to the present embodiment may have the same configuration as described with reference to FIG. 18. In addition, the input signals and the output signals of the MAC command generator 570 may be inputted to and outputted from the MAC command generator 570 at the same points in time as described with reference to FIG. 19. As described with reference to FIGS. 18 and 19, the MAC command generator 570 may sequentially receive the memory active signal ACT_M, the MAC arithmetic signal MAC, and the result read signal READ_RST from the command decoder 550. In addition, the MAC command generator 570 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted from the MAC command generator 570 in series with certain time intervals.

The MAC command generator 570 may generate and output the MAC active signal RACTV in response to the memory active signal ACT_M outputted from the command decoder 550. Subsequently, the MAC command generator 570 may generate and output the MAC read signal MAC_RD_BK in response to the MAC arithmetic signal MAC outputted from the command decoder 550. The MAC command generator 570 may delay the MAC arithmetic signal MAC by a certain time determined by the first delay circuit (372 of FIG. 18) to generate and output the MAC input latch signal MAC_L1. The MAC command generator 570 may delay the MAC input latch signal MAC_L1 by a certain time determined by the second delay circuit (373 of FIG. 18) to generate and output the MAC output latch signal MAC_L3. Subsequently, the MAC command generator 570 may generate and output the MAC result latch signal MAC_L_RST in response to the result read signal READ_RST outputted from the command decoder 550.

Figure 29:
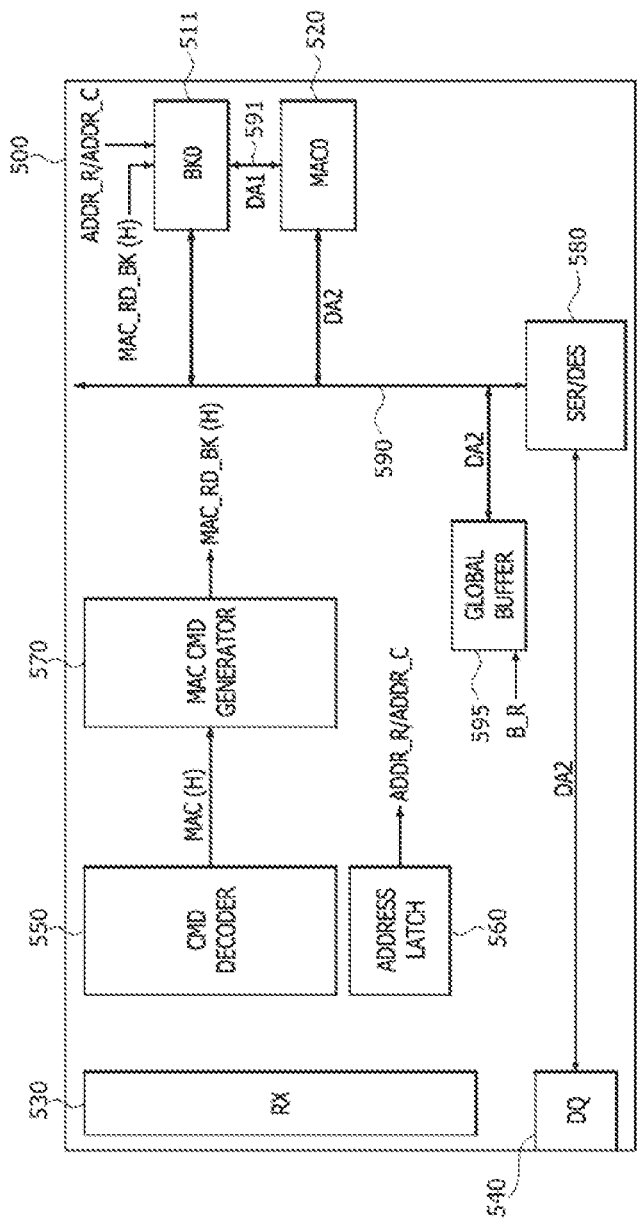
FIG. 29 is a block diagram illustrating an operation of the PIM device illustrated in FIG. 28.

FIG. 29 is a block diagram illustrating an operation of the PIM device 500 illustrated in FIG. 28. In FIG. 29, the same reference numerals or the same reference symbols as used in FIG. 16 denote the same elements. The operation of the PIM device 500 according to the present embodiment may be similar to the operation of the PIM device 300 described with reference to FIG. 16 except a transmission process of the first and second data DA1 and DA2 inputted to the first MAC operator (MAC0) 520. Thus, the operation of the PIM device 500 executed before the first and second data DA1 and DA2 are transmitted to the first MAC operator (MAC0) 520 may be the same as the operation of the PIM device 300 described with reference to FIG. 21. As illustrated in FIG. 29, when the MAC arithmetic signal MAC having a logic "high(H)" level is transmitted from the command decoder 550 to the MAC command generator 570, the MAC command generator 570 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 511. In such a case, a global buffer read signal B_R may also be transmitted to the global buffer 595. The first data DA1 may be read out of the first memory bank (BK0) 511 by the MAC read signal MAC_RD_BK having a logic "high(H)" level and may be transmitted to the first MAC operator (MAC0) 520 through the BIO line 591. In addition, the second data DA2 may be read out of the global buffer 595 by the global buffer read signal B_R and may be transmitted to the first MAC operator (MAC0) 520 through the GIO line 590. The operation of the PIM device 500 executed after the first and second data DA1 and DA2 are transmitted to the first MAC operator (MAC0) 520 may be the same as the operation of the PIM device 300 described with reference to FIGS. 23 to 25.

Figure 30:
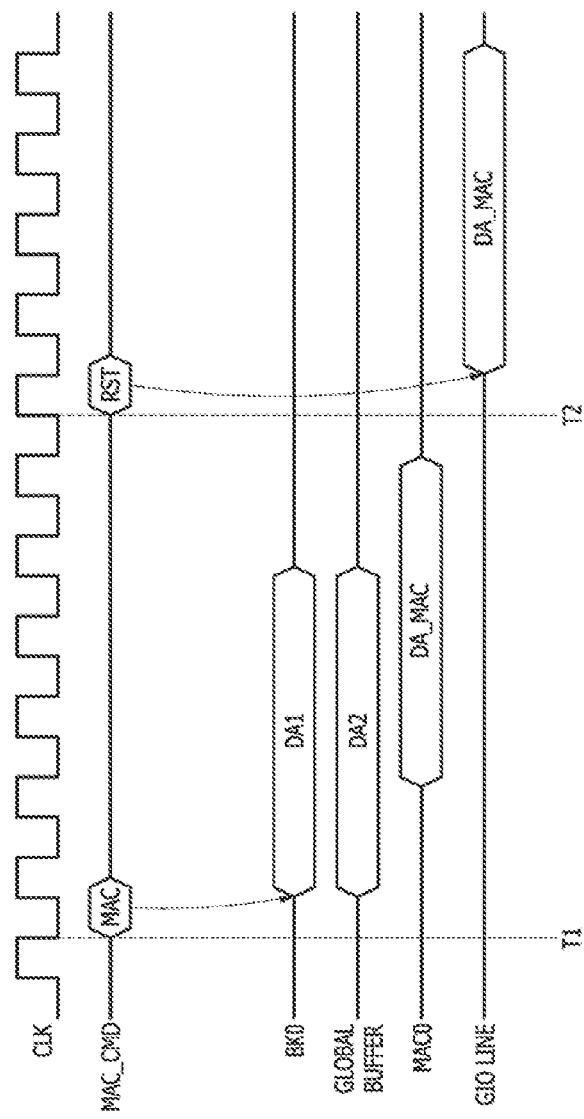
FIG. 30 is a timing diagram illustrating an operation of the PIM device illustrated in FIG. 28.

FIG. 30 is a timing diagram illustrating an operation of the PIM device 500 illustrate in FIG. 28. Referring to FIG. 30, at a first point in time "T1", the MAC command generator 570 may be synchronized with a falling edge of a clock signal CLK to generate and output the MAC read signal MAC_RD_BK (R) having a logic "high(H)" level. The first memory bank (BK0) 511 may be selected by the MAC read signal MAC_RD_BK (R) having a logic "high(H)" level so that the first data DA1 are read out of the first memory bank (BK0) 511. In addition, the second data DA2 may be read out of the global buffer 595. If a certain time elapses from a point in time when the first and second data DA1 and DA2 are read out of the first memory bank (BK0) 511 and the global buffer 595, the first MAC operator (MAC0) 520 may perform the MAC arithmetic operation of the first and second data DA1 and DA2 to generate the MAC result data DA_MAC. At a second point in time "T2", the MAC command generator 570 may be synchronized with a falling edge of the clock signal CLK to generate and output the MAC result latch signal MAC_L_RST (RST). The MAC result data DA_MAC may be transmitted to an external device through the GIO line 590 or to the first memory bank (BK0) 511 through the BIO line 591, by the MAC result latch signal MAC_L_RST (RST).

Figure 31:
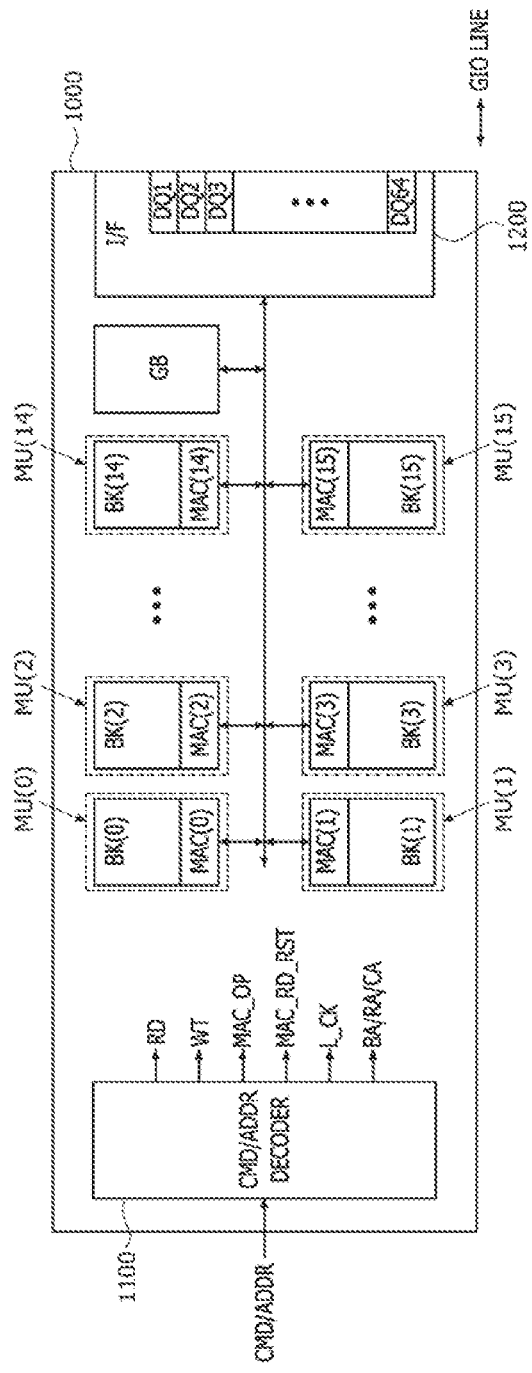
FIG. 31 illustrates a PIM device according to an embodiment of the present disclosure.

FIG. 31 illustrates a PIM device 1000 according to an embodiment of the present disclosure. Referring to FIG. 31, the PIM device 1000 may include a plurality of memory banks BKs, a global buffer GB, a plurality of MAC operators MACs, a command/address decoder 1100, and an interface

1200. In an embodiment, the plurality of memory banks BKs and the global buffer GB may be disposed in the first storage region and the second storage region constituting the data storage region 11 of the PIM device 10 illustrated in FIG. 1, respectively. The plurality of MAC operators MACs may constitute the arithmetic circuit 12 of the PIM device 10 illustrated in FIG. 1. In an embodiment, the number of the memory banks BKs may be equal to the number of the MAC operators MACs. In the following embodiment described hereinafter, it may be assumed that the PIM device 1000 includes first to sixteenth memory banks BK(0)-BK(15) and first to sixteenth MAC operators MAC(0)-MAC(15).

The first to sixteenth memory banks BK(0)-BK(15) may be allocated to respective ones of the first to sixteenth MAC operators MAC(0)-MAC(15), and one of the MAC operators MAC(0)-MAC(15) and one memory bank allocated to the one MAC operator may constitute a MAC unit (MU). Thus, the PIM device 1000 may include first to sixteenth MAC units MU(0)-MU(15). For example, the first memory bank BK(0) and the first MAC operator MAC(0) may constitute the first MAC unit MU(0), and the second memory bank BK(1) and the second MAC operator MAC(1) may constitute the second MAC unit MU(1). In addition, the third memory bank BK(2) and the third MAC operator MAC(2) may constitute the third MAC unit MU(2), and the fourth memory bank BK(3) and the fourth MAC operator MAC(3) may constitute the fourth MAC unit MU(3). Similarly, the fifteenth memory bank BK(14) and the fifteenth MAC operator MAC(14) may constitute the fifteenth MAC unit MU(14), and the sixteenth memory bank BK(15) and the sixteenth MAC operator MAC(15) may constitute the sixteenth MAC unit MU(15).

The first to sixteenth memory banks BK(0)-BK(15) may store weight data. The first to sixteenth memory banks BK(0)-BK(15) may output the weight data to the first to sixteenth MAC operators MAC(0)-MAC(15) for MAC arithmetic operations. In such a case, the first to sixteenth memory banks BK(0)-BK(15) may output first to sixteenth weight data to the first to sixteenth MAC operators MAC(0)-MAC(15), respectively. For example, the first memory bank BK(0) of the first MAC unit MU(0) may provide first weight data to the first MAC operator MAC(0) of the first MAC unit MU(0), and the second memory bank BK(1) of the second MAC unit MU(1) may provide second weight data to the second MAC operator MAC(1) of the second MAC unit MU(1). Similarly, the sixteenth memory bank BK(15) of the sixteenth MAC unit MU(15) may provide sixteenth weight data to the sixteenth MAC operator MAC(15) of the sixteenth MAC unit MU(15).

The global buffer GB may store vector data used for the MAC arithmetic operations. In this connection, the global buffer GB may receive the vector data from a host or a controller based on a request outputted from the host. The global buffer GB may provide the vector data to the first to sixteenth MAC operators MAC(0)-MAC(15) for the MAC arithmetic operations. In an embodiment, the vector data outputted from the global buffer GB may be transmitted to the first to sixteenth MAC operators MAC(0)-MAC(15) through a global I/O line GIO. The vector data outputted from the global buffer GB may be transmitted to each of the first to sixteenth MAC operators MAC(0)-MAC(15).

The command/address decoder 1100 may receive a command CMD and an address ADDR from the host or the controller. The command/address decoder 1100 may decode the command CMD and the address ADDR to generate and output control signals and address signals. The control signals outputted from the command/address decoder 1100 may include a read signal RD, a write signal WT, a MAC arithmetic operation signal MAC_OP, a MAC result read signal MAC_RD_RST, and a latch clock signal L_CK. The address signal outputted from the command/address decoder 1100 may include a bank/row/column address signal BA/RA/CA.

The read signal RD may control a data read operation for reading data out of the memory banks BK(0)-BK(15) and the global buffer GB. The write signal WT may control a data write operation for writing the data into the memory banks BK(0)-BK(15) and the global buffer GB. The MAC arithmetic operation signal MAC_OP may control a MAC read operation and a MAC arithmetic operation. The MAC read operation may be defined as an operation that the memory banks BK(0)-BK(15) and the global buffer GB transmit the weight data and the vector data to the MAC operators MAC(0)-MAC(15). The MAC arithmetic operation may be defined as an operation that is performed by the MAC operators MAC(0)-MAC(15) using the weight data and the vector data. The MAC result read signal MAC_RD_RST may control an operation for outputting MAC result data, which are generated by the MAC arithmetic operation of the MAC operators MAC(0)-MAC(15), from the MAC operators MAC(0)-MAC(15). The latch clock signal L_CK may control a latch operation performed in the MAC operators MAC(0)-MAC(15).

The interface 1200 may provide a data transmission path between the PIM device 1000 and the host (or the controller) coupled to the PIM device 1000. The data transmission path may include a plurality of data I/O circuits DQs. In the following embodiment described hereinafter, it may be assumed that the interface 1200 may include first to 64$^{th}$ data I/O circuits DQ1-DQ64. The interface 1200 may be coupled to the global I/O line GIO. In an embodiment, when a read operation of the memory banks BK(0)-BK(15) or the global buffer GB is performed, the interface 1200 may receive read data from the host (or the controller) through the first to 64$^{th}$ data I/O circuits DQ1-DQ64 and may transmit the read data to the memory banks BK(0)-BK(15) or the global buffer GB through the global I/O line GIO. In contrast, when a write operation of the memory banks BK(0)-BK(15) or the global buffer GB is performed, the interface 1200 may receive write data from the memory banks BK(0)-BK(15) or the global buffer GB through the global I/O line GIO and may output the write data to the host (or the controller) through the first to 64$^{th}$ data I/O circuits DQ1-DQ64. When an operation for outputting the MAC result data of the MAC operators MAC(0)-MAC(15) is performed, the interface 1200 may receive the MAC result data from the MAC operators MAC(0)-MAC(15) through the global I/O line GIO and may output the MAC result data to the host (or the controller) through the first to 64$^{th}$ data I/O circuits DQ1-DQ64.

Figure 32:
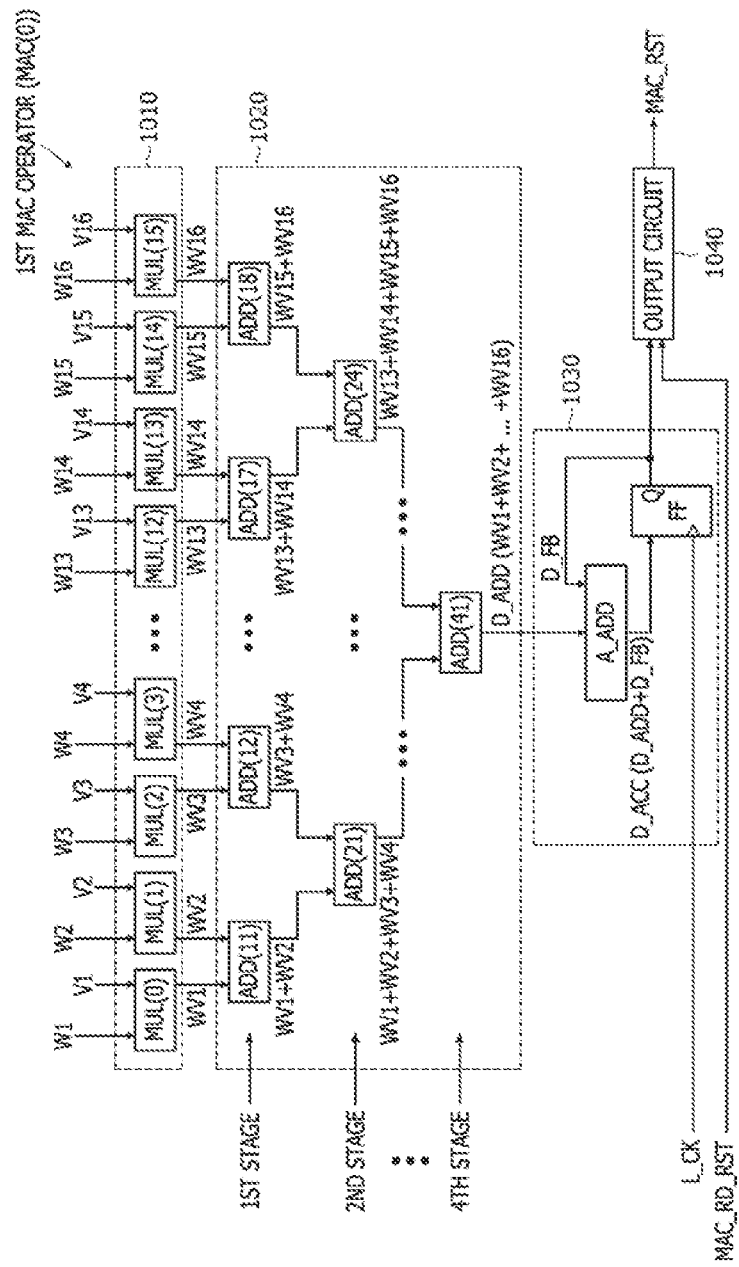
FIG. 32 illustrates an example of a configuration of a first MAC operator included in the PIM device illustrated in FIG. 31.

FIG. 32 illustrates an example of a configuration of the first MAC operator MAC(0) included in the PIM device 1000 illustrated in FIG. 31. The configuration of the first MAC operator MAC(0) illustrated in FIG. 32 may be equally applicable to each of the second to sixteenth MAC operators MAC(1)-MAC(15). Referring to FIG. 32, the first MAC operator MAC(0) may include a multiplying circuit 1010, an adder tree 1020, an accumulator 1030, and an output circuit 1040.

The multiplying circuit 1010 may include a plurality of multipliers MULs. The number of the multipliers MULs constituting the multiplying circuit 1010 may be determined according to a size of data which are processed by the MAC arithmetic operation of the first MAC operator MAC(0).

Hereinafter, it may be assumed that the multiplying circuit 1010 includes first to sixteenth multipliers MUL(0)-MUL(15). The multiplying circuit 1010 may receive weight data W1-W16 nd vector data V1-V16 from the first memory bank BK(0) and the global buffer GB and may output first to sixteenth multiplication result data WV1-WV16. The weight data W1-W16, that is, first to sixteenth weight data W1-W16 may be transmitted to the first to sixteenth multipliers MUL(0)-MUL(15), respectively. The vector data V1-V16, that is, first to sixteenth vector data V1-V16 may also be transmitted to the first to sixteenth multipliers MUL(0)-MUL(15), respectively.

The first multiplier MUL(0) may receive the first weight data W1 and the first vector data V1 to generate and output the first multiplication result data WV1. The second multiplier MUL(1) may receive the second weight data W2 and the second vector data V2 to generate and output the second multiplication result data WV2. The third multiplier MUL(2) may receive the third weight data W3 and the third vector data V3 to generate and output the third multiplication result data WV3. The fourth multiplier MUL(3) may receive the fourth weight data W4 and the fourth vector data V4 to generate and output the fourth multiplication result data WV4. Similarly, the thirteenth multiplier MUL(12) may receive the thirteenth weight data W13 and the thirteenth vector data V13 to generate and output the thirteenth multiplication result data WV13. The fourteenth multiplier MUL(13) may receive the fourteenth weight data W14 and the fourteenth vector data V14 to generate and output the fourteenth multiplication result data WV14. The fifteenth multiplier MUL(14) may receive the fifteenth weight data W15 and the fifteenth vector data V15 to generate and output the fifteenth multiplication result data WV15. The sixteenth multiplier MUL(15) may receive the sixteenth weight data W16 and the sixteenth vector data V16 to generate and output the sixteenth multiplication result data WV16. The remaining multipliers omitted in FIG. 32 may also operate in the same way as the multipliers described above.

The adder tree 1020 may include a plurality of adders ADDs which are arrayed to have a hierarchical structure, such as a tree structure. The adder tree 1020 may receive the first to sixteenth multiplication result data WV1-WV16 from the multiplying circuit 1010 and may generate and output addition result data D_ADD. In an embodiment, the adder tree 1020 may include half-adders. Alternatively, the adder tree 1020 may include full-adders. In the present embodiment, eight adders ADD(11)-ADD(18) may be disposed in a first stage located at a highest level of the adder tree 1020, and four adders ADD(21)-ADD(24) may be disposed in a second stage located at a second highest level of the adder tree 1020. Although not shown in FIG. 32, two adders may be disposed in a third stage located at a third highest level of the adder tree 1020, and one adder ADD(41) may be disposed in a fourth stage located at a lowest level of the adder tree 1020.

Each of the adders ADD(11)-ADD(18) disposed in the first stage of the adder tree 1020 may perform an adding calculation of two sets of multiplication result data which are outputted from two multipliers among the first to sixteenth multipliers MUL(0)-MUL(15), thereby generating and outputting added data. For example, the first adder ADD(11) in the first stage may perform an adding calculation of the first multiplication result data WV1 outputted from the first multiplier MUL(0) and the second multiplication result data WV2 outputted from the second multiplier MUL(1), thereby generating and outputting first added data WV1+WV2. In addition, the second adder ADD(12) in the first stage may perform an adding calculation of the third multiplication result data WV3 outputted from the third multiplier MUL(2) and the fourth multiplication result data WV4 outputted from the fourth multiplier MUL(3), thereby generating and outputting second added data WV3+WV4. Similarly, the seventh adder ADD(17) in the first stage may perform an adding calculation of the thirteenth multiplication result data WV13 outputted from the thirteenth multiplier MUL(12) and the fourteenth multiplication result data WV14 outputted from the fourteenth multiplier MUL(13), thereby generating and outputting seventh added data WV13+WV14, and the eighth adder ADD(18) in the first stage may perform an adding calculation of the fifteenth multiplication result data WV15 outputted from the fifteenth multiplier MUL(14) and the sixteenth multiplication result data WV16 outputted from the sixteenth multiplier MUL(15), thereby generating and outputting eighth added data WV15+WV16. The remaining adders in the first stage, which are omitted in FIG. 32, may also operate in the same way as the adders described above.

Each of the adders ADD(21)-ADD(24) disposed in the second stage may perform an adding calculation of two sets of added data which are outputted from two adders among the eight adders ADD(11)-ADD(18) disposed in the first stage, thereby generating and outputting added data. For example, the first adder ADD(21) disposed in the second stage may perform an adding calculation of the first added data WV1+WV2 outputted from the first adder ADD(11) of the first stage and the second added data WV3+WV4 outputted from the second adder ADD(12) of the first stage, thereby generating and outputting ninth added data WV1+WV2+WV3+WV4. Similarly, the fourth adder ADD(24) disposed in the second stage may perform an adding calculation of the seventh added data WV13+WV14 outputted from the seventh adder ADD(17) of the first stage and the eighth added data WV15+WV16 outputted from the eighth adder ADD(18) of the first stage, thereby generating and outputting tenth added data WV13+WV14+WV15+WV16. The remaining adders in the second stage, which are omitted in FIG. 32, may also operate in the same way as the adders described above.

Although not shown in FIG. 32, each of the adders disposed in the third stage of the adder tree 1020 may also perform the same operation as any one of the adders in the second stage of the adder tree 1020. The adder ADD(41) disposed in the fourth stage may perform an adding calculation of two sets of added data outputted from the two adders disposed in the third stage, thereby generating and outputting added data WV1+WV2+ . . . , +WV16 as the addition result data D_ADD. The addition result data D_ADD outputted from the adder ADD(41) in the fourth stage of the adder tree 1020 may be transmitted to the accumulator 1030.

The accumulator 1030 may perform an accumulative adding calculation for adding latched data in the accumulator 1030 to the addition result data D_ADD outputted from the adder tree 1020. The accumulator 1030 may include an accumulative adder A_ADD and a latch circuit FF. In an embodiment, the latch circuit FF may be realized using a flip-flop having a latch function. The accumulative adder A_ADD may receive the addition result data D_ADD which are transmitted from the adder tree 1020 to the accumulator 1030. In addition, the accumulative adder A_ADD may receive feedback data D_FB from the latch circuit FF. The accumulative adder A_ADD may add the feedback data D_FB to the addition result data D_ADD to generate and output accumulation result data D_ADD+D_FB as accumulated data D_ACC. The accumulated data D_ACC outputted from the accumulative adder A_ADD may be transmitted to an input terminal of the latch circuit FF.

The latch circuit FF may have an input terminal, a clock terminal, and an output terminal Q. The latch circuit FF may receive the accumulated data D_ACC from the accumulative adder A_ADD through the input terminal. The latch circuit FF may receive the latch clock signal L_CK from the command/address decoder (1100 of FIG. 31) through the clock terminal. The latch circuit FF may output latched data of the accumulated data D_ACC through the output terminal Q. Specifically, the latch circuit FF may be synchronized with a rising edge of the latch clock signal L_CK inputted to the clock terminal to latch the accumulated data D_ACC inputted to the input terminal and to output the latched data of the accumulated data D_ACC through the output terminal Q. The latched accumulated data D_ACC outputted through the output terminal Q of the latch circuit FF may be fed back to the accumulative adder A_ADD to act as the feedback data D_FB and may also be transmitted to the output circuit 1040.

The output circuit 1040 may have a first input terminal, a second input terminal, and an output terminal. The output circuit 1040 may receive the accumulated data D_ACC from the latch circuit FF of the accumulator 1030 through the first input terminal. The output circuit 1040 may receive the MAC result read signal MAC_RD_RST from the command/address decoder (1100 of FIG. 31) through the second input terminal. The output circuit 1040 may output the accumulated data D_ACC, which are received from the latch circuit FF of the accumulator 1030, as MAC result data MAC_RST through the output terminal in response to the MAC result read signal MAC_RD_RST. The MAC result data MAC_RST outputted from the output circuit 1040 may be transmitted to the host or the controller coupled to the PIM device 1000 through the global I/O line (GIO of FIG. 31) and the data I/O circuits (DQ1-DQ64 of FIG. 31) of the interface (1200 of FIG. 31). In another embodiment, the MAC result data MAC_RST outputted from the output circuit 1040 may be transmitted to the memory banks BK(0)-BK(15) or the global buffer GB through the global I/O line GIO.

Figure 33:
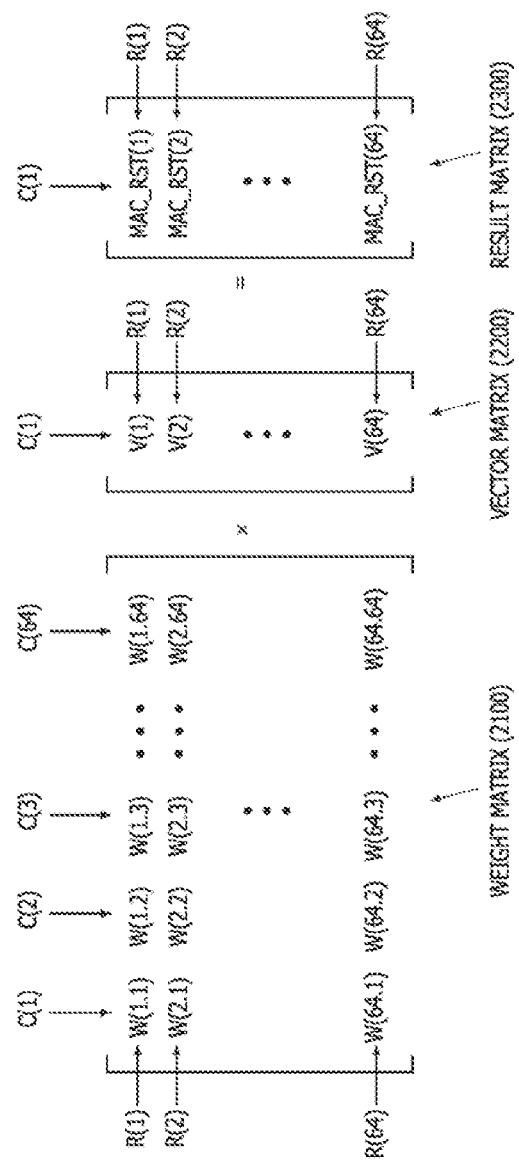
FIG. 33 illustrates an example of a matrix multiplying calculation executed by a MAC arithmetic operation of the PIM device illustrated in FIG. 31.

FIG. 33 illustrates an example of a matrix multiplying calculation executed by the MAC arithmetic operation of the PIM device 1000 illustrated in FIG. 31. Referring to FIG. 33, the PIM device 1000 may perform the matrix multiplying calculation of a 'M×N' weight matrix 2100 and a 'N×1' vector matrix 2200 (where, 'M' and 'N' are natural numbers which are equal to or greater than two). Hereinafter, the term "matrix multiplying calculation" may be construed as having the same meaning as the term "MAC arithmetic operation" or the term "MAC operation". The PIM device 1000 may perform the matrix multiplying calculation to generate and output a 'M×1' result matrix 2300. In the following embodiment described hereinafter, it may be assumed that the 'M×N' weight matrix 2100 has 64 rows (i.e., first to $64^{th}$ rows R(1)-R(64)) and 64 columns (i.e., first to $64^{th}$ columns C(1)-C(64)) and the 'N×1' vector matrix 2200 has 64 rows (i.e., first to $64^{th}$ rows R(1)-R(64)) and one column C(1). The result matrix 2300 generated by the matrix multiplying calculation of the weight matrix 2100 and the vector matrix 2200 may have 64 rows (i.e., first to $64^{th}$ rows R(1)-R(64)) and one column C(1). The weight matrix 2100 may have 4096 sets of weight data W(1.1)-W(1.64), . . . , and W(64.1)-W(64.64) as elements. The vector matrix 2200 may have 64 sets of vector data V(1)-V(64) as elements. The result matrix 2300 generated by the MAC arithmetic operation may have 64 sets of MAC result data MAC_RST(1)-MAC_RST(64) as elements. The first to sixteenth MAC operators MAC(0)-MAC(15) of the PIM device 1000 may perform the MAC arithmetic operation of the weight data W(1.1)-W(1.64), . . . , and W(64.1)-W(64.64) and the vector data V(1)-V(64) to generate and output the first to $64^{th}$ sets of MAC result data MAC_RST(1)-MAC_RST(64) (also, referred to as first to $64^{th}$ MAC result data MAC_RST(1)-MAC_RST(64)).

According to the present embodiment, the weight data of the weight matrix 2100 may be stored into the memory banks BKs using a specific way. Specifically, when the number of the rows of the weight matrix 2100 is "M", the number of the memory banks BKs is "L", and "i" is one of 0, 1, . . . , and ((M/L)−1), the sets of weight data in a $(iL+1)^{th}$ row, a $(iL+2)^{th}$ row, a $(iL+3)^{th}$ row, . . . , and a $(iL+L)^{th}$ row may be stored in respective ones of the first to $L^{th}$ memory banks BK(0)-BK(L−1). According to the above storage way, all of the weight data arrayed in one row of the weight matrix 2100 may be stored in one of the memory banks. That is, when "j" is one of iL+1, iL+2, iL+3, . . . , and iL+(L−1), and iL+L, the weight data arrayed in the $j^{th}$ row R(j) of the weight matrix 2100 may be stored in the $(j−iL)^{th}$ memory bank BK(j−1). In the PIM device 1000 of FIG. 31 performing the matrix multiplying calculation of FIG. 33, the number "L" of the memory banks BKs is 16 and the number "M" of the rows of the weight matrix 2100 is 64. Thus, "i" may be one of 0, 1, 2, and 3. Accordingly, "j" may be one of 1, . . . , and 16 when "i" is zero, "j" may be one of 17, . . . , and 32 when "i" is one, "j" may be one of 33, . . . , and 48 when "i" is two, and "j" may be one of 49, . . . , and 64 when "i" is three. For example, when "i" is zero and "j" is 17, the weight data in the seventeenth row R(17) of the weight matrix 2100 may be stored in the first memory bank BK(0). In addition, when "i" is zero and "j" is 18, the weight data in the eighteenth row R(18) of the weight matrix 2100 may be stored in the second memory bank BK(1). Moreover, when "i" is zero and "j" is 32, the weight data in the $32^{nd}$ row R(32) of the weight matrix 2100 may be stored in the sixteenth memory bank BK(15). Even in the case that "i" is any one of 1, 2, and 3, the same storage way as described above may be applied.

Figure 34:
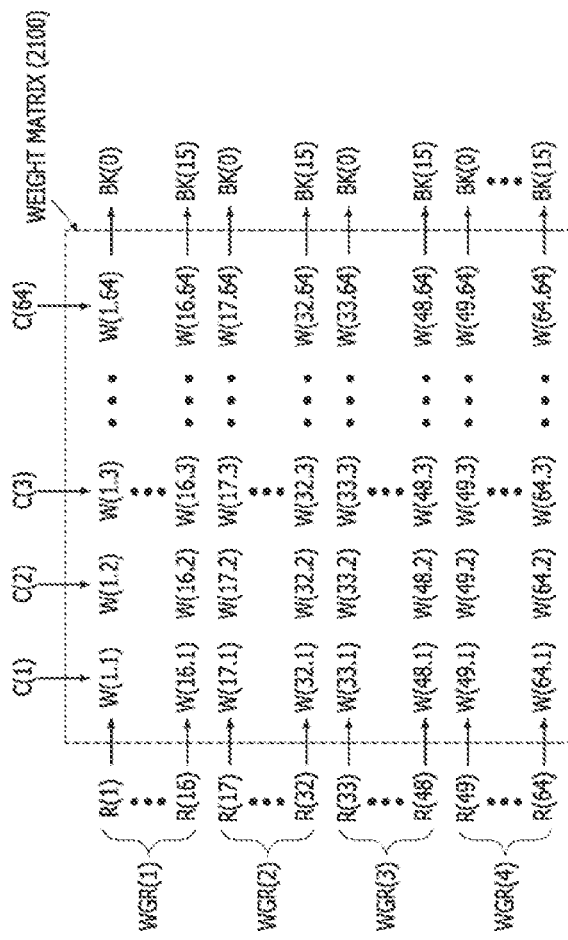
FIG. 34 illustrates an example of a process for storing weight data of a weight matrix shown in FIG. 33 into memory banks.
Figure 35:
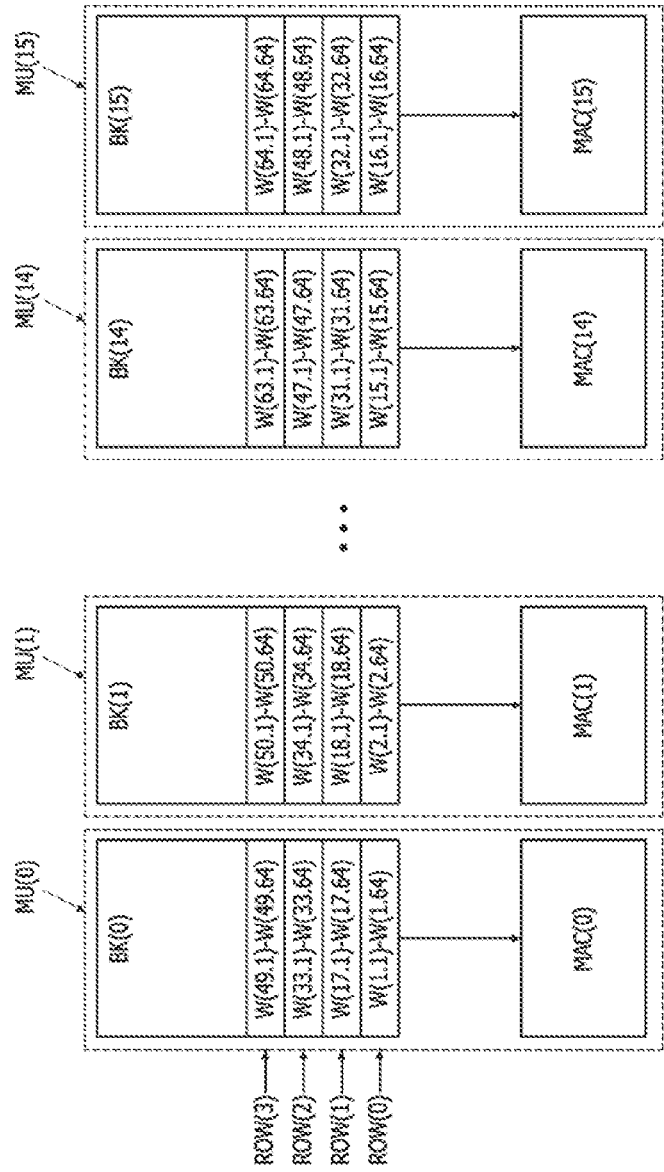
FIG. 35 illustrates an example of a state of memory banks including weight data which are stored by the process described with reference to FIG. 34.

FIG. 34 illustrates an example of a process for storing the weight data of the weight matrix 2100 shown in FIG. 33 into the memory banks BK(0)-BK(15), and FIG. 35 illustrates an example of a state of the memory banks BK(0)-BK(15) including the weight data which are stored by the process described with reference to FIG. 34. First, referring to FIG. 34, the weight data W(1.1)-W(1.64), . . . , and W(64.1)-W(64.64) transmitted from a host (or a controller) to the PIM device 1000 may be sequentially stored into the first to sixteenth memory banks BK(0)-BK(15) in units of rows of the weight matrix 2100 and in sequence from the first row R(1) to the $64^{th}$ row R(64) of the weight matrix 2100. The process for storing the weight data W(1.1)-W(1.64), . . . , and W(64.1)-W(64.64) into the memory banks BKs may be performed by the write signal WT and the bank/row/column address signal BS/RS/CS which are generated by the command/address decoder (1100 of FIG. 31) according to a write request of the host or the controller.

In the present embodiment, the weight matrix 2100 has 64 rows (i.e., the first to $64^{th}$ rows R(1)-R(64)) and the PIM device 1000 has 16 memory banks (i.e., the first to sixteenth memory banks BK(0)-BK(15)) because the number "M" of the rows of the weight matrix 2100 is set to be 64 and the number "L" of the memory banks BKs is set to be 16. Thus, each of the first to sixteenth memory banks BK(0)-BK(15)

may store the weight data arrayed in four rows of the weight matrix 2100. When "i" is zero, the weight data W(1.1)-W(1.64), . . . , and W(16.1)-W(16.64) arrayed in the first to sixteenth rows R(1)-R(16) of the weight matrix 2100 may be stored in respective ones of the first to sixteenth memory banks BK(0)-BK(15) in units of rows. Specifically, the weight data W(1.1)-W(1.64) arrayed in the first row R(1) of the weight matrix 2100 may be stored in the first memory bank BK(0). Although not shown in FIG. 34, the weight data W(2.1)-W(2.64), . . . , and W(15.1)-W(15.64) arrayed in the second to fifteenth rows R(2)-R(15) of the weight matrix 2100 may be stored in respective ones of the second to fifteenth memory banks BK(1)-BK(14) in units of rows. In addition, the weight data W(16.1)-W(16.64) arrayed in the sixteenth row R(16) of the weight matrix 2100 may be stored in the sixteenth memory bank BK(15). If the weight data W(1.1)-W(1.64), . . . , and W(16.1)-W(16.64) arrayed in the first to sixteenth rows R(1)-R(16) of the weight matrix 2100 are stored in respective ones of the first to sixteenth memory banks BK(0)-BK(15) in units of rows and "i" has a value of "1", the weight data W(17.1)-W(17.64), . . . , and W(32.1)-W(32.64) arrayed in the seventeenth to $32^{nd}$ rows R(17)-R(32) of the weight matrix 2100 may also be stored in respective ones of the first to sixteenth memory banks BK(0)-BK(15) in units of rows. That is, the weight data W(17.1)-W(17.64) arrayed in the seventeenth row R(17) of the weight matrix 2100 may be stored in the first memory bank BK(0). Similarly, the weight data W(32.1)-W(32.64) arrayed in the $32^{nd}$ row R(32) of the weight matrix 2100 may be stored in the sixteenth memory bank BK(15).

If the weight data W(17.1)-W(17.64), . . . , and W(32.1)-W(32.64) arrayed in the seventeenth to $32^{nd}$ rows R(17)-R(32) of the weight matrix 2100 are stored in respective ones of the first to sixteenth memory banks BK(0)-BK(15) in units of rows and "i" has a value of "2", the weight data W(33.1)-W(33.64), . . . , and W(48.1)-W(48.64) arrayed in the $33^{rd}$ to $48^{th}$ rows R(33)-R(48) of the weight matrix 2100 may also be stored in respective ones of the first to sixteenth memory banks BK(0)-BK(15) in units of rows. That is, the weight data W(33.1)-W(33.64) arrayed in the $33^{rd}$ row R(33) of the weight matrix 2100 may be stored in the first memory bank BK(0). Similarly, the weight data W(48.1)-W(48.64) arrayed in the $48^{th}$ row R(48) of the weight matrix 2100 may be stored in the sixteenth memory bank BK(15).

If the weight data W(33.1)-W(33.64), . . . , and W(48.1)-W(48.64) arrayed in the $33^{rd}$ to $48^{th}$ rows R(33)-R(48) of the weight matrix 2100 are stored in respective ones of the first to sixteenth memory banks BK(0)-BK(15) in units of rows and "i" has a value of "3", the weight data W(49.1)-W(49.64), . . . , and W(64.1)-W(64.64) arrayed in the $49^{th}$ to $64^{th}$ rows R(49)-R(64) of the weight matrix 2100 may also be stored in respective ones of the first to sixteenth memory banks BK(0)-BK(15) in units of rows. That is, the weight data W(49.1)-W(49.64) arrayed in the $49^{th}$ row R(49) of the weight matrix 2100 may be stored in the first memory bank BK(0). Similarly, the weight data W(64.1)-W(64.64) arrayed in the $64^{th}$ row R(64) of the weight matrix 2100 may be stored in the sixteenth memory bank BK(15).

As described above, the process for storing the weight data W(1.1)-W(1.64), . . . , and W(64.1)-W(64.64) of the weight matrix 2100 into the memory banks BK(0)-BK(15) may be performed by four steps (i.e., first to fourth storage steps), each of which is executed whenever "i" has one of the values 0, 1, 2, and 3. Hereinafter, for the purpose of ease and convenience in explanation, the first to sixteenth rows R(1)-R(16) of the weight matrix 2100 having the weight data stored into the first to sixteenth memory banks BK(0)-BK(15) during the first storage step will be referred to as a first weight group row WGR(1). In addition, the seventeenth to $32^{nd}$ rows R(17)-R(32) of the weight matrix 2100 having the weight data stored into the first to sixteenth memory banks BK(0)-BK(15) during the second storage step will be referred to as a second weight group row WGR(2) hereinafter. Moreover, the $33^{rd}$ to $48^{th}$ rows R(33)-R(48) of the weight matrix 2100 having the weight data stored into the first to sixteenth memory banks BK(0)-BK(15) during the third storage step will be referred to as a third weight group row WGR(3) hereinafter. Furthermore, the $49^{th}$ to $64^{th}$ rows R(49)-R(64) of the weight matrix 2100 having the weight data stored into the first to sixteenth memory banks BK(0)-BK(15) during the fourth storage step will be referred to as a fourth weight group row WGR(4) hereinafter.

Referring to FIG. 35, the weight data W(1.1)-W(1.64) arrayed in the first row R(1) of the weight matrix 2100 may be stored in a first row ROW(0) of the first memory bank BK(0). The weight data W(17.1)-W(17.64) arrayed in the seventeenth row R(17) of the weight matrix 2100 may be stored in a second row ROW(1) of the first memory bank BK(0). The weight data W(33.1)-W(33.64) arrayed in the $33^{rd}$ row R(33) of the weight matrix 2100 may be stored in a third row ROW(2) of the first memory bank BK(0). The weight data W(49.1)-W(49.64) arrayed in the $49^{th}$ row R(49) of the weight matrix 2100 may be stored in a fourth row ROW(3) of the first memory bank BK(0). The weight data stored in the first memory bank BK(0) may be transmitted to the first MAC operator MAC(0) included in the first MAC unit MU(0) during the MAC arithmetic operation of the PIM device 1000.

The weight data W(2.1)-W(2.64) arrayed in the second row R(2) of the weight matrix 2100 may be stored in the first row ROW(0) of the second memory bank BK(1). The weight data W(18.1)-W(18.64) arrayed in the eighteenth row R(18) of the weight matrix 2100 may be stored in the second row ROW(1) of the second memory bank BK(1). The weight data W(34.1)-W(34.64) arrayed in the $34^{th}$ row R(34) of the weight matrix 2100 may be stored in the third row ROW(2) of the second memory bank BK(1). The weight data W(50.1)-W(50.64) arrayed in the $50^{th}$ row R(50) of the weight matrix 2100 may be stored in the fourth row ROW(3) of the second memory bank BK(1). The weight data stored in the second memory bank BK(1) may be transmitted to the second MAC operator MAC(1) included in the second MAC unit MU(1) during the MAC arithmetic operation of the PIM device 1000.

Similarly, the weight data W(15.1)-W(15.64) arrayed in the fifteenth row R(15) of the weight matrix 2100 may be stored in the first row ROW(0) of the fifteenth memory bank BK(14). The weight data W(31.1)-W(31.64) arrayed in the $31^{st}$ row R(31) of the weight matrix 2100 may be stored in the second row ROW(1) of the fifteenth memory bank BK(14). The weight data W(47.1)-W(47.64) arrayed in the $47^{th}$ row R(47) of the weight matrix 2100 may be stored in the third row ROW(2) of the fifteenth memory bank BK(14). The weight data W(63.1)-W(63.64) arrayed in the $63^{rd}$ row R(63) of the weight matrix 2100 may be stored in the fourth row ROW(3) of the fifteenth memory bank BK(14). The weight data stored in the fifteenth memory bank BK(14) may be transmitted to the fifteenth MAC operator MAC(14) included in the fifteenth MAC unit MU(14) during the MAC arithmetic operation of the PIM device 1000.

Moreover, the weight data W(16.1)-W(16.64) arrayed in the sixteenth row R(16) of the weight matrix 2100 may be stored in the first row ROW(0) of the sixteenth memory bank BK(15). The weight data W(32.1)-W(32.64) arrayed in the 32$^{nd}$ row R(32) of the weight matrix 2100 may be stored in the second row ROW(1) of the sixteenth memory bank BK(15). The weight data W(48.1)-W(48.64) arrayed in the 48$^{th}$ row R(48) of the weight matrix 2100 may be stored in the third row ROW(2) of the sixteenth memory bank BK(15). The weight data W(64.1)-W(64.64) arrayed in the 64$^{th}$ row R(64) of the weight matrix 2100 may be stored in the fourth row ROW(3) of the sixteenth memory bank BK(15). The weight data stored in the sixteenth memory bank BK(15) may be transmitted to the sixteenth MAC operator MAC(15) included in the sixteenth MAC unit MU(15) during the MAC arithmetic operation of the PIM device 1000.

Figure 36:
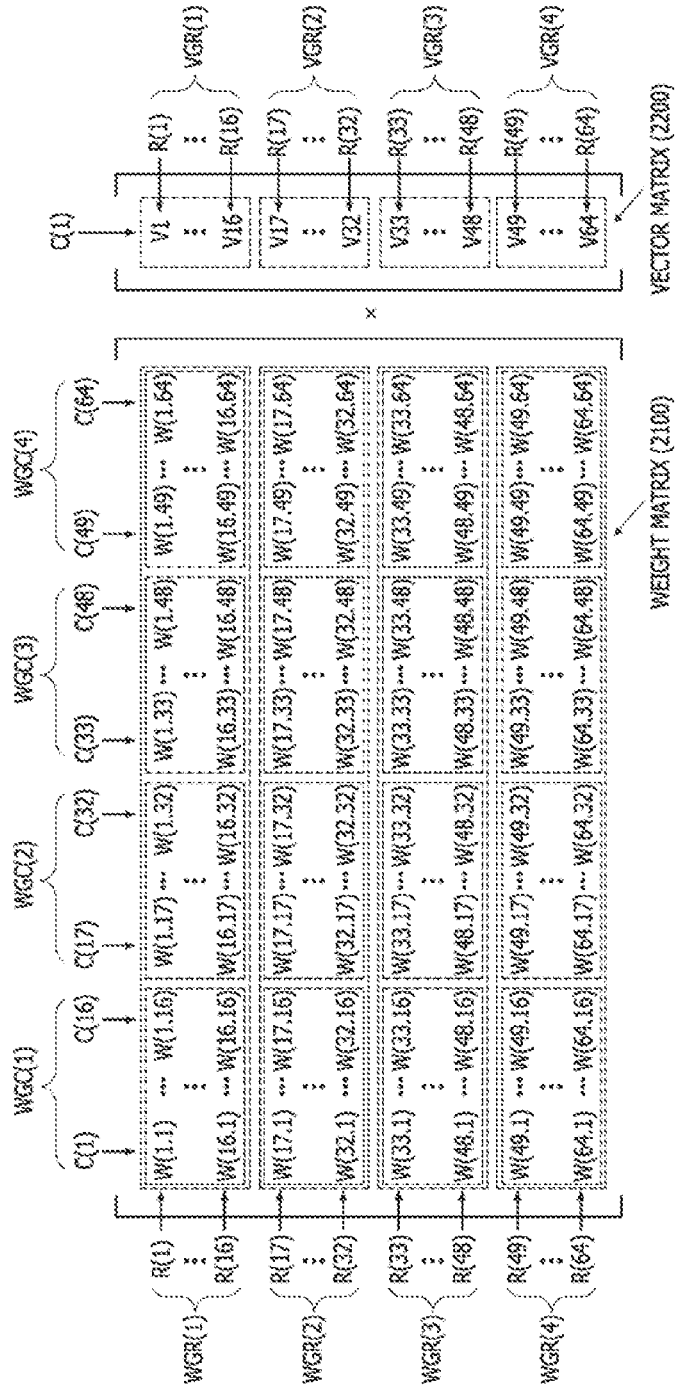
FIG. 36 illustrates a MAC arithmetic operation of FIG. 33 performed by the PIM device illustrated in FIG. 31.

FIG. 36 illustrates the MAC arithmetic operation of FIG. 33 performed by the PIM device 1000 illustrated in FIG. 31. Referring to FIG. 36, the MAC arithmetic operation of FIG. 33 may be performed in parallel by the first to sixteenth MAC operators MAC(0)-MAC(15). Specifically, the first to sixteenth MAC operators MAC(0)-MAC(15) may perform in parallel a first MAC arithmetic operation of the weight data W(1.1)-W(1.64), . . . , W(16.1)-W(16.64) arrayed in the first to sixteenth rows R(1)-R(16) (i.e., the first weight group row WGR(1)) of the weight matrix 2100 and the vector data V(1)-V(64) of the vector matrix 2200. The first to sixteenth MAC operators MAC(0)-MAC(15) may output the first to sixteenth MAC result data MAC_RST(1)-MAC_RST(16) as a result of the first MAC arithmetic operation, respectively. Next, the first to sixteenth MAC operators MAC(0)-MAC (15) may perform in parallel a second MAC arithmetic operation of the weight data W(17.1)-W(17.64), . . . , W(32.1)-W(32.64) arrayed in the seventeenth to 32$^{nd}$ rows R(17)-R(32) (i.e., the second weight group row WGR(2)) of the weight matrix 2100 and the vector data V(1)-V(64) of the vector matrix 2200. The first to sixteenth MAC operators MAC(0)-MAC(15) may output the seventeenth to 32$^{nd}$ MAC result data MAC_RST(17)-MAC_RST(32) as a result of the second MAC arithmetic operation, respectively.

Next, the first to sixteenth MAC operators MAC(0)-MAC (15) may perform in parallel a third MAC arithmetic operation of the weight data W(33.1)-W(33.64), . . . , W(48.1)-W(48.64) arrayed in the 33$^{rd}$ to 48$^{th}$ rows R(33)-R(48) (i.e., the third weight group row WGR(3)) of the weight matrix 2100 and the vector data V(1)-V(64) of the vector matrix 2200. The first to sixteenth MAC operators MAC(0)-MAC (15) may output the 33$^{rd}$ to 48$^{th}$ MAC result data MAC_RST (33)-MAC_RST(48) as a result of the third MAC arithmetic operation. Subsequently, the first to sixteenth MAC operators MAC(0)-MAC(15) may perform in parallel a fourth MAC arithmetic operation of the weight data W(49.1)-W (49.64), . . . , W(64.1)-W(64.64) arrayed in the 49$^{th}$ to 64$^{th}$ rows R(49)-R(64) (i.e., the fourth weight group row WGR (4)) of the weight matrix 2100 and the vector data V(1)-V (64) of the vector matrix 2200. The first to sixteenth MAC operators MAC(0)-MAC(15) may output the 49$^{th}$ to 64$^{th}$ MAC result data MAC_RST(49)-MAC_RST(64) as a result of the fourth MAC arithmetic operation.

As described above, the MAC arithmetic operation of the weight data arrayed in the first to 64$^{th}$ rows of the weight matrix 2100 and the vector data arrayed in the vector matrix 2200 may be performed by the first to fourth MAC arithmetic operations which are sequentially executed for the first to fourth weight group rows WGR(1)-WGR(4). In addition, 16 sets of MAC result data MAC_RSTs may be generated by and outputted from the first to sixteenth MAC operators MAC(0)-MAC(15) whenever each of the first to fourth MAC arithmetic operations is executed. That is, 16 sets of MAC result data MAC_RSTs may be outputted from the first to sixteenth MAC operators MAC(0)-MAC(15) four times during the first to fourth MAC arithmetic operations. Thus, 64 sets of MAC result data MAC_RSTs (i.e., the first to 64th MAC result data MAC_RST(1)-MAC_RST(64)) may be outputted during the first to fourth MAC arithmetic operations. Meanwhile, as described with reference to FIG. 32, each of the first to sixteenth MAC operators MAC(0)-MAC(15) includes 16 multipliers (i.e., the first to sixteenth multipliers MUL(0)-MUL(15)). Thus, each of the first to sixteenth MAC operators MAC(0)-MAC(15) may be able to process only 16 sets of weight data and 16 sets of vector data at a time. Accordingly, because each of the rows of the weight matrix 2100 has 64 sets of weight data (i.e., first to 64$^{th}$ sets of weight data), each of the first to fourth MAC arithmetic operations may perform a MAC arithmetic operation for all of the weight data arrayed in one row of the weight matrix 2100 by executing a sub-MAC arithmetic operation for the 16 sets of weight data four times.

Specifically, the first MAC arithmetic operation for the first weight group row WGR(1) of the weight matrix 2100 may be performed by sequentially executing first to fourth sub-MAC arithmetic operations for the first weight group row WGR(1). The second arithmetic operation for the second weight group row WGR(2) of the weight matrix 2100 may be performed by sequentially executing first to fourth sub-MAC arithmetic operations for the second weight group row WGR(2). The third arithmetic operation for the third weight group row WGR(3) of the weight matrix 2100 may be performed by sequentially executing first to fourth sub-MAC arithmetic operations for the third weight group row WGR(3). The fourth arithmetic operation for the fourth weight group row WGR(4) of the weight matrix 2100 may be performed by sequentially executing first to fourth sub-MAC arithmetic operations for the fourth weight group row WGR(4).

Because 16 sets of weight data and 16 sets of vector data are processed by each of the sub-MAC arithmetic operations processes at a time, each of the first to fourth sub-MAC arithmetic operations may be performed for the 16 sets of weight data and the 16 sets of vector data. Specifically, the first sub-MAC arithmetic operation of the first MAC arithmetic operation may be performed using the weight data W(1.1)-W(1.16), . . . , and W(16.1)-W(16.16) arrayed in first to sixteenth columns C(1)-C(16) of the first weight group row WGR(1) and the vector data V(1)-V(16) arrayed in the first to sixteenth rows R(1)-R(16) of the vector matrix 2200 as input data of the first sub-MAC arithmetic operation. Hereinafter, for the purpose of ease and convenience in explanation, the first to sixteenth columns C(1)-C(16) of the weight matrix 2100 will be referred to as a first weight group column WGC(1), and the first to sixteenth rows R(1)-R(16) of the vector matrix 2200 will be referred to as a first vector group row VGR(1). The second sub-MAC arithmetic operation of the first MAC arithmetic operation may be performed using the weight data W(1.17)-W(1.32), . . . , and W(16.17)-W(16.32) arrayed in seventeenth to 32$^{nd}$ columns C(17)-C (32) of the first weight group row WGR(1) and the vector data V(17)-V(32) arrayed in the seventeenth to 32$^{nd}$ rows R(17)-R(32) of the vector matrix 2200 as input data of the second sub-MAC arithmetic operation. Hereinafter, for the purpose of ease and convenience in explanation, the seventeenth to 32$^{nd}$ columns C(17)-C(32) of the weight matrix 2100 will be referred to as a second weight group column WGC(2), and the seventeenth to 32$^{nd}$ rows R(17)-R(32) of the vector matrix 2200 will be referred to as a second vector group row VGR(2).

The third sub-MAC arithmetic operation of the first MAC arithmetic operation may be performed using the weight data W(1.33)-W(1.48), . . . , and W(16.33)-W(16.48) arrayed in $33^{rd}$ to $48^{th}$ columns C(33)-C(48) of the first weight group row WGR(1) and the vector data V(33)-V(48) arrayed in the $33^{rd}$ to $48^{th}$ rows R(33)-R(48) of the vector matrix 2200 as input data of the third sub-MAC arithmetic operation. Hereinafter, for the purpose of ease and convenience in explanation, the $33^{rd}$ to $48^{th}$ columns C(33)-C(48) of the weight matrix 2100 will be referred to as a third weight group column WGC(3), and the $33^{rd}$ to $48^{th}$ rows R(33)-R(48) of the vector matrix 2200 will be referred to as a third vector group row VGR(3). The fourth sub-MAC arithmetic operation of the first MAC arithmetic operation may be performed using the weight data W(1.49)-W(1.64), . . . , and W(16.49)-W(16.64) arrayed in $49^{th}$ to $64^{th}$ columns C(49)-C(64) of the first weight group row WGR(1) and the vector data V(49)-V(64) arrayed in the $49^{th}$ to $64^{th}$ rows R(49)-R(64) of the vector matrix 2200 as input data of the fourth sub-MAC arithmetic operation. Hereinafter, for the purpose of ease and convenience in explanation, the $49^{th}$ to $64^{th}$ columns C(49)-C(64) of the weight matrix 2100 will be referred to as a fourth weight group column WGC(4), and the $49^{th}$ to $64^{th}$ rows R(49)-R(64) of the vector matrix 2200 will be referred to as a fourth vector group row VGR(4).

The first sub-MAC arithmetic operation of the second MAC arithmetic operation for the second weight group row WGR(2) may be performed using the weight data in the first weight group column WGC(1) of the second weight group row WGR(2) and the vector data in the first vector group row VGR(1) as input data. The second sub-MAC arithmetic operation of the second MAC arithmetic operation may be performed using the weight data in the second weight group column WGC(2) of the second weight group row WGR(2) and the vector data in the second vector group row VGR(2) as input data. The third sub-MAC arithmetic operation of the second MAC arithmetic operation may be performed using the weight data in the third weight group column WGC(3) of the second weight group row WGR(2) and the vector data in the third vector group row VGR(3) as input data. The fourth sub-MAC arithmetic operation of the second MAC arithmetic operation may be performed using the weight data in the fourth weight group column WGC(4) of the second weight group row WGR(2) and the vector data in the fourth vector group row VGR(4) as input data. The third MAC arithmetic operation for the third weight group row WGR(3) may also be performed by sequentially executing the first to fourth sub-MAC arithmetic operations using a way similar to the above description. In addition, the fourth MAC arithmetic operation for the fourth weight group row WGR(4) may also be performed by sequentially executing the first to fourth sub-MAC arithmetic operations using a way similar to the above description.

Figure 37:
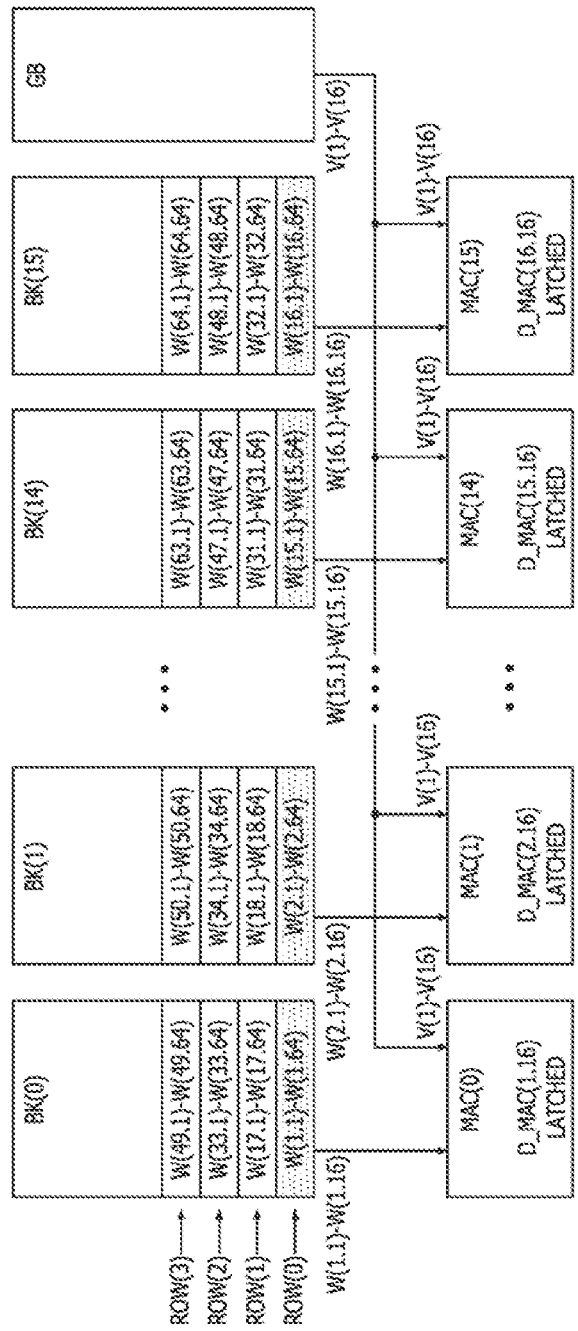
FIG. 37 illustrates a process for supplying weight data and vector data during a first sub-MAC arithmetic operation of a first MAC arithmetic operation performed by the PIM device illustrated in FIG. 31.
Figure 38:
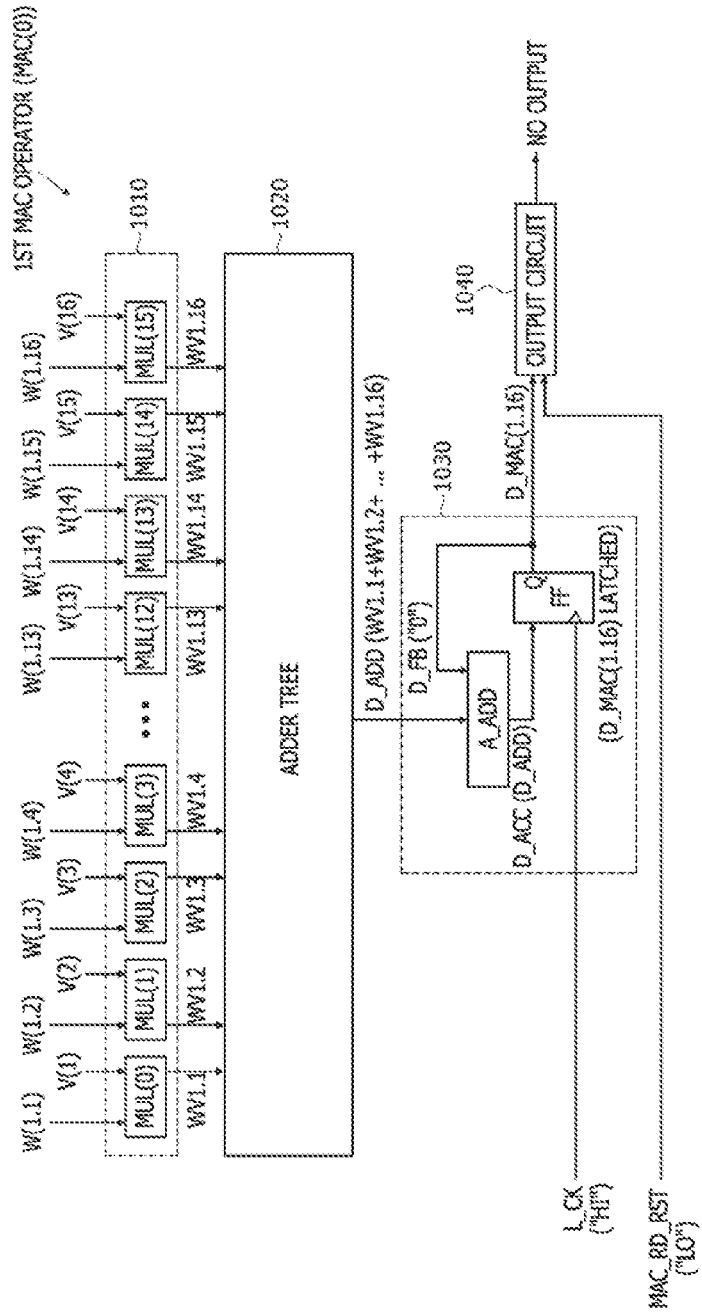
FIG. 38 illustrates a first sub-MAC arithmetic operation of a first MAC operator illustrated in FIG. 37.

FIGS. 37 and 38 illustrate the first sub-MAC arithmetic operation of the first MAC arithmetic operation of the PIM device 1000 illustrated in FIG. 31. Specifically, FIG. 37 illustrates a process for supplying the weight data and the vector data during the first sub-MAC arithmetic operation of the first MAC arithmetic operation performed by the PIM device 1000, and FIG. 38 illustrates the first sub-MAC arithmetic operation of the first MAC operator MAC(0). In FIG. 38, the same reference numerals or the same reference symbols as used in FIG. 32 denote the same elements. In FIG. 38, the adders of the adder tree 1020 are not illustrated.

Referring to FIG. 37, the first memory bank BK(0) may transmit the weight data W(1.1)-W(1.16), which are located at a cross position of the first row R(1) of the first weight group row WGR(1) and the first weight group column WGC(1), to the first MAC operator MAC(0). The second memory bank BK(1) may transmit the weight data W(2.1)-W(2.16), which are located at a cross position of the second row R(2) of the first weight group row WGR(1) and the first weight group column WGC(1), to the second MAC operator MAC(1). Similarly, the fifteenth memory bank BK(14) may transmit the weight data W(15.1)-W(15.16), which are located at a cross position of the fifteenth row R(15) of the first weight group row WGR(1) and the first weight group column WGC(1), to the fifteenth MAC operator MAC(14). In addition, the sixteenth memory bank BK(15) may transmit the weight data W(16.1)-W(16.16), which are located at a cross position of the sixteenth row R(16) of the first weight group row WGR(1) and the first weight group column WGC(1), to the sixteenth MAC operator MAC(15). The global buffer GB may transmit the vector data V(1)-V(16) in the first vector group row VGR(1) to each of the first to sixteenth MAC operators MAC(0)-MAC(15).

Referring to FIG. 38, the first to sixteenth multipliers MUL(0)-MUL(15) included in the multiplying circuit 1010 of the first MAC operator MAC(0) may perform a multiplying calculation of the weight data W(1.1)-W(1.16) and the vector data V(1)-V(16) to generate and output the first to sixteenth multiplication result data WV1.1-WV1.16 to the adder tree 1020. The adder tree 1020 may add all of the first to sixteenth multiplication result data WV1.1-WV1.16 to output the added data WV1.1+WV1.2+ . . . +WV1.16 as the addition result data D_ADD. The accumulative adder A_ADD of the accumulator 1030 may add the feedback data D_FB outputted from the latch circuit FF to the addition result data D_ADD outputted from the adder tree 1020, thereby generating and outputting the accumulation result data D_ADD+D_FB as the accumulated data D_ACC. The latch circuit FF may have an initialized state, and the feedback data D_FB inputted to the accumulative adder A_ADD may have a value of zero. Thus, the accumulative adder A_ADD may output the addition result data D_ADD (i.e., a total sum of the first to sixteenth multiplication result data WV1.1-WV1.16) received from the adder tree 1020 as the accumulated data D_ACC. The latch circuit FF may be synchronized with the latch clock signal L_CK having a logic "high(HI)" level to latch the accumulated data D_ACC. Hereinafter, for the purpose of ease and convenience in explanation, the accumulated data D_ACC latched by the latch circuit FF during the first sub-MAC arithmetic operation of the first MAC arithmetic operation will be referred to as MAC data D_MAC(1.16) of the first row and the sixteenth column. The latch circuit FF may output the MAC data D_MAC(1.16) to the accumulative adder A_ADD and the output circuit 1040 through the output terminal Q. In such a case, the MAC result read signal MAC_RD_RST may keep a first logic level, for example, a logic "low(LO)" level. Thus, the MAC data D_MAC(1.16) are not outputted from the output circuit 1040.

Referring again to FIG. 37, an arithmetic operation of the first MAC operator MAC(0) described with reference to FIG. 38 may be equally applied to each of the second to sixteenth MAC operators MAC(1)-MAC(15) except the weight data used as the input data of the MAC arithmetic operation. Accordingly, MAC data D_MAC(2.16) of the second row and the sixteenth column may be latched in a latch circuit of an accumulator included in the second MAC operator MAC(1) by the first sub-MAC arithmetic operation of the first MAC arithmetic operation. The MAC data D_MAC(2.16) of the second row and the sixteenth column may be the same as a total sum of first to sixteenth multiplication result data which are generated by a multiplying circuit of the second MAC operator MAC(1). Similarly, MAC data D_MAC(15.16) of the fifteenth row and the sixteenth column may be latched in a latch circuit of an accumulator included in the fifteenth MAC operator MAC (14) by the first sub-MAC arithmetic operation of the first MAC arithmetic operation. The MAC data D_MAC(15.16) of the fifteenth row and the sixteenth column may be the same as a total sum of first to sixteenth multiplication result data which are generated by a multiplying circuit of the fifteenth MAC operator MAC(14). In addition, MAC data D_MAC(16.16) of the sixteenth row and the sixteenth column may be latched in a latch circuit of an accumulator included in the sixteenth MAC operator MAC(15) by the first sub-MAC arithmetic operation of the first MAC arithmetic operation. The MAC data D_MAC(16.16) of the sixteenth row and the sixteenth column may be the same as a total sum of first to sixteenth multiplication result data which are generated by a multiplying circuit of the sixteenth MAC operator MAC(15).

Figure 39:
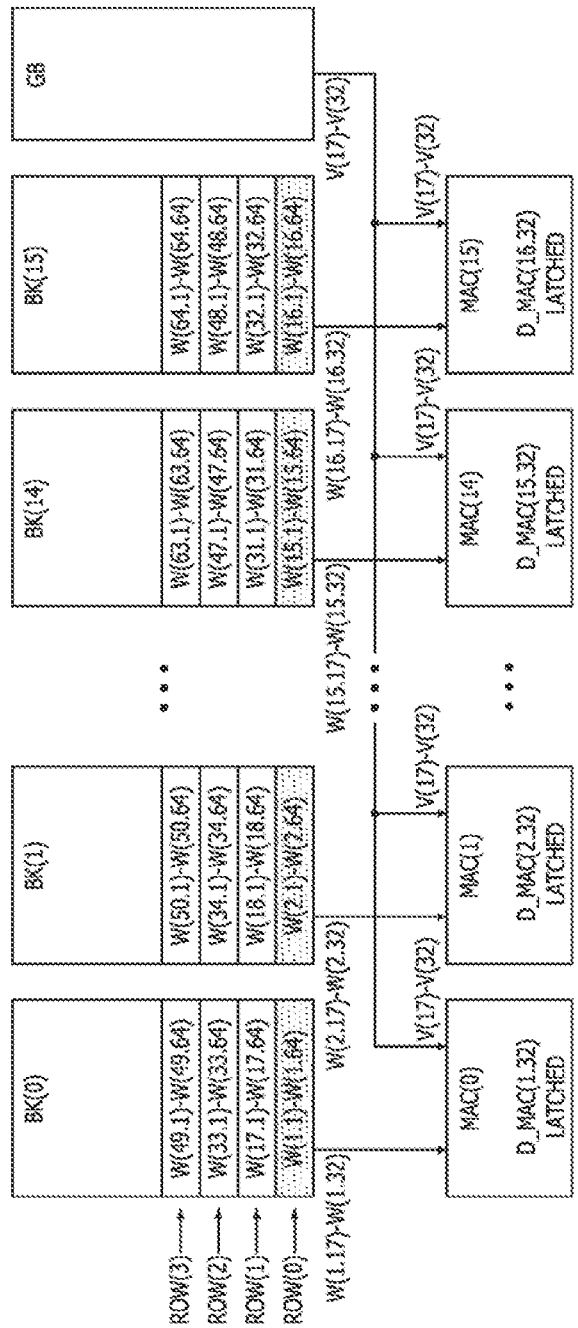
FIG. 39 illustrates a process for supplying weight data and vector data during a second sub-MAC arithmetic operation of a first MAC arithmetic operation performed by the PIM device illustrated in FIG. 31.
Figure 40:
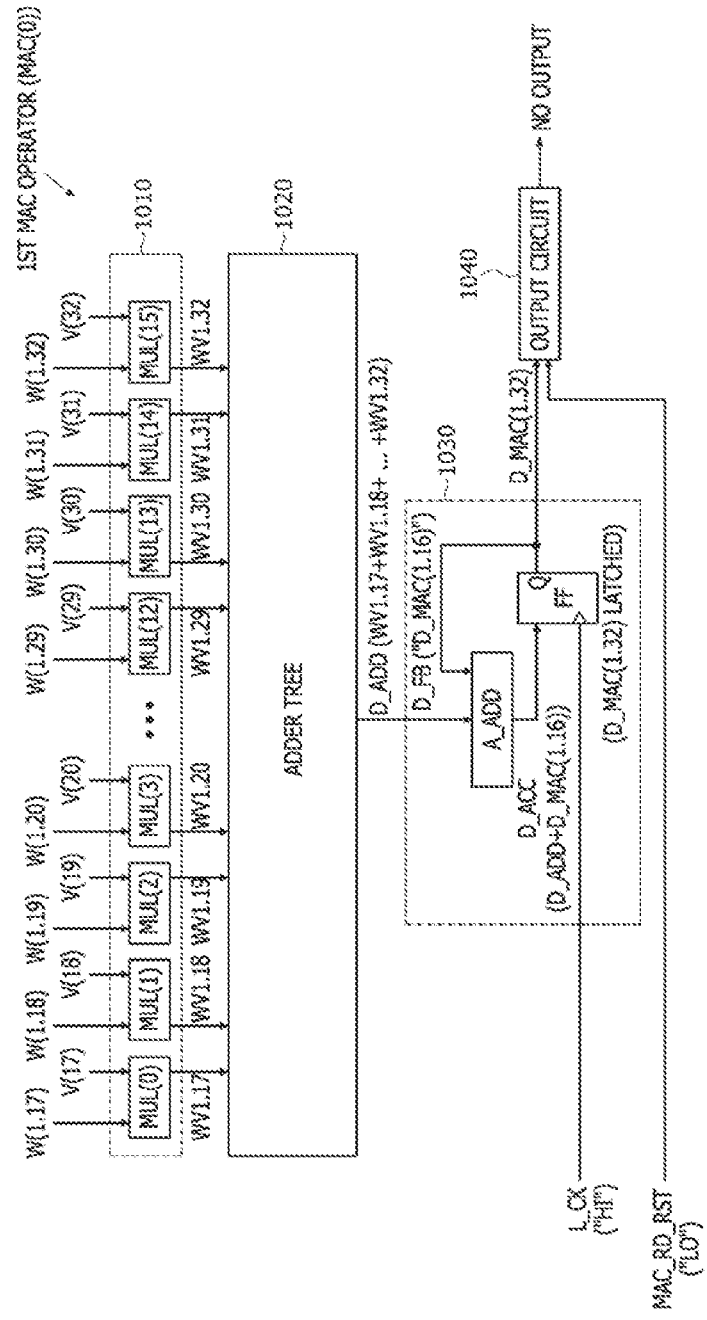
FIG. 40 illustrates a second sub-MAC arithmetic operation of a first MAC operator illustrated in FIG. 39.

FIGS. 39 and 40 illustrate the second sub-MAC arithmetic operation of the first MAC arithmetic operation of the PIM device 1000 illustrated in FIG. 31. Specifically, FIG. 39 illustrates a process for supplying the weight data and the vector data during the second sub-MAC arithmetic operation of the first MAC arithmetic operation performed by the PIM device 1000, and FIG. 40 illustrates the second sub-MAC arithmetic operation of the first MAC operator MAC(0). In FIG. 40, the same reference numerals or the same reference symbols as used in FIG. 32 denote the same elements. In FIG. 40, the adders of the adder tree 1020 are not illustrated.

Referring to FIG. 39, the first memory bank BK(0) may transmit the weight data W(1.17)-W(1.32), which are located at a cross position of the first row R(1) of the first weight group row WGR(1) and the second weight group column WGC(2), to the first MAC operator MAC(0). The second memory bank BK(1) may transmit the weight data W(2.17)-W(2.32), which are located at a cross position of the second row R(2) of the first weight group row WGR(1) and the second weight group column WGC(2), to the second MAC operator MAC(1). Similarly, the fifteenth memory bank BK(14) may transmit the weight data W(15.17)-W (15.32), which are located at a cross position of the fifteenth row R(15) of the first weight group row WGR(1) and the second weight group column WGC(2), to the fifteenth MAC operator MAC(14). In addition, the sixteenth memory bank BK(15) may transmit the weight data W(16.17)-W(16.32), which are located at a cross position of the sixteenth row R(16) of the first weight group row WGR(1) and the second weight group column WGC(2), to the sixteenth MAC operator MAC(15). The global buffer GB may transmit the vector data V(17)-V(32) in the second vector group row VGR(2) to each of the first to sixteenth MAC operators MAC(0)-MAC (15).

Referring to FIG. 40, the first to sixteenth multipliers MUL(0)-MUL(15) included in the multiplying circuit 1010 of the first MAC operator MAC(0) may perform a multiplying calculation of the weight data W(1.17)-W(1.32) and the vector data V(17)-V(32) to generate and output sixteen sets of multiplication result data WV1.17-WV1.32 to the adder tree 1020. The adder tree 1020 may add all of the sixteen sets of multiplication result data WV1.17-WV1.32 to output the added data WV1.17+WV1.18+ . . . +WV1.32 as the addition result data D_ADD. The accumulative adder A_ADD of the accumulator 1030 may receive the addition result data D_ADD outputted from the adder tree 1020 and the feedback data D_FB outputted from the latch circuit FF.

The feedback data D_FB may correspond to the MAC data D_MAC(1.16) of the first row and the sixteenth column which are latched in the latch circuit FF by the first sub-MAC arithmetic operation of the first MAC arithmetic operation. The accumulative adder A_ADD may add the MAC data D_MAC(1.16) of the first row and the sixteenth column to the addition result data D_ADD, thereby generating and outputting the accumulation result data D_ADD+ D_MAC(1.16) as the accumulated data D_ACC. The accumulated data D_ACC outputted from the accumulative adder A_ADD may correspond to data which are obtained as a result of the matrix multiplying calculation of the weight data W(1.1)-W(1.32), which are located at cross points of the first row R(1) and the first to $32^{nd}$ columns C(1)-C(32) of the weight matrix 2100, and the vector data V(1)-V(32), which are arrayed in the first to $32^{nd}$ rows R(1)-R(32) of the vector matrix 2200. The latch circuit FF may latch the accumulated data D_ACC in synchronization with the latch clock signal L_CK having a logic "high(HI)" level, thereby outputting the latched data of the accumulated data D_ACC as MAC data D_MAC(1.32) of the first row and the $32^{nd}$ column. The latch circuit FF may output the MAC data D_MAC(1.32) to the accumulative adder A_ADD and the output circuit 1040 through the output terminal Q. In such a case, the MAC result read signal MAC_RD_RST may still keep the first logic level, for example, a logic "low(LO)" level. Thus, the MAC data D_MAC(1.32) are not outputted from the output circuit 1040.

Referring again to FIG. 39, an arithmetic operation of the first MAC operator MAC(0) described with reference to FIG. 40 may be equally applied to each of the second to sixteenth MAC operators MAC(1)-MAC(15) except the weight data used as the input data of the MAC arithmetic operation. Accordingly, MAC data D_MAC(2.32) of the second row and the $32^{nd}$ column may be latched in a latch circuit of an accumulator included in the second MAC operator MAC(1) by the second sub-MAC arithmetic operation of the first MAC arithmetic operation. Similarly, MAC data D_MAC(15.32) of the fifteenth row and the $32^{nd}$ column may be latched in a latch circuit of an accumulator included in the fifteenth MAC operator MAC(14) by the second sub-MAC arithmetic operation of the first MAC arithmetic operation. In addition, MAC data D_MAC(16.32) of the sixteenth row and the $32^{nd}$ column may be latched in a latch circuit of an accumulator included in the sixteenth MAC operator MAC(15) by the second sub-MAC arithmetic operation of the first MAC arithmetic operation.

Figure 41:
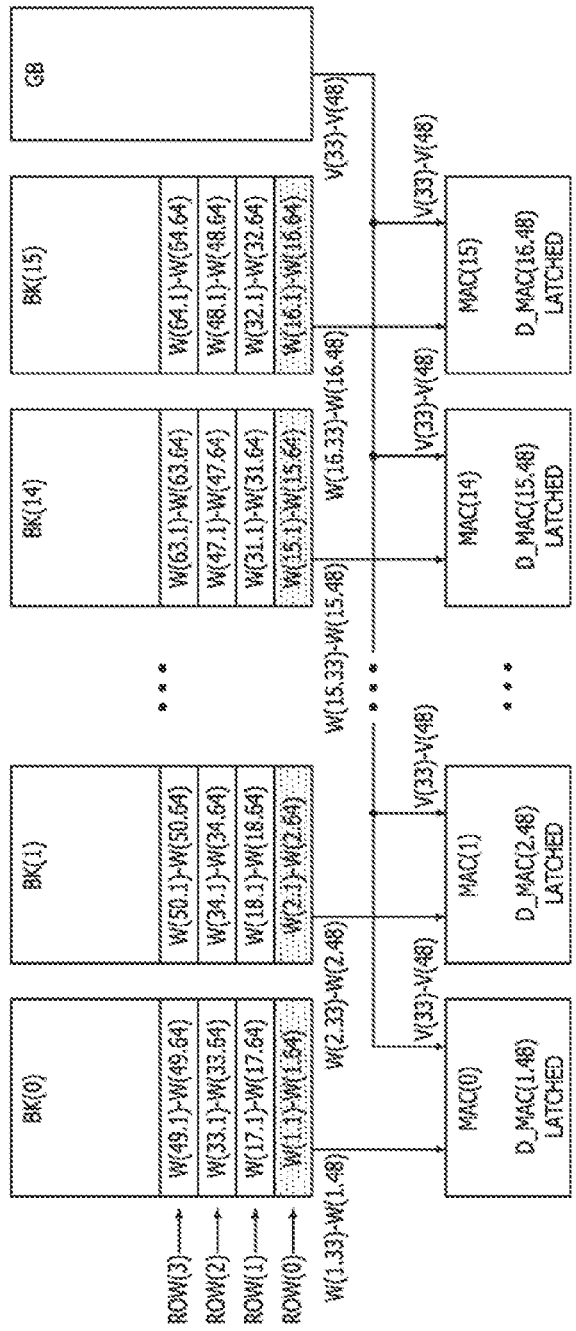
FIG. 41 illustrates a process for supplying weight data and vector data during a third sub-MAC arithmetic operation of a first MAC arithmetic operation performed by the PIM device illustrated in FIG. 31.
Figure 42:
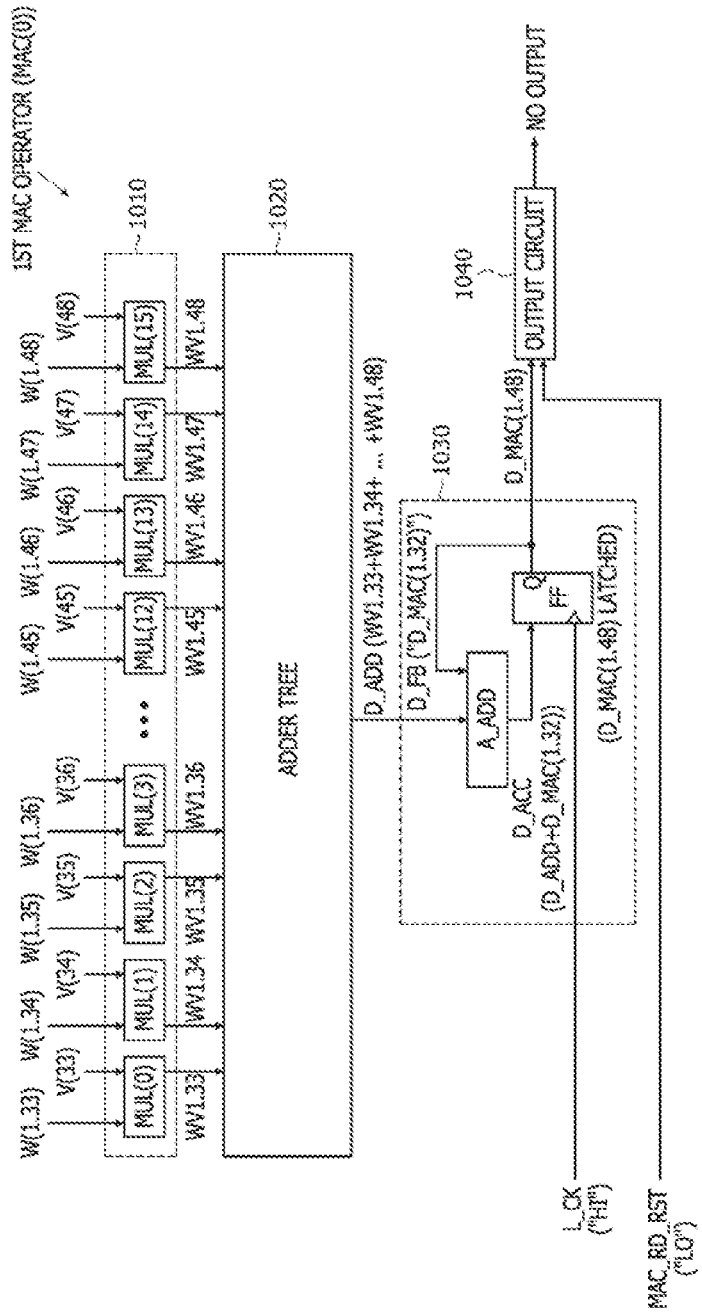
FIG. 42 illustrates a third sub-MAC arithmetic operation of a first MAC operator illustrated in FIG. 41.

FIGS. 41 and 42 illustrate the third sub-MAC arithmetic operation of the first MAC arithmetic operation of the PIM device 1000 illustrated in FIG. 31. Specifically, FIG. 41 illustrates a process for supplying the weight data and the vector data during the third sub-MAC arithmetic operation of the first MAC arithmetic operation performed by the PIM device 1000, and FIG. 42 illustrates the third sub-MAC arithmetic operation of the first MAC operator MAC(0). In FIG. 42, the same reference numerals or the same reference symbols as used in FIG. 32 denote the same elements. In FIG. 42, the adders of the adder tree 1020 are not illustrated.

Referring to FIG. 41, the first memory bank BK(0) may transmit the weight data W(1.33)-W(1.48), which are located at a cross position of the first row R(1) of the first weight group row WGR(1) and the third weight group column WGC(3), to the first MAC operator MAC(0). The second memory bank BK(1) may transmit the weight data W(2.33)-W(2.48), which are located at a cross position of the second row R(2) of the first weight group row WGR(1) and the third weight group column WGC(3), to the second MAC operator MAC(1). Similarly, the fifteenth memory bank BK(14) may transmit the weight data W(15.33)-W(15.48), which are located at a cross position of the fifteenth row R(15) of the first weight group row WGR(1) and the third weight group column WGC(3), to the fifteenth MAC operator MAC(14). In addition, the sixteenth memory bank BK(15) may transmit the weight data W(16.33)-W(16.48), which are located at a cross position of the sixteenth row R(16) of the first weight group row WGR(1) and the third weight group column WGC(3), to the sixteenth MAC operator MAC(15). The global buffer GB may transmit the vector data V(33)-V(48) in the third vector group row VGR(3) to each of the first to sixteenth MAC operators MAC(0)-MAC(15).

Referring to FIG. 42, the first to sixteenth multipliers MUL(0)-MUL(15) included in the multiplying circuit 1010 of the first MAC operator MAC(0) may perform a multiplying calculation of the weight data W(1.33)-W(1.48) and the vector data V(33)-V(48) to generate and output sixteen sets of multiplication result data WV1.33-WV1.48 to the adder tree 1020. The adder tree 1020 may add all of the sixteen sets of multiplication result data WV1.33-WV1.48 to output the added data WV1.33+WV1.34+ . . . +WV1.48 as the addition result data D_ADD. The accumulative adder A_ADD of the accumulator 1030 may receive the addition result data D_ADD outputted from the adder tree 1020 and the feedback data D_FB outputted from the latch circuit FF. The feedback data D_FB may correspond to the MAC data D_MAC(1.32) of the first row and the $32^{nd}$ column which are latched in the latch circuit FF by the second sub-MAC arithmetic operation of the first MAC arithmetic operation. The accumulative adder A_ADD may add the MAC data D_MAC(1.32) of the first row and the $32^{nd}$ column to the addition result data D_ADD, thereby generating and outputting the accumulation result data D_ADD+D_MAC(1.32) as the accumulated data D_ACC. The accumulated data D_ACC outputted from the accumulative adder A_ADD may correspond to data which are obtained as a result of the matrix multiplying calculation of the weight data W(1.1)-W(1.48), which are located at cross points of the first row R(1) and the first to $48^{th}$ columns C(1)-C(48) of the weight matrix 2100, and the vector data V(1)-V(48), which are arrayed in the first to $48^{th}$ rows R(1)-R(48) of the vector matrix 2200. The latch circuit FF may latch the accumulated data D_ACC in synchronization with the latch clock signal L_CK having a logic "high(HI)" level, thereby outputting the latched data of the accumulated data D_ACC as MAC data D_MAC(1.48) of the first row and the $48^{th}$ column. The latch circuit FF may output the MAC data D_MAC(1.48) to the accumulative adder A_ADD and the output circuit 1040 through the output terminal Q. In such a case, the MAC result read signal MAC_RD_RST may still keep the first logic level, for example, a logic "low(LO)" level. Thus, the MAC data D_MAC(1.48) are not outputted from the output circuit 1040.

Referring again to FIG. 41, an arithmetic operation of the first MAC operator MAC(0) described with reference to FIG. 42 may be equally applied to each of the second to sixteenth MAC operators MAC(1)-MAC(15) except the weight data used as the input data of the MAC arithmetic operation. Accordingly, MAC data D_MAC(2.48) of the second row and the $48^{th}$ column may be latched in a latch circuit of an accumulator included in the second MAC operator MAC(1) by the third sub-MAC arithmetic operation of the first MAC arithmetic operation. Similarly, MAC data D_MAC(15.48) of the fifteenth row and the $48^{th}$ column may be latched in a latch circuit of an accumulator included in the fifteenth MAC operator MAC(14) by the third sub-MAC arithmetic operation of the first MAC arithmetic operation. In addition, MAC data D_MAC(16.48) of the sixteenth row and the $48^{th}$ column may be latched in a latch circuit of an accumulator included in the sixteenth MAC operator MAC(15) by the third sub-MAC arithmetic operation of the first MAC arithmetic operation.

Figure 43:
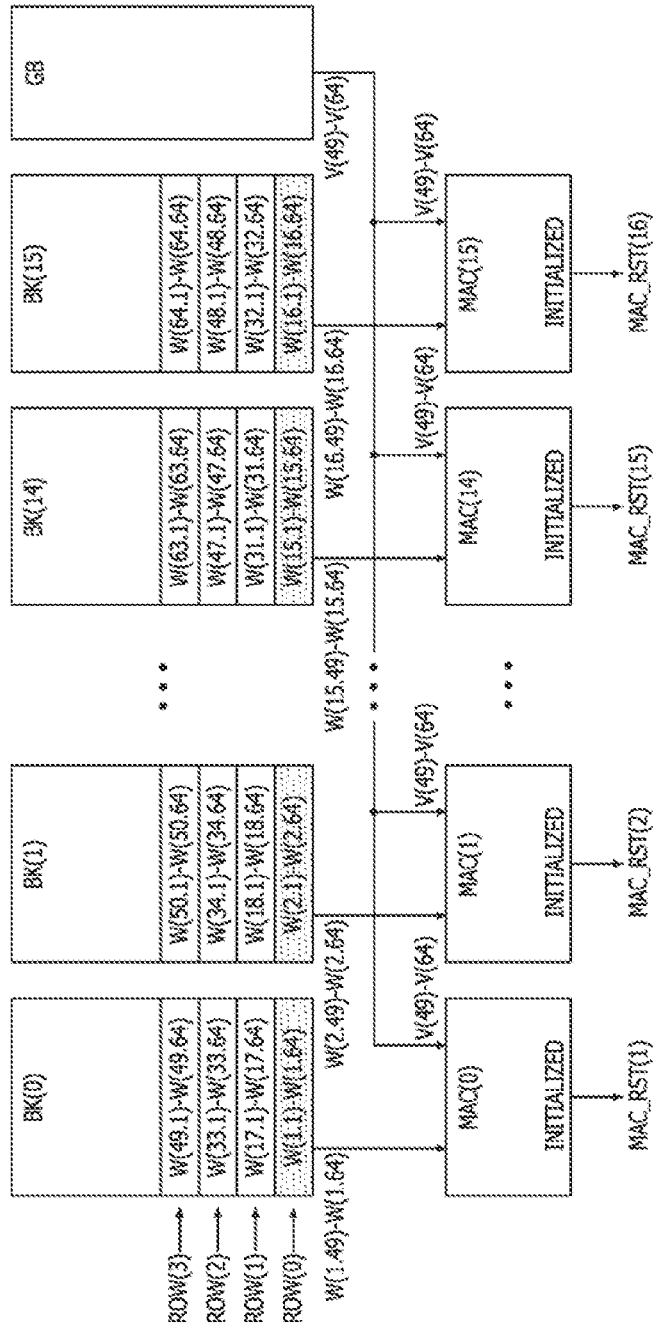
FIG. 43 illustrates a process for supplying weight data and vector data during a fourth sub-MAC arithmetic operation of a first MAC arithmetic operation performed by the PIM device illustrated in FIG. 31.
Figure 44:
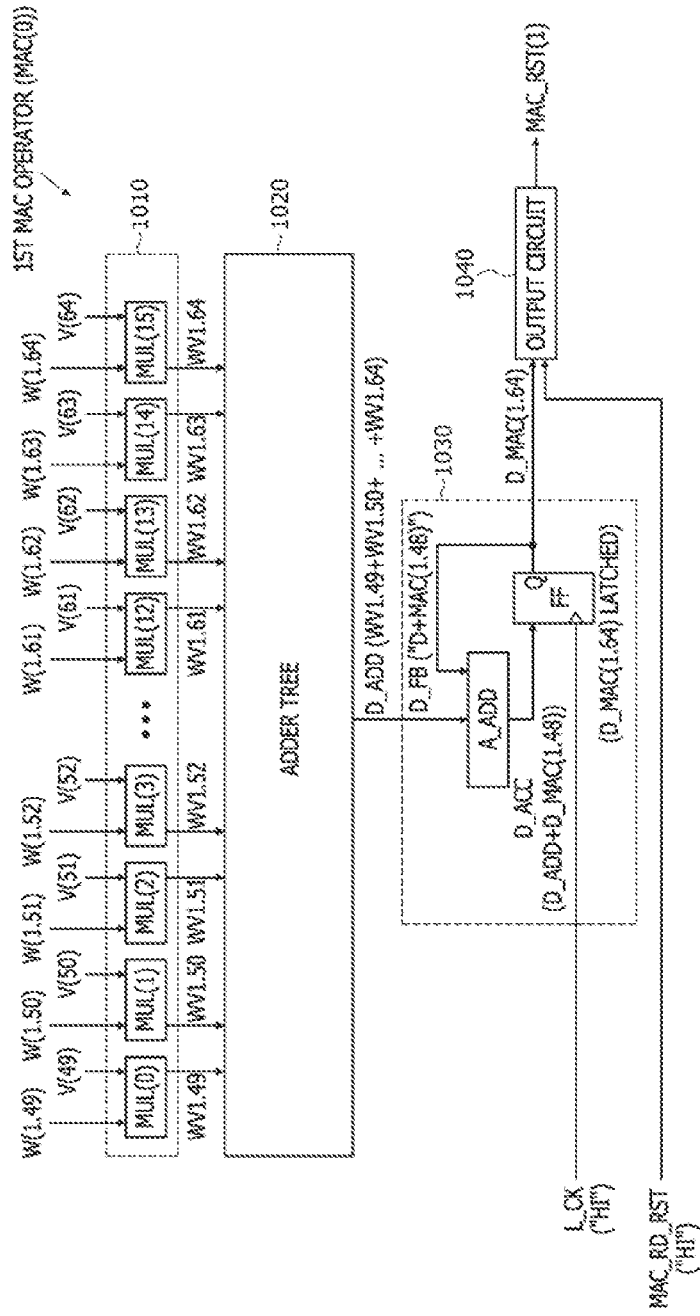
FIG. 44 illustrates a fourth sub-MAC arithmetic operation of a first MAC operator illustrated in FIG. 43.

FIGS. 43 and 44 illustrate the fourth sub-MAC arithmetic operation of the first MAC arithmetic operation of the PIM device 1000 illustrated in FIG. 31. Specifically, FIG. 43 illustrates a process for supplying the weight data and the vector data during the fourth sub-MAC arithmetic operation of the first MAC arithmetic operation performed by the PIM device 1000, and FIG. 44 illustrates the fourth sub-MAC arithmetic operation of the first MAC operator MAC(0). In FIG. 44, the same reference numerals or the same reference symbols as used in FIG. 32 denote the same elements. In FIG. 44, the adders of the adder tree 1020 are not illustrated.

Referring to FIG. 43, the first memory bank BK(0) may transmit the weight data W(1.49)-W(1.64), which are located at a cross position of the first row R(1) of the first weight group row WGR(1) and the fourth weight group column WGC(4), to the first MAC operator MAC(0). The second memory bank BK(1) may transmit the weight data W(2.49)-W(2.64), which are located at a cross position of the second row R(2) of the first weight group row WGR(1) and the fourth weight group column WGC(4), to the second MAC operator MAC(1). Similarly, the fifteenth memory bank BK(14) may transmit the weight data W(15.49)-W(15.64), which are located at a cross position of the fifteenth row R(15) of the first weight group row WGR(1) and the fourth weight group column WGC(4), to the fifteenth MAC operator MAC(14). In addition, the sixteenth memory bank BK(15) may transmit the weight data W(16.49)-W(16.64), which are located at a cross position of the sixteenth row R(16) of the first weight group row WGR(1) and the fourth weight group column WGC(4), to the sixteenth MAC operator MAC(15). The global buffer GB may transmit the vector data V(49)-V(64) in the fourth vector group row VGR(4) to each of the first to sixteenth MAC operators MAC(0)-MAC(15).

Referring to FIG. 44, the first to sixteenth multipliers MUL(0)-MUL(15) included in the multiplying circuit 1010 of the first MAC operator MAC(0) may perform a multiplying calculation of the weight data W(1.49)-W(1.64) and the vector data V(49)-V(64) to generate and output sixteen sets of multiplication result data WV1.49-WV1.64 to the adder tree 1020. The adder tree 1020 may add all of the sixteen sets of multiplication result data WV1.49-WV1.64 to output the added data WV1.49+WV1.50+ . . . +WV1.64 as the addition result data D_ADD. The accumulative adder A_ADD of the accumulator 1030 may receive the addition result data D_ADD outputted from the adder tree 1020 and the feedback data D_FB outputted from the latch circuit FF. The feedback data D_FB may correspond to the MAC data D_MAC(1.48) of the first row and the $48^{th}$ column which are latched in the latch circuit FF by the third sub-MAC arithmetic operation of the first MAC arithmetic operation. The accumulative adder A_ADD may add the MAC data D_MAC(1.48) to the addition result data D_ADD, thereby generating and outputting the accumulation result data D_ADD+D_MAC(1.48) as the accumulated data D_ACC. The accumulated data D_ACC outputted from the accumulative adder A_ADD may correspond to data (i.e., the first MAC result data MAC_RST(1) for the first row R(1) of the weight matrix 2100) which are obtained as a result of the matrix multiplying calculation of the weight data W(1.1)-

W(1.64) arrayed in the first row R(1) of the weight matrix 2100 and the vector data V(1)-V(64) arrayed in the vector matrix 2200. The latch circuit FF may latch the accumulated data D_ACC in synchronization with the latch clock signal L_CK having a logic "high(HI)" level, thereby outputting the latched data of the accumulated data D_ACC as MAC data D_MAC(1.64) of the first row and the $64^{th}$ column. The latch circuit FF may output the MAC data D_MAC(1.64) to the accumulative adder A_ADD and the output circuit 1040 through the output terminal Q. As the matrix multiplying calculation of the first row R(1) of the weight matrix 2100 and the vector matrix 2200 terminates, the MAC result read signal MAC_RD_RST having a logic "high(HI)" level may be transmitted to the output circuit 1040. The output circuit 1040 may output the MAC data D_MAC(1.64), which are received from the latch circuit FF, as the first MAC result data MAC_RST(1) in response to the MAC result read signal MAC_RD_RST having a logic "high(HI)" level.

Referring again to FIG. 43, an arithmetic operation of the first MAC operator MAC(0) described with reference to FIG. 44 may be equally applied to each of the second to sixteenth MAC operators MAC(1)-MAC(15) except the weight data used as the input data of the MAC arithmetic operation. Accordingly, MAC data D_MAC(2.64) of the second row and the $64^{th}$ column may be latched in a latch circuit of an accumulator included in the second MAC operator MAC(1) by the fourth sub-MAC arithmetic operation of the first MAC arithmetic operation, and the second MAC operator MAC(1) may output the second MAC result data MAC_RST(2) in response to the MAC result read signal MAC_RD_RST having a logic "high(HI)" level. Similarly, MAC data D_MAC(15.64) of the fifteenth row and the $64^{th}$ column may be latched in a latch circuit of an accumulator included in the fifteenth MAC operator MAC (14) by the fourth sub-MAC arithmetic operation of the first MAC arithmetic operation, and the fifteenth MAC operator MAC(14) may output the fifteenth MAC result data MAC_RST(15) in response to the MAC result read signal MAC_RD_RST having a logic "high(HI)" level. In addition, MAC data D_MAC(16.64) of the sixteenth row and the $64^{th}$ column may be latched in a latch circuit of an accumulator included in the sixteenth MAC operator MAC(15) by the fourth sub-MAC arithmetic operation of the first MAC arithmetic operation, and the sixteenth MAC operator MAC (15) may output the sixteenth MAC result data MAC_RST (16) in response to the MAC result read signal MAC_RD_RST having a logic "high(HI)" level. If the first to sixteenth MAC result data MAC_RST(1)-MAC_RST(16) are outputted from respective ones of the first to sixteenth MAC operators MAC(0)-MAC(15), all of the latch circuits FFs included in the first to sixteenth MAC operators MAC (0)-MAC(15) may be initialized.

FIG. 45 illustrates a process for outputting the MAC result data MAC_RSTs obtained as a result of the matrix multiplying calculation of FIG. 33 performed by the PIM device 1000 illustrated in FIG. 31. Referring to FIG. 45, the MAC arithmetic operation of the '64×64' weight matrix 2100 and the '64×1' vector matrix 2200 may be achieved by performing the first MAC arithmetic operation, the second MAC arithmetic operation, the third MAC arithmetic operation, and the fourth MAC arithmetic operation. Each of the first to fourth MAC arithmetic operations may be performed by sequentially executing the first sub-MAC arithmetic operation, the second sub-MAC arithmetic operation, the third sub-MAC arithmetic operation, and the fourth sub-MAC arithmetic operation. As described with reference to FIGS. 37 to 44, the first to sixteenth MAC operators MAC(0)-MAC(15) may perform the first to fourth sub-MAC arithmetic operations for the weight data W(1.1)-W(1.64), . . . , and W(16.1)-W(16.64) arrayed in the first to sixteenth rows R(1)-R(16) of the weight matrix 2100 and the vector data V(1)-V(64) arrayed in the vector matrix 2200 to achieve the first MAC arithmetic operation. As a result of the first MAC arithmetic operation, the first to sixteenth MAC operators MAC(0)-MAC(15) may generate sixteen sets of MAC data D_MAC(1.64)-D_MAC(16.64), respectively. The first to sixteenth MAC operators MAC(0)-MAC(15) may output the sixteen sets of MAC data D_MAC(1.64)-D_MAC (16.64), which are generated by the fourth sub-MAC arithmetic operation of the first MAC arithmetic operation, as the first to sixteenth MAC result data MAC_RST(1)-MAC_RST(16) of the result matrix 2300, respectively.

The first to sixteenth MAC operators MAC(0)-MAC(15) may perform the first to fourth sub-MAC arithmetic operations for the weight data W(17.1)-W(17.64), . . . , and W(32.1)-W(32.64) arrayed in the seventeenth to $32^{nd}$ rows R(17)-R(32) of the weight matrix 2100 and the vector data V(1)-V(64) arrayed in the vector matrix 2200 to achieve the second MAC arithmetic operation. The first to fourth sub-MAC arithmetic operations of the second MAC arithmetic operation may be executed in substantially the same way as the first to fourth sub-MAC arithmetic operations of the first MAC arithmetic operation described with reference to FIGS. 37 to 44. Accordingly, MAC data D_MAC(17.16)-D_MAC(32.16) may be generated by the first sub-MAC arithmetic operation of the second MAC operation, and MAC data D_MAC(17.32)-D_MAC(32.32) may be generated by the second sub-MAC arithmetic operation of the second MAC operation. In addition, MAC data D_MAC (17.48)-D_MAC(32.48) may be generated by the third sub-MAC arithmetic operation of the second MAC arithmetic operation, and MAC data D_MAC(17.64)-D_MAC(32.64) may be generated by the fourth sub-MAC arithmetic operation of the second MAC arithmetic operation. The first to sixteenth MAC operators MAC(0)-MAC(15) may output the sixteen sets of MAC data D_MAC(17.64)-D_MAC (32.64), which are generated by the fourth sub-MAC arithmetic operation of the second MAC arithmetic operation, as the seventeenth to $32^{nd}$ MAC result data MAC_RST(17)-MAC_RST(32) of the result matrix 2300, respectively.

The first to sixteenth MAC operators MAC(0)-MAC(15) may perform the first to fourth sub-MAC arithmetic operations for the weight data W(33.1)-W(33.64), . . . , and W(48.1)-W(48.64) arrayed in the $33^{rd}$ to $48^{th}$ rows R(33)-R(48) of the weight matrix 2100 and the vector data V(1)-V(64) arrayed in the vector matrix 2200 to achieve the third MAC arithmetic operation. The first to fourth sub-MAC arithmetic operations of the third MAC arithmetic operation may also be executed in substantially the same way as the first to fourth sub-MAC arithmetic operations of the first MAC arithmetic operation described with reference to FIGS. 37 to 44. Accordingly, MAC data D_MAC(33.16)-D_MAC(48.16) may be generated by the first sub-MAC arithmetic operation of the third MAC arithmetic operation, and MAC data D_MAC(33.32)-D_MAC(48.32) may be generated by the second sub-MAC arithmetic operation of the third MAC arithmetic operation. In addition, MAC data D_MAC(33.48)-D_MAC(48.48) may be generated by the third sub-MAC arithmetic operation of the third MAC arithmetic operation, and MAC data D_MAC(33.64)-D_MAC(48.64) may be generated by the fourth sub-MAC arithmetic operation of the third MAC arithmetic operation. The first to sixteenth MAC operators MAC(0)-MAC(15) may output the sixteen sets of MAC data D_MAC(33.64)-

D_MAC(48.64), which are generated by the fourth sub-MAC arithmetic operation of the third MAC arithmetic operation, as the $33^{rd}$ to $48^{th}$ MAC result data MAC_RST(33)-MAC_RST(48) of the result matrix 2300, respectively.

The first to sixteenth MAC operators MAC(0)-MAC(15) may perform the first to fourth sub-MAC arithmetic operations for the weight data W(49.1)-W(49.64), . . . , and W(64.1)-W(64.64) arrayed in the $49^{th}$ to $64^{th}$ rows R(49)-R(64) of the weight matrix 2100 and the vector data V(1)-V(64) arrayed in the vector matrix 2200 to achieve the fourth MAC arithmetic operation. The first to fourth sub-MAC arithmetic operations of the fourth MAC arithmetic operation may also be executed in substantially the same way as the first to fourth sub-MAC arithmetic operations of the first MAC arithmetic operation described with reference to FIGS. 37 to 44. Accordingly, MAC data D_MAC(49.16)-D_MAC(64.16) may be generated by the first sub-MAC arithmetic operation of the fourth MAC arithmetic operation, and MAC data D_MAC(49.32)-D_MAC(64.32) may be generated by the second sub-MAC arithmetic operation of the fourth MAC arithmetic operation. In addition, MAC data D_MAC(49.48)-D_MAC(64.48) may be generated by the third sub-MAC arithmetic operation of the fourth MAC arithmetic operation, and MAC data D_MAC(49.64)-D_MAC(64.64) may be generated by the fourth sub-MAC arithmetic operation of the fourth MAC arithmetic operation. The first to sixteenth MAC operators MAC(0)-MAC(15) may output the sixteen sets of MAC data D_MAC(49.64)-D_MAC(64.64), which are generated by the fourth sub-MAC arithmetic operation of the fourth MAC arithmetic operation, as the $49^{th}$ to $64^{th}$ MAC result data MAC_RST(49)-MAC_RST(64) of the result matrix 2300, respectively.

Figure 46:
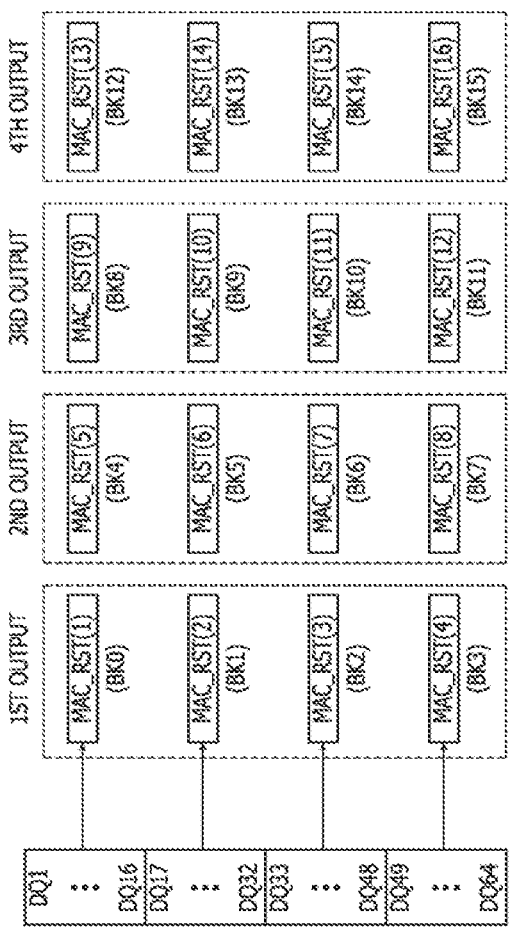
FIG. 46 illustrates an output sequence of MAC result data outputted through data input/output (I/O) circuits included in the PIM device illustrated in FIG. 31.

FIG. 46 illustrates an output sequence of the MAC result data MAC_RSTs outputted through the data I/O circuits DQ1-DQ64 included in the PIM device 1000 illustrated in FIG. 31. It may be assumed that each set of the plural sets of MAC result data MAC_RSTs has a data size of "O" bits (where, "O" is a natural number which is equal to or greater than two) and "Q"-number of data I/O circuits DQ(1)-DQ(Q) are disposed in the PIM device 1000 (where, "Q" is a multiple of "O"). In such a case, the "Q"-number of data I/O circuits DQ(1)-DQ(Q) may perform a process, which outputs "Q/O" sets of MAC result data MAC_RST(1)-MAC_RST(Q/O) at a time, "M×O/Q" times to output first to $M^{th}$ MAC result data MAC_RST(1)-MAC_RST(M). In the present embodiment, because the number "M" is 64, the number "O" is 16, and the number "Q" is 64, the first to $64^{th}$ data I/O circuits DQ(1)-DQ(64) may perform a process, which outputs 4 (=Q/O) sets of MAC result data MAC_RSTs at a time, 16 (=M×O/Q) times to output all of the first to $64^{th}$ MAC result data MAC_RST(1)-MAC_RST(64). Specifically, referring to FIG. 46, the first to sixteenth MAC result data MAC_RST(1)-MAC_RST(16) outputted from respective ones of the first to sixteenth MAC operators MAC(0)-MAC(15) as a result of the first MAC arithmetic operation described with reference to FIG. 45 may be outputted to a host or a controller coupled to the PIM device 1000 through the first to $64^{th}$ data I/O circuits DQ1-DQ64.

Each MAC result data MAC_RST having a data size of 16 bits may be outputted from the PIM device 1000 through sixteen data I/O circuits DQs. Thus, the first to $64^{th}$ data I/O circuits DQ1-DQ64 may be synchronized with a clock signal to output four sets of MAC result data MAC_RSTs at a time. Specifically, the first to fourth MAC result data MAC_RST(1)-MAC_RST(4) may be outputted from the PIM device 1000 at a time through the first to sixteenth data I/O circuits DQ1-DQ16, the seventeenth to $32^{nd}$ data I/O circuits DQ17-DQ32, the $33^{rd}$ to $48^{th}$ data I/O circuits DQ33-DQ48, and the $49^{th}$ to $64^{th}$ data I/O circuits DQ49-DQ64 in synchronization with a first point in time of the clock signal. Next, the fifth to eighth MAC result data MAC_RST(5)-MAC_RST(8) may be outputted from the PIM device 1000 at a time through the first to sixteenth data I/O circuits DQ1-DQ16, the seventeenth to $32^{nd}$ data I/O circuits DQ17-DQ32, the $33^{rd}$ to $48^{th}$ data I/O circuits DQ33-DQ48, and the $49^{th}$ to $64^{th}$ data I/O circuits DQ49-DQ64 in synchronization with a second point in time of the clock signal. Next, the ninth to twelfth MAC result data MAC_RST(9)-MAC_RST(12) may be outputted from the PIM device 1000 at a time through the first to sixteenth data I/O circuits DQ1-DQ16, the seventeenth to $32^{nd}$ data I/O circuits DQ17-DQ32, the $33^{rd}$ to $48^{th}$ data I/O circuits DQ33-DQ48, and the $49^{th}$ to $64^{th}$ data I/O circuits DQ49-DQ64 in synchronization with a third point in time of the clock signal. Subsequently, the thirteenth to sixteenth MAC result data MAC_RST(13)-MAC_RST(16) may be outputted from the PIM device 1000 at a time through the first to sixteenth data I/O circuits DQ1-DQ16, the seventeenth to $32^{nd}$ data I/O circuits DQ17-DQ32, the $33^{rd}$ to $48^{th}$ data I/O circuits DQ33-DQ48, and the $49^{th}$ to $64^{th}$ data I/O circuits DQ49-DQ64 in synchronization with a fourth point in time of the clock signal.

The first to sixteenth MAC result data MAC_RST(1)-MAC_RST(16) may be outputted from the PIM device 1000 in order of the row number of the weight matrix (2100 of FIG. 33) from the first MAC result data MAC_RST(1) for the weight data in the first row R(1) of the weight matrix 2100 to the sixteenth MAC result data MAC_RST(16) for the weight data in the sixteenth row R(16) of the weight matrix 2100. This means that the first to sixteenth MAC result data MAC_RST(1)-MAC_RST(16) are outputted from PIM device 1000 in sequence from the MAC result data MAC_RST for the weight data stored in the first memory bank BK(0) to the MAC result data MAC_RST for the weight data stored in the sixteenth memory bank BK(15) on the basis of the memory banks storing the weight data. That is, the first to sixteenth MAC result data MAC_RST(1)-MAC_RST(16) may be outputted according to the sequence that the row number of the result matrix (2300 of FIG. 33) increases. Thus, a host or a controller receiving the multiple sets of MAC result data MAC_RSTs from the PIM device 1000 may skip a process for readjusting the transmission sequence of the multiple sets of MAC result data MAC_RSTs which are used in a subsequent process. Although the present embodiment is illustrated in conjunction with a case that the first to sixteenth MAC result data MAC_RST(1)-MAC_RST(16) are outputted from the PIM device 1000, the remaining MAC result data MAC_RST(17)-MAC_RST(64) may also be outputted from the PIM device 1000 in the same way as described above.

Figure 47:
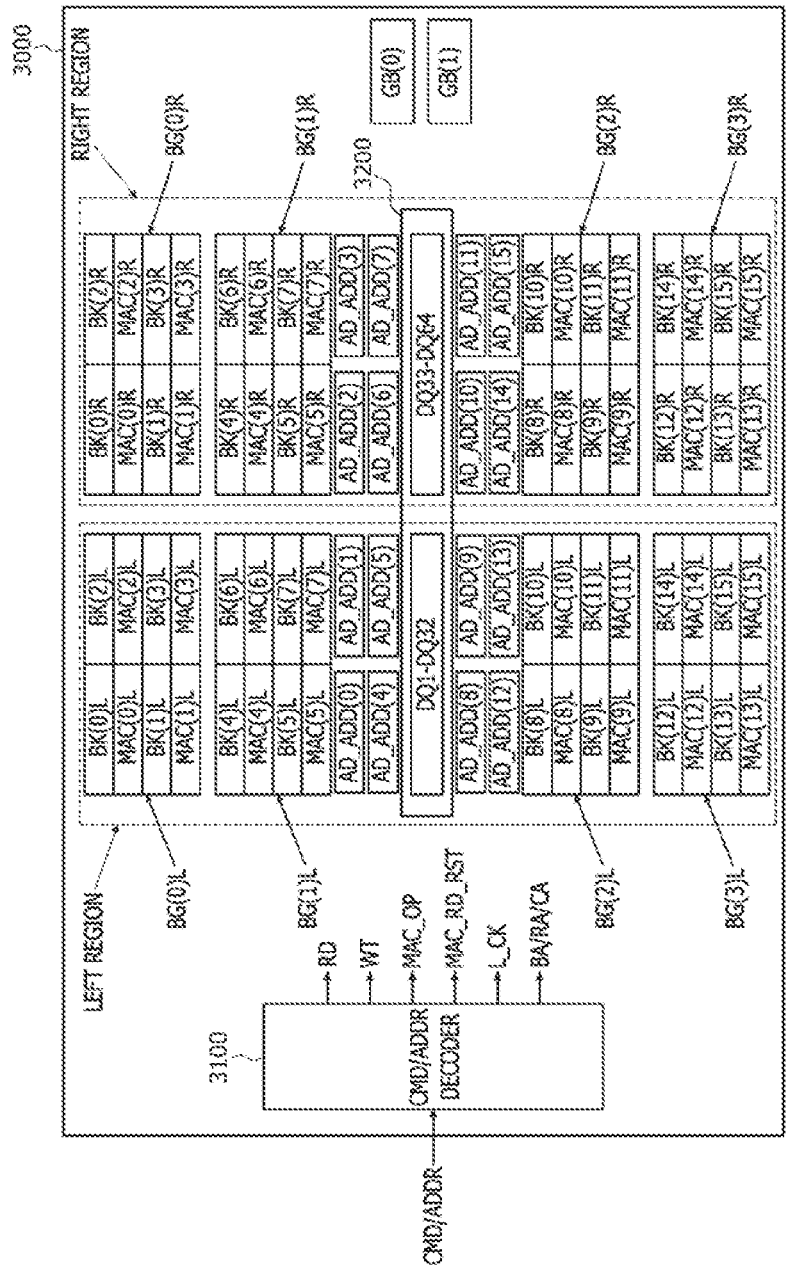
FIG. 47 illustrates a PIM device including a plurality of memory banks and a plurality of MAC operators which are disposed in a left region and a right region according to another embodiment of the present disclosure.

FIG. 47 illustrates a PIM device 3000 according to another embodiment of the present disclosure. The PIM device 3000 may be different from the PIM device 1000 described with reference to FIG. 31 in that a plurality of memory banks BKs are divided into two groups to be disposed in a left region and a right region which are physically distinguished from each other and a plurality of MAC operators MACs are divided into two groups to be disposed in the left region and the right region like the plurality of memory banks BKs. Referring to FIG. 47, the PIM device 3000 may include a plurality of memory banks BKs, a first global buffer GB(0), a second global buffer GB(1) a plurality of MAC operators MACs, a plurality of additional adders AD_ADDs, a command/address decoder 3100, and an interface 3200. In an embodiment, the plurality of memory banks BKs and the global buffers GBs may be disposed in the first storage region and the second storage region constituting the data storage region 11 of the PIM device 10 illustrated in FIG. 1, respectively. The plurality of MAC operators MACs may constitute the arithmetic circuit 12 of the PIM device 10 illustrated in FIG. 1. In an embodiment, the number of the memory banks BKs, the number of the MAC operators MACs, and the number of the additional adders AD_ADDs may be equal to each other. In the following embodiment described hereinafter, it may be assumed that the PIM device 3000 includes first to sixteenth memory banks BK(0)-BK(15), first to sixteenth MAC operators MAC(0)-MAC(15), and first to sixteenth additional adders AD_ADD(0)-AD_ADD(15). The command/address decoder 3100 may have substantially the same configuration as the command/address decoder 1100 described with reference to FIG. 31. Thus, to avoid duplicate explanation, the same descriptions as the command/address decoder 1100 will be omitted hereinafter. In addition, a global I/O line GIO is not illustrated in FIG. 47 to avoid complexity of the drawing.

The first to sixteenth memory banks BK(0)-BK(15) may include first to sixteenth left memory banks BK(0)L-BK(15)L disposed in the left region and first to sixteenth right memory banks BK(0)R-BK(15)R disposed in the right region. For example, the first memory bank BK(0) may include the first left memory bank BK(0)L disposed in the left region and the first right memory bank BK(0)R disposed in the right region, and the second memory bank BK(1) may include the second left memory bank BK(1)L disposed in the left region and the second right memory bank BK(1)R disposed in the right region. Similarly, the sixteenth memory bank BK(15) may include the sixteenth left memory bank BK(15)L disposed in the left region and the sixteenth right memory bank BK(15)R disposed in the right region.

Like the first to sixteenth memory banks BK(0)-BK(15), the first to sixteenth MAC operators MAC(0)-MAC(15) may include first to sixteenth left MAC operators MAC(0)L-MAC(15)L disposed in the left region and first to sixteenth right MAC operators MAC(0)R-MAC(15)R disposed in the right region. For example, the first MAC operator MAC(0) may include the first left MAC operator MAC(0)L disposed in the left region and the first right MAC operator MAC(0)R disposed in the right region, and the second MAC operator MAC(1) may include the second left MAC operator MAC(1)L disposed in the left region and the second right MAC operator MAC(1)R disposed in the right region. Similarly, the sixteenth MAC operator MAC(15) may include the sixteenth left MAC operator MAC(15)L disposed in the left region and the sixteenth right MAC operator MAC(15)R disposed in the right region.

Although not indicated in FIG. 47, the first to sixteenth left memory banks BK(0)L-BK(15)L and the first to sixteenth left MAC operators MAC(0)L-MAC(15)L may constitute first to sixteenth left MAC units. Similarly, the first to sixteenth right memory banks BK(0)R-BK(15)R and the first to sixteenth right MAC operators MAC(0)R-MAC(15)R may constitute first to sixteenth right MAC units. Accordingly, the PIM device 3000 may include sixteen left MAC units and sixteen right MAC units. The descriptions of the MAC units MU(0)-MU(15) illustrated in FIG. 31 may be equally applied to both of the left MAC units and the right MAC units. Thus, the first left memory bank BK(0)L and the first left MAC operator MAC(0)L may constitute the first left MAC unit, and the first left MAC operator MAC(0)L may receive the weight data from the first left memory bank BK(0)L. Similarly, the first right memory bank BK(0)R and the first right MAC operator MAC(0)R may constitute the first right MAC unit, and the first right MAC operator MAC(0)R may receive the weight data from the first right memory bank BK(0)R.

Four memory banks among the first to sixteenth left memory banks BK(0)L-BK(15)L may constitute one left memory bank group. For example, the first to fourth left memory banks BK(0)L-BK(3)L may constitute a first left memory bank group BG(0)L, and the fifth to eighth left memory banks BK(4)L-BK(7)L may constitute a second left memory bank group BG(1)L. In addition, the ninth to twelfth left memory banks BK(8)L-BK(11)L may constitute a third left memory bank group BG(2)L, and the thirteenth to sixteenth left memory banks BK(12)L-BK(15)L may constitute a fourth left memory bank group BG(3)L. Similarly, four memory banks among the first to sixteenth right memory banks BK(0)R-BK(15)R may constitute one right memory bank group. For example, the first to fourth right memory banks BK(0)R-BK(3)R may constitute a first right memory bank group BG(0)R, and the fifth to eighth right memory banks BK(4)R-BK(7)R may constitute a second right memory bank group BG(1)R. In addition, the ninth to twelfth right memory banks BK(8)R-BK(11)R may constitute a third right memory bank group BG(2)R, and the thirteenth to sixteenth right memory banks BK(12)R-BK(15)R may constitute a fourth right memory bank group BG(3)R.

In an embodiment, one of the first to sixteenth left memory banks BK(0)L-BK(15)L and one of the first to sixteenth right memory banks BK(0)R-BK(15)R may be designated by the same bank address. For example, the first left memory bank BK(0)L and the first right memory bank BK(0)R may be designated by the same bank address. Accordingly, the first left memory bank BK(0)L and the first right memory bank BK(0)R may be selected together. Similarly, one of the first to fourth left memory bank groups BG(0)L-BG(3)L and one of the first to fourth right memory bank groups BG(0)R-BG(3)R may be designated by the same bank group address. For example, the first left memory bank group BG(0)L and the first right memory bank group BG(0)R may be designated by the same bank group address. Accordingly, the first left memory bank group BG(0)L and the first right memory bank group BG(0)R may be selected together.

The first global buffer GB(0) may store a first portion of vector data, which is supplied to the first to sixteenth left MAC operators MAC(0)L-MAC(15)L. The second global buffer GB(1) may store a second portion of the vector data, which is supplied to the first to sixteenth right MAC operators MAC(0)R-MAC(15)R. Thus, the first and second global buffers GB(0) and GB(1) may receive the vector data from a host or a controller according to a request outputted from the host. In an embodiment, the first portion of the vector data may be transmitted from the first global buffer GB(0) to each of the first to sixteenth left MAC operators MAC(0)L-MAC(15)L through the global I/O line GIO (not shown). Similarly, the second portion of the vector data may be transmitted from the second global buffer GB(1) to each of the first to sixteenth right MAC operators MAC(0)R-MAC(15)R through the global I/O line GIO (not shown).

The interface 3200 may be similar to the interface 1200 of the PIM device 1000 described with reference to FIG. 31. A portion of the interface 3200 may be disposed in the left region, and the other portion of the interface 3200 may be disposed in the right region. Specifically, the interface 3200 may include first to $32^{nd}$ data I/O circuits DQ1-DQ32 disposed in the left region and 33$^{rd}$ to 64$^{th}$ data I/O circuit DQ33-DQ64 disposed in the right region. Hereinafter, for the purpose of ease and convenience in explanation, the first to 32$^{nd}$ data I/O circuits DQ1-DQ32 disposed in the left region will also be referred to as 'left data I/O circuits' and the 33$^{rd}$ to 64$^{th}$ data I/O circuit DQ33-DQ64 disposed in the right region will also be referred to as 'right data I/O circuits'. The left data I/O circuits DQ1-DQ32 may be used for data transmission between an external device (not shown) coupled to the PIM device 3000 and the first to sixteenth left memory banks BK(0)L-BK(15)L. In addition, the left data I/O circuits DQ1-DQ32 may also be used to transmit MAC result data from the first to sixteenth left MAC operators MAC(0)L-MAC(15)L to the external device coupled to the PIM device 3000. Similarly, the right data I/O circuits DQ33-DQ64 may be used for data transmission between the external device coupled to the PIM device 3000 and the first to sixteenth right memory banks BK(0)R-BK(15)R. In addition, the right data I/O circuits DQ33-DQ64 may also be used to transmit the MAC result data from the first to sixteenth right MAC operators MAC(0)R-MAC(15)R to the external device coupled to the PIM device 3000.

The first to sixteenth additional adders AD_ADD(0)-AD_ADD(15) may add left MAC data provided by the left MAC operators to right MAC data provided by the right MAC operators to generate and output the MAC result data. The first additional adder AD_ADD(0) may have a first input terminal coupled to an output terminal of the first left MAC operator MAC(0)L and a second input terminal coupled to an output terminal of the first right MAC operator MAC(0)R. The first additional adder AD_ADD(0) may add first left MAC data outputted from the first left MAC operator MAC(0)L to first right MAC data outputted from the first right MAC operator MAC(0)R to generate and output first MAC result data. Similarly, the sixteenth additional adder AD_ADD(15) may add sixteenth left MAC data outputted from the sixteenth left MAC operator MAC(15)L to sixteenth right MAC data outputted from the sixteenth right MAC operator MAC(15)R to generate and output sixteenth MAC result data.

The first to sixteenth additional adders AD_ADD(0)-AD_ADD(15) may be alternately disposed in the left region and the right region by 'unit number of output' corresponding to the number of sets of the MAC result data which is capable of being outputted from the left data I/O circuits DQ1-DQ32 (or the right data I/O circuit DQ33-DQ64) at a time. In the present embodiment, the unit number of output may be two. Thus, the first to sixteenth additional adders AD_ADD(0)-AD_ADD(15) may be alternately disposed in the left region and the right region by two additional adders. Accordingly, the first and second additional adders AD_ADD(0) and AD_ADD(1) may be disposed in the left region, and the third and fourth additional adders AD_ADD(2) and AD_ADD(3) may be disposed in the right region. Next, the fifth and sixth additional adders AD_ADD(4) and AD_ADD(5) may be disposed in the left region, and the seventh and eighth additional adders AD_ADD(6) and AD_ADD(7) may be disposed in the right region. Next, the ninth and tenth additional adders AD_ADD(8) and AD_ADD(9) may be disposed in the left region, and the eleventh and twelfth additional adders AD_ADD(10) and AD_ADD(11) may be disposed in the right region. Next, the thirteenth and fourteenth additional adders AD_ADD(12) and AD_ADD(13) may be disposed in the left region, and the fifteenth and sixteenth additional adders AD_ADD(14) and AD_ADD(15) may be disposed in the right region. Hereinafter, for the purpose of ease and convenience in explanation, the additional adders AD_ADD(0), AD_ADD(1), AD_ADD(4), AD_ADD(5), AD_ADD(8), AD_ADD(9), AD_ADD(12), and AD_ADD(13) disposed in the left region will be referred to as 'left additional adders AD_ADD(L)' and the additional adders AD_ADD(2), AD_ADD(3), AD_ADD(6), AD_ADD(7), AD_ADD(10), AD_ADD(11), AD_ADD(14), and AD_ADD(15) disposed in the right region will be referred to as 'right additional adders AD_ADD(R)'. The left additional adders AD_ADD(L) may output MAC result data as output data of the PIM device 3000 through the left data I/O circuits DQ1-DQ32 of the interface 3200. Moreover, the right additional adders AD_ADD(R) may output the other MAC result data as the output data of the PIM device 3000 through the right data I/O circuits DQ33-DQ64 of the interface 3200.

Figure 48:
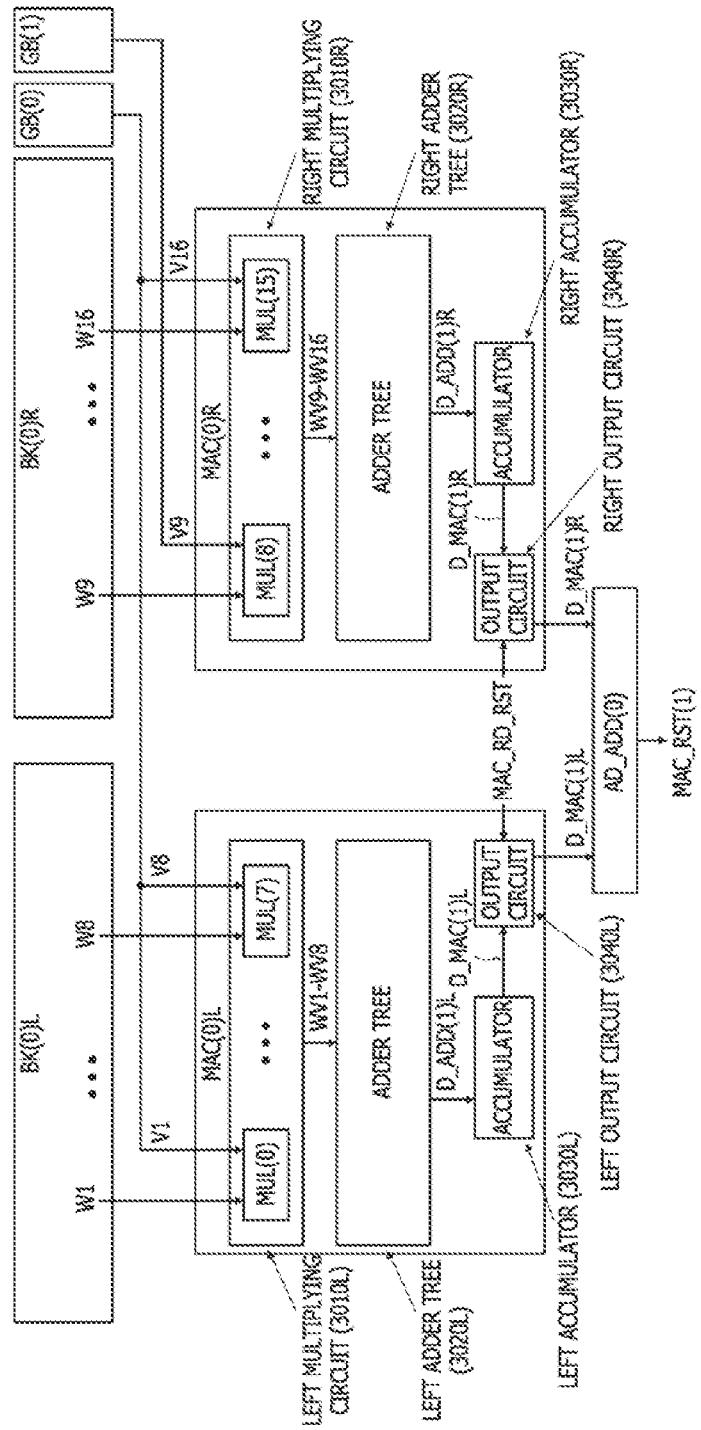
FIG. 48 illustrates a first left MAC operator and a first right MAC operator included in the PIM device of FIG. 47.

FIG. 48 illustrates an example of the first left MAC operator MAC(0)L and the first right MAC operator MAC(0)R included in the PIM device 3000 of FIG. 47. In the present embodiment, descriptions of the first left MAC operator MAC(0)L and the first right MAC operator MAC(0)R may be equally applied to the remaining left MAC operators (i.e., the second to sixteenth left MAC operators MAC(1)L-MAC(15)L) and the remaining right MAC operators (i.e., the second to sixteenth right MAC operators MAC(1)R-MAC(15)R).

Referring to FIG. 48, the first left MAC operator MAC(0)L may include a left multiplying circuit 3010L, a left adder tree 3020L, a left accumulator 3030L, and a left output circuit 3040L. Similarly, the first right MAC operator MAC(0)R may include a right multiplying circuit 3010R, a right adder tree 3020R, a right accumulator 3030R, and a right output circuit 3040R. The left multiplying circuit 3010L may include a plurality of multipliers, and the right multiplying circuit 3010R may also include a plurality of multipliers. While the first to sixteenth multipliers MUL(0)-MUL(15) included in the multiplying circuit 1010 of the first MAC operator MAC(0) described with reference to FIG. 32 are disposed in the same region, first to sixteenth multipliers MUL(0)-MUL(15) included in the PIM device 3000 according to the present embodiment may be equally divided into two groups of the left multiplying circuit 3010L and the right multiplying circuit 3010R which are disposed in respective ones of the left region and the right region. Thus, the first to eighth multipliers MUL(0)-MUL(7) may be allocated to the left multiplying circuit 3010L, and the ninth to sixteenth multipliers MUL(8)-MUL(15) may be allocated to the right multiplying circuit 3010R.

The left multiplying circuit 3010L may perform a multiplying calculation of first to eighth weight data W1-W8 outputted from the first left memory bank BK(0)L and first to eighth vector data V1-V8 outputted from the first global buffer GB(0), thereby generating and outputting eight sets of left multiplication result data (i.e., first to eighth multiplication result data WV1-WV8). The right multiplying circuit 3010R may perform a multiplying calculation of ninth to sixteenth weight data W9-W16 outputted from the first right memory bank BK(0)R and ninth to sixteenth vector data V9-V16 outputted from the second global buffer GB(1), thereby generating and outputting eight sets of right multiplication result data (i.e., ninth to sixteenth multiplication result data WV9-WV16). The left adder tree 3020L may perform an adding calculation of the left multiplication result data WV1-WV8 to generate and output first left addition result data D_ADD(1)L. The right adder tree 3020R may perform an adding calculation of the right multiplication result data WV9-WV16 to generate and output first right addition result data D_ADD(1)R. The left accumulator 3030L may use the first left addition result data D_ADD(1)L as feedback data in the left accumulator 3030L and may also output the first left addition result data D_ADD(1)L to the left output circuit 3040L. The left accumulator 3030L may perform an accumulative adding calculation for the first left addition result data D_ADD(1)L outputted from the left adder tree 3020L to generate first left MAC data D_MAC(1)L. The right accumulator 3030R may use the first right addition result data D_ADD(1)R as feedback data in the right accumulator 3030R and may also output the first right addition result data D_ADD(1)R to the right output circuit 3040R. The right accumulator 3030R may perform an accumulative adding calculation for the first right addition result data D_ADD(1)R outputted from the right adder tree 3020R to generate first right MAC data D_MAC(1)R.

If the MAC arithmetic operation for the weight data in one row of the weight matrix 2100 illustrated in FIG. 33 and the vector data of the vector matrix 2200 illustrated in FIG. 33 terminates, the MAC result read signal MAC_RD_RST having a logic "high" level may be transmitted from the command/address decoder 3100 to the left output circuit 3040L and the right output circuit 3040R. The left output circuit 3040L and the right output circuit 3040R may output the first left MAC data D_MAC(1)L and the first right MAC data D_MAC(1)R as output data of the first left MAC operator MAC(0)L and the first right MAC operator MAC(0)R in response to the MAC result read signal MAC_RD_RST having a logic "high" level. The first left MAC data D_MAC(1)L and the first right MAC data D_MAC(1)R outputted from the first left MAC operator MAC(0)L and the first right MAC operator MAC(0)R may be transmitted to the first additional adder AD_ADD(0). The first additional adder AD_ADD(0) may perform an adding calculation of the first left MAC data D_MAC(1)L and the first right MAC data D_MAC(1)R to generate and output first MAC result data MAC_RST(1).

Figure 49:
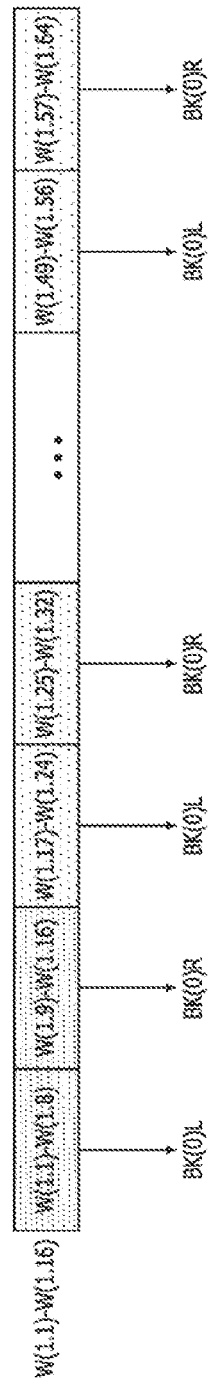
FIG. 49 illustrates a process for storing weight data arrayed in a first row of the weight matrix shown in FIG. 33 into a first left memory bank and a first right memory bank included in the PIM device of FIG. 47.

FIG. 49 illustrates a process for storing the weight data W(1.1)-W(1.64) arrayed in the first row R(1) of the weight matrix 2100 shown in FIG. 33 into the first left memory bank BK(0)L and the first right memory bank BK(0)R included in the PIM device 3000 of FIG. 47. The following description may be equally applied to processes for storing the weight data arrayed in the remaining rows R(2)-R(64) of the weight matrix 2100 shown in FIG. 33 into the second to sixteenth left memory banks BK(1)L-BK(15)L and the second to sixteenth right memory banks BK(1)R-BK(15)R. As described with reference to FIG. 48, the first MAC arithmetic operation for the weight data W(1.1)-W(1.64) in the first row R(1) of the weight matrix 2100 shown in FIG. 33 may be performed by the first left MAC operator MAC(0)L and the first right MAC operator MAC(0)R. Hereinafter, for the purpose of ease and convenience in explanation, the first MAC arithmetic operation performed by the first left MAC operator MAC(0)L will be referred to as 'a first left MAC arithmetic operation', and the first MAC arithmetic operation performed by the first right MAC operator MAC(0)R will be referred to as 'a first right MAC arithmetic operation'. In addition, the weight data stored in the first left memory bank BK(0)L will be referred to as 'first left weight data', and the weight data stored in the first right memory bank BK(0)R will be referred to as 'first right weight data'.

Referring to FIG. 49, the left weight data used for the first left MAC arithmetic operation among the weight data W(1.1)-W(1.64) arrayed in the first row R(1) of the weight matrix 2100 illustrated in FIG. 33 may be stored in the first left memory bank BK(0)L, and the right weight data used for the first right MAC arithmetic operation among the weight data W(1.1)-W(1.64) arrayed in the first row R(1) of the weight matrix 2100 illustrated in FIG. 33 may be stored in the first right memory bank BK(0)R. When each of the number of the multipliers in the left multiplying circuit and the number of the multipliers in the right multiplying circuit is "K" (where, "K" is "N/n", and "n" is a natural number), the weight data in the $j^{th}$ row of the weight matrix 2100 may be stored in the $(j-iL)^{th}$ left memory bank and the $(j-iL)^{th}$ right memory bank in units of (2×K) sets of weight data. Because the "K" is equal to "8" in the present embodiment, the weight data W(1.1)-W(1.64) in the first row R(1) (when "i" is zero and "j" is one) may be stored in the first left memory banks BK(0)L and the first right memory bank BK(0)R in units of sixteen sets of the weight data. Thus, the weight data W(1.1)-W(1.8) located at cross points of the first row R(1) and the first to eighth columns C(1)-C(8) may be stored in the first left memory bank BK(0)L, and the weight data W(1.9)-W(1.16) located at cross points of the first row R(1) and the ninth to sixteenth columns C(9)-C(16) may be stored in the first right memory bank BK(0)R. In addition, the weight data W(1.17)-W(1.24) located at cross points of the first row R(1) and the seventeenth to $24^{th}$ columns C(17)-C(24) may also be stored in the first left memory bank BK(0)L, and the weight data W(1.25)-W(1.32) located at cross points of the first row R(1) and the $25^{th}$ to $32^{nd}$ columns C(25)-C(32) may also be stored in the first right memory bank BK(0)R. In the same way, the weight data W(1.49)-W(1.56) located at cross points of the first row R(1) and the $49^{th}$ to $56^{th}$ columns C(49)-C(56) may also be stored in the first left memory bank BK(0)L, and the weight data W(1.57)-W(1.64) located at cross points of the first row R(1) and the $57^{th}$ to $64^{th}$ columns C(57)-C(64) may also be stored in the first right memory bank BK(0)R.

Figure 50:
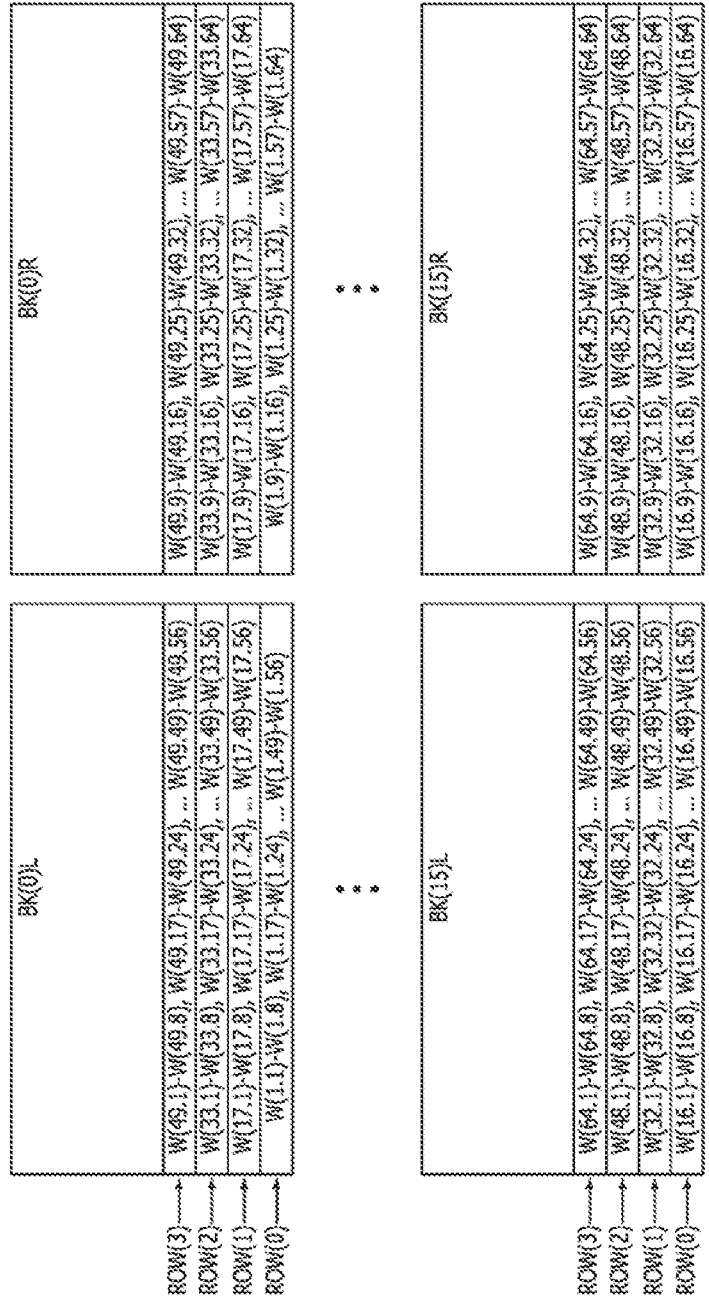
FIG. 50 illustrates a state of left memory banks and right memory banks of the PIM device of FIG. 47 in which weight data of a weight matrix of FIG. 33 are stored.

FIG. 50 illustrates a state of the left memory banks BK(0)L-BK(15)L and the right memory banks BK(0)R-BK(15)R of the PIM device 3000 of FIG. 47 in which the weight data of the weight matrix 2100 of FIG. 33 are stored. Referring to FIG. 50, sixty four sets of the weight data W(1.1)-W(1.64) in the first row R(1) of the weight matrix 2100 may be stored in the first rows ROW(0) of the first left memory bank BK(0)L and the first right memory bank BK(0)R, as described with reference to FIG. 49. Thus, the weight data W(1.1)-W(1.8) located at cross points of the first row R(1) and the first to eighth columns C(1)-C(8), the weight data W(1.17)-W(1.24) located at cross points of the first row R(1) and the seventeenth to $24^{th}$ columns C(17)-C(24), . . . , and the weight data W(1.49)-W(1.56) located at cross points of the first row R(1) and the $49^{th}$ to $56^{th}$ columns C(49)-C(56) may be sequentially stored in the first row ROW(0) of the first left memory bank BK(0)L in one direction. Similarly, the weight data W(1.9)-W(1.16) located at cross points of the first row R(1) and the ninth to sixteenth columns C(9)-C(16), the weight data W(1.25)-W(1.32) located at cross points of the first row R(1) and the $25^{th}$ and $32^{nd}$ columns C(25)-C(32), . . . , and the weight data W(1.57)-W(1.64) located at cross points of the first row R(1) and the $57^{th}$ to $64^{th}$ columns C(57)-C(64) may be sequentially stored in the first row ROW(0) of the first right memory bank BK(0)R in one direction.

The weight data arrayed in the second to sixteenth rows R(2)-R(16) of the weight matrix 2100 may also be stored in the first rows ROW(0) of the second to sixteenth left memory banks BK(1)L-BK(15)L and the first rows ROW(0) of the second to sixteenth right memory banks BK(1)R-BK(15)R in the same way as described above. Thus, the weight data W(16.1)-W(16.8) located at cross points of the sixteenth row R(16) and the first to eighth columns C(1)-C(8), the weight data W(16.17)-W(16.24) located at cross points of the sixteenth row R(16) and the seventeenth to 24$^{th}$ columns C(17)-C(24), . . . , and the weight data W(16.49)-W(16.56) located at cross points of the sixteenth row R(16) and the 49$^{th}$ to 56$^{th}$ columns C(49)-C(56) may be sequentially stored in the first row ROW(0) of the sixteenth left memory bank BK(15)L in one direction. Similarly, the weight data W(16.9)-W(16.16) located at cross points of the sixteenth row R(16) and the ninth to sixteenth columns C(9)-C(16), the weight data W(16.25)-W(16.32) located at cross points of the sixteenth row R(16) and the 25$^{th}$ and 32$^{nd}$ columns C(25)-C(32), . . . , and the weight data W(16.57)-W(16.64) located at cross points of the sixteenth row R(16) and the 57$^{th}$ to 64$^{th}$ columns C(57)-C(64) may be sequentially stored in the first row ROW(0) of the sixteenth right memory bank BK(15)R in one direction.

The weight data W(17.1)-W(17.64), . . . , and W(32.1)-W(32.64) arrayed in the seventeenth to 32$^{nd}$ rows R(17)-R(32) of the weight matrix 2100 may also be stored in the second rows ROW(1) of the first to sixteenth left memory banks BK(0)L-BK(15)L and the second rows ROW(1) of the first to sixteenth right memory banks BK(0)R-BK(15)R in the same way as the process for storing the weight data arrayed in the first to sixteenth rows R(1)-R(16) of the weight matrix 2100. Moreover, the weight data W(33.1)-W(33.64), . . . , and W(48.1)-W(48.64) arrayed in the 33$^{rd}$ to 48$^{th}$ rows R(33)-R(48) of the weight matrix 2100 may also be stored in the third rows ROW(2) of the first to sixteenth left memory banks BK(0)L-BK(15)L and the third rows ROW(2) of the first to sixteenth right memory banks BK(0)R-BK(15)R. Furthermore, the weight data W(49.1)-W(49.64), . . . , and W(64.1)-W(64.64) arrayed in the 49$^{th}$ to 64$^{th}$ rows R(49)-R(64) of the weight matrix 2100 may also be stored in the fourth rows ROW(3) of the first to sixteenth left memory banks BK(0)L-BK(15)L and the fourth rows ROW(3) of the first to sixteenth right memory banks BK(0)R-BK(15)R.

Figure 51:
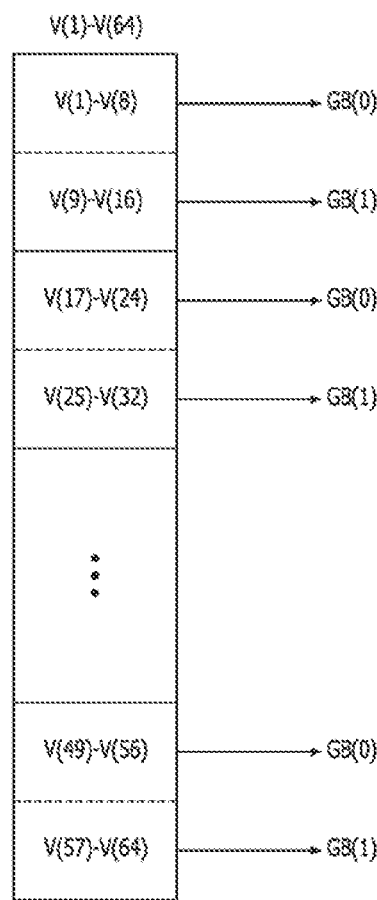
FIG. 51 illustrates a process for storing vector data of a vector matrix of FIG. 33 into a first global buffer and a second global buffer included in the PIM device of FIG. 47.

FIG. 51 illustrates a process for storing the vector data V(1)-V(64) of the vector matrix 2200 illustrated in FIG. 33 into the first global buffer GB(0) and the second global buffer GB(1) included in the PIM device 3000 of FIG. 47. Referring to FIG. 51, as described with reference to FIG. 47, the first global buffer GB(0) may store the vector data used for the left MAC arithmetic operations performed for the weight data stored in the left memory banks BK(0)L-BK(15)L, and the second global buffer GB(1) may store the vector data used for the right MAC arithmetic operations performed for the weight data stored in the right memory banks BK(0)R-BK(15)R. Thus, before the MAC arithmetic operations are performed, the vector data used for the left MAC arithmetic operations are stored in the first global buffer GB(0) and the vector data used for the right MAC arithmetic operations are stored in the second global buffer GB(1). That is, the vector data used for the left MAC arithmetic operations with the weight data stored in the left memory banks BK(0)L-BK(15)L may be stored in the first global buffer GB(0), and the vector data used for the right MAC arithmetic operations with the weight data stored in the right memory banks BK(0)R-BK(15)R may be stored in the second global buffer GB(1).

Specifically, like the weight data in the first row R(1), the vector data V(1)-V(64) may be equally divided into four groups, each of which includes sixteen sets of vector data, and the sixteen sets of vector data may be equally divided into two groups which are stored in respective ones of the first global buffer GB(0) and the second global buffer GB(1). Thus, the vector data V(1)-V(8) arrayed in the first to eighth rows of the vector matrix 2200 may be stored in the first global buffer GB(0), and the vector data V(9)-V(16) arrayed in the ninth to sixteenth rows of the vector matrix 2200 may be stored in the second global buffer GB(1). In addition, the vector data V(17)-V(24) arrayed in the seventeenth to 24$^{th}$ rows of the vector matrix 2200 may also be stored in the first global buffer GB(0), and the vector data V(25)-V(32) arrayed in the 25$^{th}$ to 32$^{nd}$ rows of the vector matrix 2200 may also be stored in the second global buffer GB(1). In the same way, the vector data V(49)-V(56) arrayed in the 49$^{th}$ to 56$^{th}$ rows of the vector matrix 2200 may also be stored in the first global buffer GB(0), and the vector data V(57)-V(64) arrayed in the 57$^{th}$ to 64$^{th}$ rows of the vector matrix 2200 may also be stored in the second global buffer GB(1).

The MAC arithmetic operation corresponding to the matrix multiplying calculation of FIG. 33 in the PIM device 3000 according to the present embodiment may be performed in substantially the same way as described with reference to FIG. 36. However, the PIM device 3000 may be different from the PIM device 1000 illustrated in FIG. 31 in that the MAC arithmetic operation for the weight data located at a cross position of one row R and one weight group column WGC and the vector data in one vector group row VGR includes the left MAC arithmetic operation and the right MAC arithmetic operation which are performed by the left MAC operator and the right MAC operator that are separated from each other. Thus, in the PIM device 3000 according to the present embodiment, the first MAC arithmetic operation for the weight data W(1.1)-W(1.64), . . . , and W(16.1)-W(16.64) in the first weight group row WGR(1) of the weight matrix 2100 and the vector data V(1)-V(64) of the vector matrix 2200 may be performed in parallel by the first to sixteenth left MAC operators MAC(0)L-MAC(15)L and the first to sixteenth right MAC operators MAC(0)R-MAC(15)R. The first MAC arithmetic operation may be performed by sequentially executing the first to fourth sub-MAC arithmetic operations, as described with reference to FIG. 36. The first to sixteenth additional adders AD_ADD(0)-AD_ADD(15) may output the first to sixteenth MAC result data MAC_RST(1)-MAC_RST(16) as a result of the first MAC arithmetic operation.

The second MAC arithmetic operation for the weight data W(17.1)-W(17.64), . . . W(32.1)-W(32.64) in the second weight group row WGR(2) of the weight matrix 2100 and the vector data V(1)-V(64) of the vector matrix 2200 may be performed in the same way as the first MAC arithmetic operation, and the third MAC arithmetic operation for the weight data W(33.1)-W(33.64), . . . W(48.1)-W(48.64) in the third weight group row WGR(3) of the weight matrix 2100 and the vector data V(1)-V(64) of the vector matrix 2200 may also be performed in the same way as the first MAC arithmetic operation. In addition, the fourth MAC arithmetic operation for the weight data W(49.1)-W(49.64), . . . W(64.1)-W(64.64) in the fourth weight group row WGR(4) of the weight matrix 2100 and the vector data V(1)-V(64) of the vector matrix 2200 may also be performed in the same way as the first MAC arithmetic operation. The first to sixteenth additional adders AD_ADD(0)-AD_ADD(15) may output the seventeenth to 32$^{nd}$ MAC result data MAC_RST(17)-MAC_RST(32) as a result of the second MAC arithmetic operation, and the first to sixteenth additional adders AD_ADD(0)-AD_ADD(15) may output the 33$^{rd}$ to 48$^{th}$ MAC result data MAC_RST(33)-MAC_RST(48) as a result of the third MAC arithmetic operation. Moreover, the first to sixteenth additional adders AD_ADD (0)-AD_ADD(15) may output the 49$^{th}$ to 64$^{th}$ MAC result data MAC_RST(49)-MAC_RST(64) as a result of the fourth MAC arithmetic operation.

Figure 52:
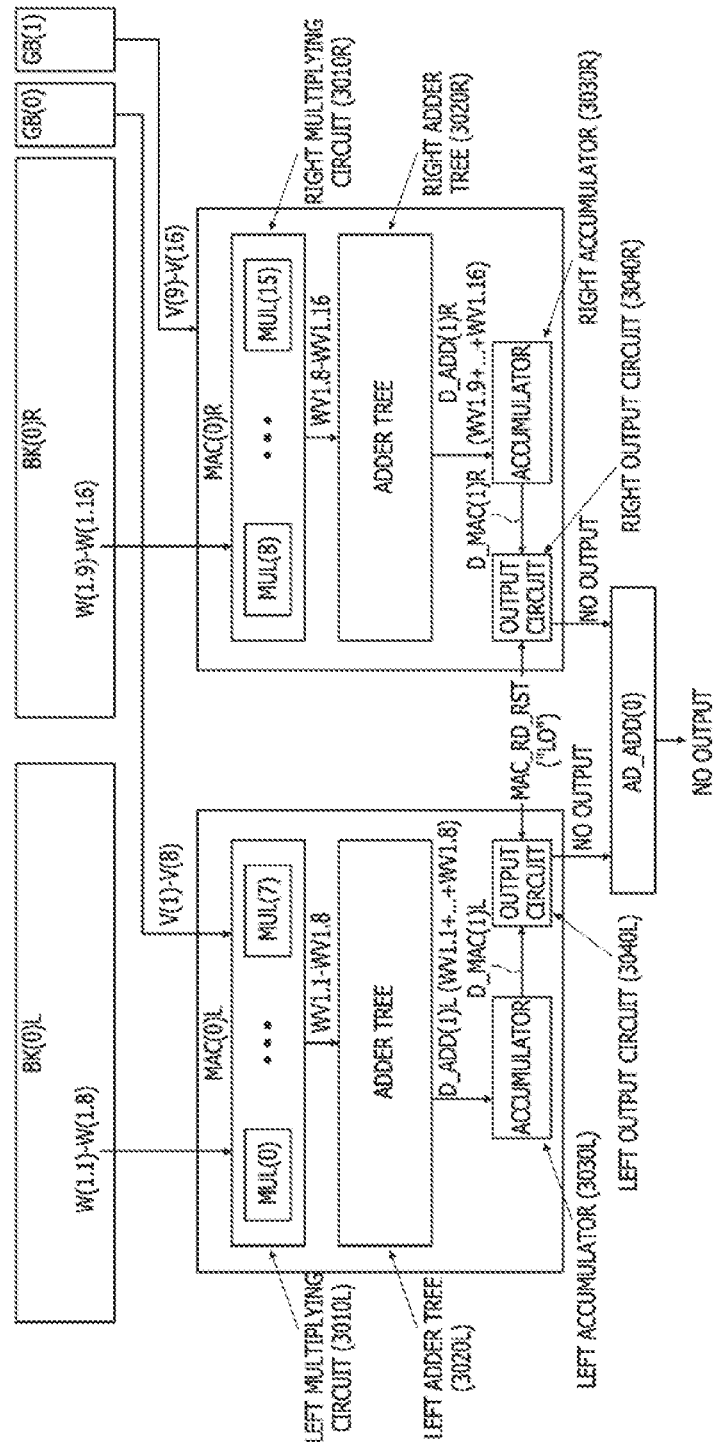
FIG. 52 illustrates a first sub-MAC arithmetic operation of a first MAC arithmetic operation performed by a first left MAC operator and a first right MAC operator included in the PIM device of FIG. 47.

FIG. 52 illustrates the first sub-MAC arithmetic operation of the first MAC arithmetic operation performed by the first left MAC operator MAC(0)L and the first right MAC operator MAC(0)R included in the PIM device 3000 of FIG. 47. In FIG. 52, the same reference numerals or the same reference symbols as used in FIG. 48 denote the same elements. The following description for the first sub-MAC arithmetic operation of the first MAC arithmetic operation performed by the first left MAC operator MAC(0)L and the first right MAC operator MAC(0)R may be equally applied to the first sub-MAC arithmetic operations of the first MAC arithmetic operations performed by the second to sixteenth left MAC operator MAC(1)L-MAC(15)L and the second to sixteenth right MAC operator MAC(1)R-MAC(15)R. In addition, the first sub-MAC arithmetic operation of the second MAC arithmetic operation, the first sub-MAC arithmetic operation of the third MAC arithmetic operation, and the first sub-MAC arithmetic operation of the fourth MAC arithmetic operation performed by the first to sixteenth left MAC operators MAC(0)L-MAC(15)L and the first to sixteenth right MAC operators MAC(0)R-MAC(15)R may also be performed in substantially the same way as the first sub-MAC arithmetic operation of the first MAC arithmetic operation performed by the first to sixteenth left MAC operators MAC(0)L-MAC(15)L and the first to sixteenth right MAC operators MAC(0)R-MAC(15)R.

Referring to FIG. 52, in order to perform the first sub-MAC arithmetic operation of the first MAC arithmetic operation, the first left memory bank BK(0)L may transmit the weight data W(1.1)-W(1.8), which are located at cross points of the first row R(1) and the first to eighth columns C(1)-C(8) of the weight matrix 2100, to the left multiplying circuit 3010L of the first left MAC operator MAC(0)L. The first global buffer GB(0) may transmit the vector data V(1)-V(8) arrayed in the first to eighth rows of the vector matrix 2200 to the left multiplying circuit 3010L of the first left MAC operator MAC(0)L. The first right memory bank BK(0)R may transmit the weight data W(1.9)-W(1.16), which are located at cross points of the first row R(1) and the ninth to sixteenth columns C(9)-C(16) of the weight matrix 2100, to the right multiplying circuit 3010R of the first right MAC operator MAC(0)R. The second global buffer GB(1) may transmit the vector data V(9)-V(16) arrayed in the ninth to sixteenth rows of the vector matrix 2200 to the right multiplying circuit 3010R of the first right MAC operator MAC(0)R.

The first to eighth multipliers MUL(0)-MUL(7) constituting the left multiplying circuit 3010L may perform a multiplying calculation of the weight data W(1.1)-W(1.8) and the vector data V(1)-V(8) to output first to eighth multiplication result data WV1.1-WV1.8 as a result of the multiplying calculation. The ninth to sixteenth multipliers MUL(8)-MUL(15) constituting the right multiplying circuit 3010R may perform a multiplying calculation of the weight data W(1.9)-W(1.16) and the vector data V(9)-V(16) to output ninth to sixteenth multiplication result data WV1.9-WV1.16 as a result of the multiplying calculation. The left adder tree 3020L may perform an adding calculation of the first to eighth multiplication result data WV1.1-WV1.8 to output first left addition result data D_ADD(1)L as a result of the adding calculation. The right adder tree 3020R may perform an adding calculation of the ninth to sixteenth multiplication result data WV1.9-WV1.16 to output first right addition result data D_ADD(1)R as a result of the adding calculation.

The left accumulator 3030L may perform an accumulative adding calculation for the first left addition result data D_ADD(1)L to generate and output first left MAC data D_MAC(1)L. The first left MAC data D_MAC(1)L generated by the accumulative adding calculation may be latched in a latch circuit of the left accumulator 3030L. Because the latch circuit in the left accumulator 3030L has a reset state during an initial accumulative adding calculation, the first left MAC data D_MAC(1)L may be the same as the first left addition result data D_ADD(1)L. The first left MAC data D_MAC(1)L may be transmitted to the left output circuit 3040L. The right accumulator 3030R may perform an accumulative adding calculation for the first right addition result data D_ADD(1)R to generate and output first right MAC data D_MAC(1)R. The first right MAC data D_MAC(1)R generated by the accumulative adding calculation may be latched in a latch circuit of the right accumulator 3030R. Because the latch circuit in the right accumulator 3030R has a reset state during an initial accumulative adding calculation, the first right MAC data D_MAC(1)R may be the same as the first right addition result data D_ADD(1)R. The first right MAC data D_MAC(1)R may be transmitted to the right output circuit 3040R. The left output circuit 3040L and the right output circuit 3040R do not output the first left MAC data D_MAC(1)L and the first right MAC data D_MAC(1)R in response to the MAC result read signal MAC_RD_RST having a logic "low(LO)" level. Accordingly, the first additional adder AD_ADD(0) does not output any MAC result data MAC_RST.

Figure 53:
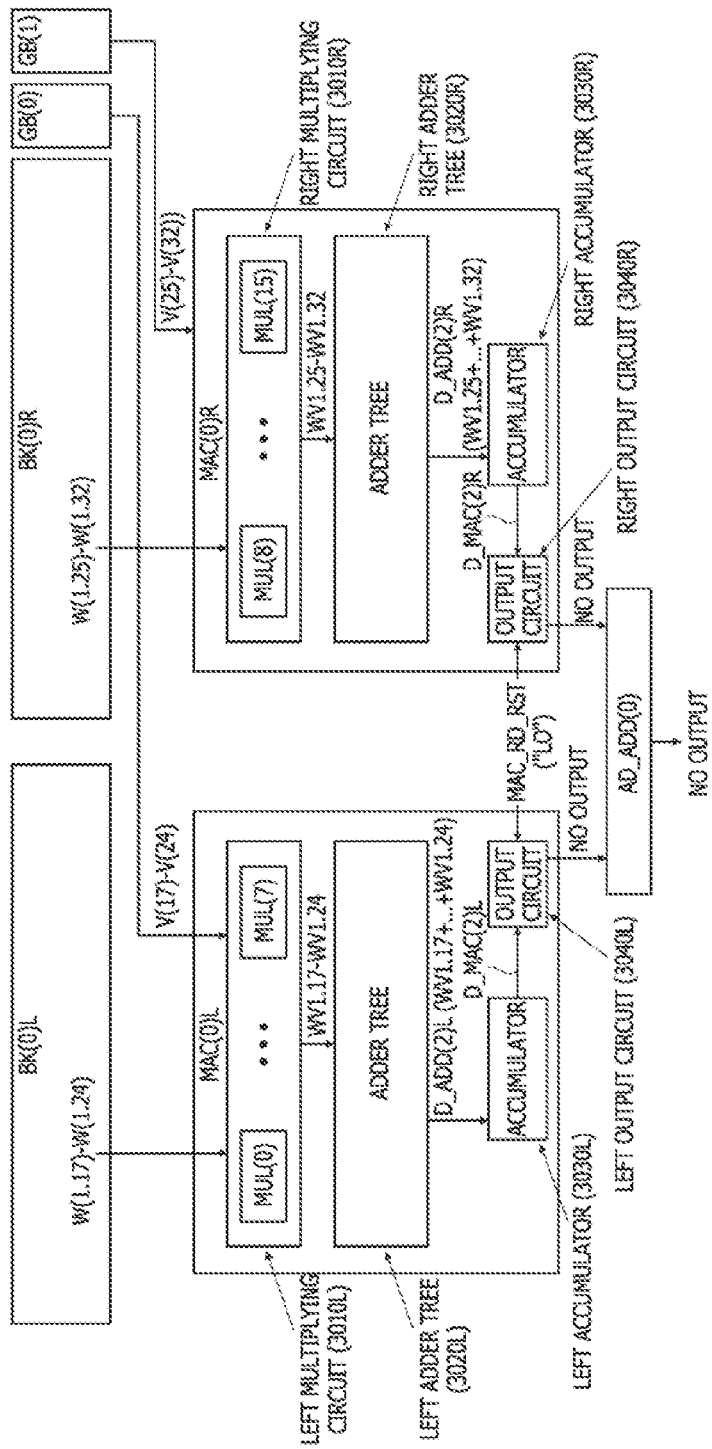
FIG. 53 illustrates a second sub-MAC arithmetic operation of a first MAC arithmetic operation performed by a first left MAC operator and a first right MAC operator included in the PIM device of FIG. 47.

FIG. 53 illustrates the second sub-MAC arithmetic operation of the first MAC arithmetic operation performed by the first left MAC operator MAC(0)L and the first right MAC operator MAC(0)R included in the PIM device 3000 of FIG. 47. In FIG. 53, the same reference numerals or the same reference symbols as used in FIG. 48 denote the same elements. The following description for the second sub-MAC arithmetic operation of the first MAC arithmetic operation performed by the first left MAC operator MAC (0)L and the first right MAC operator MAC(0)R may be equally applied to the second sub-MAC arithmetic operations of the first MAC arithmetic operations performed by the second to sixteenth left MAC operator MAC(1)L-MAC (15)L and the second to sixteenth right MAC operator MAC(1)R-MAC(15)R. In addition, the second sub-MAC arithmetic operation of the second MAC arithmetic operation, the second sub-MAC arithmetic operation of the third MAC arithmetic operation, and the second sub-MAC arithmetic operation of the fourth MAC arithmetic operation performed by the first to sixteenth left MAC operators MAC(0)L-MAC(15)L and the first to sixteenth right MAC operators MAC(0)R-MAC(15)R may also be performed in substantially the same way as the second sub-MAC arithmetic operation of the first MAC arithmetic operation performed by the first to sixteenth left MAC operators MAC (0)L-MAC(15)L and the first to sixteenth right MAC operators MAC(0)R-MAC(15)R.

Referring to FIG. 53, in order to perform the second sub-MAC arithmetic operation of the first MAC arithmetic operation, the first left memory bank BK(0)L may transmit the weight data W(1.17)-W(1.24), which are located at cross points of the first row R(1) and the seventh to 24$^{th}$ columns C(17)-C(24) of the weight matrix 2100, to the left multiplying circuit 3010L of the first left MAC operator MAC (0)L. The first global buffer GB(0) may transmit the vector data V(17)-V(24) arrayed in the seventh to 24$^{th}$ rows of the vector matrix 2200 to the left multiplying circuit 3010L of the first left MAC operator MAC(0)L. The first right memory bank BK(0)R may transmit the weight data W(1.25)-W(1.32), which are located at cross points of the first row R(1) and the 25$^{th}$ to 32$^{nd}$ columns C(25)-C(32) of the weight matrix 2100, to the right multiplying circuit 3010R of the first right MAC operator MAC(0)R. The second global buffer GB(1) may transmit the vector data V(25)-V(32) arrayed in the 25$^{th}$ to 32$^{nd}$ rows of the vector matrix 2200 to the right multiplying circuit 3010R of the first right MAC operator MAC(0)R.

The first to eighth multipliers MUL(0)-MUL(7) constituting the left multiplying circuit 3010L may perform a multiplying calculation of the weight data W(1.17)-W(1.24) and the vector data V(17)-V(24) to output seventeenth to 24$^{th}$ multiplication result data WV1.17-WV1.24 as a result of the multiplying calculation. The ninth to sixteenth multipliers MUL(8)-MUL(15) constituting the right multiplying circuit 3010R may perform a multiplying calculation of the weight data W(1.25)-W(1.32) and the vector data V(25)-V(32) to output 25$^{th}$ to 32$^{nd}$ multiplication result data WV1.25-WV1.32 as a result of the multiplying calculation. The left adder tree 3020L may perform an adding calculation of the seventeenth to 24$^{th}$ multiplication result data WV1.17-WV1.24 to output second left addition result data D_ADD(2)L as a result of the adding calculation. The right adder tree 3020R may perform an adding calculation of the 25$^{th}$ to 32$^{nd}$ multiplication result data WV1.25-WV1.32 to output second right addition result data D_ADD(2)R as a result of the adding calculation.

The left accumulator 3030L may perform an accumulative adding calculation for the second left addition result data D_ADD(2)L to generate and output second left MAC data D_MAC(2)L. The second left MAC data D_MAC(2)L generated by the accumulative adding calculation may be latched in the latch circuit of the left accumulator 3030L. Because the first left MAC data D_MAC(1)L are latched in the latch circuit included in the left accumulator 3030L before the accumulative adding calculation, the second left MAC data D_MAC(2)L may have a value corresponding to a sum of the first left MAC data D_MAC(1)L and the second left addition result data D_ADD(2)L by the accumulative adding calculation. The second left MAC data D_MAC(2)L may be transmitted to the left output circuit 3040L. The right accumulator 3030R may perform an accumulative adding calculation for the second right addition result data D_ADD(2)R to generate and output second right MAC data D_MAC(2)R. The second right MAC data D_MAC(2)R generated by the accumulative adding calculation may be latched in the latch circuit of the right accumulator 3030R. Because the first right MAC data D_MAC(1)R are latched in the latch circuit included in the right accumulator 3030R before the accumulative adding calculation, the second right MAC data D_MAC(2)R may have a value corresponding to a sum of the first right MAC data D_MAC(1)R and the second right addition result data D_ADD(2)R by the accumulative adding calculation. The second right MAC data D_MAC(2)R may be transmitted to the right output circuit 3040R. The left output circuit 3040L and the right output circuit 3040R do not output the second left MAC data D_MAC(2)L and the second right MAC data D_MAC(2)R in response to the MAC result read signal MAC_RD_RST having a logic "low(LO)" level. Accordingly, the first additional adder AD_ADD(0) does not output any MAC result data MAC_RST.

Figure 54:
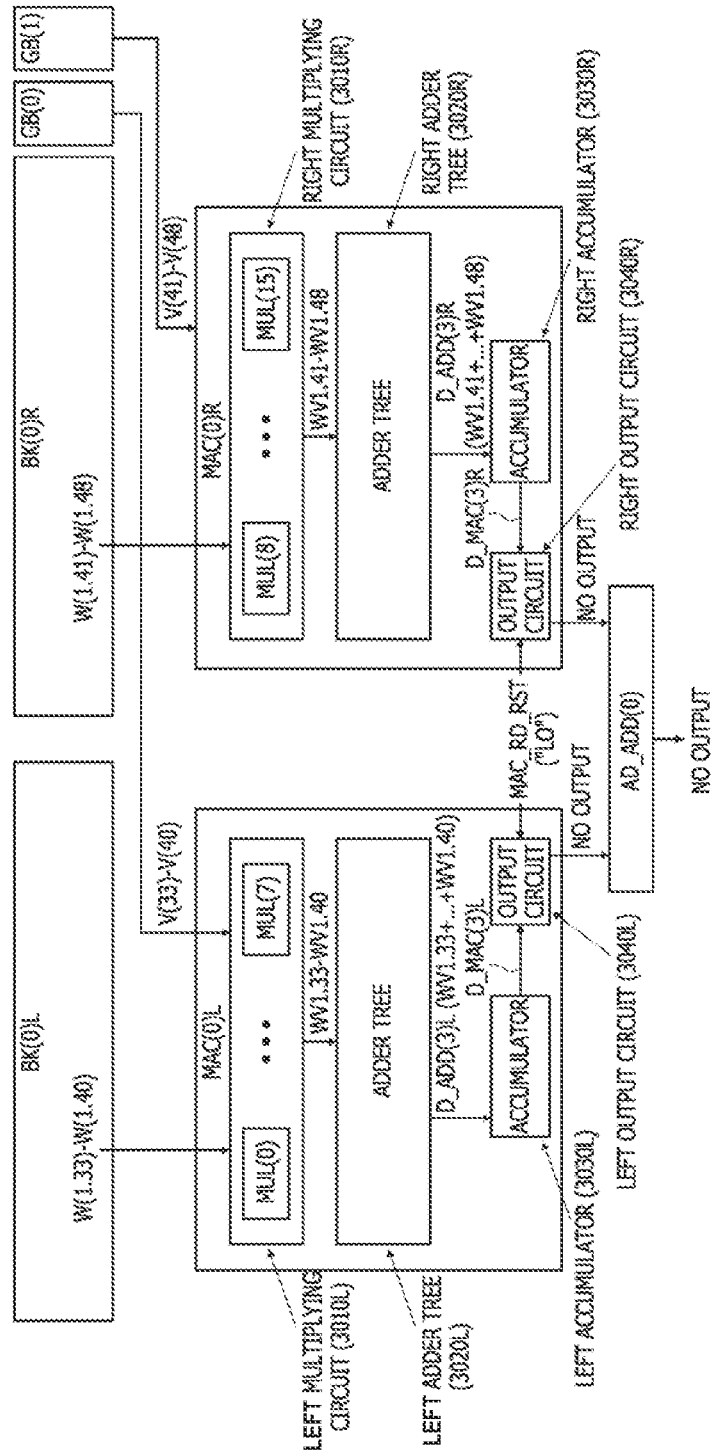
FIG. 54 illustrates a third sub-MAC arithmetic operation of a first MAC arithmetic operation performed by a first left MAC operator and a first right MAC operator included in the PIM device of FIG. 47.

FIG. 54 illustrates the third sub-MAC arithmetic operation of the first MAC arithmetic operation performed by the first left MAC operator MAC(0)L and the first right MAC operator MAC(0)R included in the PIM device 3000 of FIG. 47. In FIG. 54, the same reference numerals or the same reference symbols as used in FIG. 48 denote the same elements. The following description for the third sub-MAC arithmetic operation of the first MAC arithmetic operation performed by the first left MAC operator MAC(0)L and the first right MAC operator MAC(0)R may be equally applied to the third sub-MAC arithmetic operations of the first MAC arithmetic operations performed by the second to sixteenth left MAC operator MAC(1)L-MAC(15)L and the second to sixteenth right MAC operator MAC(1)R-MAC(15)R. In addition, the third sub-MAC arithmetic operation of the second MAC arithmetic operation, the third sub-MAC arithmetic operation of the third MAC arithmetic operation, and the third sub-MAC arithmetic operation of the fourth MAC arithmetic operation performed by the first to sixteenth left MAC operators MAC(0)L-MAC(15)L and the first to sixteenth right MAC operators MAC(0)R-MAC(15)R may also be performed in substantially the same way as the third sub-MAC arithmetic operation of the first MAC arithmetic operation performed by the first to sixteenth left MAC operators MAC(0)L-MAC(15)L and the first to sixteenth right MAC operators MAC(0)R-MAC(15)R.

Referring to FIG. 54, in order to perform the third sub-MAC arithmetic operation of the first MAC arithmetic operation, the first left memory bank BK(0)L may transmit the weight data W(1.33)-W(1.40), which are located at cross points of the first row R(1) and the 33$^{rd}$ to 40$^{th}$ columns C(33)-C(40) of the weight matrix 2100, to the left multiplying circuit 3010L of the first left MAC operator MAC(0)L. The first global buffer GB(0) may transmit the vector data V(33)-V(40) arrayed in the 33$^{rd}$ to 40$^{th}$ rows of the vector matrix 2200 to the left multiplying circuit 3010L of the first left MAC operator MAC(0)L. The first right memory bank BK(0)R may transmit the weight data W(1.41)-W(1.48), which are located at cross points of the first row R(1) and the 41$^{st}$ to 48$^{th}$ columns C(41)-C(48) of the weight matrix 2100, to the right multiplying circuit 3010R of the first right MAC operator MAC(0)R. The second global buffer GB(1) may transmit the vector data V(41)-V(48) arrayed in the 41$^{st}$ to 48$^{th}$ rows of the vector matrix 2200 to the right multiplying circuit 3010R of the first right MAC operator MAC(0)R.

The first to eighth multipliers MUL(0)-MUL(7) constituting the left multiplying circuit 3010L may perform a multiplying calculation of the weight data W(1.33)-W(1.40) and the vector data V(33)-V(40) to output 33$^{rd}$ to 40$^{th}$ multiplication result data WV1.33-WV1.40 as a result of the multiplying calculation. The ninth to sixteenth multipliers MUL(8)-MUL(15) constituting the right multiplying circuit 3010R may perform a multiplying calculation of the weight data W(1.41)-W(1.48) and the vector data V(41)-V(48) to output 41$^{st}$ to 48$^{th}$ multiplication result data WV1.41-WV1.48 as a result of the multiplying calculation. The left adder tree 3020L may perform an adding calculation of the 33$^{rd}$ to 40$^{th}$ multiplication result data WV1.33-WV1.40 to output third left addition result data D_ADD(3)L as a result of the adding calculation. The right adder tree 3020R may perform an adding calculation of the 41$^{st}$ to 48$^{th}$ multiplication result data WV1.41-WV1.48 to output third right addition result data D_ADD(3)R as a result of the adding calculation.

The left accumulator 3030L may perform an accumulative adding calculation for the third left addition result data D_ADD(3)L to generate and output third left MAC data D_MAC(3)L. The third left MAC data D_MAC(3)L generated by the accumulative adding calculation may be latched in the latch circuit of the left accumulator 3030L. Because the second left MAC data D_MAC(2)L are latched in the latch circuit included in the left accumulator 3030L before the accumulative adding calculation, the third left MAC data D_MAC(3)L may have a value corresponding to a sum of the second left MAC data D_MAC(2)L and the third left addition result data D_ADD(3)L by the accumulative adding calculation. The third left MAC data D_MAC(3)L may be transmitted to the left output circuit 3040L. The right accumulator 3030R may perform an accumulative adding calculation for the third right addition result data D_ADD(3)R to generate and output third right MAC data D_MAC(3)R. The third right MAC data D_MAC(3)R generated by the accumulative adding calculation may be latched in the latch circuit of the right accumulator 3030R. Because the second right MAC data D_MAC(2)R are latched in the latch circuit included in the right accumulator 3030R before the accumulative adding calculation, the third right MAC data D_MAC(3)R may have a value corresponding to a sum of the second right MAC data D_MAC(2)R and the third right addition result data D_ADD(3)R by the accumulative adding calculation. The third right MAC data D_MAC(3)R may be transmitted to the right output circuit 3040R. The left output circuit 3040L and the right output circuit 3040R do not output the third left MAC data D_MAC(3)L and the third right MAC data D_MAC(3)R in response to the MAC result read signal MAC_RD_RST having a logic "low(LO)" level. Accordingly, the first additional adder AD_ADD(0) does not output any MAC result data MAC_RST.

Figure 55:
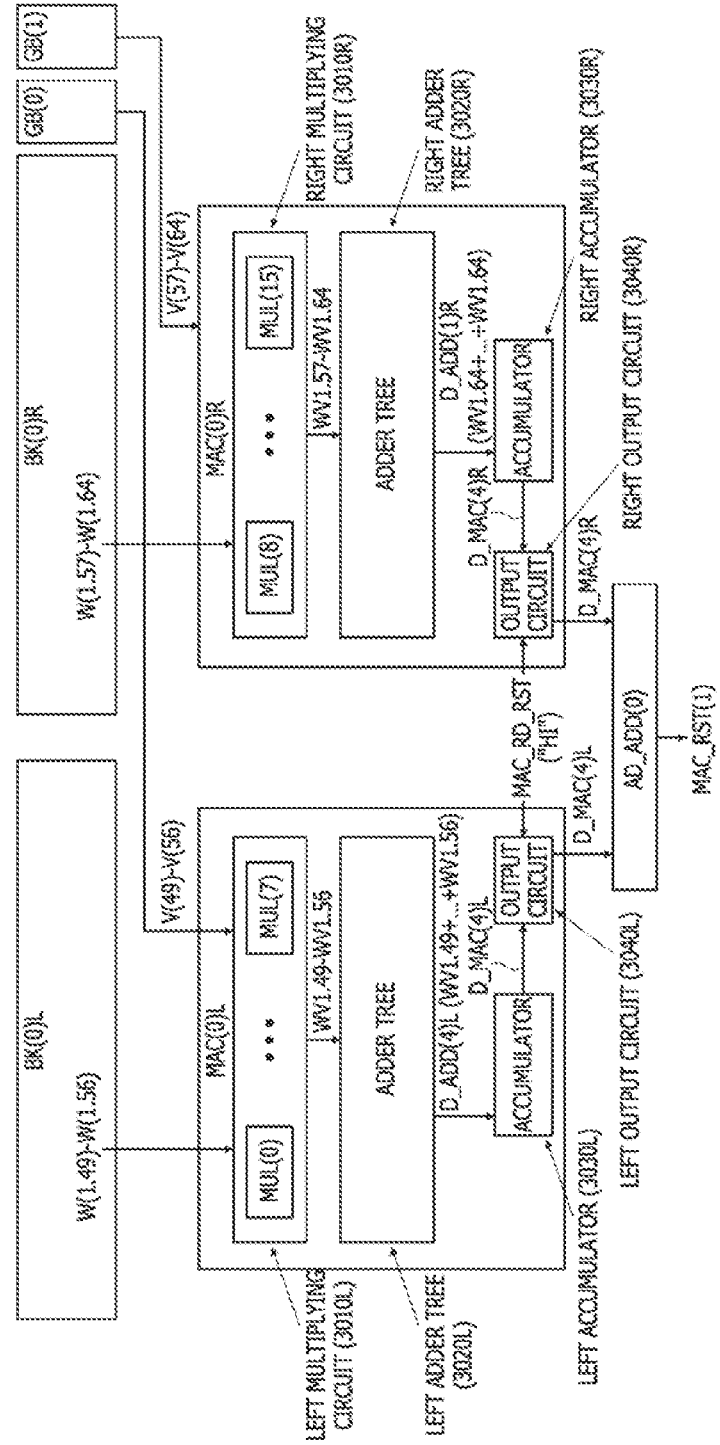
FIG. 55 illustrates a fourth sub-MAC arithmetic operation of a first MAC arithmetic operation performed by a first left MAC operator and a first right MAC operator included in the PIM device of FIG. 47.

FIG. 55 illustrates the fourth sub-MAC arithmetic operation of the first MAC arithmetic operation performed by the first left MAC operator MAC(0)L and the first right MAC operator MAC(0)R included in the PIM device 3000 of FIG. 47. In FIG. 55, the same reference numerals or the same reference symbols as used in FIG. 48 denote the same elements. The following description for the fourth sub-MAC arithmetic operation of the first MAC arithmetic operation performed by the first left MAC operator MAC(0)L and the first right MAC operator MAC(0)R may be equally applied to the fourth sub-MAC arithmetic operations of the first MAC arithmetic operations performed by the second to sixteenth left MAC operator MAC(1)L-MAC(15)L and the second to sixteenth right MAC operator MAC(1)R-MAC(15)R. In addition, the fourth sub-MAC arithmetic operation of the second MAC arithmetic operation, the fourth sub-MAC arithmetic operation of the third MAC arithmetic operation, and the fourth sub-MAC arithmetic operation of the fourth MAC arithmetic operation performed by the first to sixteenth left MAC operators MAC(0)L-MAC(15)L and the first to sixteenth right MAC operators MAC(0)R-MAC(15)R may also be performed in substantially the same way as the fourth sub-MAC arithmetic operation of the first MAC arithmetic operation performed by the first to sixteenth left MAC operators MAC(0)L-MAC(15)L and the first to sixteenth right MAC operators MAC(0)R-MAC(15)R.

Referring to FIG. 55, in order to perform the fourth sub-MAC arithmetic operation of the first MAC arithmetic operation, the first left memory bank BK(0)L may transmit the weight data W(1.49)-W(1.56), which are located at cross points of the first row R(1) and the $49^{th}$ to $56^{th}$ columns C(49)-C(56) of the weight matrix 2100, to the left multiplying circuit 3010L of the first left MAC operator MAC(0)L. The first global buffer GB(0) may transmit the vector data V(49)-V(56) arrayed in the $49^{th}$ to $56^{th}$ rows of the vector matrix 2200 to the left multiplying circuit 3010L of the first left MAC operator MAC(0)L. The first right memory bank BK(0)R may transmit the weight data W(1.57)-W(1.64), which are located at cross points of the first row R(1) and the $57^{th}$ to $64^{th}$ columns C(57)-C(64) of the weight matrix 2100, to the right multiplying circuit 3010R of the first right MAC operator MAC(0)R. The second global buffer GB(1) may transmit the vector data V(57)-V(64) arrayed in the $57^{th}$ to $64^{th}$ rows of the vector matrix 2200 to the right multiplying circuit 3010R of the first right MAC operator MAC(0)R.

The first to eighth multipliers MUL(0)-MUL(7) constituting the left multiplying circuit 3010L may perform a multiplying calculation of the weight data W(1.49)-W(1.56) and the vector data V(49)-V(56) to output $49^{th}$ to $56^{th}$ multiplication result data WV1.49-WV1.56 as a result of the multiplying calculation. The ninth to sixteenth multipliers MUL(8)-MUL(15) constituting the right multiplying circuit 3010R may perform a multiplying calculation of the weight data W(1.57)-W(1.64) and the vector data V(57)-V(64) to output $57^{th}$ to $64^{th}$ multiplication result data WV1.57-WV1.64 as a result of the multiplying calculation. The left adder tree 3020L may perform an adding calculation of the $49^{th}$ to $56^{th}$ multiplication result data WV1.49-WV1.56 to output fourth left addition result data D_ADD(4)L as a result of the adding calculation. The right adder tree 3020R may perform an adding calculation of the $57^{th}$ to $64^{th}$ multiplication result data WV1.57-WV1.64 to output fourth right addition result data D_ADD(4)R as a result of the adding calculation.

The left accumulator 3030L may perform an accumulative adding calculation for the fourth left addition result data D_ADD(4)L to generate and output fourth left MAC data D_MAC(4)L. If the fourth left MAC data D_MAC(4)L are outputted from the left accumulator 3030L, the latch circuit in the left accumulator 3030L may be reset. Because the third left MAC data D_MAC(3)L are latched in the latch circuit included in the left accumulator 3030L before the accumulative adding calculation, the fourth left MAC data D_MAC(4)L may have a value corresponding to a sum of the third left MAC data D_MAC(3)L and the fourth left addition result data D_ADD(4)L by the accumulative adding calculation. The fourth left MAC data D_MAC(4)L may be transmitted to the left output circuit 3040L. The right accumulator 3030R may perform an accumulative adding calculation for the fourth right addition result data D_ADD(4)R to generate and output fourth right MAC data D_MAC(4)R. If the fourth right MAC data D_MAC(4)R are outputted from the right accumulator 3030R, the latch circuit in the right accumulator 3030R may be reset. Because the third right MAC data D_MAC(3)R are latched in the latch circuit included in the right accumulator 3030R before the accumulative adding calculation, the fourth third right MAC data D_MAC(4)R may have a value corresponding to a sum of the third right MAC data D_MAC(3)R and the fourth right addition result data D_ADD(4)R by the accumulative adding calculation. The fourth right MAC data D_MAC(4)R may be transmitted to the right output circuit 3040R.

The left output circuit 3040L and the right output circuit 3040R may output the fourth left MAC data D_MAC(4)L and the fourth right MAC data D_MAC(4)R to the first additional adder AD_ADD(0) in response to the MAC result read signal MAC_RD_RST having a logic "high(HI)" level. The first additional adder AD_ADD(0) may perform an adding calculation of the fourth left MAC data D_MAC(4)L and the fourth right MAC data D_MAC(4)R to generate the first MAC result data MAC_RST(1). The first MAC result data MAC_RST(1) generated by the first to fourth sub-MAC arithmetic operations of the first MAC arithmetic operation may be the same as data that are obtained by a matrix multiplying calculation of the weight data W(1.1)-W(1.64) arrayed in the first row R(1) of the weight matrix 2100 and the vector data V(1)-V(64) of the vector matrix 2200. As described with reference to FIG. 47, the first additional adder AD_ADD(0) may be disposed in the left region. Thus, the first MAC result data MAC_RST(1) generated by the first additional adder AD_ADD(0) may be outputted as output data of the PIM device 300 through the first to sixteenth data I/O circuits DQ1-DQ16.

Figure 56:
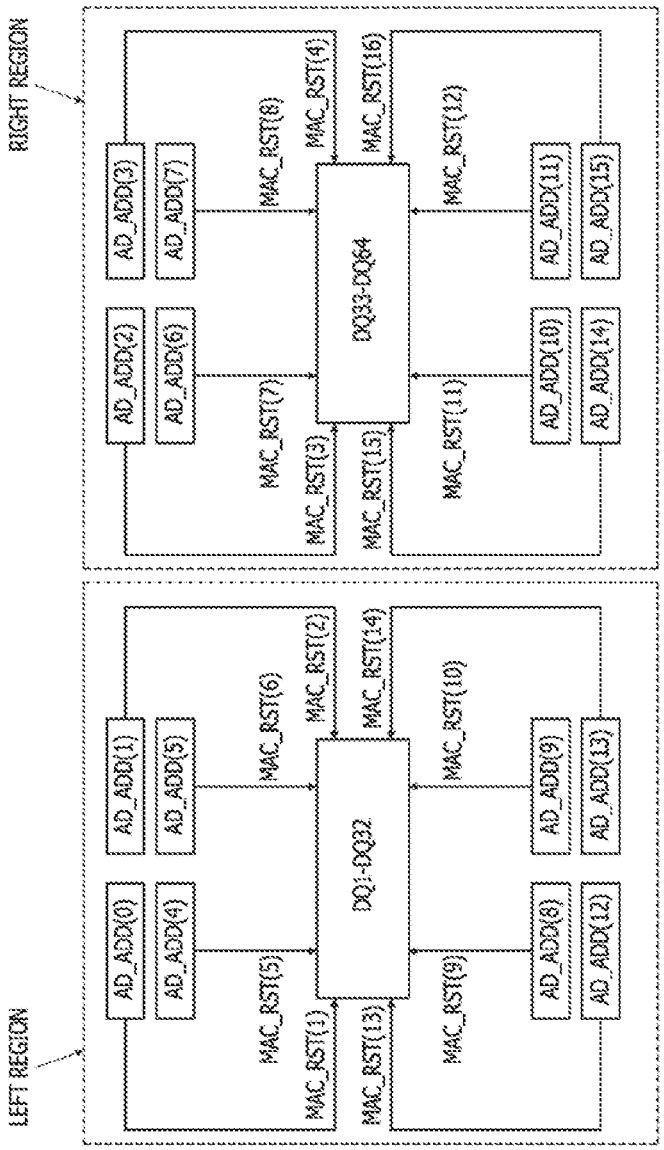
FIG. 56 illustrates a process for transmitting MAC result data from additional adders to data I/O circuits in the PIM device of FIG. 47.

FIG. 56 illustrates a process for transmitting the MAC result data MAC_RSTs from the additional adders AD_ADDs to the data I/O circuits DQs in the PIM device 3000 of FIG. 47. Referring to FIG. 56, the matrix multiplying calculation of the weight data W(1.1)-W(1.64), ..., and W(16.1)-W(16.64) arrayed in the first to sixteenth rows R(1)-R(16) among the first to $64^{th}$ rows R(1)-R(64) of the weight matrix 2100 illustrated in FIG. 33 and the vector data V(1)-V(64) arrayed in the vector matrix 2200 illustrated in FIG. 33 may be performed by the first MAC arithmetic operation. As a result of the first MAC arithmetic operation, the first to sixteenth MAC result data MAC_RST(1)-MAC_RST(16) may be outputted from respective ones of the first to sixteenth additional adders AD_ADD(0)-AD_ADD(15). The MAC result data MAC_RSTs outputted from the left additional adders AD_ADD(L) disposed in the left region may be outputted as output data of the PIM device 3000 through the first to $32^{nd}$ data I/O circuits DQ1-DQ32 disposed in the left region. Similarly, the MAC result data MAC_RSTs outputted from the right additional adders AD_ADD(R) disposed in the right region may be outputted as output data of the PIM device 3000 through the $33^{rd}$ to $64^{th}$ data I/O circuits DQ33-DQ64 disposed in the right region.

As described with reference to FIG. 47, the left additional adders AD_ADD(L) may include the first, second, fifth, sixth, ninth, tenth, thirteenth, and fourteenth additional adders AD_ADD(0), AD_ADD(1), AD_ADD(4), AD_ADD(5), AD_ADD(8), AD_ADD(9), AD_ADD(12), and AD_ADD(13). Thus, the first, second, fifth, sixth, ninth, tenth, thirteenth, and fourteenth MAC result data MAC_RST(1), MAC_RST(2), MAC_RST(5), MAC_RST(6), MAC_RST(9), MAC_RST(10), MAC_RST(13), and MAC_RST(14) outputted from the left additional adders AD_ADD(L) may be outputted from the PIM device 3000 through the first to $32^{nd}$ data I/O circuits DQ1-DQ32. In addition, the right additional adders AD_ADD(R) may include the third, fourth, seventh, eighth, eleventh, twelfth, fifteenth, and sixteenth additional adders AD_ADD(2), AD_ADD(3), AD_ADD(6), AD_ADD(7), AD_ADD(10), AD_ADD(11), AD_ADD(14), and AD_ADD(15). Thus, the third, fourth, seventh, eighth, eleventh, twelfth, fifteenth, and sixteenth MAC result data MAC_RST(3), MAC_RST(4), MAC_RST(7), MAC_RST(8), MAC_RST(11), MAC_RST(12), MAC_RST(15), and MAC_RST(16) outputted from the right additional adders AD_ADD(R) may be outputted from the PIM device 3000 through the $33^{rd}$ to $64^{th}$ data I/O circuits DQ33-DQ64.

Figure 57:
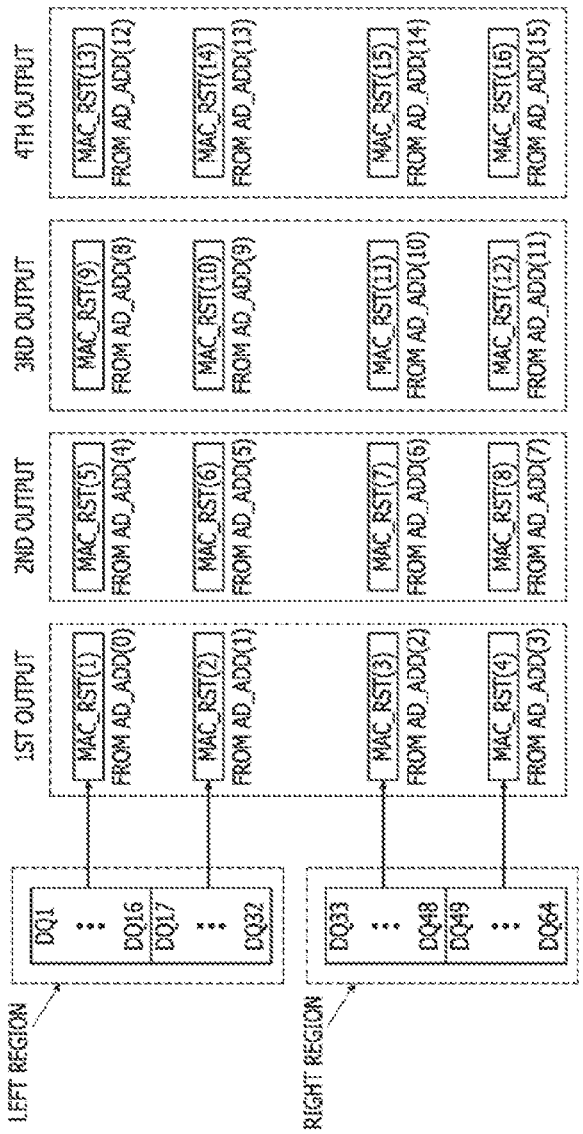
FIG. 57 illustrates an output sequence of MAC result data outputted through data input/output (I/O) circuits included in the PIM device illustrated in FIG. 47.

FIG. 57 illustrates an output sequence of the MAC result data MAC_RSTs outputted through the data I/O circuits DQ1-DQ64 included in the PIM device 3000 illustrated in FIG. 47. Although FIG. 57 illustrates in conjunction with an output sequence of the first to sixteenth MAC result data MAC_RST(1)-MAC_RST(16) generated by the first MAC arithmetic operation, sixteen sets of the MAC result data generated by each of the second, third, and fourth MAC arithmetic operations may also be outputted in the same sequence as described with reference to FIG. 57. In the present embodiment, it may be assumed that each of the first to sixteenth MAC result data MAC_RST(1)-MAC_RST(16) represents a 16-*bit* binary stream. However, the following description may be equally applied to other embodiments that a data size of each of the first to sixteenth MAC result data MAC_RST(1)-MAC_RST(16) is less than or greater than 16 bits.

Referring to FIG. 57, each MAC result data having a data size of 16 bits may be outputted from the PIM device 3000 through sixteen data I/O circuits DQs. Thus, the first to $64^{th}$ data I/O circuits DQ1-DQ64 may be synchronized with a clock signal to output four sets of MAC result data MAC_RSTs at a time. Specifically, in a first output process performed in synchronization with a first point in time of the clock signal, the first MAC result data MAC_RST(1) outputted from the first additional adder AD_ADD(0) and the second MAC result data MAC_RST(2) outputted from the second additional adder AD_ADD(1) may be outputted from the PIM device 3000 at a time through the first to sixteenth data I/O circuits DQ1-DQ16 and the seventeenth to $32^{nd}$ data I/O circuits DQ17-DQ32 disposed in the left region. Moreover, in the first output process performed in synchronization with the first point in time of the clock signal, the third MAC result data MAC_RST(3) outputted from the third additional adder AD_ADD(2) and the fourth MAC result data MAC_RST(4) outputted from the fourth additional adder AD_ADD(3) may be outputted from the PIM device 3000 at a time through the $33^{rd}$ to $48^{th}$ data I/O circuits DQ33-DQ48 and the $49^{th}$ to $64^{th}$ data I/O circuits DQ49-DQ64 disposed in the right region.

Next, in a second output process performed in synchronization with a second point in time of the clock signal, the fifth MAC result data MAC_RST(5) outputted from the fifth additional adder AD_ADD(4) and the sixth MAC result data MAC_RST(6) outputted from the sixth additional adder AD_ADD(5) may be outputted from the PIM device 3000 at a time through the first to sixteenth data I/O circuits DQ1-DQ16 and the seventeenth to $32^{nd}$ data I/O circuits DQ17-DQ32 disposed in the left region. Furthermore, in the second output process performed in synchronization with the second point in time of the clock signal, the seventh MAC result data MAC_RST(7) outputted from the seventh additional adder AD_ADD(6) and the eighth MAC result data MAC_RST(8) outputted from the eighth additional adder AD_ADD(7) may be outputted from the PIM device 3000 at a time through the $33^{rd}$ to $48^{th}$ data I/O circuits DQ33-DQ48 and the $49^{th}$ to $64^{th}$ data I/O circuits DQ49-DQ64 disposed in the right region.

Next, in a third output process performed in synchronization with a third point in time of the clock signal, the ninth MAC result data MAC_RST(9) outputted from the ninth additional adder AD_ADD(8) and the tenth MAC result data MAC_RST(10) outputted from the tenth additional adder AD_ADD(9) may be outputted from the PIM device 3000 at a time through the first to sixteenth data I/O circuits DQ1-DQ16 and the seventeenth to $32^{nd}$ data I/O circuits DQ17-DQ32 disposed in the left region. Furthermore, in the third output process performed in synchronization with the third point in time of the clock signal, the eleventh MAC result data MAC_RST(11) outputted from the eleventh additional adder AD_ADD(10) and the twelfth MAC result data MAC_RST(12) outputted from the twelfth additional adder AD_ADD(11) may be outputted from the PIM device 3000 at a time through the 33$^{rd}$ to 48$^{th}$ data I/O circuits DQ33-DQ48 and the 49$^{th}$ to 64$^{th}$ data I/O circuits DQ49-DQ64 disposed in the right region.

Next, in a fourth output process performed in synchronization with a fourth point in time of the clock signal, the thirteenth MAC result data MAC_RST(13) outputted from the thirteenth additional adder AD_ADD(12) and the fourteenth MAC result data MAC_RST(14) outputted from the fourteenth additional adder AD_ADD(13) may be outputted from the PIM device 3000 at a time through the first to sixteenth data I/O circuits DQ1-DQ16 and the seventeenth to 32$^{nd}$ data I/O circuits DQ17-DQ32 disposed in the left region. Furthermore, in the fourth output process performed in synchronization with the fourth point in time of the clock signal, the fifteenth MAC result data MAC_RST(15) outputted from the fifteenth additional adder AD_ADD(14) and the sixteenth MAC result data MAC_RST(16) outputted from the sixteenth additional adder AD_ADD(15) may be outputted from the PIM device 3000 at a time through the 33$^{rd}$ to 48$^{th}$ data I/O circuits DQ33-DQ48 and the 49$^{th}$ to 64$^{th}$ data I/O circuits DQ49-DQ64 disposed in the right region.

As described above, in the PIM device 3000 according to the present embodiment, the first to sixteenth MAC result data MAC_RST(1)-MAC_RST(16) may be outputted from the PIM device 3000 in order of the row number from the first MAC result data MAC_RST(1) for the weight data in the first row R(1) of the weight matrix 2100 to the sixteenth MAC result data MAC_RST(16) for the weight data in the sixteenth row R(16) of the weight matrix 2100. This means that the first to sixteenth MAC result data MAC_RST(1)-MAC_RST(16) are outputted from PIM device 3000 in sequence from the MAC result data MAC_RST for the weight data stored in the first left memory bank BK(0)L and the first right memory bank BK(0)R to the MAC result data MAC_RST for the weight data stored in the sixteenth left memory bank BK(15)L and the sixteenth left memory bank BK(15)R on the basis of the memory banks storing the weight data. That is, the first to sixteenth MAC result data MAC_RST(1)-MAC_RST(16) may be outputted according to the sequence that the row number of the result matrix (2300 of FIG. 33) increases. Thus, a host or a controller receiving the multiple sets of MAC result data MAC_RSTs from the PIM device 3000 may skip a process for readjusting the transmission sequence of the multiple sets of MAC result data MAC_RSTs which are used in a subsequent process.

Figure 58:
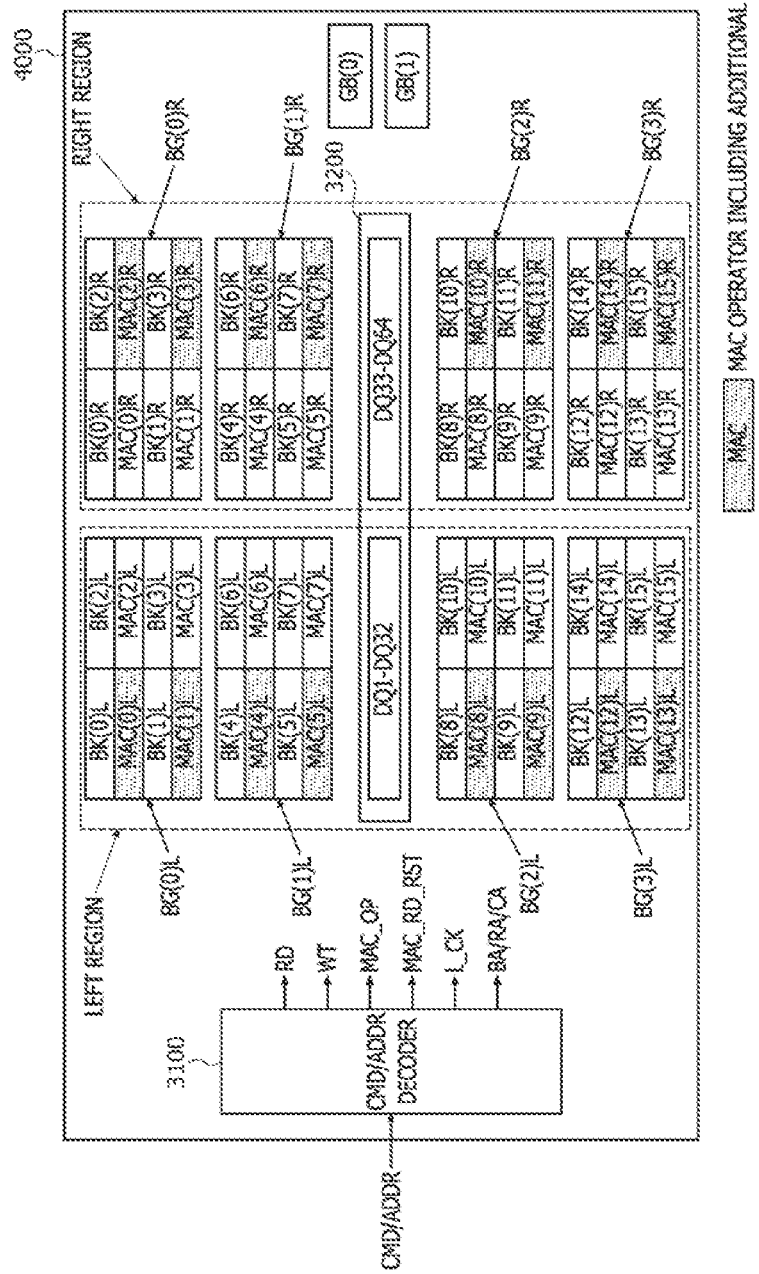
FIG. 58 illustrates a configuration of a PIM device according to yet another embodiment of the present disclosure.

FIG. 58 illustrates a configuration of a PIM device 4000 according to yet another embodiment of the present disclosure. In FIG. 58, the same reference numerals or the same reference symbols as used in FIG. 47 denote the same elements. Thus, to avoid duplicate explanation, descriptions of the same elements as set forth previously will be omitted or briefly mentioned hereinafter. Referring to FIG. 58, the PIM device 4000 according to the present embodiment may include the first to sixteenth left memory banks BK(0)L-BK(15)L disposed in the left region and the first to sixteenth right memory banks BK(0)R-BK(15)R disposed in the right region, like the PIM device 3000 described with reference to FIG. 47. In addition, the PIM device 4000 may also include the first to sixteenth left MAC operators MAC(0)L-MAC(15)L disposed in the left region and the first to sixteenth right MAC operators MAC(0)R-MAC(15)R disposed in the right region. The PIM device 4000 may be different from the PIM device 3000 described with reference to FIG. 47 in that additional adders of the PIM device 4000 are included in the MAC operators.

Specifically, an additional adder generating MAC result data by adding left MAC data outputted from a left MAC operator to right MAC data outputted from a right MAC operator may be included in one of the left MAC operator and the right MAC operator. Thus, the MAC operators may be categorized as either a first group of MAC operators outputting the MAC result data through the left MAC operators or a second group of MAC operators outputting the MAC result data through the right MAC operators. When each set of the plural sets of MAC result data MAC_RSTs has a data size of "O" bits (where, "O" is a natural number which is equal to or greater than two) and "Q"-number of left data I/O circuits and "Q"-number of right data I/O circuits are disposed in respective ones of the left region and the right region of the PIM device 4000 (where, "Q" is multiple of "O"), the MAC operators may be alternately and sequentially allocated to the first group of MAC operators and the second group of MAC operators in units of "Q/O"-number of MAC operators. In the case of the present embodiment, each set of the plural sets of MAC result data MAC_RSTs has a data size of 16 bits (i.e., "O"=16), and each of the number of the left data I/O circuits and the number of the right data I/O circuits is 32 (i.e., "Q"=32). Accordingly, the MAC operators may be alternately and sequentially allocated to the first group of MAC operators and the second group of MAC operators in units of two MAC operators.

As illustrated by shaded blocks in FIG. 58, each of the first, second, fifth, sixth, ninth, tenth, thirteenth, and fourteenth left MAC operators MAC(0)L, MAC(1)L, MAC(4)L, MAC(5)L, MAC(8)L, MAC(9)L, MAC(12)L, and MAC(13)L among the first to sixteenth left MAC operators MAC(0)L-MAC(15)L disposed in the left region may include an additional adder, and all of the first, second, fifth, sixth, ninth, tenth, thirteenth, and fourteenth left MAC operators MAC(0)L, MAC(1)L, MAC(4)L, MAC(5)L, MAC(8)L, MAC(9)L, MAC(12)L, and MAC(13)L may be included in the first group of MAC operators. The remaining left MAC operators MAC(2)L, MAC(3)L, MAC(6)L, MAC(7)L, MAC(10)L, MAC(11)L, MAC(14)L, and MAC(15)L include no additional adders and may be included in the second group of MAC operators. In addition, each of the third, fourth, seventh, eighth, eleventh, twelfth, fifteenth, and sixteenth right MAC operators MAC(2)R, MAC(3)R, MAC(6)R, MAC(7)R, MAC(10)R, MAC(11)R, MAC(14)R, and MAC(15)R among the first to sixteenth right MAC operators MAC(0)R-MAC(15)R disposed in the right region may include an additional adder, and all of the third, fourth, seventh, eighth, eleventh, twelfth, fifteenth, and sixteenth right MAC operators MAC(2)R, MAC(3)R, MAC(6)R, MAC(7)R, MAC(10)R, MAC(11)R, MAC(14)R, and MAC(15)R may be included in the second group of MAC operators. The remaining right MAC operators MAC(0)R, MAC(1)R, MAC(4)R, MAC(5)R, MAC(8)R, MAC(9)R, MAC(12)R, and MAC(13)R include no additional adders and may be included in the first group of MAC operators. The left MAC operators including the additional adders among the first group of the MAC operators and the right MAC operators including the additional adders among the second group of the MAC operators will be described hereinafter in more detail with reference to FIGS. 59 and 60.

Figure 59:
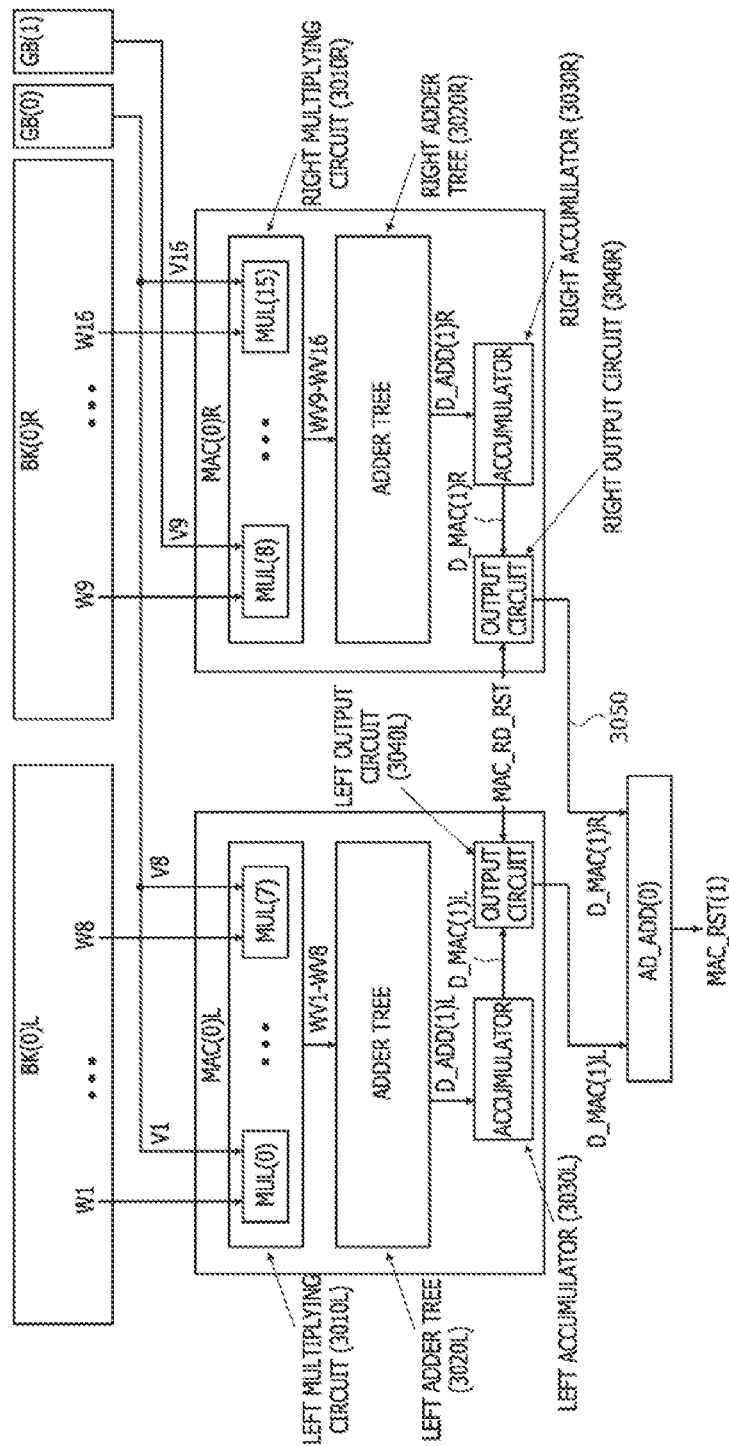
FIG. 59 illustrates an example of a configuration of a first MAC operator included in the PIM device of FIG. 58.

FIG. 59 illustrates an example of a configuration of the first MAC operator MAC(0)L and MAC(0)R included in the PIM device 4000 of FIG. 58. In FIG. 59, the same reference numerals or the same reference symbols as used in FIG. 48 denote the same elements. The first MAC operator MAC(0)L and MAC(0)R illustrated in FIG. 59 may have substantially the same configuration as the first MAC operator MAC(0)L and MAC(0)R illustrated in FIG. 48. Thus, to avoid duplicate explanation, descriptions of the same elements as set forth previously will be omitted or briefly mentioned hereinafter.

Referring to FIG. 59, the first MAC operator MAC(0)L and MAC(0)R may include a first left MAC operator MAC (0)L disposed in the left region and a first right MAC operator MAC(0)R disposed in the right region. The first left MAC operator MAC(0)L may include a left multiplying circuit 3010L, a left adder tree 3020L, a left accumulator 3030L, a left output circuit 3040L, and a first additional adder AD_ADD(0). The first right MAC operator MAC(0)R may include a right multiplying circuit 3010R, a right adder tree 3020R, a right accumulator 3030R, and a right output circuit 3040R. A process for generating first left MAC data D_MAC(1)L from the left output circuit 3040L in the first left MAC operator MAC(0)L and a process for generating first right MAC data D_MAC(1)R from the right output circuit 3040R in the first right MAC operator MAC(0)R may be the same as those described with reference to FIG. 48.

The first left MAC data D_MAC(1)L outputted from the left output circuit 3040L may be transmitted to a first input terminal of the first additional adder AD_ADD(0) in the first left MAC operator MAC(0)L. The first right MAC data D_MAC(1)R outputted from the right output circuit 3040R may be transmitted to a second input terminal of the first additional adder AD_ADD(0) in the first left MAC operator MAC(0)L through a connection line 3050. The first additional adder AD_ADD(0) may perform an adding calculation of the first left MAC data D_MAC(1)L and the first right MAC data D_MAC(1)R to generate first MAC result data MAC_RST(1). The first MAC result data MAC_RST(1) may correspond to data which are obtained by a matrix multiplying calculation of the weight data W(1.1)-W(1.64) arrayed in the first row R(1) of the weight matrix 2100 and the vector data V(1)-V(64) in the vector matrix 2200. Because the first left MAC operator MAC(0)L is disposed in the left region, the first MAC result data MAC_RST(1) outputted from the first additional adder AD_ADD(0) may be outputted as output data of the PIM device 4000 through the first to sixteenth data I/O circuits DQ1-DQ16 disposed in the left region.

The above description for the first MAC operator MAC (0)L and MAC(0)R of the PIM device 4000 may be equally applied to the second MAC operator MAC(1)L and MAC (1)R, the fifth MAC operator MAC(4)L and MAC(4)R, the sixth MAC operator MAC(5)L and MAC(5)R, the ninth MAC operator MAC(8)L and MAC(8)R, the tenth MAC operator MAC(9)L and MAC(9)R, the thirteenth MAC operator MAC(12)L and MAC(12)R, and the fourteenth MAC operator MAC(13)L and MAC(13)R, the left MAC operators of which include the additional adders. Thus, as described with reference to FIG. 57, the second, fifth, sixth, ninth, tenth, thirteenth, and fourteenth MAC result data MAC_RST(2), MAC_RST(5), MAC_RST(6), MAC_RST (9), MAC_RST(10), MAC_RST(13), and MAC_RST(14) outputted from the second, fifth, sixth, ninth, tenth, thirteenth, and fourteenth left MAC operators MAC(1)L, MAC (4)L, MAC(5)L, MAC(8)L, MAC(9)L, MAC(12)L, and MAC(13)L may be outputted from the PIM device 4000 through the first to $32^{nd}$ data I/O circuits DQ1-DQ32 disposed in the left region.

Figure 60:
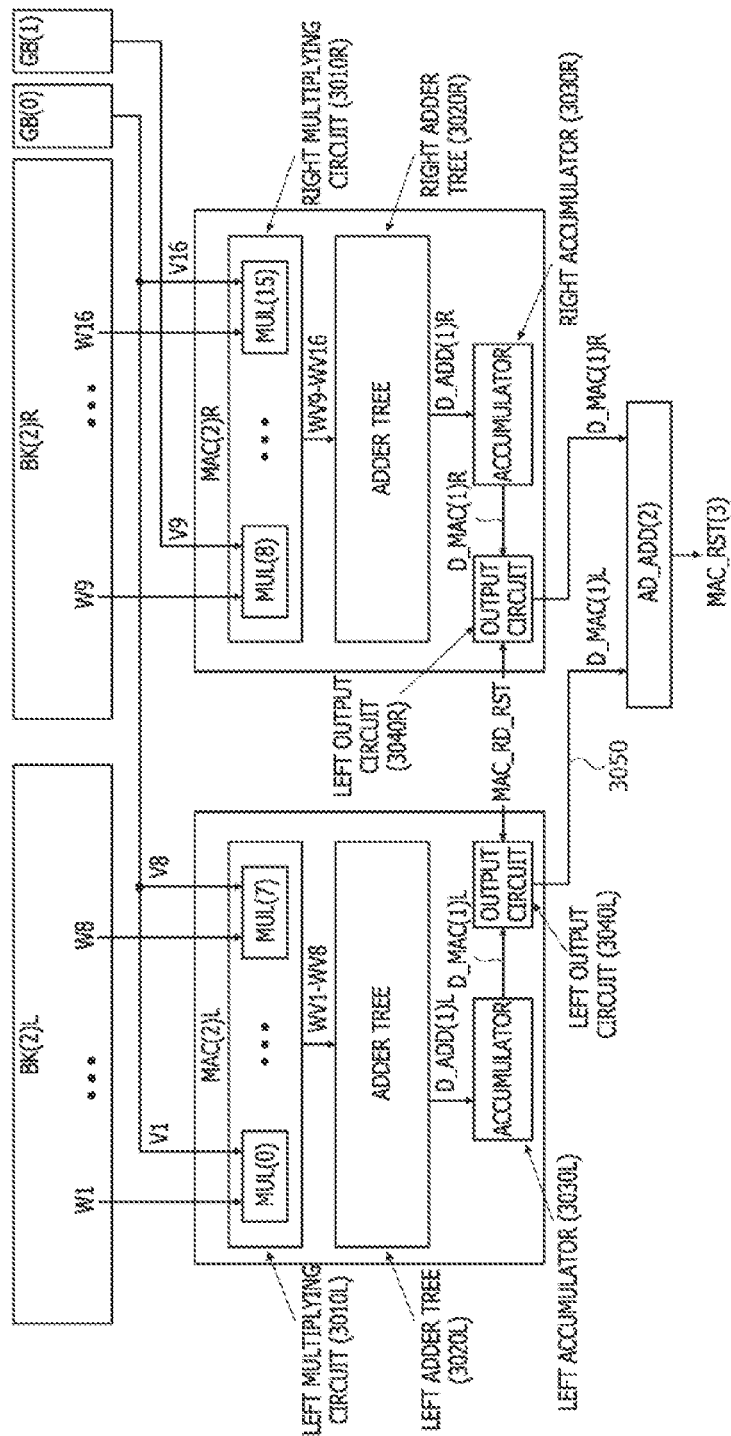
FIG. 60 illustrates an example of a configuration of a third MAC operator included in the PIM device of FIG. 58.

FIG. 60 illustrates an example of a configuration of the third MAC operator MAC(2)L and MAC(2)R included in the PIM device 4000 of FIG. 58. In FIG. 60, the same reference numerals or the same reference symbols as used in FIG. 48 denote the same elements. The third MAC operator MAC(2)L and MAC(2)R illustrated in FIG. 60 may have substantially the same configuration as the first MAC operator MAC(0)L and MAC(0)R illustrated in FIG. 48. Thus, to avoid duplicate explanation, descriptions of the same elements as set forth previously will be omitted or briefly mentioned hereinafter.

Referring to FIG. 60, the third MAC operator MAC(2)L and MAC(2)R may include a third left MAC operator MAC(2)L disposed in the left region and a third right MAC operator MAC(2)R disposed in the right region. The third left MAC operator MAC(2)L may include a left multiplying circuit 3010L, a left adder tree 3020L, a left accumulator 3030L, and a left output circuit 3040L. The third right MAC operator MAC(2)R may include a right multiplying circuit 3010R, a right adder tree 3020R, a right accumulator 3030R, a right output circuit 3040R, and a third additional adder AD_ADD(2). A process for generating first left MAC data D_MAC(1)L from the left output circuit 3040L in the third left MAC operator MAC(2)L and a process for generating first right MAC data D_MAC(1)R from the right output circuit 3040R in the third right MAC operator MAC(2)R may be the same as those described with reference to FIG. 48.

The first left MAC data D_MAC(1)L outputted from the left output circuit 3040L may be transmitted to a first input terminal of the third additional adder AD_ADD(2) in the third right MAC operator MAC(2)R through a connection line 3050. The first right MAC data D_MAC(1)R outputted from the right output circuit 3040R may be transmitted to a second input terminal of the third additional adder AD_ADD (2) in the third right MAC operator MAC(2)R. The third additional adder AD_ADD(2) may perform an adding calculation of the first left MAC data D_MAC(1)L and the first right MAC data D_MAC(1)R to generate third MAC result data MAC_RST(3). The third MAC result data MAC_RST (3) may correspond to data which are obtained by a matrix multiplying calculation of the weight data W(3.1)-W(3.64) arrayed in the third row R(3) of the weight matrix 2100 and the vector data V(1)-V(64) in the vector matrix 2200. Because the third right MAC operator MAC(2)R is disposed in the right region, the third MAC result data MAC_RST(3) outputted from the third additional adder AD_ADD(2) may be outputted as output data of the PIM device 4000 through the $33^{rd}$ to $48^{th}$ data I/O circuits DQ33-DQ48 disposed in the right region.

The above description for the third MAC operator MAC (2)L and MAC(2)R of the PIM device 4000 may be equally applied to the fourth MAC operator MAC(3)L and MAC(3) R, the seventh MAC operator MAC(6)L and MAC(6)R, the eighth MAC operator MAC(7)L and MAC(7)R, the eleventh MAC operator MAC(10)L and MAC(10)R, the twelfth MAC operator MAC(11)L and MAC(11)R, the fifteenth MAC operator MAC(14)L and MAC(14)R, and the sixteenth MAC operator MAC(15)L and MAC(15)R, the right MAC operators of which include the additional adders. Thus, as described with reference to FIG. 57, the fourth, seventh, eighth, eleventh, twelfth, fifteenth, and sixteenth MAC result data MAC_RST(4), MAC_RST(7), MAC_RST (8), MAC_RST(11), MAC_RST(12), MAC_RST(15), and MAC_RST(16) outputted from the fourth, seventh, eighth, eleventh, twelfth, fifteenth, and sixteenth right MAC operators MAC(3)R, MAC(6)R, MAC(7)R, MAC(10)R, MAC (11)R, MAC(14)R, and MAC(15)R may be outputted from the PIM device 4000 through the $33^{rd}$ to $64^{th}$ data I/O circuits DQ33-DQ64 disposed in the right region.

As described above, in the PIM device 4000 according to the present embodiment, the first to sixteenth MAC result data MAC_RST(1)-MAC_RST(16) may be outputted from the PIM device 4000 in order of the row number of the weight matrix (2100 of FIG. 33) from the first MAC result data MAC_RST(1) for the weight data in the first row R(1) of the weight matrix 2100 to the sixteenth MAC result data MAC_RST(16) for the weight data in the sixteenth row R(16) of the weight matrix 2100. This means that the first to sixteenth MAC result data MAC_RST(1)-MAC_RST(16) are outputted from PIM device 4000 in sequence from the MAC result data MAC_RST for the weight data stored in the first left memory bank BK(0)L and the first right memory bank BK(0)R to the MAC result data MAC_RST for the weight data stored in the sixteenth left memory bank BK(15)L and the sixteenth left memory bank BK(15)R on the basis of the memory banks storing the weight data. That is, the first to sixteenth MAC result data MAC_RST(1)-MAC_RST(16) may be outputted according to the sequence that the row number of the result matrix (2300 of FIG. 33) increases. Thus, a host or a controller receiving the multiple sets of MAC result data MAC_RSTs from the PIM device 4000 may skip a process for readjusting the transmission sequence of the multiple sets of MAC result data MAC_RSTs which are used in a subsequent process.

Figure 61:
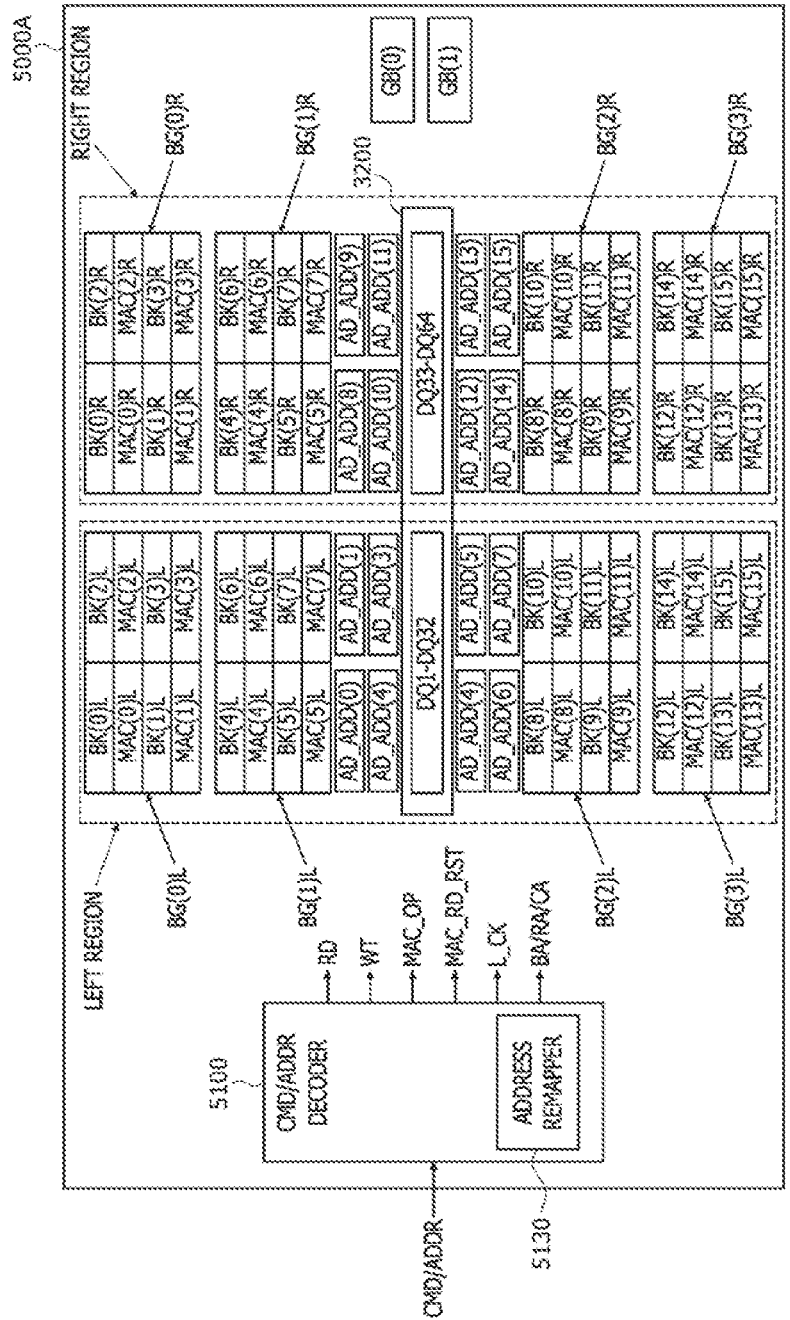
FIG. 61 illustrates a PIM device according to still another embodiment of the present disclosure.

FIG. 61 illustrates a PIM device 5000A according to still another embodiment of the present disclosure. In FIG. 61, the same reference numerals or the same reference symbols as used in FIG. 47 denote the same elements. The PIM device 5000A according to the present embodiment may have substantially the same configuration as the PIM device 3000 described with reference to FIG. 47 except that a command/address decoder 5100 of the PIM device 5000A includes an address remapper 5130 and a layout of the first to sixteenth additional adders AD_ADD(0)-AD_ADD(15) in the PIM device 5000A is different from a layout of the first to sixteenth additional adders AD_ADD(0)-AD_ADD(15) in the PIM device 3000. Thus, the same descriptions as set forth in the embodiment of FIG. 47 will be omitted or briefly mentioned in this embodiment.

Referring to FIG. 61, the first to eighth additional adders AD_ADD(0)-AD_ADD(7) outputting the first to eighth MAC result data MA_RST(1)-MAC_RST(8) may be disposed in the left region, and the ninth to sixteenth additional adders AD_ADD(8)-AD_ADD(15) outputting the ninth to sixteenth MAC result data MA_RST(9)-MAC_RST(16) may be disposed in the right region. That is, the first to eighth additional adders AD_ADD(0)-AD_ADD(7) may correspond to left additional adders AD_ADD(L), and the ninth to sixteenth additional adders AD_ADD(8)-AD_ADD(15) may correspond to right additional adders AD_ADD(R). The first to eighth additional adders AD_ADD(0)-AD_ADD(7) corresponding to the left additional adders AD_ADD(L) may output the first to eighth MAC result data MAC_RST(1)-MAC_RST(8) as output data of the PIM device 5000A through the first to $32^{nd}$ data I/O circuits DQ1-DQ32 disposed in the left region. In addition, the ninth to sixteenth additional adders AD_ADD(8)-AD_ADD(15) corresponding to the right additional adders AD_ADD(R) may output the ninth to sixteenth MAC result data MAC_RST(9)-MAC_RST(16) as output data of the PIM device 5000A through the $33^{rd}$ to $64^{th}$ data I/O circuits DQ33-DQ64 disposed in the right region.

The command/address decoder 5100 of the PIM device 5000A according to the present embodiment may include the address remapper 5130. The address remapper 5130 may perform a remapping operation for remapping bank addresses of the memory banks in which the weight data are stored during a process for storing the weight data into the first to sixteenth left memory banks BK(0)L-BK(15)L and the first to sixteenth right memory banks BK(0)R-BK(15)R. The address remapper 5130 may perform the remapping operation for a bank address among the bank/row/column address signal BA/RA/CA, which are generated by decoding the addresses transmitted from a host (or a controller) to the command/address decoder 5100, under a certain condition to generate a remapped bank/row/column address signal R_BA/RA/CA. A configuration and an operation of the address remapper 5130 and an output sequence of the plural sets of MAC result data MAC_RSTs according to the operation of the address remapper 5130 will be described more fully later.

Figure 62:
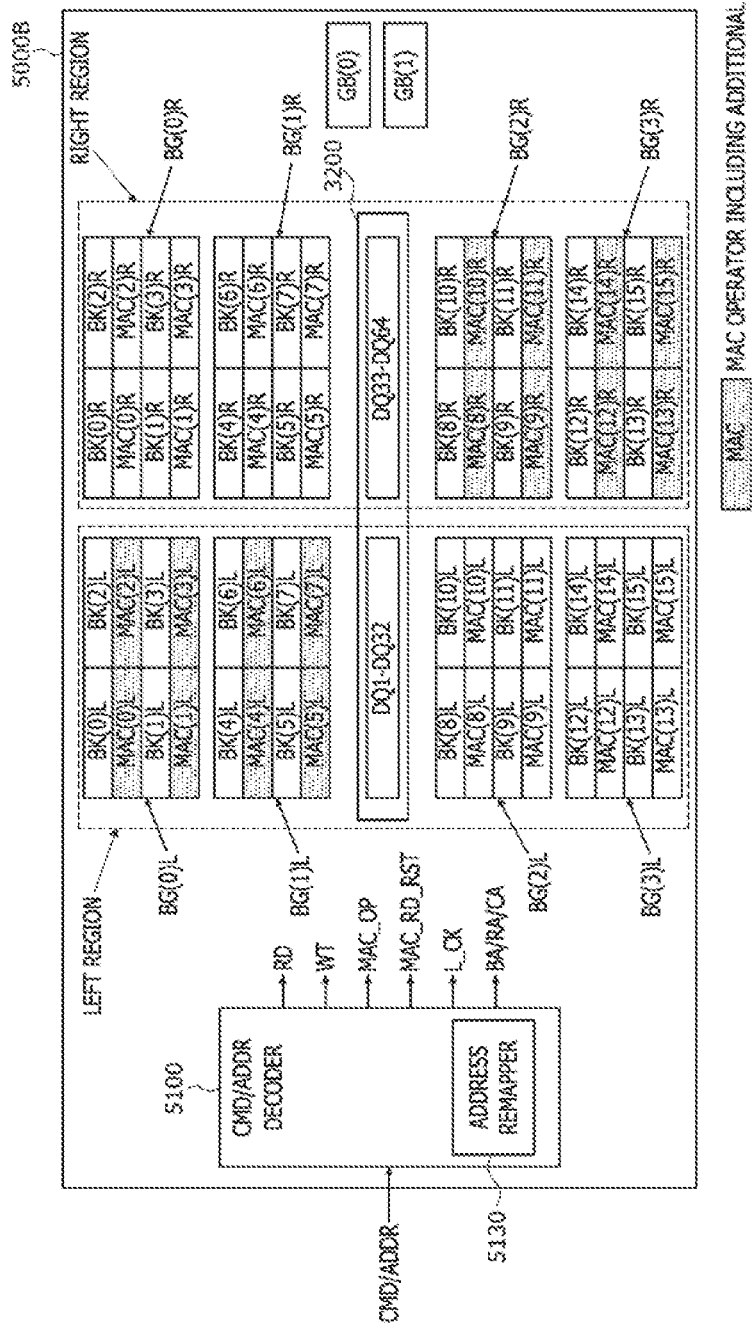
FIG. 62 illustrates a PIM device according to yet still another embodiment of the present disclosure.

FIG. 62 illustrates a PIM device 5000B according to yet still another embodiment of the present disclosure. In FIG. 62, the same reference numerals or the same reference symbols as used in FIG. 58 denote the same elements. The PIM device 5000B according to the present embodiment may have substantially the same configuration as the PIM device 4000 described with reference to FIG. 58 except that the command/address decoder 5100 of the PIM device 5000B includes the address remapper 5130 and locations of the additional adders in the PIM device 5000B are different from the locations of the additional adders in the PIM device 4000. Thus, the same descriptions as set forth in the embodiment of FIG. 58 will be omitted or briefly mentioned in this embodiment. The address remapper 5130 included in the command/address decoder 5100 of the PIM device 5000B may be the same as the address remapper 5130 included in the command/address decoder 5100 of the PIM device 5000A illustrated in FIG. 61. The configuration and the operation of the address remapper 5130 and an output sequence of the plural sets of MAC result data MAC_RSTs according to the operation of the address remapper 5130 will be described more fully hereinafter.

Referring to FIG. 62, the additional adders of the PIM device 5000B may be disposed in the MAC operators, as described with reference to FIG. 58. Specifically, as illustrated by shaded blocks in FIG. 62, the additional adders may be disposed in the first to eighth left MAC operators MAC(0)L-MAC(7)L among the first to sixteenth left MAC operators MAC(0)L-MAC(15)L disposed in the left region, and no additional adder is disposed in the ninth to sixteenth left MAC operators MAC(8)L-MAC(15)L among the first to sixteenth left MAC operators MAC(0)L-MAC(15)L disposed in the left region. In contrast, the additional adders may be disposed in the ninth to sixteenth right MAC operators MAC(8)R-MAC(15)R among the first to sixteenth right MAC operators MAC(0)R-MAC(15)R disposed in the right region, and no additional adder is disposed in the first to eighth right MAC operators MAC(0)R-MAC(7)R among the first to sixteenth right MAC operators MAC(0)R-MAC(15)R disposed in the right region. The configuration and the operation of each of the first to eighth left MAC operators MAC(0)L-MAC(7)L may be the same as those described with reference to FIG. 59, and the configuration and the operation of each of the ninth to sixteenth right MAC operators MAC(8)R-MAC(15)R may be the same as those described with reference to FIG. 60.

The first to eighth MAC result data MAC_RST(1)-MAC_RST(8) among the first to sixteenth MAC result data MAC_RST(1)-MAC_RST(16) generated by the first MAC arithmetic operation performed using the weight data arrayed in the first to sixteenth rows R(1)-R(16) of the weight matrix (2100 of FIG. 33) and the vector data arrayed in the vector matrix (2200 of FIG. 33) as input data may be outputted from the first to eighth left MAC operators MAC(0)L-MAC(7)L. In contrast, the ninth to sixteenth MAC result data MAC_RST(9)-MAC_RST(16) among the first to sixteenth MAC result data MAC_RST(1)-MAC_RST(16) may be outputted from the ninth to sixteenth right MAC operators MAC(8)R-MAC(15)R. Thus, the first to eighth MAC result data MAC_RST(1)-MAC_RST(8) may be outputted as output data of the PIM device 5000B through the first to 32$^{nd}$ data I/O circuits DQ1-DQ32 disposed in the left region, and the ninth to sixteenth MAC result data MAC_RST(9)-MAC_RST(16) may be outputted as output data of the PIM device 5000B through the 33$^{rd}$ to 64$^{th}$ data I/O circuits DQ33-DQ64 disposed in the right region.

In the case of the PIM device 5000A illustrated in FIG. 61, the additional adders may be disposed in an outside region of the MAC operators. However, in the case of the PIM device 5000B illustrated in FIG. 62, the additional adders may be disposed in the MAC operators. In any case, the first to eighth MAC result data MAC_RST(1)-MAC_RST(8) may be outputted through the first to 32$^{nd}$ data I/O circuits DQ1-DQ32 disposed in the left region, and the ninth to sixteenth MAC result data MAC_RST(9)-MAC_RST(16) may be outputted through the 33$^{rd}$ to 64$^{th}$ data I/O circuits DQ33-DQ64 disposed in the right region. Due to the above common point between the PIM devices 5000A and 5000B illustrated in FIGS. 61 and 62, the MAC result data MAC_RSTs might not be sequentially outputted in order of the row number of the result matrix (2300 of FIG. 33) when the weight data are sequentially stored into the memory banks according to the sequence that the row number of the weight matrix 2100 increases. In order to prevent the MAC result data MAC_RSTs from being outputted from the PIM device 5000A or the PIM device 5000B out of order, the command/address decoder 5100 of the PIM device 5000A or the PIM device 5000B may include the address remapper 5130 performing the remapping operation for the bank address under a certain condition during a write operation for the weight data. The following descriptions for the command/address decoder 5100 and the address remapper 5130 may be equally applied to any one of the PIM devices 5000A and 5000B illustrated in FIGS. 61 and 62.

Figure 63:
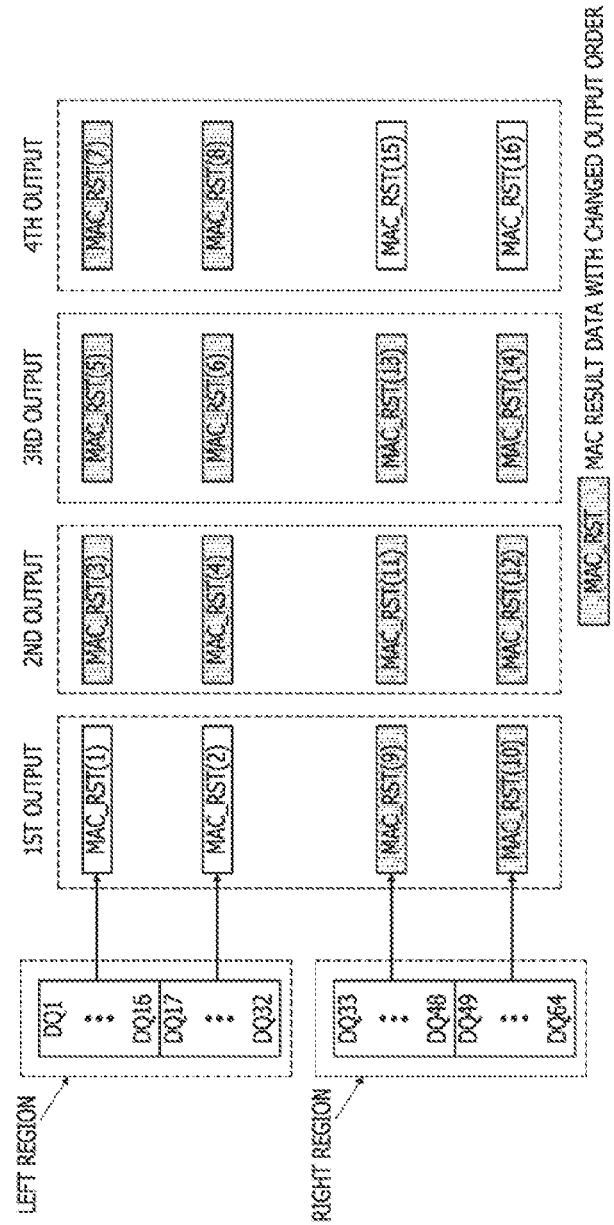
FIG. 63 illustrates an output sequence of first to sixteenth MAC result data when weight data are stored in memory banks without remapping bank addresses in each of the PIM devices illustrated in FIGS. 61 and 62.

FIG. 63 illustrates an output sequence of the first to sixteenth MAC result data MAC_RST(1)-MAC_RST(16) when the weight data are stored in the memory banks BKs without remapping the bank addresses in each of the PIM devices 5000A and 5000B illustrated in FIGS. 61 and 62. The following description will be illustrated in conjunction with an output sequence of the first to sixteenth MAC result data MAC_RST(1)-MAC_RST(16) which are generated by the first MAC arithmetic operation. The following description may be equally applied to the output sequences of the seventeenth to 64$^{th}$ MAC result data MAC_RST(17)-MAC_RST(64) which are generated by the second to fourth MAC arithmetic operations. For the purpose of ease and convenience in explanation, it may be assumed that each data of the first to sixteenth MAC result data MAC_RST(1)-MAC_RST(16) have a data size of 16 bits.

Referring to FIG. 63, in a first output process performed in synchronization with a first point in time of a clock signal, the first MAC result data MAC_RST(1) may be outputted from the PIM device 5000A (or 5000B) through the first to sixteenth data I/O circuits DQ1-DQ16 disposed in the left region, and the second MAC result data MAC_RST(2) may be outputted from the PIM device 5000A (or 5000B) through the seventeenth to 32$^{nd}$ data I/O circuits DQ17-DQ32 disposed in the left region. Moreover, in the first output process, the ninth MAC result data MAC_RST(9) may be outputted from the PIM device 5000A (or 5000B) through the 33$^{rd}$ to 48$^{th}$ data I/O circuits DQ33-DQ48 disposed in the right region, and the tenth MAC result data MAC_RST(10) may be outputted from the PIM device 5000A (or 5000B) through the 49$^{th}$ to 64$^{th}$ data I/O circuits DQ49-DQ64 disposed in the right region. Next, in a second output process performed in synchronization with a second point in time of the clock signal, the third MAC result data MAC_RST(3) may be outputted from the PIM device 5000A (or 5000B) through the first to sixteenth data I/O circuits DQ1-DQ16 disposed in the left region, and the fourth MAC result data MAC_RST(4) may be outputted from the PIM device 5000A (or 5000B) through the seventeenth to 32$^{nd}$ data I/O circuits DQ17-DQ32 disposed in the left region. Moreover, in the second output process, the eleventh MAC result data MAC_RST(11) may be outputted from the PIM device 5000A (or 5000B) through the 33$^{rd}$ to 48$^{th}$ data I/O circuits DQ33-DQ48 disposed in the right region, and the twelfth MAC result data MAC_RST(12) may be outputted from the PIM device 5000A (or 5000B) through the 49$^{th}$ to 64$^{th}$ data I/O circuits DQ49-DQ64 disposed in the right region.

Next, in a third output process performed in synchronization with a third point in time of the clock signal, the fifth MAC result data MAC_RST(5) may be outputted from the PIM device 5000A (or 5000B) through the first to sixteenth data I/O circuits DQ1-DQ16 disposed in the left region, and the sixth MAC result data MAC_RST(6) may be outputted from the PIM device 5000A (or 5000B) through the seventeenth to 32$^{nd}$ data I/O circuits DQ17-DQ32 disposed in the left region. Moreover, in the third output process, the thirteenth MAC result data MAC_RST(13) may be outputted from the PIM device 5000A (or 5000B) through the 33$^{rd}$ to 48$^{th}$ data I/O circuits DQ33-DQ48 disposed in the right region, and the fourteenth MAC result data MAC_RST(14) may be outputted from the PIM device 5000A (or 5000B) through the 49$^{th}$ to 64$^{th}$ data I/O circuits DQ49-DQ64 disposed in the right region. Next, in a fourth output process performed in synchronization with a fourth point in time of the clock signal, the seventh MAC result data MAC_RST(7) may be outputted from the PIM device 5000A (or 5000B) through the first to sixteenth data I/O circuits DQ1-DQ16 disposed in the left region, and the eighth MAC result data MAC_RST(8) may be outputted from the PIM device 5000A (or 5000B) through the seventeenth to 32$^{nd}$ data I/O circuits DQ17-DQ32 disposed in the left region. Moreover, in the fourth output process, the fifteenth MAC result data MAC_RST(15) may be outputted from the PIM device 5000A (or 5000B) through the 33$^{rd}$ to 48$^{th}$ data I/O circuits DQ33-DQ48 disposed in the right region, and the sixteenth MAC result data MAC_RST(16) may be outputted from the PIM device 5000A (or 5000B) through the 49$^{th}$ to 64$^{th}$ data I/O circuits DQ49-DQ64 disposed in the right region.

As described above, when the weight data are stored in the memory banks without remapping the bank address in the PIM device 5000A (or 5000B), the first, second, fifteenth, and sixteenth MAC result data MAC_RST(1), MAC_RST(2), MAC_RST(15), and MAC_RST(16) may be sequentially outputted in order of the row number of the result matrix 2300. However, as illustrated by shaded blocks in FIG. 63, the remaining MAC result data (e.g., the ninth to fourteenth MAC result data MAC_RST(9)-MAC_RST(14)) may be outputted in a mixed sequence which is different from a sequence that the row number of the result matrix 2300 increases. In such a case, a host or a controller receiving the first to sixteenth MAC result data MAC_RST(1)-MAC_RST(16) from the PIM device 5000A (or 5000B) may need to execute a process for readjusting the transmission sequence of the first to sixteenth MAC result data MAC_RST(1)-MAC_RST(16) which are used in a subsequent process if necessary. Accordingly, in each of the PIM devices 5000A and 5000B, the command/address decoder 5100 may include the address remapper 5130. The address remapper 5130 may perform a conditional bank address remapping operation during a MAC write operation for writing the weight data into the memory banks. As a result of the conditional bank address remapping operation, the first to sixteenth MAC result data MAC_RST(1)-MAC_RST(16) may be sequentially outputted from the PIM device 5000A (or 5000B) to be consistent with the row number of the result matrix 2300.

Figure 64:
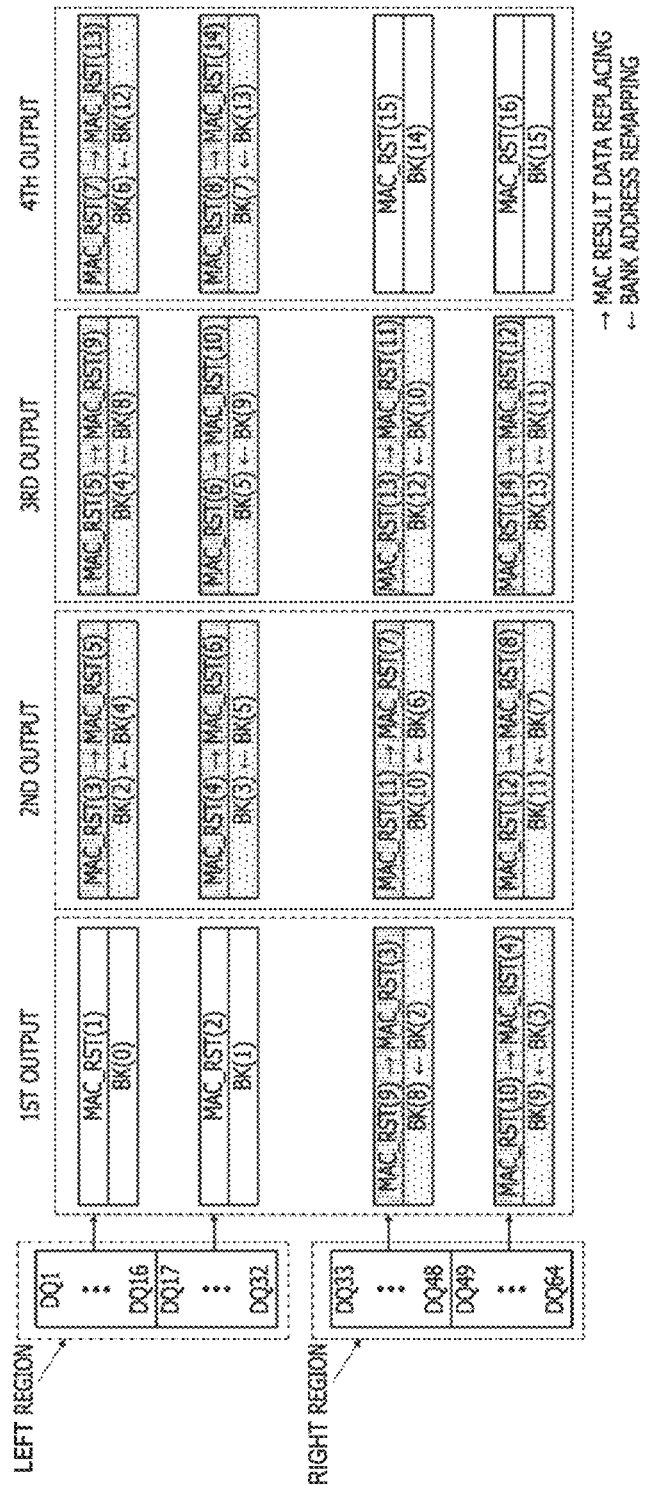
FIG. 64 illustrates a remapping operation of bank addresses for sequentially outputting MAC result data in each of the PIM devices illustrated in FIGS. 61 and 62.

FIG. 64 illustrates the bank address remapping operation for outputting the plural sets of MAC result data according to a predetermined sequence in each of the PIM devices 5000A and 5000B illustrated in FIGS. 61 and 62. Referring to FIG. 64, before the bank address remapping operation is executed in the first output process, the ninth MAC result data MAC_RST(9) instead of the third MAC result data MAC_RST(3) may be outputted through the $33^{rd}$ to $48^{th}$ data I/O circuits DQ33-DQ46 disposed in the right region. Thus, in the first output process, it may be necessary to replace the output of the ninth MAC result data MAC_RST(9) with the output of the third MAC result data MAC_RST(3). The ninth MAC result data MAC_RST(9) may be generated as a result of the MAC arithmetic operation of the weight data arrayed in the ninth row R(9) of the weight matrix (2100 of FIG. 33) and the vector data arrayed in the vector matrix (2200 of FIG. 33). The weight data for generating the ninth MAC result data MAC_RST(9) may be provided by the ninth memory bank BK(8). The third MAC result data MAC_RST(3) may be generated as a result of the MAC arithmetic operation of the weight data arrayed in the third row R(3) of the weight matrix (2100 of FIG. 33) and the vector data arrayed in the vector matrix (2200 of FIG. 33). Thus, if the ninth memory bank BK(8) provides the weight data in the third row R(3) that is not the ninth row R(9) of the weight matrix 2100, the third MAC result data MAC_RST(3) instead of the ninth MAC result data MAC_RST(9) may be outputted in the first output process. In order that the ninth memory bank BK(8) provides the weight data in the third row R(3) of the weight matrix 2100, it may be necessary to store the weight data in the third row R(3) of the weight matrix 2100 into the ninth memory bank BK(8) instead of the third memory bank BK(2). This may be achieved by remapping a bank address of the third memory bank BK(2) into a bank address of the ninth memory bank BK(8).

Similarly, in order to output the fourth MAC result data MAC_RST(4) instead of the tenth MAC result data MAC_RST(10) through the $33^{rd}$ to 48 data I/O circuits DQ33-DQ48 disposed in the right region during the first output process, a bank address of the fourth memory bank BK(3) may be remapped into a bank address of the tenth memory bank BK(9) during a write operation for the weight data arrayed in the fourth row R(4) of the weight matrix 2100. Moreover, in order to output the fifth MAC result data MAC_RST(5) instead of the third MAC result data MAC_RST(3) through the first to sixteenth data I/O circuits DQ1-DQ16 disposed in the left region during the second output process, a bank address of the fifth memory bank BK(4) may be remapped into a bank address of the third memory bank BK(2) during a write operation for the weight data arrayed in the fifth row R(5) of the weight matrix 2100. Furthermore, in order to output the sixth, seventh, and eight MAC result data MAC_RST(6), MAC_RST(7), and MAC_RST(8) instead of the fourth, eleventh, and twelfth MAC result data MAC_RST(4), MAC_RST(11), and MAC_RST(12) during the second output process, bank addresses of the sixth, seventh, and eighth memory banks BK(5), BK(6), and BK(7) may be remapped into respective ones of bank addresses of the fourth, eleventh, and twelfth memory banks BK(3), BK(10), and BK(11).

In the same way as described above, in order to output the ninth, tenth, eleventh, and twelfth MAC result data MAC_RST(9), MAC_RST(10), MAC_RST(11), and MAC_RST(12) instead of the fifth, sixth, thirteenth, and fourteenth MAC result data MAC_RST(5), MAC_RST(6), MAC_RST(13), and MAC_RST(14) during the third output process, bank addresses of the ninth, tenth, eleventh, and twelfth memory banks BK(9), BK(10), BK(11), and BK(12) may be remapped into respective ones of bank addresses of the fifth, sixth, thirteenth, and fourteenth memory banks BK(4), BK(5), BK(12), and BK(13). Similarly, in order to output the thirteenth and fourteenth MAC result data MAC_RST(13) and MAC_RST(14) instead of the seventh and eighth MAC result data MAC_RST(7) and MAC_RST(8) during the fourth output process, bank addresses of the thirteenth and fourteenth memory banks BK(12) and BK(13) may be remapped into respective ones of bank addresses of the seventh and eighth memory banks BK(6) and BK(7).

Figure 65:
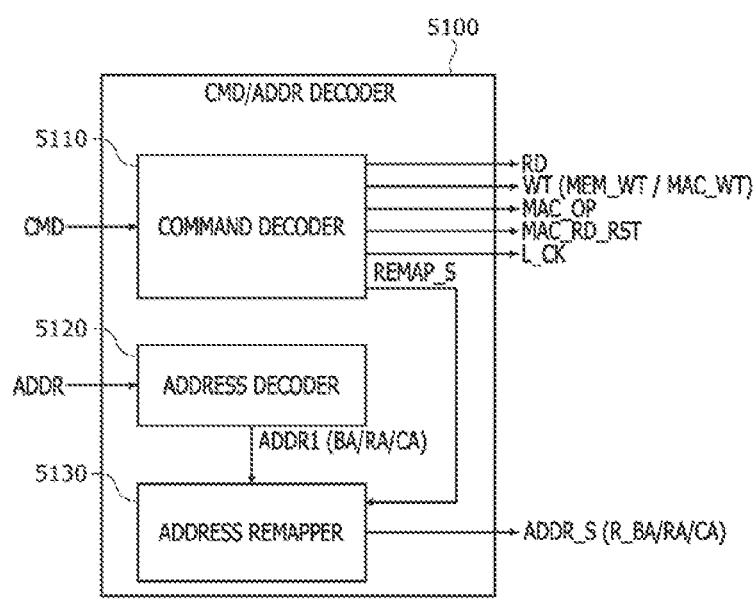
FIG. 65 is a block diagram illustrating an example of a configuration of a command/address decoder included in each of the PIM devices illustrated in FIGS. 61 and 62.

FIG. 65 is a block diagram illustrating an example of a configuration of the command/address decoder 5100 included in each of the PIM devices 5000A and 5000B illustrated in FIGS. 61 and 62. Referring to FIG. 65, the command/address decoder 5100 may receive a command CMD and an address ADDR from an external device such as a host or a controller which is coupled to the PIM device 5000A (or 5000B). The command/address decoder 5100 may decode the command CMD to generate and output control signals such as the read signal RD, the write signal WT, the MAC arithmetic operation signal MAC_OP, the MAC result read signal MAC_RD_RST, and the latch clock signal L_CK that control the operations of the memory banks and the MAC operators. In addition, the command/address decoder 5100 may decode the address ADDR to generate a bank address, a row address, and a column address and may perform a conditional remapping operation for the bank address to generate and output an address signal ADDR_S. Hereinafter, it may be assumed that the left memory bank and the right memory bank included in one memory bank have the same bank address. Thus, the left memory bank and the right memory bank having the same bank address may be referred to as just 'memory bank' without using the term 'left' and 'right'. The control signals outputted from the command/address decoder 5100 may be the same as those described with reference to FIG. 31. However, in the following descriptions, the write signal may be appropriately mentioned as any one of a memory write signal MEM_WT and a MAC write signal MAC_WT. For example, the memory write signal MEM_WT may control a write operation of the PIM device 5000A (or 5000B) when the PIM device 5000A (or 5000B) operates in a memory mode, and the MAC write signal MAC_WT may control a write operation for storing the weight data and the vector data used for the MAC arithmetic operation into the memory banks and the global buffer.

Specifically, the command/address decoder 5100 may include a command decoder 5110, an address decoder 5120, and the address remapper 5130. The command decoder 5110 may decode the command CMD to generate and output the read signal RD, the write signal MEM_WT or MAC_WT, the MAC arithmetic operation signal MAC_OP, the MAC result read signal MAC_RD_RST, and the latch clock signal L_CK as the control signals. In addition, the command/address decoder 5100 may generate and output a remapping selection signal REMAP_S. The remapping selection signal REMAP_S outputted from the command/address decoder 5100 may be transmitted to the address remapper 5130. When the command CMD is a command for requesting an operation other than the operation performed by the MAC write signal MAC_WT, the command decoder 5110 may generate and output the remapping selection signal REMAP_S having a first logic level. When the command CMD is a command for requesting the operation performed by the MAC write signal MAC_WT, the command decoder 5110 may generate and output the remapping selection signal REMAP_S having a second logic level. In an embodiment, the first logic level may be set as a logic "low" level, and the second logic level may be set as a logic "high" level. For example, the remapping selection signal REMAP_S having the first logic level may inactivate the remapping operation of the address remapper 5130. In contrast, the remapping selection signal REMAP_S having the second logic level may activate the remapping operation of the address remapper 5130.

The address decoder 5120 of the command/address decoder 5100 may decode the address ADDR outputted from an external device such as a host or a controller) to generate a first address signal ADDR1 corresponding to the bank/row/column address signal BA/RA/CA. The address decoder 5120 may transmit the first address signal ADDR1 to the address remapper 5130. The address remapper 5130 of the command/address decoder 5100 may receive the first address signal ADDR1 and the remapping selection signal REMAP_S from the address decoder 5120 and the command decoder 5110. The address remapper 5130 may perform the conditional remapping operation for the bank address of the first address signal ADDR1 to generate and output the address signal ADDR_S including the remapped bank address R_BA. The address signal ADDR_S outputted from the address remapper 5130 may be transmitted to the memory banks BKs.

Figure 66:
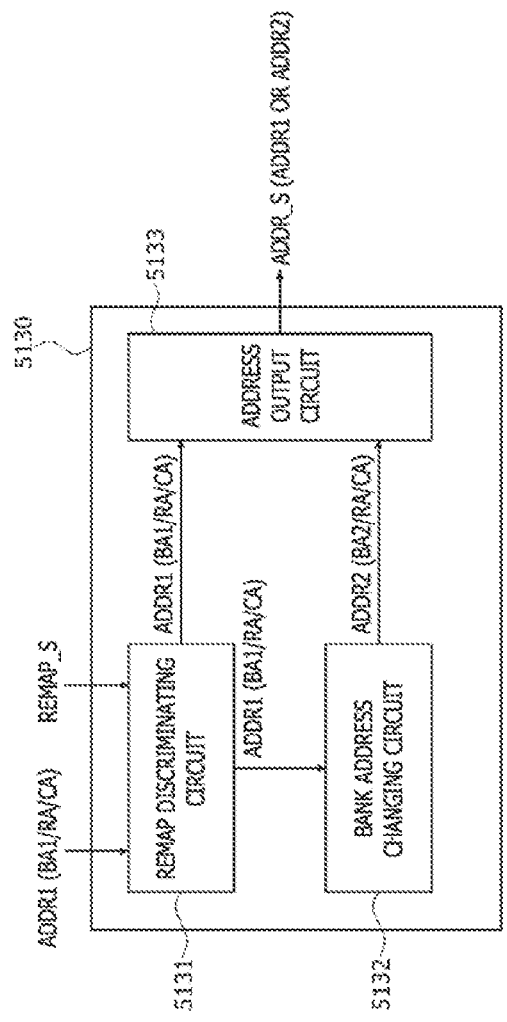
FIG. 66 is a block diagram illustrating an example of a configuration of an address remapper included in the command/address decoder illustrated in FIG. 65.
Figure 69:
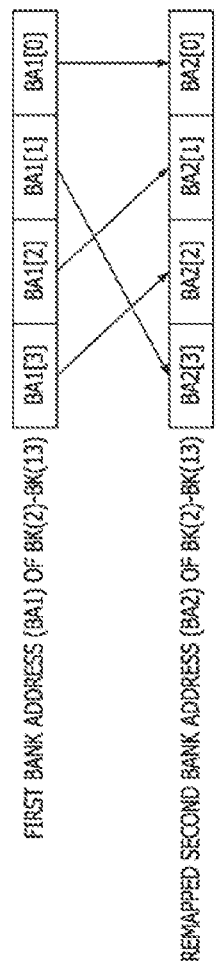
FIG. 69 illustrates a bank address remapping operation of a bank address changing circuit included in the address remapper of FIG. 66.

FIG. 66 is a block diagram illustrating an example of a configuration of the address remapper 5130 included in the command/address decoder 5100 illustrated in FIG. 65, and FIG. 67 illustrates an operation for determining the execution or skipping of the remap discriminating operation of a remap discriminating circuit 5131 included in the address remapper 5130 of FIG. 66. FIG. 68 illustrates the remap discriminating operation of the remap discriminating circuit 5131 included in the address remapper 5130 of FIG. 66, and FIG. 69 illustrates the bank address remapping operation of a bank address changing circuit 5132 included in the address remapper 5130 of FIG. 66.

First, referring to FIG. 66, the address remapper 5130 may include the remap discriminating circuit 5131, the bank address changing circuit 5132, and an address output circuit 5133. The remap discriminating circuit 5131 may receive the first address signal ADDR1 from the address decoder 5120. The remap discriminating circuit 5131 may also receive the remapping selection signal REMAP_S from the command decoder 5110. The remap discriminating circuit 5131 may perform or skip the remap discriminating operation according to a logic level of the remapping selection signal REMAP_S. The remap discriminating operation may be defined as an operation for discriminating the execution or skipping of the remapping operation for the bank address during the MAC write operation for storing the weight data into the memory banks.

As illustrated in FIG. 67, the remap discriminating circuit 5131 may skip the remap discriminating operation when the remapping selection signal REMAP_S has a logic "low (LO)" signal. In such a case, the remap discriminating circuit 5131 may transmit the first address signal ADDR1, which is received from the address decoder 5120, to the address output circuit 5133. In contrast, the remap discriminating circuit 5131 may perform the remap discriminating operation when the remapping selection signal REMAP_S has a logic "high(HI)" signal. The remap discriminating operation of the remap discriminating circuit 5131 may skip or perform the bank address remapping operation according to a first bank address BA1 included in the first address signal ADDR1.

Specifically, as illustrated in FIG. 68, the first to sixteenth memory banks BK(0)-BK(15) may have bank addresses that sequentially increase from a logic level combination of '0000' to a logic level combination of '1111'. When the first bank address BA1 outputted from the address decoder 5120 has a logic level combination of '0000', '0001', '1110', or '1111' designating the first, second, fifteenth, or sixteenth memory banks BK(0), BK(1), BK(14), or BK(15), the remap discriminating circuit 5131 may determine to skip the bank address remapping operation. As described with reference to FIG. 63, the MAC result data MAC_RSTs generated by the weight data provided by the first, second, fifteenth, and sixteenth memory banks BK(0), BK(1), BK(14), and BK(15) may be outputted according to the sequence that is consistent with the row number of the result matrix (2300 of FIG. 33). Thus, when the first bank address BA1 is a bank address designating one of the first, second, fifteenth, and sixteenth memory banks BK(0), BK(1), BK(14), and BK(15), it may be unnecessary to remap the bank address. In such a case, the remap discriminating circuit 5131 may transmit the first address signal ADDR1 to the address output circuit 5133. In contrast, when the first bank address BA1 has one of logic level combinations of '0010', . . . , and '1101' designating respective ones of the third to fourteenth memory banks BK(2)-BK(13), the remap discriminating circuit 5131 may determine to perform the bank address remapping operation. In such a case, the remap discriminating circuit 5131 may transmit the first address signal ADDR1 to the bank address changing circuit 5132.

Referring again to FIG. 66, the bank address changing circuit 5132 may remap the first bank address BA1 of the first address signal ADDR1 to generate a second bank address BA2 when the first address signal ADDR1 is transmitted from the remap discriminating circuit 5131 to the bank address changing circuit 5132. The bank address changing circuit 5132 may generate and output a second address signal ADDR2 including the second bank address BA2. The second address signal ADDR2 outputted from the bank address changing circuit 5132 may be transmitted to the address output circuit 5133. The bank address remapping operation of the bank address changing circuit 5132 may be performed by readjusting an array sequence of some bits included in the first bank address BA1.

Specifically, as illustrated in FIG. 69, a first bit BA1[0] corresponding to a least significant bit (LSB) among four bits included in the first bank address BA1 of each of the third to fourteenth memory banks BK(2)-BK(13) may be maintained without change. That is, the first bit BA1[0] of the first bank address BA1 may become a first bit BA2[0] of the second bank address BA2 corresponding to a remapped bank address of the first bank address BA1. A second bit BA1[1] of the first bank address BA1 may move to a position of a most significant bit (MSB) of the second bank address BA2. Thus, the second bit BA1[1] of the first bank address BA1 may become a fourth bit BA2[3] of the second bank address BA2. A third bit BA1[2] and a fourth bit BA1[3] of the first bank address BA1 may move to positions of second and third bits of the second bank address BA2, respectively. Thus, the third bit BA1[2] and the fourth bit BA1[3] of the first bank address BA1 may become a second bit BA2[1] and a third bit BA2[2] of the second bank address BA2, respectively.

Referring to again to FIG. 66, the address output circuit 5133 may receive the first address signal ADDR1 from the remap discriminating circuit 5131 or may receive the second address signal ADDR2 from the bank address changing circuit 5132. The address output circuit 5133 may output the first address signal ADDR1 or the second address signal ADDR2 as the address signal ADDR_S. When the address output circuit 5133 outputs the first address signal ADDR1 as the address signal ADDR_S, it means that the bank address remapping operation is skipped. In contrast, when the address output circuit 5133 outputs the second address signal ADDR2 as the address signal ADDR_S, it means that the bank address remapping operation is performed.

FIG. 70 illustrates a remapped result that the first bank addresses BA1 are remapped by the bank address remapping operation described with reference to FIG. 69. Referring to FIG. 70, the first bank addresses BA1 designating the first, second, fifteenth, and sixteenth memory banks BK(0), BK(1), BK(14), and BK(15) are not remapped, as described with reference to FIG. 68. Thus, the second bank addresses BA2 (i.e., '0000', '0001', '1110', and '1111') designating the first, second, fifteenth, and sixteenth memory banks BK(0), BK(1), BK(14), and BK(15) may be the same as the first bank addresses BA1 designating the first, second, fifteenth, and sixteenth memory banks BK(0), BK(1), BK(14), and BK(15). In contrast, the first bank address BA1 of '0010' designating the third memory bank BK(2) may be remapped by the bank address remapping operation described with reference to FIG. 69 to change into the second bank address BA2 of '1000' designating the ninth memory bank BK(8). In the same way, the first bank address BA1 of '0011' designating the fourth memory bank BK(3) may be remapped to change into the second bank address BA2 of '1001' designating the tenth memory bank BK(9). Similarly, the first bank addresses BA1 of '0100', '1010', '0110', '0111', '1000', '1001', '1010', '1011', '1100', and '1101' designating the fifth to fourteenth memory bank BK(4)-BK(13) may be remapped to change into the second bank addresses BA2 of '0010', '0011', '1010', '1011', '0100', '0101', '1100', '1101', '0110', and '0111' designating the third, fourth, eleventh, twelfth, fifth, sixth, thirteenth, fourteenth, seventh, and eighth memory banks BK(2), BK(3), BK(10), BK(11), BK(4), BK(5), BK(12), BK(13), BK(6), and BK(7), respectively.

Figure 71:
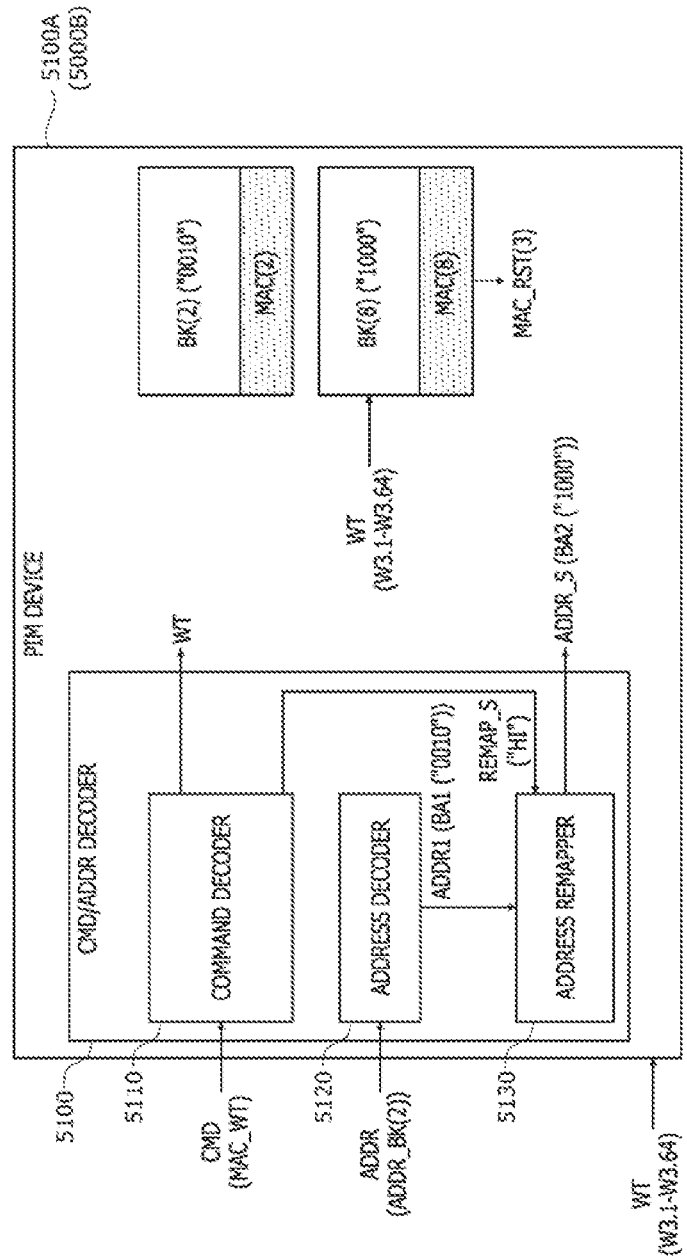
FIG. 71 illustrates an example of a process for writing weight data into a memory bank designated by a remapped bank address in each of the PIM devices illustrated in FIGS. 61 and 62.

FIG. 71 illustrates an example of a process for writing the weight data into the memory bank designated by the second bank address BA2 in the PIM device 5000A (or 5000B) illustrated in FIG. 61 (or 62). The following description will be illustrated in conjunction with a case that the weight data W(3.1)-W(3.64) arrayed in the third row R(3) of the weight matrix (2100 of FIG. 33) are stored in the memory bank. For the purpose of ease and convenience in explanation, elements not directly related with operations according to the present embodiment are not illustrated in FIG. 71. Referring to FIG. 71, in order to write the weight data W(3.1)-W(3.64) arrayed in the third row R(3) of the weight matrix (2100 of FIG. 33) into the memory bank, a host or a controller may transmit the command CMD requesting the MAC write operation, the address ADDR including a bank address ADDR_BK(2) of the third memory bank BK(2) in which the weight data W(3.1)-W(3.64) are stored, and the weight data W(3.1)-W(3.64) to the PIM device 5000A (or 5000B). The command decoder 5110 may decode the command CMD to generate and output the write signal WT as the control signal. In addition, because the command CMD is a command requesting the MAC write operation, the command decoder 5110 may generate and transmit the remapping selection signal REMAP_S having a logic "high(HI)" signal to the address remapper 5130. The address decoder 5120 may decode the address ADDR to transmit the first address signal ADDR1 including the first bank address BA1 of '0010' to the address remapper 5130.

The address remapper 5130 may determine the execution or skipping of the remap discriminating operation for the first bank address BA1 of '0010' included in the first address signal ADDR1 according to the remapping selection signal REMAP_S having a logic "high(HI)" signal. Because the first bank address BA1 of '0010' designates the third memory bank BK(2) as a target memory bank to be remapped, the address remapper 5130 may remap the first bank address BA1 of '0010' to generate and output the address signal ADDR_S including the second bank address BA2 of '1000'. The weight data W(3.1)-W(3.64) inputted to the PIM device 5000A (or 5000B) may be written into the ninth memory bank BK(8) designated by the second bank address BA2 of '1000' included in the address signal ADDR_S. Accordingly, the ninth MAC operator MAC(8) may receive the weight data W(3.1)-W(3.64) from the ninth memory bank BK(8) and may perform the MAC arithmetic operation for the weight data W(3.1)-W(3.64) to generate the third MAC result data MAC_RST(3).

Figure 72:
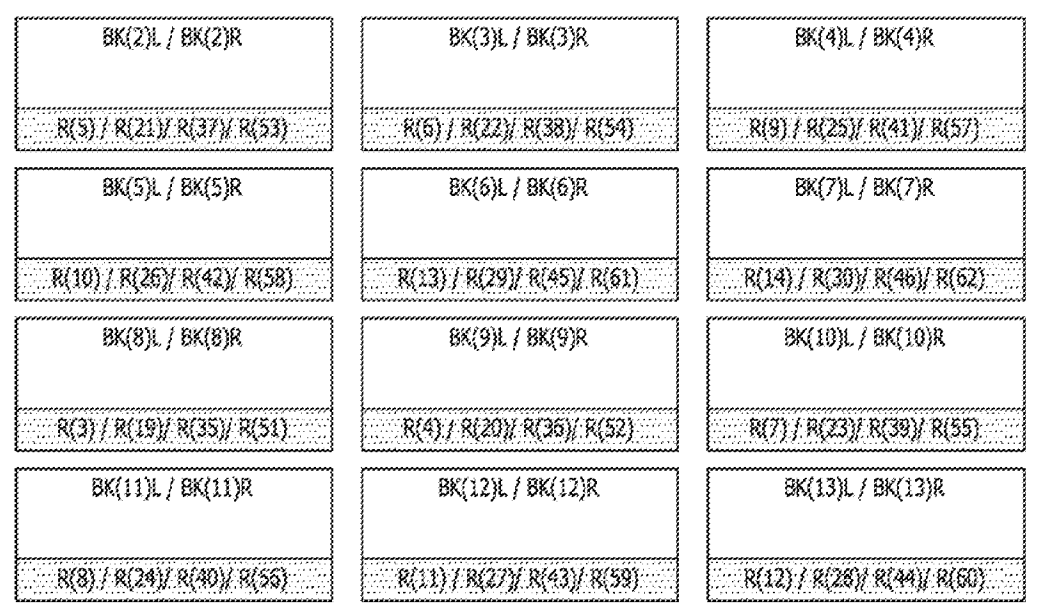

FIG. 72 illustrates a state of the memory banks in which the weight data are stored by the bank address remapping operation, in the PIM device 5000A (or 5000B) illustrated in FIG. 61 (or 62). In FIG. 72, the first, second, fifteenth, and sixteenth memory banks BK(0), BK(1), BK(14), and BK(15) are not illustrated because the first, second, fifteenth, and sixteenth memory banks BK(0), BK(1), BK(14), and BK(15) are not target memory banks to which the bank address remapping operation is applied. Referring to FIG. 72, the weight data arrayed in the fifth, $21^{st}$, $37^{th}$, and $53^{rd}$ rows R(5), R(21), R(37), and R(53) of the weight matrix 2100 may be stored in the third memory bank BK(2)L and BK(2)R. The weight data arrayed in the sixth, $22^{nd}$, $38^{th}$, and $54^{th}$ rows R(6), R(22), R(38), and R(54) of the weight matrix 2100 may be stored in the fourth memory bank BK(3)L and BK(3)R. The weight data arrayed in the ninth, $25^{th}$, $41^{st}$, and $57^{th}$ rows R(9), R(25), R(41), and R(57) of the weight matrix 2100 may be stored in the fifth memory bank BK(4)L and BK(4)R. The weight data arrayed in the tenth, $26^{th}$, $42^{nd}$, and $58^{th}$ rows R(10), R(26), R(42), and R(58) of the weight matrix 2100 may be stored in the sixth memory bank BK(5)L and BK(5)R. The weight data arrayed in the $13^{th}$, $29^{th}$, $45^{th}$, and $61^{st}$ rows R(13), R(29), R(45), and R(61) of the weight matrix 2100 may be stored in the seventh memory bank BK(6)L and BK(6)R. The weight data arrayed in the $14^{th}$, $30^{th}$, 46, and $62^{nd}$ rows R(14), R(30), R(46), and R(62) of the weight matrix 2100 may be stored in the eighth memory bank BK(7)L and BK(7)R. The weight data arrayed in the third, $19^{th}$, $35^{th}$, and $51^{st}$ rows R(3), R(19), R(35), and R(51) of the weight matrix 2100 may be stored in the ninth memory bank BK(8)L and BK(8)R. The weight data arrayed in the fourth, $20^{th}$, $36^{th}$, and $52^{nd}$ rows R(4), R(20), R(36), and R(52) of the weight matrix 2100 may be stored in the tenth memory bank BK(9)L and BK(9)R. The weight data arrayed in the seventh, 23$^{rd}$, 39$^{th}$, and 55$^{th}$ rows R(7), R(23), R(39), and R(55) of the weight matrix 2100 may be stored in the eleventh memory bank BK(10)L and BK(10)R. The weight data arrayed in the eighth, 24$^{th}$, 40$^{th}$, and 56$^{th}$ rows R(8), R(24), R(40), and R(56) of the weight matrix 2100 may be stored in the twelfth memory bank BK(11)L and BK(11)R. The weight data arrayed in the eleventh, 27$^{th}$, 43$^{rd}$, and 59$^{th}$ rows R(11), R(27), R(43), and R(59) of the weight matrix 2100 may be stored in the thirteenth memory bank BK(12)L and BK(12)R. Lastly, the weight data arrayed in the twelfth, 28$^{th}$, 44$^{th}$, and 60$^{th}$ rows R(12), R(28), R(44), and R(60) of the weight matrix 2100 may be stored in the fourteenth memory bank BK(13)L and BK(13)R.

FIG. 73 illustrates an output sequence of the MAC result data MAC_RSTs when the weight data are stored in the memory banks by the bank address remapping operation in the PIM device 5000A (or 5000B) illustrated in FIG. 61 (or 62). In FIG. 73, the memory banks and the MAC operators are illustrated without using the term 'left' and 'right' for the purpose of ease and convenience in explanation. Referring to FIG. 73, in the first output process, the first to fourth MAC result data MAC_RST(1)-MAC_RST(4) may be outputted through the first to 64$^{th}$ data I/O circuits DQ1-DQ64. Specifically, the ninth MAC operator MAC(8) may perform the first MAC arithmetic operation of the weight data W(3.1)-W(3.64) (provided by the ninth memory bank BK(8)) arrayed in the third row R(3) of the weight matrix 2100 and the vector data V(1)-V(64) arrayed in the vector matrix 2200 to generate and output the third MAC result data MAC_RST(3). In addition, the tenth MAC operator MAC(9) may perform the first MAC arithmetic operation of the weight data W(4.1)-W(4.64) (provided by the tenth memory bank BK(9)) arrayed in the fourth row R(4) of the weight matrix 2100 and the vector data V(1)-V(64) arrayed in the vector matrix 2200 to generate and output the fourth MAC result data MAC_RST(4).

In the second output process, the fifth to eighth MAC result data MAC_RST(5)-MAC_RST(8) may be outputted through the first to 64$^{th}$ data I/O circuits DQ1-DQ64. Specifically, the third MAC operator MAC(2) may perform the first MAC arithmetic operation of the weight data W(5.1)-W(5.64) (provided by the third memory bank BK(2)) arrayed in the fifth row R(5) of the weight matrix 2100 and the vector data V(1)-V(64) arrayed in the vector matrix 2200 to generate and output the fifth MAC result data MAC_RST(5). In addition, the fourth MAC operator MAC(3) may perform the first MAC arithmetic operation of the weight data W(6.1)-W(6.64) (provided by the fourth memory bank BK(3)) arrayed in the sixth row R(6) of the weight matrix 2100 and the vector data V(1)-V(64) arrayed in the vector matrix 2200 to generate and output the sixth MAC result data MAC_RST(6). Moreover, the eleventh MAC operator MAC(10) may perform the first MAC arithmetic operation of the weight data W(7.1)-W(7.64) (provided by the eleventh memory bank BK(10)) arrayed in the seventh row R(7) of the weight matrix 2100 and the vector data V(1)-V(64) arrayed in the vector matrix 2200 to generate and output the seventh MAC result data MAC_RST(7). Furthermore, the twelfth MAC operator MAC(11) may perform the first MAC arithmetic operation of the weight data W(8.1)-W(8.64) (provided by the twelfth memory bank BK(11)) arrayed in the eighth row R(8) of the weight matrix 2100 and the vector data V(1)-V(64) arrayed in the vector matrix 2200 to generate and output the eighth MAC result data MAC_RST(8). Even in the third and fourth output processes, the ninth to twelfth MAC result data MAC_RST(9)-MAC_RST(12) and the thirteenth to sixteenth MAC result data MAC_RST(13)-MAC_RST(16) may be outputted through the first to 64$^{th}$ data I/O circuits DQ1-DQ64 by processes which are similar to the first and second output processes described above. As a result, the first to sixteenth MAC result data MAC_RST(1)-MAC_RST(16) may be sequentially outputted from the PIM device 5000A (or 5000B) to provide the result matrix (2300 of FIG. 33) including the first to sixteenth MAC result data MAC_RST(1)-MAC_RST(16) which are sequentially arrayed in a column.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
   first to L$^{th}$ multiplication/accumulation (MAC) operators configured to perform a MAC arithmetic operation for weight data of a weight matrix having "M"-number of rows to generate first to M$^{th}$ MAC result data corresponding to elements of a result matrix (where, "L" is divisor of "M", and "M" is a natural number which is equal to or greater than two);
   first to L$^{th}$ memory banks configured to provide the weight data to the first to L$^{th}$ MAC operators; and
   a plurality of data input/output (I/O) circuits configured to output the first to M$^{th}$ MAC result data, which are generated by the first to L$^{th}$ MAC operators, as output data of the PIM device,
   wherein the PIM device is configured to, when the number "i" is one of 0, 1, . . . , and "M/L−1" and the number "j" is one of "iL+1", "iL+2", "iL+3", . . . , "iL+(L−1)", and "iL+L", store "L" sets of the weight data arrayed in the (iL+1)th to (iL+L)$^{th}$ rows of the weight matrix in respective ones of the first to L$^{th}$ memory banks, and store the weight data arrayed in the j$^{th}$ row of the weight matrix in the (j−iL)$^{th}$ memory bank, and
   wherein the PIM device is configured to output the first to M$^{th}$ MAC result data through the plurality of data I/O circuits in order of a row number of the result matrix.

2. The PIM device of claim 1, further comprising a global buffer configured to transmit vector data arrayed in a vector matrix, which are used for the MAC arithmetic operation, to each of the first to L$^{th}$ MAC operators.

3. The PIM device of claim 1,
   wherein each of the first to L$^{th}$ MAC operators and the corresponding one of the first to L$^{th}$ memory banks constitute one MAC unit; and
   wherein the MAC operator in the one MAC unit performs the MAC arithmetic operation using the weight data received from the memory bank in the one MAC unit as input data.

4. The PIM device of claim 1, wherein each of the first to $L^{th}$ MAC operators includes:
- a plurality of multipliers configured to perform a multiplying calculation of the weight data and vector data to generate and output plural sets of multiplication result data;
- an adder tree configured to perform an adding calculation of the plural sets of multiplication result data to generate and output addition result data;
- an accumulator configured to perform an accumulative adding calculation for the addition result data to generate accumulated data and configured to perform a latch operation for the accumulated data; and
- an output circuit configured to output data outputted from the accumulator as one of the first to $M^{th}$ MAC result data in response to a MAC result read signal having a first logic level.

5. The PIM device of claim 4, wherein the accumulator includes:
- an accumulative adder configured to add latched data to the addition result data to generate and output the accumulated data through an output terminal of the accumulative adder; and
- a latch circuit having an input terminal coupled to the output terminal of the accumulative adder,
- wherein the latch circuit latches the accumulated data inputted to the input terminal to generate the latched data in response to a latch clock signal and outputs the latched data to the accumulative adder and the output circuit.

6. The PIM device of claim 5, wherein the first to $L^{th}$ MAC operators perform the $(i+1)^{th}$ MAC arithmetic operation of the weight data in the $(iL+1)^{th}$ to $(iL+L)^{th}$ rows of the weight matrix and the vector data to generate and output the $(iL+1)^{th}$ to $(iL+L)^{th}$ MAC result data, respectively.

7. The PIM device of claim 6, wherein the $(j-iL)^{th}$ MAC operator among the first to $L^{th}$ MAC operators receives the weight data in the $j^{th}$ row of the weight matrix from the $(j-iL)^{th}$ memory bank and performs the $(i+1)^{th}$ MAC arithmetic operation of the weight data in the $j^{th}$ row of the weight matrix and the vector data to generate and output the $j^{th}$ MAC result data.

8. The PIM device of claim 7, wherein when the number of the plurality of multipliers included in each of the first to $L^{th}$ MAC operators is "K" (where, "K" is equal to "N/n", "N" is the number of columns of the weight matrix, and "n" is a natural number), the $(j-iL)^{th}$ MAC operator sequentially performs first to $(N/K)^{th}$ sub-MAC arithmetic operations of the $(i+1)^{th}$ MAC arithmetic operation to generate and output the $j^{th}$ MAC result data as a result of the $(i+1)^{th}$ MAC arithmetic operation.

9. The PIM device of claim 8, wherein the output circuit of the $(j-iL)^{th}$ MAC operator receives and outputs data generated by the $(N/K)^{th}$ sub-MAC arithmetic operation among the first to $(N/K)^{th}$ sub-MAC arithmetic operations of the $(i+1)^{th}$ MAC arithmetic operation as the $j^{th}$ MAC result data.

10. The PIM device of claim 9, wherein the latch circuit included in the accumulator of the $(j-iL)^{th}$ MAC operator is reset after outputting the data generated by the $(N/K)^{th}$ sub-MAC arithmetic operation among the first to $(N/K)^{th}$ sub-MAC arithmetic operations of the $(i+1)^{th}$ MAC arithmetic operation.

11. The PIM device of claim 8, wherein when the number "N" is equal to the number of rows of a vector matrix including the vector data and "p" is one of 0, 1, . . . , and (N/K−1) (where, the number "N" is a natural number which is equal to or greater than two), each of the first to $(N/K)^{th}$ sub-MAC arithmetic operations of the $(i+1)^{th}$ MAC arithmetic operation is performed using the weight data arrayed in the $(pK+1)^{th}$ to $(pK+K)^{th}$ columns of the weight matrix and the vector data arrayed in the $(pK+1)^{th}$ to $(pK+K)^{th}$ rows of the vector matrix as input data.

12. The PIM device of claim 1, wherein when each of the first to $M^{th}$ MAC result data has a data size of "O" bits (where, "O" is a natural number which is equal to or greater than two) and the number of the plurality of data I/O circuits is "Q" (where, "Q" is a multiple of "O"), the "Q"-number of data I/O circuits perform an output process, which outputs "Q/O" sets of the MAC result data at a time, "M×O/Q" times to output the first to $M^{th}$ MAC result data.

* * * * *